United States Patent
Rogers et al.

(10) Patent No.: US 9,324,733 B2
(45) Date of Patent: Apr. 26, 2016

(54) CONTROLLED BUCKLING STRUCTURES IN SEMICONDUCTOR INTERCONNECTS AND NANOMEMBRANES FOR STRETCHABLE ELECTRONICS

(71) Applicant: The Board of Trustees of the University of Illinois, Urbana, IL (US)

(72) Inventors: John A. Rogers, Champaign, IL (US); Matthew Meitl, Durham, NC (US); Yugang Sun, Naperville, IL (US); Heung Cho Ko, Gwangju (KR); Andrew Carlson, Urbana, IL (US); Won Mook Choi, Gyeonggi-do (KR); Mark Stoykovich, Dover, NH (US); Hanqing Jiang, Chandler, AZ (US); Yonggang Huang, Glencoe, IL (US); Ralph G. Nuzzo, Champaign, IL (US); Zhengtao Zhu, Rapid City, SD (US); Etienne Menard, Durham, NC (US); Dahl-Young Khang, Seoul (KR)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 14/220,910

(22) Filed: Mar. 20, 2014

(65) Prior Publication Data
US 2014/0374872 A1  Dec. 25, 2014

Related U.S. Application Data

(63) Continuation of application No. 13/441,598, filed on Apr. 6, 2012, now Pat. No. 8,729,524, which is a
(Continued)

(51) Int. Cl.
*H01L 29/12* (2006.01)
*H01L 27/12* (2006.01)
(Continued)

(52) U.S. Cl.
CPC .......... *H01L 27/12* (2013.01); *H01L 21/02422* (2013.01); *H01L 21/02628* (2013.01);
(Continued)

(58) Field of Classification Search
CPC ........................................................ H01L 27/12
USPC .......................... 257/9, 40, 499, 619; 439/67
See application file for complete search history.

(56) References Cited

U.S. PATENT DOCUMENTS

| 4,761,335 A | 8/1988 | Aurichio et al. |
| 4,766,670 A * | 8/1988 | Gazdik et al. .................. 29/830 |

(Continued)

FOREIGN PATENT DOCUMENTS

| JP | 06-118441 | 4/1994 |
| JP | 2001332383 | 11/2001 |

(Continued)

OTHER PUBLICATIONS

U.S. Appl. No. 11/465,317, filed Aug. 17, 2006.
(Continued)

*Primary Examiner* — Edward Wojciechowicz
(74) *Attorney, Agent, or Firm* — Lathrop & Gage LLP

(57) ABSTRACT

In an aspect, the present invention provides stretchable, and optionally printable, components such as semiconductors and electronic circuits capable of providing good performance when stretched, compressed, flexed or otherwise deformed, and related methods of making or tuning such stretchable components. Stretchable semiconductors and electronic circuits preferred for some applications are flexible, in addition to being stretchable, and thus are capable of significant elongation, flexing, bending or other deformation along one or more axes. Further, stretchable semiconductors and electronic circuits of the present invention are adapted to a wide range of device configurations to provide fully flexible electronic and optoelectronic devices.

38 Claims, 71 Drawing Sheets

Related U.S. Application Data continuation of application No. 11/851,182, filed on Sep. 6, 2007, now Pat. No. 8,217,381, and a continuation-in-part of application No. 11/145,574, filed on Jun. 2, 2005, now Pat. No. 7,622,367, and a continuation-in-part of application No. 11/145,542, filed on Jun. 2, 2005, now Pat. No. 7,557,367, and a continuation-in-part of application No. 11/423,287, filed on Jun. 9, 2006, now Pat. No. 7,521,292.

(60) Provisional application No. 60/944,626, filed on Jun. 18, 2007, provisional application No. 60/824,683, filed on Sep. 6, 2006, provisional application No. 60/577,077, filed on Jun. 4, 2004, provisional application No. 60/601,061, filed on Aug. 11, 2004, provisional application No. 60/650,305, filed on Feb. 4, 2005, provisional application No. 60/663,391, filed on Mar. 18, 2005, provisional application No. 60/677,617, filed on May 4, 2005, provisional application No. 60/790,104, filed on Apr. 7, 2006.

(51) Int. Cl.
*H01L 21/8258* (2006.01)
*H05K 1/02* (2006.01)
*H01L 21/02* (2006.01)
*H01L 29/06* (2006.01)
*H05K 3/20* (2006.01)

(52) U.S. Cl.
CPC ........ *H01L21/8258* (2013.01); *H01L 29/0657* (2013.01); *H05K 1/0283* (2013.01); *H01L 2924/12041* (2013.01); *H01L 2924/13091* (2013.01); *H05K 3/20* (2013.01); *H05K 2201/0133* (2013.01); *H05K 2201/09045* (2013.01); *H05K 2203/0271* (2013.01)

(56) References Cited

U.S. PATENT DOCUMENTS

| | | |
|---|---|---|
| 5,086,785 A | 2/1992 | Gentile et al. |
| 5,375,397 A | 12/1994 | Ferrand et al. |
| 5,545,291 A | 8/1996 | Smith et al. |
| 5,691,245 A | 11/1997 | Bakhit et al. |
| 5,772,905 A | 6/1998 | Chou |
| 5,783,856 A | 7/1998 | Smith et al. |
| 5,817,242 A | 10/1998 | Biebuyck et al. |
| 5,824,186 A | 10/1998 | Smith et al. |
| 5,904,545 A | 5/1999 | Smith et al. |
| 5,928,001 A | 7/1999 | Gillette et al. |
| 5,998,291 A | 12/1999 | Bakhit et al. |
| 6,150,602 A | 11/2000 | Campbell |
| 6,225,149 B1 | 5/2001 | Gan et al. |
| 6,274,508 B1 | 8/2001 | Jacobsen et al. |
| 6,281,038 B1 | 8/2001 | Jacobsen et al. |
| 6,291,896 B1 | 9/2001 | Smith |
| 6,316,278 B1 | 11/2001 | Jacobsen et al. |
| 6,317,175 B1 | 11/2001 | Salerno et al. |
| 6,319,012 B1 | 11/2001 | Moessinger et al. |
| 6,380,729 B1 | 4/2002 | Smith |
| 6,403,397 B1 | 6/2002 | Katz |
| 6,413,790 B1 | 7/2002 | Duthaler et al. |
| 6,417,025 B1 | 7/2002 | Gengel |
| 6,420,266 B1 | 7/2002 | Smith et al. |
| 6,468,638 B2 | 10/2002 | Jacobsen et al. |
| 6,479,395 B1 | 11/2002 | Smith et al. |
| 6,527,964 B1 | 3/2003 | Smith et al. |
| 6,555,408 B1 | 4/2003 | Jacobsen et al. |
| 6,566,744 B2 | 5/2003 | Gengel |
| 6,580,151 B2 | 6/2003 | Vandeputte et al. |
| 6,586,338 B2 | 7/2003 | Smith et al. |
| 6,590,346 B1 | 7/2003 | Hadley et al. |
| 6,606,079 B1 | 8/2003 | Smith |
| 6,606,247 B2 | 8/2003 | Credelle et al. |
| 6,608,370 B1 | 8/2003 | Chen et al. |
| 6,623,579 B1 | 9/2003 | Smith et al. |
| 6,655,286 B2 | 12/2003 | Rogers |
| 6,657,289 B1 | 12/2003 | Craig et al. |
| 6,665,044 B1 | 12/2003 | Jacobsen et al. |
| 6,683,663 B1 | 1/2004 | Hadley et al. |
| 6,693,384 B1 | 2/2004 | Vicentini et al. |
| 6,723,576 B2 | 4/2004 | Nozawa et al. |
| 6,730,990 B2 | 5/2004 | Kondo et al. |
| 6,731,353 B1 | 5/2004 | Credelle et al. |
| 6,743,982 B2 | 6/2004 | Biegelsen et al. |
| 6,780,696 B1 | 8/2004 | Schatz |
| 6,816,380 B2 | 11/2004 | Credelle et al. |
| 6,844,673 B1 | 1/2005 | Bernkopf |
| 6,848,162 B2 | 2/2005 | Arneson et al. |
| 6,850,312 B2 | 2/2005 | Jacobsen et al. |
| 6,863,219 B1 | 3/2005 | Jacobsen et al. |
| 6,864,435 B2 | 3/2005 | Hermanns et al. |
| 6,864,570 B2 | 3/2005 | Smith |
| 6,872,645 B2 | 3/2005 | Duan et al. |
| 6,878,871 B2 | 4/2005 | Scher et al. |
| 6,949,206 B2 | 9/2005 | Whiteford |
| 6,989,285 B2 | 1/2006 | Ball |
| 7,169,669 B2 | 1/2007 | Blakers et al. |
| 7,195,733 B2 | 3/2007 | Rogers et al. |
| 7,255,919 B2 | 8/2007 | Sakata et al. |
| 7,273,987 B2 | 9/2007 | Becker et al. |
| 7,374,968 B2 | 5/2008 | Kornilovich et al. |
| 7,521,292 B2 | 4/2009 | Rogers et al. |
| 7,557,367 B2 | 7/2009 | Rogers et al. |
| 7,622,367 B1 | 11/2009 | Nuzzo et al. |
| 7,629,691 B2 | 12/2009 | Roush |
| 7,704,684 B2 | 4/2010 | Rogers et al. |
| 7,705,280 B2 | 4/2010 | Nuzzo et al. |
| 7,799,699 B2 | 9/2010 | Nuzzo et al. |
| 7,932,123 B2 | 4/2011 | Rogers et al. |
| 7,943,491 B2 | 5/2011 | Nuzzo et al. |
| 7,972,875 B2 | 7/2011 | Rogers et al. |
| 7,982,296 B2 | 7/2011 | Nuzzo et al. |
| 8,039,847 B2 | 10/2011 | Nuzzo et al. |
| 8,198,621 B2 | 6/2012 | Rogers et al. |
| 8,217,381 B2 | 7/2012 | Rogers et al. |
| 8,367,035 B2 | 2/2013 | Rogers et al. |
| 8,394,706 B2 | 3/2013 | Nuzzo et al. |
| 8,440,546 B2 | 5/2013 | Nuzzo et al. |
| 8,470,701 B2 | 6/2013 | Rogers et al. |
| 8,552,299 B2 | 10/2013 | Rogers et al. |
| 8,562,095 B2 | 10/2013 | Alleyne et al. |
| 8,664,699 B2 | 3/2014 | Nuzzo et al. |
| 8,666,471 B2 | 3/2014 | Rogers et al. |
| 8,679,888 B2 | 3/2014 | Rogers et al. |
| 8,722,458 B2 | 5/2014 | Rogers et al. |
| 8,729,524 B2 | 5/2014 | Rogers et al. |
| 8,754,396 B2 | 6/2014 | Rogers et al. |
| 8,865,489 B2 | 10/2014 | Rogers et al. |
| 8,895,406 B2 | 11/2014 | Rogers et al. |
| 2002/0094701 A1 | 7/2002 | Biegelsen et al. |
| 2003/0006527 A1 | 1/2003 | Rabolt et al. |
| 2003/0082889 A1 | 5/2003 | Maruyama et al. |
| 2003/0178316 A1 | 9/2003 | Jacobs et al. |
| 2003/0222282 A1* | 12/2003 | Fjelstad et al. ................ 257/200 |
| 2003/0227116 A1 | 12/2003 | Halik et al. |
| 2004/0005723 A1 | 1/2004 | Empedocles et al. |
| 2004/0026684 A1 | 2/2004 | Empedocles |
| 2004/0079464 A1 | 4/2004 | Kumakura et al. |
| 2004/0095658 A1 | 5/2004 | Buretea et al. |
| 2004/0112964 A1 | 6/2004 | Empedocles et al. |
| 2004/0136866 A1 | 7/2004 | Pontis et al. |
| 2004/0146560 A1 | 7/2004 | Whiteford et al. |
| 2004/0178390 A1 | 9/2004 | Whiteford |
| 2004/0192062 A1 | 9/2004 | Mikelson et al. |
| 2004/0192082 A1* | 9/2004 | Wagner et al. .................. 439/67 |
| 2004/0206448 A1 | 10/2004 | Dubrow |
| 2004/0250950 A1 | 12/2004 | Dubrow |
| 2005/0020094 A1 | 1/2005 | Forbes et al. |
| 2005/0038498 A1 | 2/2005 | Dubrow et al. |
| 2005/0227389 A1 | 10/2005 | Bhattacharya et al. |
| 2005/0238967 A1 | 10/2005 | Rogers et al. |

(56) References Cited

U.S. PATENT DOCUMENTS

| | | |
|---|---|---|
| 2005/0255686 A1 | 11/2005 | Yamano et al. |
| 2006/0038182 A1 | 2/2006 | Rogers et al. |
| 2006/0076561 A1 | 4/2006 | Hioki et al. |
| 2006/0127817 A1 | 6/2006 | Ramanujan et al. |
| 2006/0132025 A1 | 6/2006 | Gao et al. |
| 2006/0134893 A1 | 6/2006 | Savage et al. |
| 2006/0169989 A1 | 8/2006 | Bhattacharya |
| 2006/0244105 A1* | 11/2006 | Forbes et al. ............. 257/619 |
| 2006/0286488 A1 | 12/2006 | Rogers et al. |
| 2006/0286785 A1 | 12/2006 | Rogers et al. |
| 2007/0032089 A1 | 2/2007 | Nuzzo et al. |
| 2008/0041617 A1 | 2/2008 | Chen et al. |
| 2008/0055581 A1 | 3/2008 | Rogers et al. |
| 2008/0108171 A1 | 5/2008 | Rogers et al. |
| 2008/0157235 A1 | 7/2008 | Rogers et al. |
| 2008/0212102 A1 | 9/2008 | Nuzzo et al. |
| 2009/0199960 A1 | 8/2009 | Nuzzo et al. |
| 2009/0294803 A1 | 12/2009 | Nuzzo et al. |
| 2010/0002402 A1 | 1/2010 | Rogers et al. |
| 2010/0052112 A1 | 3/2010 | Rogers et al. |
| 2010/0059863 A1 | 3/2010 | Rogers et al. |
| 2010/0283069 A1 | 11/2010 | Rogers et al. |
| 2010/0289124 A1 | 11/2010 | Nuzzo et al. |
| 2010/0317132 A1 | 12/2010 | Rogers et al. |
| 2011/0147715 A1 | 6/2011 | Rogers et al. |
| 2011/0170225 A1 | 7/2011 | Rogers et al. |
| 2011/0171813 A1 | 7/2011 | Rogers et al. |
| 2011/0187798 A1 | 8/2011 | Rogers et al. |
| 2011/0316120 A1 | 12/2011 | Rogers et al. |
| 2012/0157804 A1 | 6/2012 | Rogers et al. |
| 2012/0165759 A1 | 6/2012 | Rogers et al. |
| 2012/0261551 A1 | 10/2012 | Rogers et al. |
| 2012/0320581 A1 | 12/2012 | Rogers et al. |
| 2012/0327608 A1 | 12/2012 | Rogers et al. |
| 2013/0036928 A1 | 2/2013 | Rogers et al. |
| 2013/0041235 A1 | 2/2013 | Rogers et al. |
| 2013/0072775 A1 | 3/2013 | Rogers et al. |
| 2013/0140649 A1 | 6/2013 | Rogers et al. |
| 2013/0333094 A1 | 12/2013 | Rogers et al. |
| 2014/0163390 A1 | 6/2014 | Rogers et al. |
| 2014/0191236 A1 | 7/2014 | Nuzzo et al. |
| 2014/0216524 A1 | 8/2014 | Rogers et al. |
| 2014/0220422 A1 | 8/2014 | Rogers et al. |
| 2014/0305900 A1 | 10/2014 | Rogers et al. |
| 2014/0323968 A1 | 10/2014 | Rogers et al. |

FOREIGN PATENT DOCUMENTS

| | | |
|---|---|---|
| JP | 2002092984 | 3/2002 |
| JP | 2003289136 | 10/2003 |
| TW | 367570 | 8/1999 |
| TW | 494257 | 7/2002 |
| TW | 200307357 | 12/2003 |
| WO | WO 96/21245 | 7/1996 |
| WO | WO 00/46854 | 8/2000 |
| WO | WO 00/49421 | 8/2000 |
| WO | WO 00/49658 | 8/2000 |
| WO | WO 00/55915 | 9/2000 |
| WO | WO 00/55916 | 9/2000 |
| WO | WO 01/33621 | 5/2001 |
| WO | WO 02/27701 | 4/2002 |
| WO | WO 02/43032 | 5/2002 |
| WO | WO 02/45160 | 6/2002 |
| WO | WO 02/071137 | 9/2002 |
| WO | WO 02/097708 | 12/2002 |
| WO | WO 02/097724 | 12/2002 |
| WO | WO 03/032240 | 4/2003 |
| WO | WO 03/049201 | 6/2003 |
| WO | WO 03/063211 | 7/2003 |
| WO | WO 03/085700 | 10/2003 |
| WO | WO 03/085701 | 10/2003 |
| WO | WO 03/092073 | 11/2003 |
| WO | WO 2004/003535 | 1/2004 |
| WO | WO 2004/022637 | 3/2004 |
| WO | WO 2004/022714 | 3/2004 |
| WO | WO 2004/023527 | 3/2004 |
| WO | WO 2004/024407 | 3/2004 |
| WO | WO 2004/027822 | 4/2004 |
| WO | WO 2004/032190 | 4/2004 |
| WO | WO 2004/032191 | 4/2004 |
| WO | WO 2004/032193 | 4/2004 |
| WO | WO 2004/034025 | 4/2004 |
| WO | WO 2004/086289 | 10/2004 |
| WO | WO 2004/094303 | 11/2004 |
| WO | WO 2004/100252 | 11/2004 |
| WO | WO 2004/099068 | 12/2004 |
| WO | WO 2004/105456 | 12/2004 |
| WO | WO 2004/107973 | 12/2004 |
| WO | WO 2005/005679 | 1/2005 |
| WO | WO 2005/015480 | 2/2005 |
| WO | WO 2005/017962 | 2/2005 |
| WO | WO 2005/022120 | 3/2005 |
| WO | WO 2005/029578 | 3/2005 |
| WO | WO 2005/033786 | 4/2005 |
| WO | WO 2005/033787 | 4/2005 |
| WO | WO 2005/054119 | 6/2005 |
| WO | WO 2005/106934 | 11/2005 |
| WO | WO 2005/122285 | 12/2005 |
| WO | WO 2006/130558 | 12/2006 |
| WO | WO 2007/000037 | 1/2007 |
| WO | WO 2007/126412 | 11/2007 |
| WO | WO 2008/030960 | 3/2008 |
| WO | WO 2008/036837 | 3/2008 |
| WO | WO 2008/143635 | 11/2008 |
| WO | WO 2009/011709 | 1/2009 |

OTHER PUBLICATIONS

U.S. Appl. No. 12/372,605, filed Feb 17, 2009.
U.S. Appl. No. 13/095,502, filed Apr. 27, 2011.
U.S. Appl. No. 14/209,481, filed Mar. 13, 2014.
U.S. Appl. No. 14/220,910, filed Mar. 20, 2014.
U.S. Appl. No. 14/220,923, filed Mar. 20, 2014.
U.S. Appl. No. 14/246,962, filed Apr. 7, 2014.
U.S. Appl. No. 14/479,100, filed Sep. 5, 2014.
U.S. Appl. No. 14/504,736, filed Oct. 2, 2014.
U.S. Appl. No. 14/521,319, filed Oct. 22, 2014.
U.S. Appl. No. 14/532,687, filed Nov. 4, 2014.
Examination Report corresponding to European Patent Application No. 07841968.6, dated Feb. 2, 2015.
Sun et al. (Aug. 7, 2006) "Printed Arrays of Aligned GaAs Wires for Flexible Transistors, Diodes, and Circuits on Plastic Substrates," *Small.* 2:1330-1334.
Adachi et al (1982) "Chemical Etching of InGaAsP/InP DH Wafer," *J. Electrochem. Soc.* 129:1053-1062.
Adachi et al. (1983) "Chemical Etching Characteristics of (001)GaAs," *J. Electrochem. Soc.* 130:2427-2435.
Ahn et al. (Jun. 2006) "High-Speed Mechanically Flexible Single-Crystal Silicon Thin-Film Film Transistors on Plastic Substrates," *IEEE Electron Dev. Lett.* 27(6):460-462.
Alivisatos et al. (1996) "Semiconductor Clusters, Nanocrystals, and Quantum Dots," *Science* 271:933-937.
Alivisatos et al. (1998) "From Molecules to Materials: Current Trends and Future Directions," *Adv. Mater.* 10:1297-1336.
Allen et al. (Feb. 20, 2006) "Nanomaterial Transfer Using Hot Embossing for Flexible Electronic Devices," *Appl. Phys. Lett.* 88:083112.
Al-Sarawi et al. (Feb. 1998) "A Review of 3-D Packaging Technology," *IEEE Trans. Comp. Packag. Manufac. Technol. B* 21(1):2-14.
Amano et al. (Feb. 3, 1986) "Metalorganic Vapor Phase Epitaxial Growth of a High Quality GaN Film Using an AlN Buffer Layer," *Appl. Phys. Lett.* 48(5):353-355.
Ambrosy et al. (1996) "Silicon Motherboards for Multichannel Optical Modules," *IEEE Trans. Compon. Pack. A* 19:34-40.
Ando et al. (2004) "Self-Aligned Self-Assembly Process for Fabricating Organic Thin-Film Transistors," *Appl. Phys. Lett.* 85:1849-1851.
Aoki et al. (2003) "Microassembly of Semiconductor Three Dimensional Photonic Crystals," *Nat. Mater.* 2:117-121.

(56) References Cited

OTHER PUBLICATIONS

Bachtold et al. (Nov. 9, 2001) "Logic Circuits with Carbon Nanotube Transistors," *Science* 294:1317-1320.
Balmer et al. (2005) "Diffusion of Alkanethiols in PDMS and Its Implications on Microcontact Printing (μCP)," *Langmuir* 21(2):622-632.
Banerjee et al. (May 2001) "3-D ICs: A Novel Chip Design for Improving Deep-Submicrometerinterconnect Performance and Systems-on-Chip Integration," *Proc. IEEE* 89(5):602-633.
Bao et al. (1997) "High-Performance Plastic Transistors Fabricated by Printing Techniques," *Chem. Mater.* 9:1299-1301.
Bao et al. (1999) "Printable Organic and Polymeric Semiconducting Materials and Devices," *J. Mater. Chem.* 9:1895-1904.
Barquins, M. (1992) "Adherence, Friction and Wear of Rubber-Like Materials," *Wear* 158:87-117.
Bates, F.S. (1991) "Polymer-Polymer Phase Behavior," *Science* 251:898-905.
Battaglia et al. (2003) "Colloidal Two-Dimensional Systems: CdSe Quantum Shells and Wells," Angew. Chem. Int. Ed. 442:5035-5039.
Bauer et al. (2004) "Biological Applications of High Aspect Ratio Nanoparticles," *J. Mater. Chem.* 14:517-526.
Berg et al. (2003) "Tailored Micropatterns Through Weak Polyelectrolyte Stamping," Langmuir 19:2231-2237.
Bernard et al. (1998) "Printing Patterns of Proteins," *Langmuir* 14(9):2225-2229.
Bhunia et al. (2004) "Free-Standing and Vertically Aligned InP Nanowires Grown by Metalorganic Vapor Phase Epitaxy," *Physica E* 21:583-587.
Bietsch et al. (Oct. 1, 2000) "Conformal Contact and Pattern Stability of Stamps Used for Soft Lithography," *J. Appl. Phys.* 8(7):4310-4318.
Bioflex—Biocompatible Flexible Electronic Circuits. Available at http://tfcg.elis.ugent.be/projects/bioflex. Accessed Feb. 8, 2012.
Blanchet et al. (2003) "Large Area, High Resolution, Dry Printing of Conducting Polymers for Organic Electronics," *Appl. Phys. Lett.* 82:463-465.
Blanchet et al. (2003) "Printing Techniques for Plastic Electronics," *J. Imag. Sci. Tech.* 47(4):296-303.
Blazdell et al. (Nov. 1999) "Preparation of Ceramic Inks for Solid Freeforming Using a Continuous Jet Printer," *J. Mat. Syn. Process.* 7(6):349-356.
Boltau et al. (1998) "Surface-Induced Structure Formation of Polymer Blends on Patterned Substrates," *Nature* 391:877-879.
Bowden et al. (1997) "Self Assembly of Mesoscale Objects into Ordered Two-Dimensional Dimensional Arrays," *Science* 276:233-235.
Bowden et al. (2001) "Molecule-Mimetic Chemistry and Mesoscale Self-Assembly," *Acc. Chem. Res.* 34:231-238.
Bowden et al. (May 14, 1998) "Spontaneous Formation of Ordered Structures in Thin Films of Metals Supported on an Elastomeric Polymer," *Nature* 393:146-149.
Braun et al. (1999) "Electrochemically Grown Photonic Crystals," *Nature* 402:603-604.
Brown et al. (Dec. 19, 2001) "Heterogeneous Materials Integration: Compliant Substrates to Active Device and Materials Packaging," *Mater. Sci. Eng. B* 87(3):317-322.
Brown, H.R. (1991) "The Adhesion Between Polymers," *Ann. Rev. Mater. Sci.* 21:463-489.
Bruschi et al. (2001) "Micromachined Silicon Suspended Wires With Submicrometric Dimensions," *Microelectron. Eng.* 57-58:959-965.
Buma et al. (Jul. 23, 2001) "High-Frequency Ultrasound Array Element Using Thermoelastic Expansion in an Elastomeric Film," *Appl. Phys. Lett.* 79(4):548-550.
Burdinski et al. (2005) "Single Etch Patterning of Stacked Silver and Molybdenum Alloy Layers on Glass Using Microcontat Wave Printing," *J. Am. Chem. Soc.* 127(31):10786-10787.
Burgin et al. (2000) "Large Area Submicrometer Contact Printing Using a Contact Aligner," *Langmuir* 16:5371-5375.

Burns et al. (2003) "Printing of Polymer Thin-Film Transistors for Active-Matrix-Display Display Applications," *J. Soc. Inf. Display* 11:599-604.
Campbell et al. (2000) "Fabrication of Photonic Crystals for the Visible Spectrum by Holographic Lithography," *Nature* 404:53-56.
Cao et al. (2006) "Highly Bendable,Transparent Thin-Film Transistors That Use Carbon-Nanotube-Based Conductors and Semiconductors with Elastomeric Delectrics," *Adv. Mater.* 18(3):304-309.
Carr et al. (1998) "Measurement of Nanomechanical Resonant Structures in Single-Crystal Crystal Silicon," *J. Vac. Sci. Technol. B* 16:3821-3824.
Chadhury et al. (1991) "Direct Measurement of Interfacial Interactions Between Semispherical Lenses and Flat Sheets of Poly(dimethylsiloxane) and their Chemical Derivatives," *Langmuir* 7:1013-1025.
Chang et al. (1994) "Process Techniques, Lithography and Device-Related Physics and Principles," in; *GaAs High-Speed Devices: Physics, Technology and Circuit Application*, John Wiley and Sons, New York, pp. 115-278.
Chen et al. (2003) "Characterization of Pd-GaAs Schottly Diodes Prepared by the Electrodes Plating Technique," *Semiconductor. Sci. Technol.* 18:620-626.
Chen et al. (2003) "Electronic Paper: Flexible Active-Matrix Electronics Ink Display," *Nature* 423:136.
Chen et al. (2005) "InGaN Nanorings and Nanodots by Selective Area Epitaxy," *Appl. Phys. Lett.* 87:143111.
Chen et al. (2005) "The Role of Metal-Nanotube Caontact in the Performance of Carbon Nanotube Field-Effect Transistors," *Nano Lett.* 5(7):1497-1502.
Chen et al. (Feb. 27, 2006) "Complementary Carbon Nanotube-Gated Carbon Nanotube Thin-Fim Transistor," *Appl. Phys. Lett.* 88:093502.
Chen et al. (Mar. 2004) "A Family of Herringbone Patterns in Thin Films," *Scr. Mater.* 50(6):797-801.
Chen et al. (Mar. 24, 2006) "An Integrated Logic Crcuit Assembled on a Single Carbon Nanotube," *Science* 311:1735.
Chen et al. (Sep. 2004) "Herringbone Buckline Patterns of Compressed Thin Films on Compliant Substrates," *J. Appl. Mech. Trans. ASME* 71:597-603.
Cheng et al. (2005) "Ink-Jet Printing, Self-Assembled Polyelectrolytes, and Electroless Plating: Low Cost Fabrication of Circuits on a Flexible Substrate at Room Temperature," *Macromol. Rapid Commun.* 26:247-264.
Childs et al. (2002) "Decal transfer Microlithography: A New Soft-Lithographic Patterning Method," *J. Am. Chem. Soc.* 124:13583-13596.
Childs et al. (2005) "Masterless Soft-Lithography: Patterning UV/Ozone-Induced Adhesion on Poly(dimethylsiloxane) Surfaces," *Langmuir* 21:10096-10105.
Choi et al. (2007) "Biaxially Stretchable 'Wavy' Silicon Nanomembranes," *Nano Lett.* 7(6):1655-1663.
Chou et al. (2004) "An Orientation-Controlled Pentacene Film Aligned by Photoaligned Polyimide for Organic Thin-Film Transistor Applications," *Adv. Func. Mater.* 14:811-815.
Chu et al. (2005) "High-Performance Organic Thin-Film Transistors with Metal Oxide/Metal Bilayer Electrode," *Appl. Phys. Lett.* 87:193508.
Chung et al. (2000) "Silicon Nanowire Devices," *Appl. Phys. Lett.* 76(15):2068-2070.
Collins et al. (Apr. 27, 2001) "Engineering Carbon Nanotubes and Nanotube Circuits Using Electrical Breakdown," *Science* 292:706-709.
Creagh et al. (2003) "Design and Performance of Inkjet Print Heads for Non-Graphic-Arts Applications," *MRS Bull.* 28:807-811.
Crowder et al. (1998) "Low-Temperature Single-Crystal Si TFTs Fabricated on Si Films Processed via Sequential Lateral Solidification," *IEEE Electron. Dev. Lett.* 19:306-308.
Cui et al. (2001) "Nanowire Nanosensors for Highly Sensitive and Selective Detection of Biological and Chemical Species," *Science* 293:1289-1292.
Dai et al. (2003) "Novel Nanostructures of Functional Oxides Synthesized by Thermal Evaporation," *Adv. Funct. Mater.* 13:9-24.

(56) References Cited

OTHER PUBLICATIONS

Davidson et al. (2004) "Supercritical Fluid-Liquid-Solid Synthesis of Gallium Arsenide Nanowires Seeded by Alkanethiol-Stabilized Gold Nanocrystals," *Adv. Mater.* 16:646-649.

de Gans (2004) "Inkjet Printing of Polymers: State of the Art and Future Developments," *Adv. Mater.* 16(3):203-213.

DeBoer et al. (2004) "Organic Single-Crystal Field-Effect Transistors," *Phys. Stat. Sol.* 201:1302-1331.

Decision of Refusal corresponding to Japanese Patent Application No. P2007-515549, Dispatched Sep. 4, 2012—English translation only.

Decision of Refusal corresponding to Japanese Patent Application No. P2009- 527564, Dispatched Jan. 29, 2013—Japanese language with English translation.

Decision of Rejection corresponding to Korean Patent Application No. 10-2007-7000216, Issued Sep. 19, 2012—includes English Translation.

Deen et al. (2004) "Electrical Characterization of Polymer-Based FETs Fabricated by Spin-Coating Poly(3-alkylthiophene)s," *IEEE Trans. Electron Devices* 51:1892-1901.

Delmerche et al. (1997) "Stability of Molded Polydimethylsiloxane Microstructures," *Adv. Mat.* 9:741-746.

Deruelle et al. (1995) "Adhesion at the Solid-Elastomer Interface: Influence of Interfacial Chains," *Macromol.* 28:7419-7428.

Derycke et al. (Sep. 2001) "Carbon Nanotube Inter- and Intramolecular Logic Gates," *Nano Lett.* 1(9):453-456.

Dick et al. (Jun. 2004) "Synthesis of Branched 'Nanotrees' by Controlled Seeding of Multiples Branching Events," *Nat. Mater.* 3:380-384.

Dinsmore et al. (2002) "Colloidosomes: Selectively Permeable Capsules Composed of Colloidal Particles," *Science* 298:1006-1009.

Divliansky et al. (2003) "Fabrication of Three-Dimensional Polymer Photonic Crystal Structures Using Single Diffraction Element Interference Lithography," *Appl. Phys. Lett.* 82(11):1667-1669.

Dodabalapur et al. (1995) "Organic Transistors: Two-Dimensional Transport and Improved Electrical Characteristics," *Science* 268:270-271.

Duan et al. (2000) "General Synthesis of Compound Semiconductor Nanowires," *Adv. Mater.* 12(4):298-302.

Duan et al. (Sep. 2003) "High-performance Thin-Film Transistors Using Semiconductor Nanowires and Nanoribbons," *Nature* 425:274-278.

Duboz et al. (1998) "Transistors and Detectors Based on GaN-Related Materials," in; *Group III Nitride Semiconductor Compounds*, Gill, B. ed., Clarendon, Oxford, pp. 343-387.

Duffy et al. (1998) "Rapid Prototyping of Microfluidic Systems in Poly(dimethylsiloxane)," *Anal. Chem.* 70(23):4974-4984.

Durkop et al. (2004) "Extraordinary Mobility in Semiconducting Carbon Nanotube," *Nano Lett.* 4(1):35-39.

Edrington et al. (2001)"Polymer-Based Photonic Crystals," *Adv. Mater.* 13:421-425.

Efimenko et al. (Oct. 15, 2002) "Surface Modification of Sylgard-184 Poly(dimethyl Siloxane) Networks by Ultraviolet and Ultraviolet/Ozone Treatment," *J. Colloid Interface Sci.* 254(2):306-315.

Eftekhari, G. (1993) "Variation in the Effective Richardson Constant of Metal—GaAs and Metal—InP Contacta Due to the Effect of Processing Parameters," *Phys. Status Solid A-Appl. Res.* 140:189-194.

Examination Report, Corresponding to European Patent Application No. 07841968.6, dated Apr. 27, 2012.

Faez et al. (1999) "An Elastomeric Conductor Based on Polyaniline Prepared by Mechanical Mixing," *Polymer* 40:5497-5503.

Feigner et al. (1996) "Flexural Rigidity of Microtubules Measured with the Use of Optical Tweezers," *J. Cell Sci.* 109:509-516.

Fink et al. (1999) "Block Copolymers as Photonic Bandgap Materials," *J. Lightwave Tech.* 17:1963-1969.

Flewitt et al. (2005) "Low-Temperature Deposition of Hydrogenated Amorphous Silicon in an Electron Cyclotron Resonance Reactor for Flexible Displays," *Proc. IEEE* 93:1364-1373.

Folch et al. (1999) "Wafer-Level In-Registry Microstamping," *J. Microelectromech. Syst.* 8:85-89.

Forment et al. (2004) "Influence of Hydrogen Treatment and Annealing Processes Upon the Schottky Barrier Height of Au/n-GaAs and Ti/n-GaAs Diodes," *Semicond. Sci. Technol.* 19:1391-1396.

Forrest et al. (2004) "The Path to Ubiquitous and Low-Cost Organic Electronic Appliances on Plastic," *Nature* 428:911-918.

Fortunato et al. (2005) "Flexible a-Si: H Position-Sensitive Detectors," *Proc. IEEE* 93:1281-1286.

Freund, L.B. (2000) "The Mechanics of Electronic Materials," *Int. J. Solids Struct.* 37:185-196.

Friedman et al. (2005) "Nanotechnology: High-Speed Integrated Nanowire Circuits," *Nature* 434:1085.

Furneaux et al. (1989) "The Formation of Controlled-Porosity Membranes from Anodically Oxidized Aluminum," *Nature* 337:147-149.

Gan et al. (2002) "Preparation of Thin-Film Transistors with Chemical Bath Deposited CdSe and CdS Thin Films," *IEEE Trans. Electron. Dev.* 49:15-18.

Gao et al. (Sep. 9, 2005) "Conversion of Zinc Oxide Nanobelts into Superlattice-Structures Structures Nanohelices," *Science* 309:1700-1704.

Garnier et al. (1994) "All-Polymer Field-Effect Transistor Realized by Printing Techniques," *Science* 265:1684-1686.

Geissler et al. (2003) "Fabrication of Metal Nanowires Using Microcontact Printing," *Langmuir* 19(15):6301-6311.

Geissler et al. (Jun. 2003) "Selective Wet-Etching of Microcontact-Printed Cu Substrates with Control Over the Etch Profile," *Microelec. Eng.* 67-68:326-332.

Gelinck et al. (2000) "High-Performance All-Polymer Integrated Circuits," *Appl. Phys. Lett.* 77:1487-1489.

Gelinck et al. (2004) "Fleible Active-Matrix Displays and Shift Registers Based on Solution-Processed Organic Transistors," *Nat. Mater.* 3:106-110.

Georgakilas et al. (2002) "Wafer-Scale Integration of GaAs Optoelectronic Devices with Standard Si Integrated Circuits Using a Low-Temperature Bonding Procedure," *Appl. Phys. Lett.* 81:5099-5101.

Givargizov, E.I. (1991) "Applications," in; *Oriented Crystallization on Amorphous Substrates*, Plenum Press, New York, pp. 341-363.

Goetting et al. (1999) "Microcontact Printing of Alkanephosphonic Acids on Aluminum: Pattern Transfer by Wet Chemical Etching," *Langmuir* 15:1182-1191.

Goldman et al. (1996) "Correlation of Buffer Strain Relaxation Modes with Transport Properties of Two-Dimensional Electron Gases," *J. Apple. Phys.* 80:6849-6854.

Goldmann et al. (2004) "Hole Mobility in Organic Single Crystals Measured by a "Flip-Crystal" Field-Effect Technique," *J. Appl. Phys.* 96:2080-2086.

Gray et al. (Dec. 2001) "Screen Printed Organic Thin Film Transistors (OTFTs) on a Flexible Substrate," *Proc. SPIE* 4466:89-94.

Gray et al. (Mar. 5, 2004) "High-Conductivity Elastomeric Electronics," *Adv. Mater.* 16(5):393-397.

Gudiksen et al. (Web Release Apr. 18, 2001) "Synthetic Control of the Diameter and Length of Single Crystal Semiconductor Nanowires," *J. Phys. Chem. B* 105:4062-4064.

Guo et al. (Aug. 19, 2002) "Metal-Insulator-Semiconductor Electrostatics of Carbon Nanotubes," *Appl. Phys. Lett.* 81(8):1486-1488.

Gur et al. (2005) "Air-Stable All-Inorganic Nanocrystal Solar Cells Processed from Solution," *Science* 310:462-465.

Haisma et al. (2002) "Contact Bonding, Including Direct-Binding in a Historical and Recent Context of Materials Science and Technology, Physics and Chemistry—Historical Review in a Broader Scope and Comparative Outlook," *Mater. Sci. Eng. R* 37:1-60.

Halik et al. (2004) "Low-Voltage Organic Transistors with an Amorphous Molecular Gate Dielectric," *Nature* 431:963-966.

Hamilton et al. (2004) "Field-Effect Mobility of Organic Polymer Thin-Film Transistors," *Chem. Mater.* 16:4699-4704.

Han et al. (2005) "Template-Free Directional Growth of Single-Walled Carbon Nanotues on a- and r-Plane Sapphire," *J. Am. Chem. Soc.* 127:5294-5295.

Harada et al. (2001) "Catalytic Amplification of the Soft Lithographic Patterning of Si. Nonelectrochemical Orthogonal Fabrication of Photoluminescent Porous Si Pixel Arrays," *J. Am. Chem. Soc.* 123:8709-8717.

(56) References Cited

OTHER PUBLICATIONS

He et al. (2005) "Si Nanowire Bridges in Microtrenches: Integration of Growth into Device Fabrication," *Adv. Mater.* 17:2098-2102.

Hillbrog et al. (Web Release Dec. 30, 2003) "Nanoscale Hydrophobic Recovery: A Chemical Force Microscopy Study of UV/Ozone-Treated Cross-Linker Poly(dimethylsiloxane)," *Langmuir* 20(3):785-794.

Hines et al. (2005) "Nanotransfer Printing of Organic and Carbon Nanotube Thin-Film Transistors on Plastic Substrates," *Appl. Phys. Lett.* 86:163101.

Horn et al. (1992) "Contact Electrification and Adhesion Between Dissimilar Materials," *Science* 256:362-364.

Hoyer, P. (1996) "Semiconductor Nanotube Formation by a Two-Step Template Process," *Adv. Mater.* 8:857-859.

Hsia et al. (2005) "Collapse of Stamps for Soft Lithography Due to Interfacial Adhesion," *Appl. Phys. Lett.* 86:154106.

Hsu et al. (2002) "Amorphous Si TFTs on Plastically Deformed Spherical Domes," *J. Non-Crystalline Solids* 299-302:1355-1359.

Hsu et al. (2003) "Nature of Electrical Contacts in a Metal—Molecule—Semiconductor System," *J. Vac. Sci. Technol. B* 21(4):1928-1935.

Hsu et al. (Mar. 2004) "Effects of Mechanical train on TFTs on Spherical Domes," *IEEE Trans. Electron. Dev.* 51(3):371-377.

Hu et al. (1997) "Using Soft Lithography to Fabricate GaAs/AlGaAs Heterostructure Field Effect Transistors," *Appl. Phys. Lett.* 71:2020-2022.

Hu et al. (1999) Chemistry and Physics in One Dimension: Synthesis and Properties of Nanowires and Nanotubes, *Acc. Chem. Res.* 32:435-445.

Huang et al. (2001) "Directed Assembly of One-Dimensional Nanostructures into Functional Networks," *Science* 291:630-633.

Huang et al. (2001) "Room-Temperature Ultraviolet Nanowire Nanolasers," *Science* 292:1897-1899.

Huang et al. (2004) "Self-Organizing High-Density Single-Walled Carbon Nanotube Arrays from Surfactant Suspensions," *Nanotechnol.* 15:1450-1454.

Huang et al. (2005) "Nanowires for Integrated Multicolor Nanophotonics," *Small* 1(1):142-147.

Huang et al. (2005) "Nonlinear Analyses of Wrinkles in a Film Bonded to a Compliant Substrate," *J. Mech. Phys. Solids* 53:2101-2118.

Huang et al. (2005) "Stamp Collapse in Soft Lithography," *Langmuir* 21:8058-8068.

Huang et al. (Jan. 16, 2001) "Catalytic Growth of Zinc Oxide Nanowires by Vapor Transport," *Adv. Mater.* 13(2):113-116.

Huck et al. (Web Release Feb. 25, 2000) "Ordering of Spontaneously Formed Buckles on Planar Surfaces," *Langmuir* 16:3497-3501.

Huie, J.C. (2003) "Guided Molecular Self Assembly: A review of Recent Efforts," *Smart Mater. Struct.* 12:264-271.

Huitema et al. (2001) "Plastic Transistors in Active-Matrix Displays," *Nature* 414:599.

Hur et al. (2005) "Organic Nanodelectrics for Low Voltage Carbon Nanotube Thin Film Transistors and Complementary Logc Gates," *J. Am. Chem. Soc.* 127:13808-13809.

Hur et al. (Dec. 2004) "Nanotransfer Printing by Use of Noncovalent Surface Forces: Applications to Thin-Film Transistors that Use Single-Walled Carbon Nanotube Networks and Semiconducting Polymers," *Appl. Phys. Lett.* 85(23):5730-57-32.

Hur et al. (Jun. 13, 2005) "Extreme Bendability of Single Walled Carbon Nanotube Networks Transferred From High-Temperature Growth Substrates to Plastic and Their Use in Thin-Film Transistors," *Appl. Phys. Lett.* 243502.

Hutchinson et al. (1992) "Mixed Mode Cracking in Layered Materials," *Adv. Appl. Mech.* 29:63-191.

Imparato et al. (2005) "Excimer Laser Induced Crystallization of Amorphous Silicon on Flexible Polymer Substrates," *Thin Solid Films* 487:58-62.

International Search Report and Written Opinion, Corresponding to International Application No. PCT/US 07/77759, Mailed Apr. 11, 2008.

International Search Report and Written Opinion, Corresponding to International Application No. PCT/US2009/036192, Mailed Jul. 6, 2009.

Islam et al. (Jan. 16, 2003) "High Weight Fraction Surfactant Solubilization of Single-Wall Wall Carbon Nanotubes in Water," *Nano Lett.* 3(2):269-273.

Ismach et al. (2004) "Atomic-Step-Templated Formation or a Single Wall Carbon Nanotube Patterns," *Angew. Chem. Int. Ed.* 43:6140-6143.

Itoh et al. (1991) "Cathodoluminescence Properties of Undoped and Zn-Doped $Al_xGa_{1-x}N$ Grown by Metaloganic Vapor Phase Epitaxy," *Jap. J. Appl. Phys.* 30:1604-1608.

Jabbour et al. (2001) "Scren Printing for the Fabrication of Organic Light-Emitting Devices," *IEEE J. Select. Top. Quantum. Electron.* 7(5):769-773.

Jacobs et al. (2002) "Fabrication of a Cylindrical Display by Patterned Assembly," *Science* 296:323-325.

Jain et al. (2000) "III-Nitrides: Growth, Characterization, and Properties," *J. Appl. Phys.* 87:965-1006.

Jain et al. (Aug. 2005) "Flexible Electronics and Displays: High-Resolution, Roll-to-Roll, Projection Lithography and Photoablation Processing Technologies for High-Throughput Production," *Proc. IEEE* 93(8):1500-1510.

James et al. (1998) "Patterned Protein Layers on Solid Substrates by This Stamp Microcontact Printing," *Langmuir* 14:742-744.

Jang et al. (2006) "Low-Voltage and High-Field-Effect Mobility Organic Transistors with a Polymer Insulator," *Appl. Phys. Lett.* 88:072101.

Javey et al. (2002) "High-$_K$ Dielectrics for Advanced Carbon-Nanotube Transistors and Logic Gates," *Nature Mater.* 1:241-246.

Javey et al. (Aug. 7, 2003) "Ballistic Carbon Nanotube Field-Effect Transistors," *Nature* 424:654-657.

Jenkins et al. (1994) "Gallium Arsenide Transistors: Realization Through a Molecularly Designed Insulator," *Science* 263:1751-1753.

Jeon et al. (1995) "Patterning of Dielectric Oxide Thin Layers by Microcontact Printing of Self-Assembled Monolayers," *J. Mater. Res.* 10:2996-2999.

Jeon et al. (2004) "Fabricating Complex Three-Dimensional Nanostructures with High Resolution Conformable Phase Masks," *Proc. Natl. Acad. Sci. USA* 101:12428-12433.

Jeon et al. (2004) "Three Dimensional Nanofabrication with Rubber Stamps and Conformable Photomasks," *Adv. Mater.* 16:593-600.

Jeon et al. (Aug. 4, 2004) "Three Dimensional Nanofabrication with Rubber Stamps and Conformable Photomasks," *Adv. Mater.* 16(15):169-1375.

Jiang et al. (1999) "Preparation of Macroporous Metal Films from Colloidal Crystals," *J. Am. Chem. Soc.* 121:7957-7958.

Jiang et al. (2002) "Polymer-on-Polymer Stamping: Universal Approaches to Chemically Patterned Surfaces," *Langmuir* 18:2607-2615.

Jin et al. (2004) "Scalable Interconnection and Integration of Nanowire Devices Without Registration," *Nano Lett.* 4:915-919.

Jin et al. (Oct. 18, 2004) "Soft-Lithographic Fabrication of an Image Sensor Array on a Curved Substrate," *J. Vac. Sci. Technol. B* 22:2548-2551.

Jiyun, C.H. (2003) "Guided Molecular Self-Assembly: A Review of Recent Efforts," *Smart Mater. Struct.* 12:264-271.

Joachim et al. (Nov. 30, 2000) "Electronics Using Hybrid-Molecular and Mono-Molecular Devices," *Nature* 408:541-548.

Johnson et al. (1999) "Ordered Mesoporous Polymers of Tunable Pore Size from Colloidal Silica Templates," *Science* 283:963-965.

Jones et al. (Jul./Aug. 2004) "Stretchable Wavy Metal Interconnects," *J. Vac. Sci. Technol. A* 22(4):1723-1725.

Jortner et al. (2002) "Nanostructured Advanced Materials Perspectives and Directions," *Pure Appl. Chem.* 74(9):1491-1506.

Kagan (1999) "Organic-Inorganic Hybrid Materials as Semiconducting Channels in Thin-Film Field-Effect Transistors," *Science* 286:945-947.

Kagan et al. (2001) "Patterning Organic—Inorganic Thin-Film Transistors Using Microcontact Printed Templates," *Appl. Phys Lett.* 79(21):3536-3538.

(56) References Cited

OTHER PUBLICATIONS

Kagan et al. (2003) *Thin Film Transistors*, Dekker, New York, pp. 1-34.
Kane et al. (2000) "Analog and Digital Circuits Using Organic Thin-Film Transistors on Polyester Substrates," *IEEE Electron. Dev. Lett.* 21:534-536.
Kang et al. (2007) "High-Performance Electronics Using Dense, Perfectly Aligned Arrays of Single-Walled Carbon Nanotubes," *Nat. Nanotechnol.* 2:230-236.
Karnik et al. (2003) "Lateral Polysilicon $p^+$-p-$n^+$ and $p^+$-n-$n^+$ Diodes," *Solid-State Electronics* 47:653-659.
Karnik et al. (2003) "Multiple Lateral Polysilicon Diodes as Temperature Sensors for Chemical Microreaction Systems," *Jpn. J. Appl. Phys.* 42:1200-1205.
Katz et al. (2001) "Synthetic Chemistry for Ultrapure, Processable, and High-Mobility Organic Transistor Semiconductors," *Acc. Chem. Res.* 34:359-369.
Katz, H.E. (2004) "Recent Advances in Semiconductor Performance and Printing Processes for Organic Transistor-Based Electronics," *Chem. Mater.* 16:4748-4756.
Kawata et al. (2001) "Finer Features for Functional Microdevices," *Nature* 412:697-698.
Kendall, D.L. (1979) "Vertical Etching of Silicon at Very High Apect Ratios," *Ann. Rev. Mater. Sci.* 9:373-403.
Khan et al. (1993) "High Electron Mobility Transistor Based on a GaN—$Al_xGa_{1-x}N$ Heterojunction," *Appl. Phys. Lett.* 63:1214-1215.
Khang et al. (2006) "A Stretchable Form of Single-Crystal Silicon for High-Performance Electronics on Rubber Substraights," *Science* 311:208-212.
Kilby, J.S. (1976) "Invention of the Integrated Circuit," *IEEE Trans. Electron. Dev.* 23:648-654.
Kim et al. (2000) "Field Emission from Carbon Nanotubes for Displays," *Diamond and Related Mater.* 9(3-6):1184-1189.
Kim et al. (2002) "Nanolithography Based on Patterned Metal Transfer and its Application to Organic Electronic Devices," *Appl. Phys. Lett.* 80:4051-4053.
Kim et al. (2003) "Epitaxial self-assembly of block copolymers on lithographically defined nanopatterned substrates," *Nature* 424:411-414.
Klauk et al. (2002) "High-Mobility Polymer Gate Dielectric Pentacene Thin Film Transistors," *J. Appl. Phys.* 92:5259-5263.
Klein-Wiele et al. (2003) "Fabrication of Periodic Nanostructures by Phase-Controlled Controlled Multiple-Beam Interference," *Appl. Phys. Lett.* 83(23):4707-4709.
Knipp et al. (2003) "Pentacine Thin Film Transistors on Inorganic Dielectrics: Morphology, Structural Properties, and Electronic Transport," *J Appl. Phys.* 93:347-355.
Ko et al. (2006) "Bulk Quantities of Single-Crystal Silicon Micro-/Nanoribbons Generated from Bulk Wafers," *Nano Lett.* 6(10):2318-2324.
Ko et al. (Aug. 7, 2008) "A Hemispherical Electronic Eye Camera Based on Compressible Silicon Optoelectronics," *Nature* 454:748-753.
Kocabas et al. (2005) "Guided Growth of Large-Scale, Horizontally Aligned Arrays of Single-Walled Carbon Nanotubes and Their Use in Thin-Film Transstors," *Small* 1(11):1110-1116.
Kocabas et al. (2006) "Spatially Selective Guided Growth of High-Coverage Arrays and Random Networks of Single-Walled Carbon Nanotbes and Thir Integration into Electronic Devices," *J. Am. Chem. Soc.* 128:4540-4541.
Kodambaka et al. (2006) "Control of Si Nanowire Growth by Oxygen," *Nano Lett.* 6(6):1292-1296.
Koide et al. (2000) "Patterned Luminescence of Organic Light-Emitting Diodes by Hot Microcontact Printing (H$\mu$ CP) of Self-Assembled Monolayers," *J. Am. Chem. Soc.* 122:11266-11267.
Kon et al. (Feb. 27, 2004) "Single-Crystal Nanorings Formed by Epitaxial Self-Coiling of Polar Nanobelts," *Science* 303:1348-1351.
Kong et al. (2004) "Single-Crystal Nanorings Formed by Epitaxial Self-Coiling of Polar Nanobelts," *Science* 303:1348-1351.
Kong et al. (Jan. 28, 2000) "Nanotube Molecular Wires as Chemical Sensors," *Science* 287:622-625.
Kong et al. (Oct. 29, 1998) "Synthesis of Individual Single-Walled Carbon Nonotubes on Patterned Silicon Wafers," *Nature* 395:878-881.
Kudo et al. (Web Release Jun. 13, 2006) "A Flexible and Wearable Glucose Sensor Based on Functional Polymers with Soft-MEMS Techniques," *Biosens. Bioelectron.* 22:558-562.
Kulkarni et al. (2002) "Mesoscale Organization of Metal Nanocrystals," *Pure Appl. Chem* 74(9):1581-1591.
Kumar et al. (1993) "Features of Gold Having Micrometer to Centimeter Dimensions can be Formed Through a Combination of Stamping with an Elastomeric Stamp and an Alkanethiol "Ink" Followed by Chemical Etching," *Appl. Phys. Lett.* 63(14):20022004.
Kumar et al. (1994) "Patterning Self-Assembled Monolayers: Applications in Materials Science," *Langmuir* 10:1498-1511.
Kumar et al. (2002) "Thermally-Stable Low-Resistance Ti/Al/Mo/Au Multilayer Ohmic Contacts on n—GaN," *J. Appl. Phys.* 92:1712-1714.
Kuo et al. (1985) "Effect of Mismatch Strain on Band Gap in III-V Semiconductors," *J. Appl. Phys.* 57:5428-5432.
Kuykendall et al. (Aug. 2004) "Crystallographic Alignment of High Density Gallium Nitride Nanowire Arrays," *Nat. Mater.* 3:524-528.
Lacour et al. (2005) "Stretchable Interconnects for Elastic Electronic Surfaces," *Proc. IEEE* 93:1459-1467.
Lacour et al. (Apr. 14, 2003) "Stretchable Gold Conductors on Elastomeric Substrates," *Appl. Phys. Lett.* 82:2404-2406.
Lacour et al. (Apr. 2004) "Design and Performance of Thin Metal Film Interconnects for Skin-Like Electronic Circuits," *IEEE Electron. Dev. Lett.* 25(4):179-181.
Lacour et al. (Dec. 2004) "An Elastically Stretchable TFT Circuit," *IEEE Electron Dev. Lett.* 25(12):792-794.
Lacour et al. (Web Release Jul. 14, 2006) "Stiff Subcircuit Islands of Diamondlike Carbon for Stretchable Electronics," *J. Appl. Phys.* 100:014913.
Lacour et al. (Web Release May 16, 2006) "Mechanisms of Reversible Stretchability of Thin Metal Films on Elastomeric Substrates," *Appl. Phys. Lett.* 88:204103.
Lambacher et al. (2004) "Electrical Imaging of Neuronal Activity by Multi-Transistor-Array (MTA) Recording at 7.8 μm Resolution," *Appl. Phys. A* 79:1607-1611.
Landes et al. (2002) "Some Properties of Spherical and Rod-Shaped Semiconductor and Metal Nanocrystals," *Pure Appl. Chem.* 74(9):1675-1692.
Law et al. (2004) "Semiconductor Nanowires and Nanotubes," *Ann. Rev. Mater. Res.* 34:83-122.
Law et al. (Aug. 27, 2004) "Nanoribbon Waveguides for Subwavelength Photonics Integration," *Science* 305:1269-1273.
Leclercq et al. (1998) "III-V Micromachined Devices for Microsystems," *Microelectronics J.* 29:613-619.
Lee et al. (2000) "Thin Film Transistors for Displays on Plastic Substrates," *Solid State Electron.* 44:1431-1434.
Lee et al. (2003) "High-Performance Poly-Si TFTs on Plastic Substrates Using a Nano-Structured Separation Layer Approach," *IEEE Elec. Dev. Lett.* 24:19-21.
Lee et al. (2004)"Organic Light-Emitting Diodes Formed by Soft Contact Lamination," *Proc. Natl. Acad. Sci. USA* 101(2):429-433.
Lee et al. (2005) "A Printable Form of Single-Crystalline Gallium Nitride for Flexable Optoelectronic Systems," *Small* 1:1164-1168.
Lee et al. (2005) "Large-Area, Selective Transfer of Microstructured Silicon (μs-Si): A Printing-Based Approach to High-Performance Thin0Film Transistors Supported on Flexible Substraights," *Adv. Mater.* 17:2332-2336.
Lee et al. (2006) "Micron and Submicron Patterning of Polydimethylsiloxane Resists on Electronic Materials by Decal Transfer Lithography and Reactive Ion-Beam Etching: Application to the Fabrication of High-Mobility, Thin-Film Transistors," *Appl. Phys. Lett.* 100:084907/1-7.
Lee et al. (Feb. 2001) "Application of Carbon Nanotubes to Field Emission Displays," *Diamond and Related Mater.* 10(2):265-270.
Li et al. (2002) "High-Resolution Contact Printing with Dendrimers," *Nano Lett.* 2(4):347-349.

(56) References Cited

OTHER PUBLICATIONS

Li et al. (2003) "Ultrathin Single-Crystalline-Silicon Cantilever Resonators: Fabrication Technology and Significant Specimen Size Effect on Young's Modulus," *Appl. Phys. Lett.* 83:3081-3083.
Li et al. (2004) "Electrospinning of Nanofibers: Reinventing the Wheel," *Adv. Mater.* 16(14):1151-1170.
Li et al. (Dec. 2005) "Compliant Thin Film Patterns of Stiff Materials as Platforms for Stretchable Electronics," *J. Mater. Res.* 20(12):3274-3277.
Lieber, C. (2001) "The Incredible Shrinking Circuit," *Sci. Am.* 285(3):58-64.
Lieber, C.M. (2003) "Nanoscale Science and Technology: Building a Bog Future from Small Things," *MRS. Bull.* 28:486.
Lim et al. (2005) "Flexible Membrane Pressure Sensor," *Sens. Act. A* 119:332-335.
Lin et al. (2005) "High-Performance Carbon Nanotube Field-Effect Transistor with Tunable Polarities," *IEEE Trans. Nano* 4(5):481-489.
Linder et al. (1994) "Fabrication Technology for Wafer Through-Hole Interconnections and Three-Dimensional Stacks of Chips and Wafers," *Proc. IEEE Micro. Electro Mech. Syst.* 349-354.
Ling et al. (2004) "Thin Film Deposition, Patterning, and Printing in Organic Thin Film Transistors," *Chem. Mater.* 16:4824-4840.
Long et al. (1990) "Heterostructure FETs and Bipolar Transistors," In; *Gallium Arsenide Digital Integrated Circuit Design*, McGraw-Hill, New York, pp. 58-69.
Loo et al. (2002) "Additive, Nanoscale Patterning of Metal Films with a Stamp and a Surface Chemistry Mediated Transfer Process: Applications in Plastic Electronics," *Appl. Physics Lett.* 81:562-564.
Loo et al. (2002) "High-Resolution Transfer Printing on GaAs Surfaces Using Alkane Dithiol Monolayers," *J. Vac. Sci. Technol. B* 20(6):2853-2856.
Loo et al. (2002) "Interfacial Chemistries for Nanoscale Transfer Printing," *J. Am. Chem. Soc.* 124:7654-7655.
Loo et al. (2002) "Soft, Conformable Electrical Contacts for Organic Semiconductors: High-Resolution Plastic Circuits by Lamination," *Proc. Natl. Acad. Sci. USA* 99(16):10252-10256.
Loo et al. (2003) "Electrical Contacts to Molecular Layers by Nanotransfer Printing," *Nano Lett.* 3(7):913-917.
Luan et al. (1992) "An Experimental Study of the Source/Drain Parasitic Resistance Effects in Amorphous Silicon Thin Film Transistors," *J. Appl. Phys.* 72:766-772.
Mack et al. (2006) "Mechanically Flexible Thin-Film Transistors that Use Ultrathin Ribbons of Silicon Derived from Bulk Wafers," *Appl. Phys. Lett.* 88:213101.
Madou, M. (1997) "Etch-Stop Techniques," In; *Fundamentals of Microfabrication*, CRC Press, New York, pp. 193-199.
Maikap et al. (2004) "Mechanically Strained-Si NMOSFETs," *IEEE Electron. Dev. Lett.* 25:40-42.
Maldovan et al. (2004) "Diamond-Structured Photonic Crystals," *Nature Materials* 3:593-600.
Mandlik et al. (Aug. 2006) "Fully Elastic Interconnects on Nanopatterned Elastomeric Substrates," *IEEE Electron Dev. Lett.* 27(8):650-652.
Manna et al. (Web Release May 25, 2003) "Controlled Growth of Tetrapod-Branched Inorganic Nanocrystals," *Nat. Mater.* 2:382-385.
Markovich et al. (1999) "Architectonic Quantum Dot Solids," *Acc. Chem. Res.* 32:415-423.
Marquette et al. (2004) "Conducting Elastomer Surface Texturing: A Path to Electrode Spotting Application to the Biochip Production," *Biosens. Bioelectron.* 20:197-203.
Martensson et al. (2004) "Nanowire Arrays Defined by Nanoimprint Lithography," *Nano Lett.* 4:699-702.
Martin, C.R. (1995) "Template Synthesis of Electronically Conductive Polymer Nanostructures," *Acc. Chem. Res.* 28:61-68.
Mas-Torrent et al. (2006) "Large Photoresponsivity in High-Mobility Single-Crystal Organic Field-Effect Phototransistors," *ChemPhysChem* 7:86-88.
Matsunaga et al. (2003) "An Improved GaAs Device Model for the Simulation of Analog Integrated Circuit," *IEEE Trans. Elect. Dev.* 50:1194-1199.

McAlpine et al. (2003) "High-Performance Nanowire Electronics and Photonics on Glass and Plastic Substrates," *Nano Lett.* 3:1531-1535.
McAlpine et al. (2005) "High-Performance Nanowire Electronics and Photonics and Nanoscale Patterning on Flexible Plastic Substrates," *Proc. IEEE* 93:1357-1363.
McCaldin et al. (1971) "Diffusivity and Solubility of Si in the Al Metallization of Integrated Circuits," *Appl. Phys. Lett.* 19:524-527.
Meisel et al. (2004) "Three-Dimensional Photonic Crystals by Holographic Lithography Using the Umbrella Configuration: Symmetries and Complete Photonic Band Gaps," *Phys. Rev. B.* 70:165101:1-10.
Meitl et al. (2004) "Solution Casting and Transfer Printing Single-Walled Carbon Nanotube Films," *Nano Lett.* 4(9):1643-1947.
Meitl et al. (2006) "Transfer Printing by Kinetic Control of Adhesion to an Elastomeric Stamp," *Nat. Mater.* 5:33-38.
Melosh et al. (2003) "Ultrahigh-Density Nanowire Lattices and Circuits," *Science* 300:112-115.
Menard et al. (2004) "A Printable Form of Silicon for High Performance Thin Film Transistors on Plastic Substrates," *Appl. Phys. Lett.* 84:5398-5400.
Menard et al. (2004) "High-Performance n- and p-Type Single-Crystal Organic Transistors with Free-Space Gate Dielectrics," *Adv. Mat.* 16:2097-2101.
Menard et al. (2004) "Improved Surface Chemistries, Thin Film Deposition Techniques, and Stamp Designs for Nanotransfer Printing," *Langmuir* 20:6871-6878.
Menard et al. (2005) Bendable Single Crystal Silicon Thin Film Transistors Formed by Printing on Plastic Substrates *Appl. Phys. Lett.* 86:093507.
Miao et al. (2003) "Micromachining of Three-Dimensional GaAs Membrane Structures Using High-Energy Nitrogen Implantation," *J. Micromech. Microeng.* 13:35-39.
Michel et al. (2001) Printing Meets Lithography: Soft Approaches to High-Resolution Patterning, *IBM J. Res. Dev.* 45(5):697-719.
Milliron et al. (2004) "Colloidal Nanocrystal Heterostructures with Linear and Branched Topology," *Nature* 430:190-195.
Min, G. (Apr. 4, 2003) "Plastic Electronics and Their Packaging Technologies," *Syn. Metals.* 135:141-143.
Mirkin et al. (Jul. 2001) "Emerging Methods for Micro- and Nanofabrication," *MRS Bull.* 26(7):506-507.
Misewich et al. (May 2, 2003) "Electronically Induced Optical Emission from a Carbon Nanotube FET," *Science* 300:783-786.
Mishra et al. (2002) "AlGaN/GaN HEMTs—an Overview of Device Operation and Applications," *Proc. IEEE* 90:1022-1031.
Mitzi et al. (2004) "High-Mobility Ulltrathin Semiconducting Films Prepared by Spin Coating," *Nature* 428:299-303.
Moon et al. (2002) "Ink-Jet Printing of Binders for Ceramic Compinents," *J. Am. Ceram. Soc.* 85(4):755-762.
Moore et al. (Sep. 9, 2003) "Individually Suspended Single-Walled Carbon Nanotubes in Various Surfactants," *Nano Lett.* 3(10):1379-1382.
Morales et al. (Jan. 9, 1998) "A Laser Ablation Method for the Synthesis of Crystalline Semiconductor Nanowires," *Science* 279:208-211.
Mori et al. (1978) "A New Etching Solution System, $H_3PO_4$—$H_2O_2$—$H_2O$, for GaAs and Its Kinetics," *J. Electrochem. Soc.* 125:1510-1514.
Morkoc et al. (1995) "High-Luminosity Blue and Blue-Green Gallium Nitride Light-Emitting Diodes," *Science* 267:51-55.
Morkved et al. (1994) "Mesoscopic Self-Assembly of Gold Islands on Diblock-Copolymer Films," *Appl. Phys. Lett.* 64:422-424.
Morra et al. (1990) "On the Aging of Oxygen Plasma-Treated Polydimethylsiloxane Surfaces," *J. Colloid Interface Sci.* 137:11-24.
Namazu et al. (2000) "Evaluation of Size Effect on Mechanical Properties of Single Crystal Silicon by Nanoscale Bending Test Using AFM," *J. MEMS* 9:450-459.
Nath et al. (2002) "Nanotubes of the Disulfides of Groups 4 and 5 Metals," *Pure Appl. Chem.* 74(9):1545-1552.
Nathan et al. (2000) "Amorphous Silicon Detector and Thin Film Transistor Technology for Large-Area Imaging of X-Rays." *Microelectron J.* 31:883-891.

(56) References Cited

OTHER PUBLICATIONS

Nathan et al. (Apr./May 2002) "Amorphous Silicon Technology for Large Area Digital X-Ray and Optical Imaging," *Microelectron. Reliab.* 42(4-5):735-746.
Newman et al. (2004) "Introduction to Organic Thin Film Transistors and Design of n-Channel Organic Semiconductors," *Chem. Mater.* 16:4436-4451.
Nirmal et al. (1999) "Luminescence Photophysics in Semiconductor Nanocrystals," *Acc. Chem. Res.* 32:407-414.
Noda et al. (1996) "New Realization Method for Three-Dimensional Photonic Crystal in Optical Wavelength Region," *Jpn. J. Appl. Phys.* 35:L909-L912.
Nomura et al. (2004) "Room-Temperature Fabrication of Transparent Flexible Thin-Film Transistors Using Oxide Semiconductors," *Nature* 432:488-492.
Notice of Reasons for Rejection, Corresponding to Japanese Patent Application No. P2006-165159, Dispatched Apr. 24, 2012.
Novoselov et al. (Oct. 22, 2004) "Electric Field Effect in Atomically Thin Carbon Films," *Science* 306:666-669.
O'Connell et al. (Jul. 26, 2002) "Bang Gap Fluorescence from Individual Single-Walled Walled Caarbon Nanotubes," *Science* 297:593-596.
O'Riordan et al. (2004) "Field Configured Assembly: Programmed Manipulation and Self-Assembly at the Mesoscale," *Nano Lett.* 4:761-765.
Odom et al. (2002) "Improved Pattern Transfer in Soft Lithography Using Compasite Stamps," *Langmuir* 18:5314-5320.
Office Action Corresponding to Chinese Patent Application No. 200780041127.6, Issued Apr. 8, 2011.
Office Action Corresponding to Taiwanese Patent Application No. 095121212, Issued May 7, 2010.
Office Action Corresponding to U.S. Appl. No. 12/398,811, Mailed Nov. 26, 2012.
Office Action, Corresponding to Indian Patent Application No. 1366/DEL/2006, Dated Jun. 10, 2011.
Office Action, Corresponding to U.S. Appl. No. 11/145,542, filed Jun. 2, 2005, Mailed Apr. 5, 2007.
Office Action, Corresponding to U.S. Appl. No. 11/423,287, Mailed Feb. 13, 2008.
Office Action, Corresponding to U.S. Appl. No. 12/405,475, Mailed Jun. 8, 2011.
Office Actions Corresponding to U.S. Appl. No. 11/851,182, Mailed Apr. 1, 2010, Oct. 29, 2010 and Jun. 7, 2011.
Ohzono et al. (2004) "Ordering of Microwrinkle Patterns by Compressive Strain," *Phys. Rev. B* 69(13):132202.
Ohzono et al. (Web Release Jul. 7, 2005) "Geometry-Dependent Stripe Rearrangement Processes Induced by Strain on Preordered Microwrinkle Patterns," *Langmuir* 21(16):7230-7237.
Ong et al. (2004) "High-Performance Semiconducting Poolythiophenes for Organic Thin-Film Transistors," *J. Am. Chem. Soc.* 126:3378-3379.
Ong et al. (2005) "Design of High-Performance Regioreular Polythiophenes for Organic Thin-Film Transistors," *Proc. IEEE* 93:1412-1419.
Oringin Energy (May 2004) "Fact Sheet—Sliver Cells," www.originenergy.com.au/sliver.
Ouyang et al. (2002) "High-Performance, Flexible Polymer Light-Emitting Diodes Fabricated by a Continuous Polymer Coating Process," *Adv. Mat.* 14:915-918.
Ouyang et al. (Web Release Mar. 20, 2000) "Conversion of Some Siloxane Polymers to Silicon Oxide by UV/Ozone Photochemical Processes," *Chem. Mater.* 12(6):1591-1596.
Pan et al. (Mar. 9, 2001) "Nanobelts of Semiconducting Oxides," *Science* 291:1947-1949.
Panev et al. (2003) "Sharp Exciton Emission from Single InAs Quantum Dots in GaAs Nanowires," *Appl. Phys. Lett.* 83:2238-2240.
Pardo et al. (2000) "Application of Screen Printing in the Fabrication of Organic LighEmitting Devices," *Adv. Mater.* 12(17):1249-1252.
Park et al. (1997) "Block Copolymer Lithography: Periodic Arrays of ~$10^{11}$ Holes in 1 Square Centimeter," *Science* 276:1401-1404.
Park et al. (1998) "Fabrication of Three-Dimensional Macroporous Membranes with Assemblies of Microspheres as Templates," *Chem. Mater.* 10:1745-1747.
Pearton et al. (1999) "GaN: Processing, Defects, and Devices," *J. Appl. Phys.* 86:1-78.
Peng et al. (Mar. 2, 2000) "Shape Control of CdSe Nanocrystals," *Nature* 404:59-61.
Podzorov et al. (2005) "Hall Effect in the Accumulation Layers on the Surface of Orgaic Semiconductors," *Phys. Rev. lett.* 95:226601.
Pushpa et al. (2002) "Stars and Stripes. Nanoscale Misfit Dislocation Patterns on Surfaces," *Pure Appl. Chem.* 74(9):1663-1671.
Quake et al (2000) "From Micro- to Nanofabrication with Soft Materials," *Science* 290:1536-1540.
Raman et al. (1989) "Study of Mesa Undercuts Produced in GaAs with $H_3PO_4$-Based Etchants," *J. Electrochem. Soc.* 136:2405-2410.
Razeghi et al. (1994) "High-Power Laser Diodes Based on InGaAsP Alloys," *Nature* 369:631-633.
Reuss et al. (Jul. 2005) "Macroelectronics: Perspectives on Technology and Applications," *Proc. IEEE* 93(7):1239-1256.
Ribas et al. (1998) "Bulk Micromachining Characterization of 0.2 μm HEMT MMIC Technology for GaAs MEMS Design," *Mater. Sci. Eng. B* 51:267-273.
Ridley et al. (1999) "All-Inorganic Field Effect Transistors Fabricated by Printing," *Science* 286:746-749.
Roberts et al. (1979) "Looking at Rubber Adhesion," *Rubber Chem. Technol.* 52:23-42.
Robinson et al. (1983) "GaAs Readied for High-Speed Microcircuits," *Science* 219:275-277.
Roelkens et al. (Dec. 2005) "Integration of InP/InGaAsP Photodetectors onto Siliconon-Insulator on-Insulator Waveguide Circuits," *Optics Express* 13(25):10102-10108.
Rogers et al. (1997) "Using an Elastomeric Phase Mask for Sub-100 nm Photolithography in the Optical Near Field," *Appl. Phys. Lett.* 70:2658-2660.
Rogers et al. (1998) "Generating ~90 Nanometer Features Using Near Field Contact Mode Photolithography with an Elastomeric Phase Mask," *J. Vac. Sci. Technol.* 16(1):59-68.
Rogers et al. (1998) "Quantifying Distortions in Soft Lithography," *J. Vac. Sci. Technol.* 16:88-97.
Rogers et al. (1998) "Using Printing and Molding Techniques to Produce Distributed Feedback and Bragg Reflector Resonators for Plastic Lasers," *Appl. Phys. Lett.* 73:1766-1768.
Rogers et al. (1999) Printing Process Sutable for Reel-to-Reel Production of High-Performance Performance Organic Transistors and Circuits, *Adv. Mater.* 11(9):741-745.
Rogers et al. (2000) "Organic Smart Pixels and Complementart Inverter Circuits Formed on Plastic Substrates by Casting and Rubber Stamping," *IEEE Electron Dev. Lett.* 21(3):100-103.
Rogers et al. (2001) "Paper-Like Electronic Displays: Large-Area Rubber-Stamped Plastic Sheets of Electronics and Microencapsulated Electrophoretic Inks," *Proc. Natl. Acad. Sci. USA* 98:4835-4840.
Rogers et al. (2002) "Printed Plastic Electronics and Paperlike Displays," *J. Polym. Sci. Part A. Polym. Chem.* 40:3327-3334.
Rogers, J. (Jul. 9, 2010) "Farewell to Flatland," *Science* 329:138-139.
Rogers, J.A. (2001) "Rubber Stamping for Plastic Electronics and Fiber Optics," *MRS Bulletin* 26(7):530-534.
Rogers, J.A. (2001) "Toward Paperlike Displays," *Science* 291:1502-1503.
Rosenblatt et al. (2002) "High Performance Electrolyte Gated Carbon Nanotube Transistors," *Nano Lett.* 2(8):869-872.
Rotkin et al. (2003) "Universal Description of Channel Conductivity for Nanotube and Nanowire Transistors," *Appl. Phys. Lett.* 83:1623-1625.
Roundy et al. (2003) "Photonic Crystal Structure with Square Symetry within Each Layer and a Three-Dimensional Band Gap," *Appl. Phys Lett.* 82:3835-3837.
Samuelson et al. (2004) "Semiconductor Nanowires for Novel One-Dimensional Devices," *Physica E* 21:560-567.
Sanyal et al. (2002) "Morphology of Nanostructures Materials," *Pure Appl. Chem.* 74(9):1553-1570.
Sazonov et al. (2005) "Low-Temperature Materials and Thin-Film Transistors for Flexible Electronics," *Proc. IEEE* 93:1420-1428.

(56) References Cited

OTHER PUBLICATIONS

Schmid et al. (2003) "Preparation of Metallic Films on Elastomeric Stamps and Their Application for Contact Processing and Contact Printing," *Adv. Funct. Mater.* 13:145-153.
Schmidt et al. (Mar. 8, 2001) "Thin Solid Films Roll up into Nanotubes," *Nature* 410:168.
Schnable et al. (1969) "Aluminum Metallization; Advantages and Limitations for Integrated Circuit Applications," *IEEE* 57:1570-1580.
Schon et al. (1995) "Ambipolar Pentacene Field-Effect Transistors and Inverters," *Science* 287:1022-1023.
Schrieber et al. (1998) "The Effectiveness of Silane Adhesion Promotors in the Performance of Polyurethane Adhesives," *J. Adhesion* 68:31-44.
Search Report and Examination Report Corresponding to Singapore Patent Application No. 200901178-4, Completed Mar. 13, 2010.
Search Report Corresponding to Taiwanese Patent Application No. 095121212, Completed Oct. 8, 2010.
Search Report, Corresponding to International Application No. PCT/US05/19354, Dated Apr. 18, 2007.
Search Report, Corresponding to Republic of China (Taiwan) Patent Application No. 094118507, Completed Feb. 24, 2007.
Second Office Action Corresponding to Chinese Patent Application No. 200780041127.6, Issues May 2, 2012.
Sekitani et al. (2005) „Bending Experimant on Pentacene Field-Effect Transistors on Plastic Films, *Appl. Phys. Lett.* 86:073511.
Sen et al. (2002) "Nonequilibrium Processes for Generating Silicon Nanostructures in Single-Crystalline Silicon," *Pure Appl. Chem.* 74(9):1631-1641.
Servanti et al. (2005) "Functional Pixel Circuits for Elastic AMOLED displays," *Proc. IEEE* 93:1257-1264.
Shan et al. (2004) "From Si Source Gas Directly to Positioned, Electrically Contacted Si Nanowires: The Self-Assembling 'Grow-in-Place' Approach," *Nano Lett.* 4(11):2085-2089.
Sharp et al. (2003) "Holographic Photonic Crystals with Diamond Symmetry," *Phys. Rev. B* 68:205102/1-205102/6.
Sheraw et al. (2002) "Organic Thin-Film Transistor-Driven Polymer-Dispersed Liquid Crystal Displays on Flexible Polymeric Substrates," *Appl. Phys. Lett.* 80:1088-1090.
Shetty et al. (2005) "Formation and Characterization of Silicon Films on Flexible Polymer Substrates," *Mater. Lett.* 59:872-875.
Shtein et al. (Oct. 15, 2004) "Direct Mask-Free Patterning of Molecular Organic Semiconductors Using Organic Vapor Jet Printing," *J. Appl. Phys.* 96(8):4500-4507.
Shull et al. (1998) "Axisymmetric Adhesion Tests of Soft Materials," *Macromol. Chem. Phys.* 199:489-511.
Sim et al. (1993) "An Analytical Back-Gate Bias Effect Model for Ultrathin SOI CMOS Devices," *IEEE Trans. Elec. Dev.* 40:755-765.
Sirringhaus et al. (2003) "Inkjet Printing of Functional Materials," *MRS Bull.* 28:802-806.
Sirringhaus et al. (Dec. 15, 2000) "High-Resolution Inkjet Printing of All-Polymer Transistor Circuits," *Science* 290:2123-2126.
Sirringhaus, H. (2005) "Device Physics of Solution-Processed Organic Field-Effect Transistors," *Adv. Mater.* 17:2411-2425.
Smay et al. (2002) "Colloidal Inks for Directed Assembly of 3-D Periodic Structures," *Langmuir* 18:5429-5437.
Smith et al. (2000) "Electric-Field Assisted Assembly and Alignment of Metallic Nanowires," *Appl. Phys. Lett.* 77(9):1399-1401.
Someya et al. (2005) "Integration of Organic FETs with Organic Photodiodes for a Large Area, Flexible, and Lightweight Sheet Image Scanners," *IEEE Trans. Electron Devices* 52:2502-2511.
Someya et al. (Aug. 30, 2005) "Conformable, Flexible, Large-Area Networks of Pressure and Thermal Sensors with Organic Transistor Active Matrixes," *Proc. Natl. Acad. Sci. USA* 102(35):12321-12325.
Someya et al. (Jul. 6, 2004) "A Large-Area, Flexible Pressure Sensor Matrix with Organic Field-Effect Transistors for Artificial Skin Applications," *Proc. Natl. Acad. Sci. USA* 101(27):9966-9970.
Someya, T. (Aug. 7, 2008) "Electronic Eyeballs," *Nature* 454:703-704.

Soole et al. (Mar. 1991) "InGaAs Metal-Semiconductor-Metal Photodetectors for Long Wavelength Optical Communications," *IEEE J. Quantum Electron.* 27(3):737-752.
Stafford et al. (2004) "A Buckling-Based Metrology for Measuring the Elastic Moduli of Polymeris Thin Films," *Nature Mater.* 3:545-550.
Stella Project—Stretchable Electronics for Large-Area Applications. Available at www.stella-project.de. Accessed Feb. 8, 2012.
Strukov et al. (2005) "CMOL FPGA: A Reconfigurable Architecture for Hybrid Digital Circuits with Two-Terminal Nanodevices," *Nanotechnology* 16:888-900.
Substantive Examination Adverse Report, Corresponding to Malaysian Patent Application No. PI 20090622, Dated Sep. 28, 2012.
Substantive Examination Adverse Report, Corresponding to Malaysian Patent Application No. PI 20062672, Mailed Aug. 28, 2009.
Substantive Examination Adverse Report, Corresponding to Malaysian Patent Application No. PI 20094997, Mailed Aug. 15, 2012.
Sun et al. (2004) "Fabricating Semiconductor Nano/Microwires and Transfer Printing Ordered Arrays of them onto Plastic Substrates," *Nano Lett.* 4:1953-1959.
Sun et al. (2005) "Advances in Organic Field-Effect Transistors," *J. Mater. Chem.* 15:53-65.
Sun et al. (2005) "Bendable GaAs Metal-Semiconductor Field-Effect Transistors Formed with a Printed GaAs Wire Arrays on Plastic Substrates," *Appl. Phys. Lett.* 87:083501.
Sun et al. (2005) "Photolithographic Route to the Fabrication of Micro/Nanowires of III-V Semiconductors," *Adv. Funct. Mater.* 15:30-40.
Sun et al. (2007) "Controlled Buckling of Semiconductor Nanoribbons for Stretchable Electronics," *Nat. Nanotechnol.* 1:201-207.
Sun et al. (Nov. 2006) "Buckled and Wavy Ribbons of GaAs for High-Performance Electronics on Elastomeric Substrates," *Adv. Mater.* 18(21):2857-2862.
Sundar et al. (2004) "Elastomeric Transistor Stamps: Reversible Probing of Charge Transport in Organic Crystals," *Science* 303:1644-1646.
Suo et al. (Feb. 22, 1999) "Mechanics of Rollable and Foldable Film-on-Foil Electronics," *Appl. Phys. Lett.* 74(8):1177-1179.
Supplemental European Search Report. Corresponding to European Application No. EP 0907106695, Mailed Jun. 26, 2012.
Supplementary European Search Report Corresponding to European Patent Application No. 07 84 1968, Completed Mar. 31, 2011.
SWEET: Stretchable and Washable Electronics for Embedding Textiles. Available at http://tfcg.elis.ugent.be/projects/sweet. Accessed Feb. 8, 2012.
Sze et al. (1985) *Semiconductor Devices, Physics and Technology*, $2^{nd}$ ed., Wiley, New York, pp. 190-192.
Sze, S. (1985) "Lithography and Etching," In; *Semiconductor Devices: Physics and Technology*, New York: Wiley, pp. 428-467.
Sze, S. (1988) "Ion Implantation," in; *VLSI Technology*, Mcgraw-Hill, 327-374, 566-611.
Sze, S. (1994) "Semiconductor Sensor Technologies," In; *Semiconductor Sensors*, John Wiley and Sons: New York pp. 17-95.
Tanase et al. (2002) "Magnetic Trapping and Self-Assembly of Multicomponent Nanowires," *J. Appl. Phys.* 91:8549-8551.
Tang et al. (2005) "One-Dimensional Assemblies of Nanoparticles: Preparation, Properties, and Promise," *Adv. Mater.* 17:951-962.
Tao et al. (2003) "Langmuir-Blodgett Silver Nanowire Monolayers for Molecular Sensing Using Surface-Enhanced Raman Spectroscopy," *Nano Lett.* 3:1229-1233.
Tate et al. (2000) "Anodization and Microcontact Printing on Elotroless Silver: Solution-Based Fabrication Procudures for Low-Voltage Electronic Systems with Organic Acitve Components," *Langmuir* 16:6054-6060.
Theiss et al. (1998) "PolySilicon Thin Film Transistors Fabricated at 100° C. on a Flexible Plastic Substrate," *IEDM* 98:257-260.
Toader et al. (2004) "Photonic Band Gap Architectures for Holographic Lithography," *Phy. Rev. Lett.* 043905/1-043905/4.
Toader et al. (2004) "Photonic Band Gaps Based on Tetragonal Lattices of Slanted Pores," *Phys. Rev. Lett.* 90:233901/1-233901/4.
Tong (1999) "Stresses in Bonded Wafers," In; *Semiconductor Wafer Bonding: Science and Technology*, John Wiley; New York, pp. 187-221.

(56) References Cited

OTHER PUBLICATIONS

Trau et al. (1997) "Microscopic Patterning of Orientated Mesoscopic Silica Through Guided Growth," *Nature* 390:674-676.
Trentler et al. (1995) "Solution-Liquid-Solid Growth of Crytalline III-V Semiconductors: An Analogy to Vapor-Liquid-Solid Growth," *Science* 270:1791-1794.
Tseng et al. (Web Release Dec. 19, 2003) "Monolithic Integration of Carbon Nanotube Devices with Silicon MOS Technology" *Nano Lett.* 4(1):123-127.
Ucjikoga, S. (2002) "Low-Temperature Polycrystalline Silicon Thin-Film Transistor Technologies ofr System-on-Glass Displays," *MRS Bull.* 27:881.
Vanfleteren, J. SWEET: Stretchable and Washable Electronics for Embedding Textiles. Available at ftp://ftp.cordis.europa.eu/pub/ist/docs/mnd/ws-sfit_en.pdf. Accessed Feb. 8, 2012.
Vanhollenbeke et al. (2000) "Compliant Substrate Technology: Integration of Mismatched Materials for Opto-Electronic Applications," *Prog. Cryst. Growth Charact. Mater.* 41(1-4):1-55.
Velev et al. (1997) "Porous silica via colloidal crystallization," *Nature* 389:447-448.
Vilan et al. (2000) "Molecular Control Over Au/GaAs Diodes," *Nature* 404:166-168.
Vlasov et al. (2001) "On-Chip Natural Assembly of Silicon Photonic Bandgap Crystals," *Nature* 414:289-293.
Voss, D. (2000) "Cheap and Cheerful Circuits," *Nature* 407:442-444.
Wagner et al. (2003) "Silicon for Thin-Film Transistors," *Thin Solid Films* 430:15-19.
Wagner et al. (Web Release Jul. 28, 2004) "Electronic Skin: Architecture and Components," *Physica E-Low-Dimensional Systems and Nanostructures* 25:326-334.
Wang et al. (2003) "A Solution-Phase, Precursor Route to Polycrystalline $SnO_2$ Nanowores That Can Be Used for Gas Sensing under Ambient Conditions," *J. Am. Chem. Soc.* 125:16176-16177.
Wang et al. (2005) "Oxidation Resistant Germanium Nanowires: Bulk Synthesis, Long Chain Alkanethiol Functionalization, and Langmuir-Blodgett Assembly," *J. Am. Chem. Soc.* 127(33):11871-11875.
Weber et al. (Ja. 2004) "A Novel Low-Cost, High Efficiency Micromachined Silicon Solar Cell," *IEEE Electron Device Lett.* 25(1):37-39.
Whang et al. (2003) "Large-Scale Hierarchical Organization of Nanowire Arrays for Integrated Nanosystems," *Nano Lett.* 3(9):1255-1259.
Willner et al. (2002) "Functional Nanoparticle Architectures for Senoric, Optoelectronic, and Bioelectronic Applications," *Pure Appl. Chem.* 74(9):1773-1783.
Wind et al. (May 20, 2002) "Vertical Scaling of Carbon Nanotube-Field-Effect Transitors Using Top Gate Electrodes," *Appl. Phys. Lett.* 80(20):3871-3819.
Won et al. (2004) "Effect of Mechanical and Electrical Stresses on the Performance of an a-Si:H TFT on Plastic Substrate," *J. Electrochem. Soc.* 151:G167-G170.
Wu et al. (2001) "Amorphous Silicon Crystallization and Polysilicon Thin Film Transistors on SiO2 Passivated Steel Foil Substrates," *Apple. Surf. Sci* 175-176:753-758.
Wu et al. (2001) "Thermal Oxide of Polycrystalline Silicon on Steel Foil as a Thin-Film Transitor Gate Dielectric," *Appl. Phys. Lett.* 78:3729-2731.
Wu et al. (2002) "Growth of Au-Catalyzed Ordered GaAs Nanowire Arrays by Molecular-Beam Epitaxy," *Appl. Phys. Lett.* 81:5177-5179.
Wu et al. (2002) "Inorganic Semiconductor Nanowires: Rational Growth, Assembly, and Novel Properties," *Chem. Eur. J.* 8(6):1261-1268.
Wu et al. (2003) "Growth, Branching, and Kinking of Molecular-Beam Epitaxial (110) GaAs Nanowires," *Appl. Phys. Lett.* 83:3368-3370.
Xia (1998) "Soft Lithography" *Angew. Chem. Int. Ed.* 37:551-575.
Xia et al. (1998) "Soft Lithography," *Annu. Rev. Mater. Sci.* 28:153-184.
Xia et al. (1999) "Unconventional Methods for Fabricating and Patterning Nanostructures," *Chem. Rev.* 99:1823-1848.
Xia et al. (2003) "One-Dimensional Nanostructures: Synthesis, Characterization and Applications," *Adv. Mater.* 15:353-389.
Xiang et al. (Mar. 25, 2006) "Ge/Si Nanowire Heterostructures as High-Performance Field-Effect Transistors," *Nature* 441:489-493.
Yang et al. (1997) "Mesoporous Silica with Micrometer-Scale Desgns," *Adv. Mater.* 9:811-814.
Yang et al. (2000) "Stability of Low-Temperature Amorphous Silicon Thin Film Transistors Formed on Glass and Transparent Plastic Substrates," *J. Vac. Sci. Technol. B* 18:683-689.
Yang et al. (2002) "Creating Periodic Three-Dimensional Structures by Multibeam Interface of Visible Laser," *Chem. Mater.* 14:2831-2833.
Yang, P. (2005) "The Chemistry and Physics of Semiconductor Nanowires," *MRS Bull.* 30:85.
Yao et al. (Mar. 2000) "High-Field Effect Electrical Transport in Single-Walled Carbon Nanotubes," *Phys. Rev. Lett.* 84(13):2941-2944.
Yeh et al. (1994) "Fluidic Self-Assembly for the Integration of GaAs Light-Emitting Diodes on Si Substrates," *IEEE Photon. Technol. Lett.* 6:706-708.
Yin et al. (2005) "Colloidal Nanocrystal Synthesis and the Organic-Inorganic Interface," Nature 437:664-670.
Yin et al. (Oct. 2, 2000) "A Soft Lithography Approach to the Fabrication of Nanostructures of Single Crystalline Silicon with Well-Defined Dimensions and Shapes," *Adv. Mater.* 12(19):1426-1430.
Yoon et al. (2005) "Low-Voltage Organic Field-Effect Transistors and Inverters Enabled by Ultrathin Cross-Linked Polymers as Gate Dielectrics," *J. Am. Chem. Soc.* 127:10388-10395.
Yu et al. (2003) "Solution-Liquid-Solid Growth of Soluble GaAs Nanowires," *Adv. Mater.* 15:416-419.
Yu et al. (Web Release Jul. 20, 2003) "Two-Versus Three-Dimensional Quantum Confinement in Indium Phosphide Wires and Dots," *Nat. Mater.* 2:517-520.
Yurelki et al. (Jul. 24, 2004) "Small-Angle Neutron Scattering from Surfactant-Assisted Aqueous Dispersions of Carbon Nanotubes," *J. Am. Chem. Soc.* 126(32):9902-9903.
Zakhidov et al. (1998) "Carbon Structure with Three-Dimensional Periodicity at Optical Wavelengths," *Science* 282:897-901.
Zaumseil et al. (2003) "Nanoscale Organic Transistors that use Source/Drain Electrodes Supported by High Resolution Rubber Stamps," *Appl. Phys. Lett.* 82(5):793-795.
Zaumseil et al. (Jul. 2003) "Three-Dimensional and Multilayer Nanostructures Formed by Nanotransfer Printing," *Nano Lett.* 3(9):1223-1227.
Zhang et al. (Jun. 6, 2006) "Anomalous Coiling of SiGe/Si and SiGe/Si/Cr Helical Nanobelts," *Nano Lett.* 6(7):1311-1317.
Zheng et al. (2004) "Shape-and Solder-Directed Self-Assembly to Package Semiconductor Device Segments," *Appl. Phys. Lett.* 85:3635-3637.
Zhou et al. (2002) "An Efficient Two-Photon-Generated Photoacid Applied to Positive-Tone 3D Microfabrication," *Science* 296:1106-1109.
Zhou et al. (2004) "p-Channel, n-Channel Thin Film Transistors and p-n Diodes Based on Single Wall Carbon Nanotube Networks," *Nano Lett.* 4:2031-2035.
Zhou et al. (2005) "Band Structure, Phonon Scattering, and the Performance Limit of Single-Walled Carbon Nanotube Transistors," *Phys. Rev. Lett.* 95:146805.
Zhu et al. (2005) "Spin on Dopants for High-Performance Singel-Crystal Silicon Transistors on Flexible Plastic Substrates," *Appl. Phys. Lett.* 86:133507.
Office Action with Search Report corresponding to Taiwanese Patent Application No. 096133310, issued Nov. 11, 2013—with English Translation.
Office Action corresponding to Japanese Patent Application No. P2009-527564, dispatched Aug. 14, 2013—with English Translation.

\* cited by examiner 2 mm 32
30
~0.1 mm 32
10

32
10
250

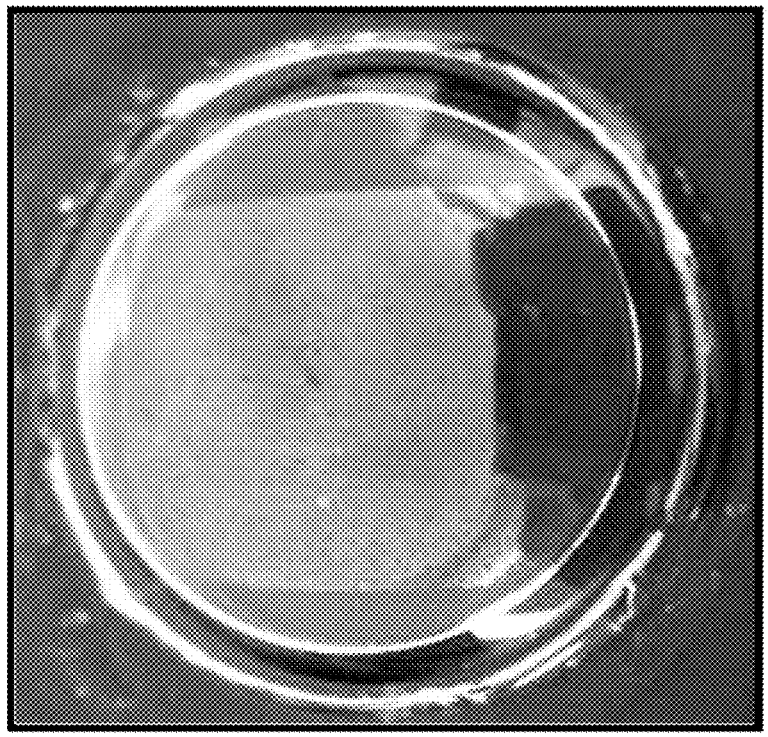
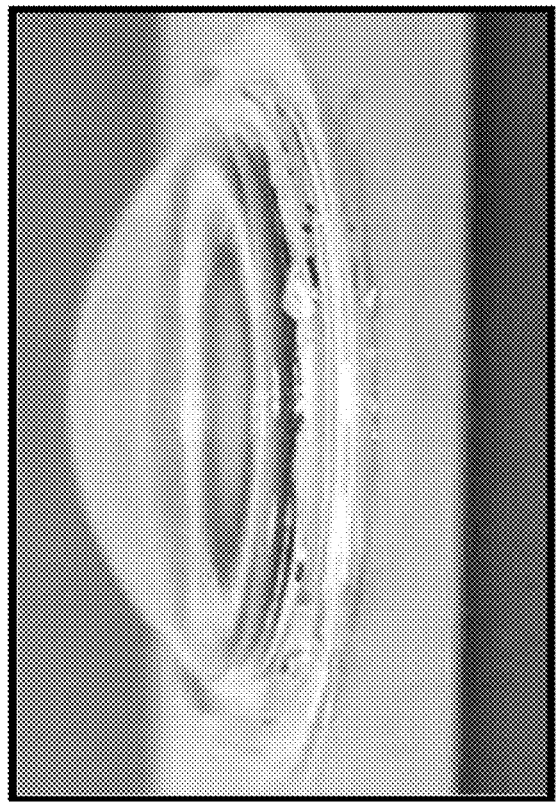
— 1 cm
FIG. 36

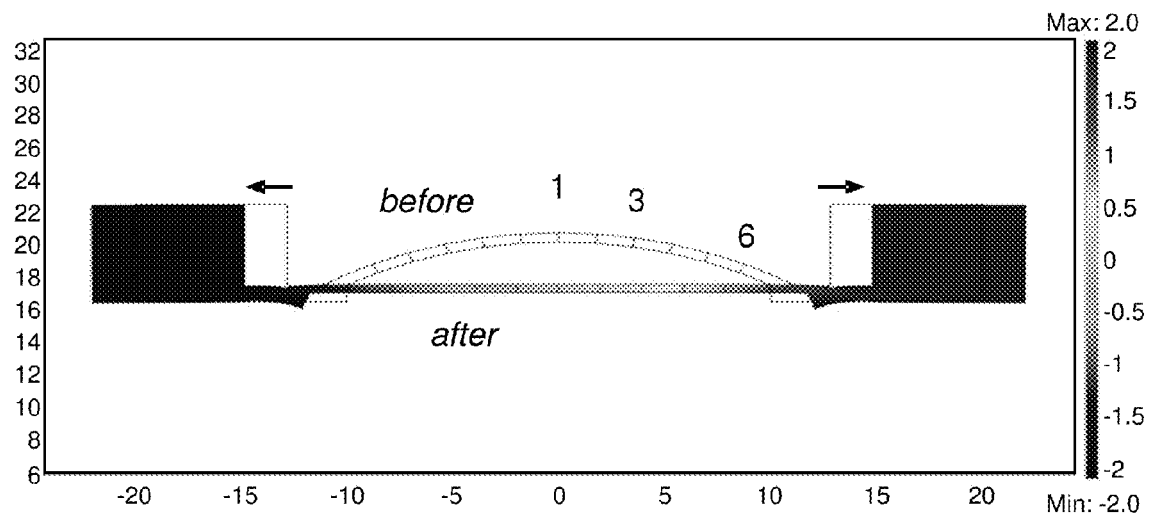
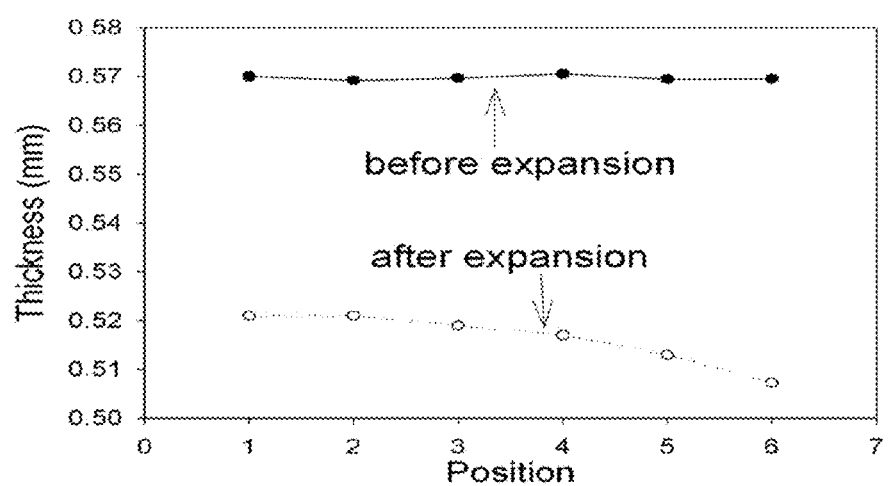
FIG. 38

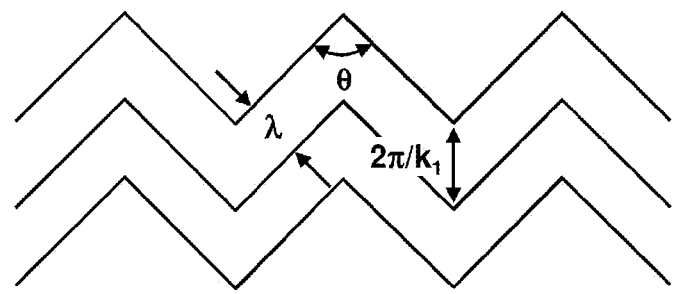
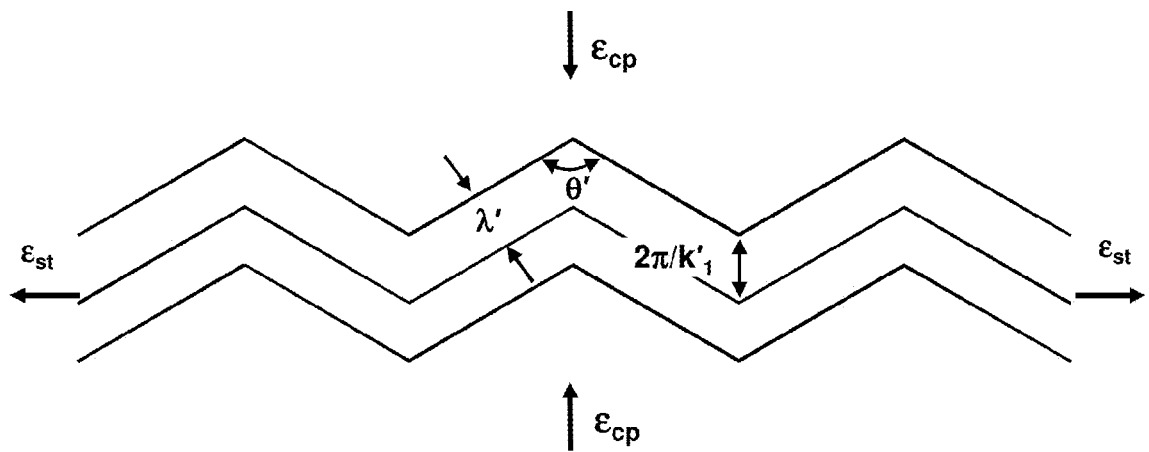
FIG. 52

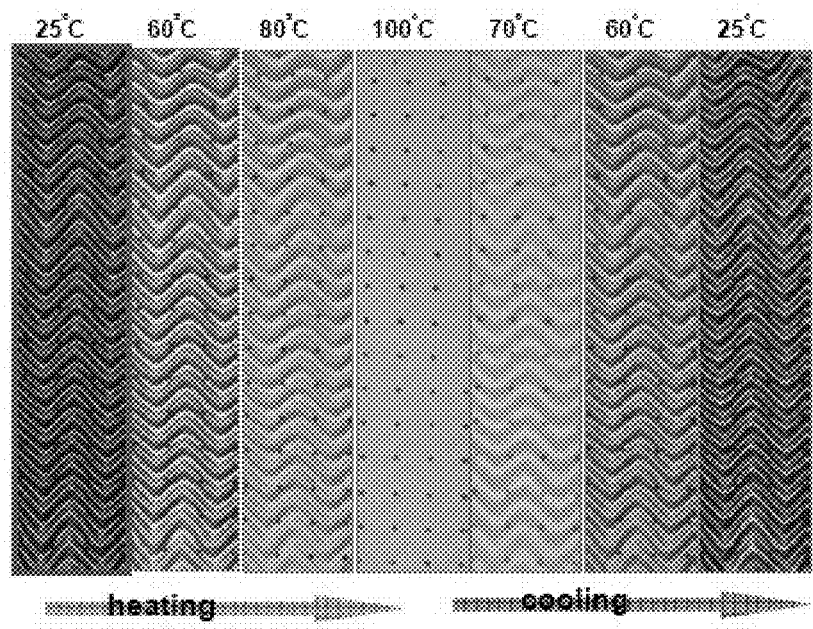
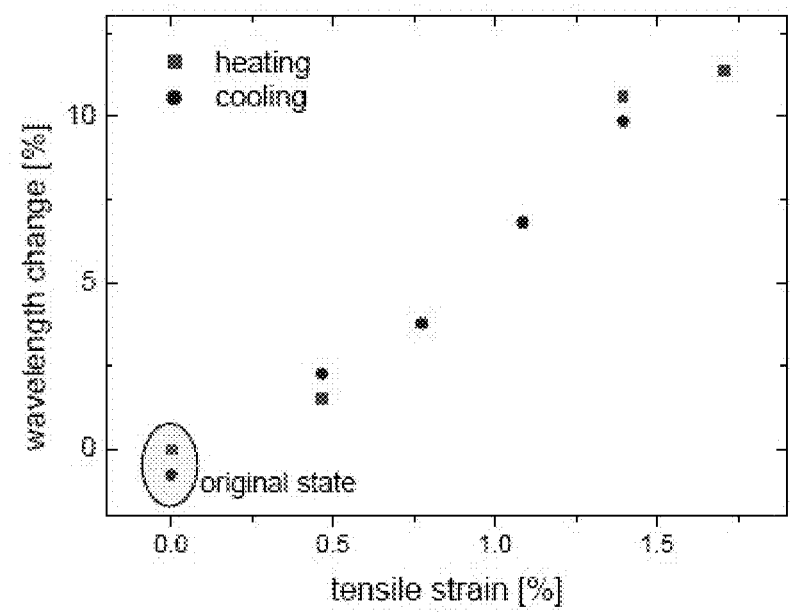
FIG. 53

1. Preparation of wavy features on a substrate (e.g. by micromachining processes) that is a master for molding wavy elastomer stamps.

2. Deposition of metal features on wavy master, e.g. by evaporation through a shadowmask, photolithography and etching, photolithography and lift-off, and/or electrodeposition 3. Cast elastomer substrate against wavy master with electrodes; cure; remove from wavy substrate master. The electrode is transferred to the elastomer upon removal.

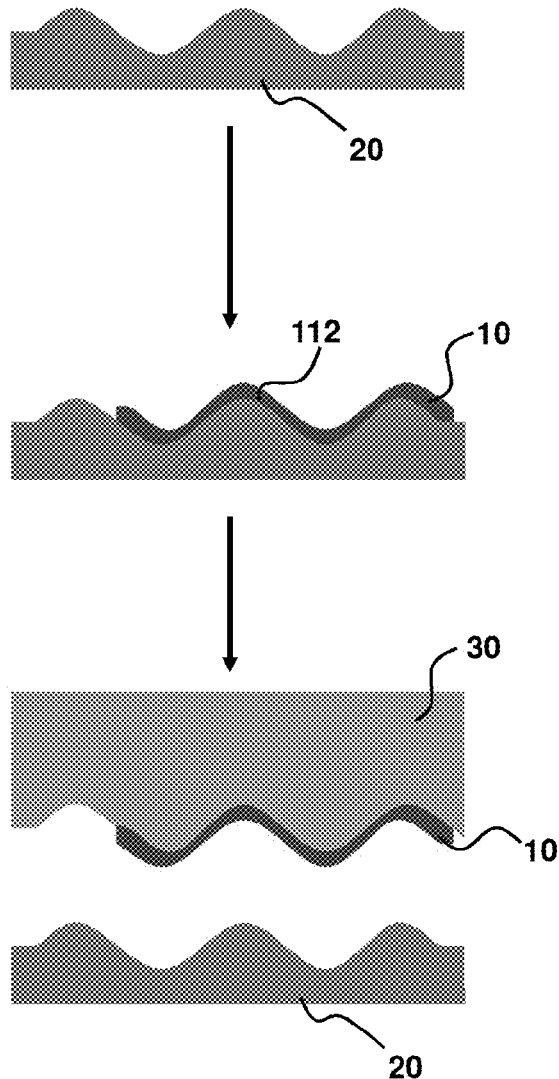

FIG. 54

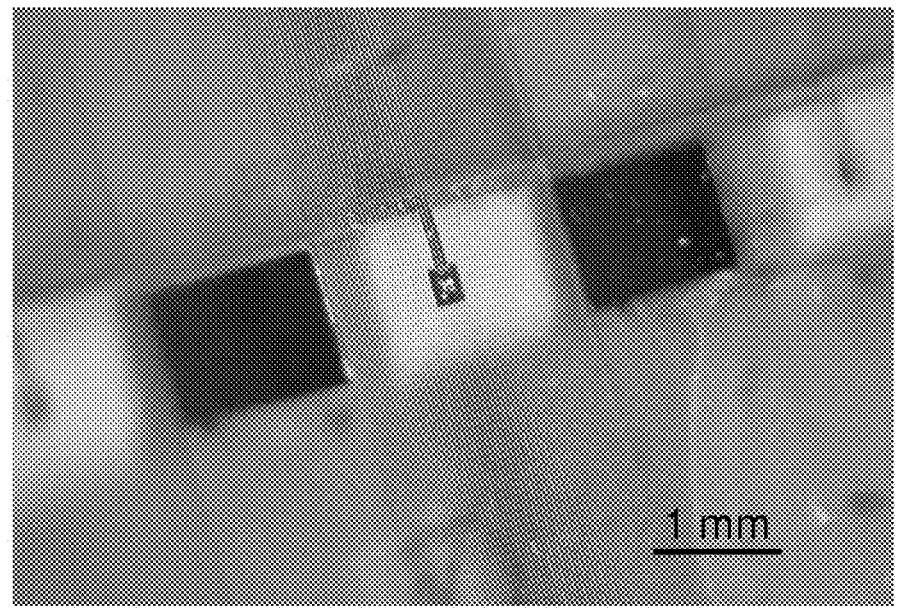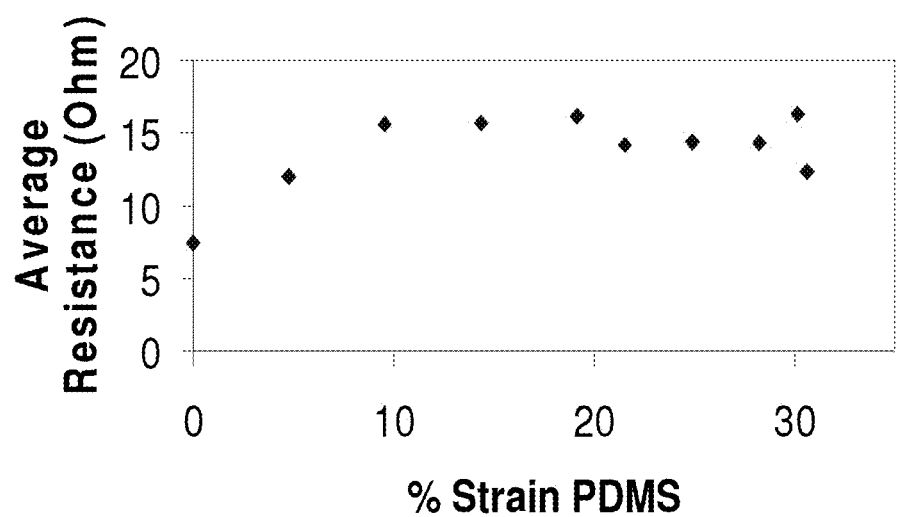
FIG. 55 elongated

CONTROLLED BUCKLING STRUCTURES IN SEMICONDUCTOR INTERCONNECTS AND NANOMEMBRANES FOR STRETCHABLE ELECTRONICS

CROSS-REFERENCE TO RELATED APPLICATIONS

This application is a continuation of U.S. patent application Ser. No. 13/441,598 filed Apr. 6, 2012, which is a continuation of U.S. patent application Ser. No. 11/851,182 filed Sep. 6, 2007 (now U.S. Pat. No. 8,217,381 issued Jul. 10, 2012), which claims the benefit of U.S. Provisional Patent Applications 60/944,626 filed Jun. 18, 2007 and 60/824,683 filed Sep. 6, 2006 and is a continuation-in-part of U.S. patent application Ser. No. 11/145,574 filed Jun. 2, 2005 (now U.S. Pat. No. 7,622,367 issued Nov. 24, 2009), and Ser. No. 11/145,542 filed Jun. 2, 2005 (now U.S. Pat. No. 7,557,367 issued Jul. 7, 2009), each of which claim benefit of U.S. Provisional Patent Application Nos. 60/577,077, 60/601,061, 60/650,305, 60/663,391 and 60/677,617 filed on Jun. 4, 2004, Aug. 11, 2004, Feb. 4, 2005, Mar. 18, 2005, and May 4, 2005, respectively, and is also a continuation-in-part of Ser. No. 11/423,287 filed Jun. 9, 2006 (now U.S. Pat. No. 7,521,292 issued Apr. 21, 2009) which claims benefit of 60/790,104 filed Apr. 7, 2006, and is a continuation-in-part of U.S. patent application Ser. No. 11/145,574 filed Jun. 2, 2005 (now U.S. Pat. No. 7,622,367 issued Nov. 24, 2009), and Ser. No. 11/145,542 filed Jun. 2, 2005 (now U.S. Pat. No. 7,557,367 issued Jul. 7, 2009), all of which are hereby incorporated by reference in their entirety to the extent not inconsistent with the disclosure herein.

STATEMENT REGARDING FEDERALLY SPONSORED RESEARCH OR DEVELOPMENT

This invention was made with government support under DEFG02-91-ER45439 awarded by U.S. Department of Energy. The government has certain rights in the invention.

BACKGROUND OF THE INVENTION

Since the first demonstration of a printed, all polymer transistor in 1994, a great deal of interest has been directed at a potential new class of electronic systems comprising flexible integrated electronic devices on plastic substrates. [Garnier, F., Hajlaoui, R., Yassar, A. and Srivastava, P., Science, Vol. 265, pgs 1684-1686] Recently, substantial research has been directed toward developing new solution processable materials for conductors, dielectrics and semiconductors elements for flexible plastic electronic devices. Progress in the field of flexible electronics, however, is not only driven by the development of new solution processable materials but also by new device component geometries, efficient device and device component processing methods and high resolution patterning techniques applicable to flexible electronic systems. It is expected that such materials, device configurations and fabrication methods will play an essential role in the rapidly emerging new class of flexible integrated electronic devices, systems and circuits.

Interest in the field of flexible electronics arises out of several important advantages provided by this technology. For example, the inherent flexibility of these substrate materials allows them to be integrated into many shapes providing for a large number of useful device configurations not possible with brittle conventional silicon based electronic devices. In addition, the combination of solution processable component materials and flexible substrates enables fabrication by continuous, high speed, printing techniques capable of generating electronic devices over large substrate areas at low cost.

The design and fabrication of flexible electronic devices exhibiting good electronic performance, however, present a number of significant challenges. First, the well developed methods of making conventional silicon based electronic devices are incompatible with most flexible materials. For example, traditional high quality inorganic semiconductor components, such as single crystalline silicon or germanium semiconductors, are typically processed by growing thin films at temperatures (>1000 degrees Celsius) that significantly exceed the melting or decomposition temperatures of most plastic substrates. In addition, most inorganic semiconductors are not intrinsically soluble in convenient solvents that would allow for solution based processing and delivery. Second, although many amorphous silicon, organic or hybrid organic-inorganic semiconductors are compatible with incorporation into flexible substrates and can be processed at relatively low temperatures, these materials do not have electronic properties capable of providing integrated electronic devices capable of good electronic performance. For example, thin film transistors having semiconductor elements made of these materials exhibit field effect mobilities approximately three orders of magnitude less than complementary single crystalline silicon based devices. As a result of these limitations, flexible electronic devices are presently limited to specific applications not requiring high performance, such as use in switching elements for active matrix flat panel displays with non-emissive pixels and in light emitting diodes.

Flexible electronic circuitry is an active area of research in a number of fields including flexible displays, electro-active surfaces of arbitrary shapes such as electronic textiles and electronic skin. These circuits often are unable to sufficiently conform to their surroundings because of an inability of the conducting components to stretch in response to conformation changes. Accordingly, those flexible circuits are prone to damage, electronic degradation and can be unreliable under rigorous and/or repeated conformation change. Flexible circuits require stretchable and bendable interconnects that remain intact while cycling through stretching and relaxation.

Conductors that are capable of both bending and elasticity are generally made by embedding metal particles in an elastomer such as silicone. Those conductive rubbers are both mechanically elastic and electrically conductive. The drawbacks of a conductive rubber include high electrical resistivity and significant resistance changes under stretching, thereby resulting in overall poor interconnect performance and reliability.

Gray et al. discuss constructing elastomeric electronics using microfabricated tortuous wires encased in a silicone elastomer capable of linear strains up to 54% while maintaining conductivity. In that study, the wires are formed as a helical spring-shape. In contrast to straight-line wires that fractured at low strains (e.g., 2.4%), tortuous wires remained conductive at significantly higher strains (e.g., 27.2%). Such a wire geometry relies on the ability of wires to elongate by bending rather than stretching. That system suffers limitations in the ability to controllably and precisely pattern in different shapes and in additional planes, thereby limiting the ability to tailor systems to different strain and bending regimes.

Studies suggest that elastically stretchable metal interconnects experience an increase in resistance with mechanical strain. (Mandlik et al. 2006). Mandlik et al. attempt to minimize this resistance change by depositing metal film on pyramidal nanopatterned surfaces. That study, however, relies on the relief feature to generate microcracks that impart stretchability to thin metal lines. The microcracks facilitate metal elastic deformation by out of plane twisting and deformation. Those metal cracks, however, are not compatible with thick metal films, and instead is compatible with a rather narrow range of thin metal films (e.g., on the order of less than 30 nm) that are deposited on top of patterned elastomer.

One manner of imparting stretchability to metal interconnects is by prestraining (e.g., 15%-25%) the substrate during conductor (e.g., metal) application, followed by spontaneous relief of the prestain, thereby inducing a waviness to the metal conductor interconnects. (see, e.g., Lacour et al. (2003); (2005); (2004), Jones et al. (2004); Huck et al. (2000); Bowden et al. (1998)). Lacour et al. (2003) report by initially compressing gold stripes to generate spontaneously wrinkled gold stripes, electrical continuity is maintained under strains of up to 22% (compared to fracture strains of gold films on elastic substrates of a few percent). That study, however, used comparatively thin layers of metal films (e.g., about 105 nm) and is relatively limited in that the system could potentially make electrical conductors that could be stretched by about 10%.

From the forgoing, it is apparent there is a need for interconnects and device components having improved stretchability, electrical properties and related processes for rapid and reliable manufacture of stretchable interconnects in a variety of different configurations. Progress in the field of flexible electronics is expected to play a critical role in a number of important emerging and established technologies. The success of these applications of flexible electronics technology depends strongly, however, on the continued development of new materials, device configurations and commercially feasible fabrication pathways for making integrated electronic circuits and devices exhibiting good electronic, mechanical and optical properties in flexed, deformed and bent conformations. Particularly, high performance, mechanically extensible materials and device configurations are needed exhibiting useful electronic and mechanical properties in stretched or contracted conformations.

SUMMARY OF THE INVENTION

The present invention provides stretchable devices and device components such as semiconductors and stretchable electronic devices, and circuits. Stretchable, bendable and conformable electronic devices and device components are required for making electronics suitable for printing on a variety of curved surfaces. Shape-conforming devices have a variety of applications ranging from flexible displays and electronic fabrics to conformable biological and physical sensors. Accordingly, an embodiment of the invention are flexible and bendable electronic devices, device components, and related methods for making flexible and bendable devices. Such flexibility and bendability is accomplished by providing an interconnect or semiconductor membrane having a wavy or buckled geometry. Such geometry provides a means for ensuring the system is stretchable and bendable without adversely impacting performance, even under vigorous and repeated stretching and/or bending cycles. Furthermore, the methods provide a capability of precise and accurate geometric construction, so that physical characteristics (e.g., stretchability, bendability) of the device and/or device component may be tailored to the operating conditions of the system. Another aspect of the invention are stretchable components having a physical property that is at least partially coupled to strain, so that the parameter is capable is capable of being tuned by application of varying amount of strain to the component.

An array of device components may be connected to one another by buckled components or interconnects, to facilitate independent movement of device components relative to one another. Local regions within the array, however, may have a different bending or stretching requirement than other regions. The devices and methods presented herein facilitate construction of a flexible system that can have localized variation in buckled component or interconnect geometry including component or interconnect dimension, periodicity, amplitude, orientation, and total number of components or interconnects in an area, for example. Generating multiple components or interconnects having controllable orientation facilitates tailoring components or interconnects to the device's operating conditions.

In an embodiment, the invention is a stretchable component of a device, where the component comprises a first end, a second end, and a central region disposed between the first and second ends. The component is supported by a substrate, with the first end and second ends of the component bonded to the substrate, and at least a portion of the central region of the component having a bent configuration. In an aspect, the central region of the component is not in physical contact with the substrate. In another aspect, the central region of the component is under strain. In an aspect, the strain in the central region is less than 10%, between 0.1% and 5%, 0.1% and 2%, or any sub-ranges thereof.

In an embodiment, the stretchable component central portion is curved or arc-shaped. In an aspect, the curve has an amplitude, such as an amplitude that is between about 100 nm and 1 mm. In an aspect, the number of distinct component or interconnect bond regions may number more than two, such as three, four, or five, for example. In this aspect, the central portion that is between the first and second component ends is actually subdivided into a number of bent configuration regions, so that a plurality of distinct curved portion regions not in physical contact with the substrate are formed. In such a configuration, the amplitude and/or periodicity may be constant or may vary over the entire longitudinal length of the component or interconnect. The component itself may be of any shape, such as a membrane, wire, or a ribbon. In an aspect where the component is a ribbon, the ribbon may have a thickness that is between about 300 nm and 1 mm.

To facilitate placement of additional device components, the device component to which a component end is electrically connected may be a contact pad. In an aspect, an additional device component is in electrical contact with the contact pad.

The stretchable component optionally comprises one or more materials that is a metal, a semiconductor, an insulator, a piezoelectric, a ferroelectric, a magnetostrictive material, an electrostrictive material, a superconductor, a ferromagnetic material, or a thermoelectric material.

In another aspect, the stretchable component comprises a component of a device selected from the group consisting of an electronic device, an optical device, an opto-electronic device, mechanical device and a thermal device.

As noted, the substrate that supports the component may be of any desired material depending on the device in which the component is incorporated. In an embodiment, the substrate comprises an elastomeric material, such as PDMS. The substrate may be reversibly deformable (e.g., PDMS) or non-reversibly deformable (e.g., a plastic). In an embodiment, the substrate itself is a layer or coating.

In an embodiment, the devices may be further described based on their physical characteristics. For example, provided herein are components and/or interconnects capable of undergoing a strain of up to 25% while maintaining electrical conductivity and electrical contact with the device component. "Maintaining" in this case refers to less than a 20%, 10% or 5% drop in electrical conductivity during strain accommodation.

In another embodiment, the invention provides a stretchable component or interconnect for establishing electrical contact with device components. The component or interconnect has a first end, a second end and a central portion disposed between the first and second ends. The ends are bonded to a substrate, such as a flexible (e.g., stretchable) substrate, an elastomeric substrate, a rigid substrate, a substrate that is not elastomeric, or a substrate to which it is desired to print electronic devices, device components, or arrays thereof. Each end of the component or interconnect may be attached to a different device component that is itself supported by the substrate. The central portion of the component or interconnect is in a bent configuration and not in physical contact (e.g., not bonded) with the substrate. In an aspect, this bent configuration is a result of the central portion being under strain. In this aspect, the bent configuration is generally curved so that if a force is applied to one or more device components (or underlying substrate) in a manner that separates the device components, the component or interconnect curved portion may at least partially straighten to accommodate relative motion between the device components, while maintaining electrical contact between the device components. The components or interconnects optionally electrically connect adjacent islands or contact pads in any one of a number of geometries such as bridge, floral and/or by multiple components or interconnects. In an aspect, a device component is in electrical contact with the contact pad.

Any of the stretchable components disclosed herein optionally further comprise a tunable device component of an electronic device. The tunable component has at least one electronic property that changes selectively with the strain of the central region provided by said bent configuration. For example, the electronic property is optionally one or more of electron mobility, resonance frequency, conductance, and resistance. In an aspect, the tunable device component comprises the semiconductor channel of a transistor.

In an embodiment, the component has a strain coefficient optical coupling, where the tunable component has at least one optical property that changes selectively with the level of strain of the central region provided by the bent configuration. Example of strain coefficient optical coupling includes, but is not limited to, the refractive index of the tunable device component or the angle of incidence of a incident beam of electromagnetic radiation relative to a surface of the central region of the stretchable component. In another embodiment, the tunable device component comprises a waveguide, an optical modulator, an optical switch, or an optical filter.

In another embodiment, the stretchable component is a tunable device component of a device having thermal conductivity that changes selectively with the level of strain in the central region provided by the bent configuration.

In another embodiment, the stretchable component is a thermal isolation component of a device, wherein the central region is not in physical contact with said substrate. In an aspect of this embodiment, the central region is not in thermal contact with the substrate, and the central region supports one or more device components, thereby providing thermal isolation of the one or more device components supported by the central region from the substrate. A useful application for this aspect is for a device that is a long wavelength imaging system.

In another embodiment, the stretchable component is an actuator of a mechanical device, wherein the central region is curved and has an amplitude that is capable of modulation by compressing or elongating said stretchable component or by applying an electric potential to said central region. A useful application in this embodiment is a mechanical device that is selected from the group consisting of a microelectromechanical device, a nanoelectromechanical device, and a microfluidic device.

In an embodiment, multi-axial stretching and bending is provided by incorporating any of the stretchable components disclosed herein into a device array having a plurality of components and more than two device components. In this embodiment, each component provides electrical contact between a pair of device components. Depending on the desired stretching, bending and/or compression operating conditions, the device array may have a geometric configuration that is in a grid, floral, bridge or any combination thereof (e.g., one region that is in a grid, another region that is bridge). In addition, further stretching and bendability control is provided by the ability to connect adjacent device components to more than one components (e.g., multiple interconnects), such as two, three, or four components. For example, a device component that is square or rectangular, may be adjacent to four other device components. If each adjacent pair is connected by two interconnects, the device component will have eight interconnects extending therefrom.

In an embodiment, a device array has sets of components that are oriented in at least two different directions. For example, in a grid configuration the components may have two orientations that are perpendicular or orthogonal to one another to provide capacity for stretching in two directions. In another embodiment, the device array may comprise components that are all aligned with respect to each other. That embodiment may be useful where stretching or bending is confined to a single direction (e.g., bending an electronic device fabric to a cylindrical surface). Additional bending and/or stretching capacity is provided by orienting the components in three or more directions, three directions or four directions, for example. In an embodiment, additional control and stability is provided by having the components of the device array placed in any number of different layers, such as two layers adjacent to one another.

In an embodiment, a device array is capable of undergoing a strain of up to about 150% without fracturing. Strain to fracture is maximized by tailoring the interconnect geometry, orientation, amplitude, periodicity, number to the operating conditions (e.g., uniaxial versus multiaxial stretching and/or bending).

The substrate to which the interconnect or device array is supported may have at least a portion that is curved, such as in a concave, convex, hemispherical shape, or combination thereof. In an embodiment, the device in which the components is incorporated is one or more of a stretchable: photodetector, display, light emitter, photovoltaic, sheet scanner, LED display, semiconductor laser, optical system, large-area electronics, transistor, or an integrated circuit.

In another aspect, the present invention relates to various methods for tuning a property of a stretchable component of a device. For example, a tuning method may comprise providing a device having a stretchable component, as disclosed herein, such as a component having a first end; a second end; and a central region disposed between the first and second ends, and that is supported by a substrate. In particular, the first end and second end of the component are bonded to the substrate, and at least a portion of the central region of the component has a bent configuration and is under a level of strain. The level of strain is modulated in the stretchable component by compressing, elongating and/or bending the stretchable component, thereby tuning the property of the stretchable component of the device.

In an aspect, the property is one or more of an optical property, an electrical property, and a mechanical property, such as an optically, mechanically, or electrically—coupled strain parameter, where the magnitude of the respective property is at least partially strain-dependent. In another aspect, the property is selected from the group consisting of resonance frequency, electron mobility, resistance, conductance, refractive index, thermal conductivity, and the angle of incidence of an incident beam of electromagnetic radiation relative to a surface of the central region of said stretchable component.

In an embodiment, provided is a method of making a stretchable component of a device. In this embodiment, an elastomeric substrate having a receiving surface is provided having a first level of strain, where the strain is optionally zero, compressive, or elongating. One or more device components are bonded to the receiving surface having the first level of strain. A force is applied to the elastomeric substrate so as generate a change in the level of strain from the first to a second different level of strain. The magnitude of this change, or how the change is accomplished does not particularly matter so long as the change in the level of strain in the substrate from the first level to the second level causes the component to bend, thereby generating the one or more stretchable components each having a first end and second end that are bonded to the substrate and a central region provided in a bent configuration.

Bonding of the device components to the substrate is by any suitable means. In an embodiment, the bonding step comprises generating a pattern of bonded and non-bonded regions of the stretchable component, wherein the bonded regions of the stretchable component are bonded to the elastomeric substrate and wherein the non-bonded regions of said stretchable component are not bonded to the elastomeric substrate.

In another aspect, non-bonded regions correspond to central regions of the stretchable components, wherein the step of applying the force to the elastomeric substrate causes the central regions to bend such that at least a portion of the central region of each stretchable component is not in physical contact with the substrate. In an aspect, the step of applying the force to the elastomeric substrate causes central regions to bend such that at least a portion of the central region of each stretchable component is not in physical contact with the substrate.

In an embodiment, any of the methods for making a stretchable component further comprises generating a pattern of bonding sites on the stretchable component, the receiving surface of the elastomeric substrate or on both the stretchable component and the receiving surface of the elastomeric substrate.

In another embodiment, any of the methods or devices have an elastomeric substrate with a plurality of compliant regions and a plurality of rigid regions. Such a substrate provides flexural rigidity of the compliant regions that is less than that of the rigid regions, and optionally have the first and second ends of each of the stretchable components bonded to at least one of the rigid regions and a central region of each of the stretchable components bonded to at least one of the compliant regions. Use of this substrate type provides the capacity of achieving controllable buckling of the component based on the pattern of compliancy of the underlying substrate.

In an embodiment, the force applied to the elastomeric substrate is achieved mechanically. In an aspect of this embodiment, the first level of strain, the second level of strain or both are generated by elongating or compressing the elastomeric substrate, curing the elastomeric substrate, or by thermal means, such as by raising or lowering the temperature of said elastomeric substrate, or by thermal expansion or thermally induced contraction of the elastomeric substrate.

In another embodiment, the step of bonding the one or more device components to said receiving surface of said elastomeric substrate is carried out before the step of applying a force to the elastomeric substrate that generates a change in the level of strain of the substrate from the first level to a second level of strain different than said first level. Alternatively, the step of bonding is carried out after the step of applying a force to the elastomeric substrate that generates a change in the level of strain of the substrate from the first level to a second level of strain different than the first level.

In an embodiment, any of the first level of strain or second level of strain is equal to 0. In an aspect, any of the device components comprises an interconnect or an electrode.

In another embodiment, the invention relates to various methods for making a buckled component or interconnect capable of establishing electrical contact with device components. In an aspect, a pattern of bond sites is applied to an elastomeric substrate surface, the components or interconnects, or to both. A force is exerted to strain the substrate and the components or interconnects contacted with the substrate. The pattern of bond sites provides bonding between specific components or interconnect locations and the substrate. Upon relaxation of the substrate (by removal of the force), buckled components or interconnects are generated. Varying one or more of the magnitude of prestrain, bond site patterning, geometry and spacing generates components or interconnects with different buckled or wavy geometry. For example, staggering the location of bond sites so that adjacent components or interconnects are bonded to the substrate at different locations, provides an "out-of-phase" interconnect geometry. Bond site patterning is by any means known in the art, such as by application of a curable photopolymer to the elastomeric substrate surface. Components or interconnects are optionally protected by encapsulating at least a portion of the component or interconnect in an encapsulating material, such as an elastomeric material. The buckled components or interconnects may have any pattern suited for the application. In an embodiment, the pattern is a grid configuration, floral configuration, bridge configuration, or any combination thereof.

The methods and devices may have components of any dimensions, such as a thickness ranging from tens of nanometers to about a millimeter, or a thickness greater than about 300 nm. In an aspect, the buckled component has an amplitude corresponding to a maximum vertical displacement of the interconnect from the substrate, and the amplitude is selected from a range that is between 100 nm and 1 mm. For a component ribbon having a length and a width, the width, the amplitude, or the width and amplitude optionally varies along the length of the interconnect. One factor that affects amplitude, is the strain applied to the elastomeric substrate prior to component bonding or after the component bonding. In general, the higher the strain, the larger the amplitude. In an embodiment, the applied force generates a strain in the elastomeric substrate, wherein the strain selected from a range that is between 20% and 100%.

In an embodiment, the component is an interconnect electrically connected to a device component. Any of the systems and processes presented herein optionally provide for a substrate that is capable of stretching up to about 100%, compressing up to about 50%, or bending with a radius of curvature as low as 5 mm, without component fracture. The component is made from any suitable material, such as a metal, a semiconductor, including GaAs or Si, an insulator, a piezoelectric, a ferroelectric, a magnetostrictive material, an electrostrictive material, a superconductor, a ferromagnetic material, and a thermoelectric material. In an embodiment, the methods provide for transfer printing of the buckled components from an elastomeric substrate, such as a stamp, to a device substrate such as, for example, a curved device substrate.

Instead of generating pop-up or buckled components via force or strain application to an elastomeric substrate, a stretchable and bendable interconnect may be made by application of a component material to a receiving surface, such as a receiving surface having relief features, such as a wavy surface.

In an embodiment, to make a stretchable and bendable component a substrate with wavy features on a surface is smoothed, such as spin-coating a polymer to partially fill the recess features. The partial filling generates a smoothly-wavy substrate. Components, including but not limited to metal features, are then deposited and patterned as desired onto the smoothly-wavy substrate. The components on the receiving surface substrate are available for subsequent casting of a polymeric stamp against the substrate at least partially coated with the component. The component is transferred to the polymeric substrate by removing the polymeric stamp from the substrate to make a stretchable and bendable component. In an embodiment, the interface between the component and substrate is Au/Su-8 epoxy photoresist. The component may be a layered metal, for example, Au/Al. The substrate may be similarly layered, for example a glass layer supporting the Su-8 layer, with the actual interface between the metal and the substrate being Au/Su-8.

An alternative method of making a pop-up component, such as a pop-up interconnect, on a stamp surface relies on flattening a curved substrate surface, contacting components to the flattened surface, and allowing the substrate surface to relax back to its curved geometry. In an embodiment, the method further provides spatial patterning of bond sites prior to contact, as disclosed herein. In this embodiment, the method is particularly suited for transferring interconnects and device components to a second corresponding curved substrate surface. In an aspect, bonding means, such as adhesive or adhesive precursor generates bonding between the second curved substrate and interconnect system on the first curved substrate, sufficient to permit transfer of interconnect system to the second substrate, even after the elastomeric stamp is removed.

Any of the methods and devices of the present invention, in an aspect, has a stamp or elastomeric substrate that is PDMS having a linear and elastic response for strains that are up to about 40%. The interconnects of the present invention are optionally part of a stretchable electrode, stretchable passive matrix LED display, or a photodetector array. In an embodiment, the invention is a stretchable electronic device with any one or more interconnects made by the methods of the present invention, where the electronic device is a stretchable or bendable: electrode, passive matrix LED, solar cell, optical collector arrays, biosensor, chemical sensor, photodiode array, or semiconductor array. In an aspect, the device component that is electrically connected to the buckled interconnect is a thin film, sensor, circuit element, control element, microprocessor, transducers, or combinations thereof. In an aspect, interconnects are accessed by electrically connecting one end of the interconnect to a device component.

In an embodiment, the invention relates to methods and structures having a wavy nanomembrane, such as a wavy semiconductor nanomembrane. Such a wavy nanomembrane facilitates incorporation of flexibility in a device component itself (in contrast to flexibility of the interconnects that connect device components). In an aspect, the invention is a method of making a biaxially stretchable semiconductor membrane transferring a semiconductor nanomembrane material from a first substrate to a second deformed substrate, wherein after transfer the deformed substrate is permitted to relax back to its resting configuration. In an aspect, the thickness of the semiconductor material is between about 40 nm and 600 nm. Release of a two-dimensional deforming force generates a nanomembrane having a two-dimensional wavy structure. In an aspect, the deforming force is generated by changing the temperature of the flexible substrate.

In an embodiment, a method is provided for making a stretchable and bendable device comprising providing a substrate having a receiving surface with relief features; smoothing the relief features by spin-coating a polymer to at least partially conformally coat the receiving surface; casting a polymeric stamp against the spin-coated substrate; removing the polymeric stamp from the substrate to expose a polymeric stamp having relief features; and depositing a device component onto the polymeric stamp surface having relief features; thereby making a stretchable and bendable component for use in a stretchable and bendable device. In an aspect, the relief features are wavy.

In an embodiment, the component comprises a metal, and the metal is deposited by electrodeposition or by: providing a shadowmask; contacting the shadowmask with the wavy surface; and evaporating metal through the shadowmask to generate a corresponding pattern of metal on the wavy surface. The substrate having wavy features is optionally made by anisotropic etching of Si (1 0 0) or by embossing Su-8. The wavy surface optionally has a wavelength having a range selected from between 50 nm-1 mm; an amplitude having a range selected from between 100 nm-1 mm; and is capable of stretching up to 100% without fracture. Optionally the component is transferred to a device substrate. In an aspect, the device component comprises an interconnect, and the method further comprises providing an additional device component and establishing an electrical contact between one end of the interconnect and the additional device component.

In another aspect, the present invention provides methods of making a device via materials level heterogeneous integration and/or device level heterogeneous integration techniques. A method of the present invention for making a device comprises the steps of: (i) providing a substrate pre-patterned with one or more device components supported by a receiving surface of the substrate; and (ii) assembling a plurality of printable semiconductor elements on the substrate by contact printing the printable semiconductor elements onto the receiving surface of the substrate or one or more structures provided thereon, wherein at least a portion of the printable semiconductor elements are positioned such that they are spatially aligned, in electrical contact or both with one or more of the device components supported by the substrate. In an embodiment, the printable semiconductor elements each comprise a unitary inorganic semiconductor structure having a length selected from the range of about 100 nanometers to about 1000 microns, a width selected from the range of about 100 nanometers to about 1000 microns, and a thickness selected from the range of about 10 nanometers to about 1000 microns.

In another aspect, the present invention provides methods of making multilevel device structures via materials level heterogeneous integration and/or device level heterogeneous integration techniques. A method of the present invention for making a device comprises the steps of: (i) providing a substrate pre-patterned with one or more device components supported by a receiving surface of the substrate; (ii) assembling a first set of printable semiconductor elements on the substrate by contact printing the printable semiconductor elements onto the receiving surface of the substrate or one or more structures provided thereon, thereby generating a first device layer; (iii) providing an interlayer on the first set of printable semiconductor elements, the interlayer having a receiving surface; and (iv) assembling a second set of printable semiconductor elements on the interlayer by contact printing the printable semiconductor elements onto the receiving surface of the interlayer or one or more structures provided thereon, thereby generating a second device layer. In an embodiment, at least a portion of the printable semiconductor elements in the first device layer are spatially aligned, in electrical contact or both with at least a portion of the printable semiconductor elements in the second device layer. A specific method of this aspect of the present invention further comprises the step of establishing electrical contact between at least a portion of the printable semiconductor elements in the first device layer and at least a portion of the printable semiconductor elements in the second device layer.

Useful contact printing methods for assembling, organizing and/or integrating printable semiconductor elements in the present methods include dry transfer contact printing, microcontact or nanocontact printing, microtransfer or nanotransfer printing and self assembly assisted printing. Use of contact printing is beneficial in the present invention because it allows assembly and integration of a plurality of printable semiconductor in selected orientations and positions relative to each other. Contact printing in the present invention also enables effective transfer, assembly and integration of diverse classes of materials and structures, including semiconductors (e.g., inorganic semiconductors, single crystalline semiconductors, organic semiconductors, carbon nanomaterials etc.), dielectrics, and conductors. Contact printing methods of the present invention optionally provide high precision registered transfer and assembly of printable semiconductor elements in preselected positions and spatial orientations relative to one or more device components prepatterned on a device substrate. Contact printing is also compatible with a wide range of substrate types, including conventional rigid or semi-rigid substrates such as glasses, ceramics and metals, and substrates having physical and mechanical properties attractive for specific applications, such as flexible substrates, bendable substrates, shapeable substrates, conformable substrates and/or stretchable substrates. Contact printing assembly of printable semiconductor structures is compatible, for example, with low temperature processing (e.g., less than or equal to 298K). This attribute allows the present optical systems to be implemented using a range of substrate materials including those that decompose or degrade at high temperatures, such as polymer and plastic substrates. Contact printing transfer, assembly and integration of device elements is also beneficial because it can be implemented via low cost and high-throughput printing techniques and systems, such as roll-to-roll printing and flexographic printing methods and systems.

In specific embodiments of the present methods of making devices at least a portion of the printable semiconductor elements comprise heterogeneous semiconductor elements. A range of heterogeneous semiconductor elements are useful in the present invention. In an embodiment, or example, the heterogeneous semiconductor elements comprise an inorganic semiconductor structure in combination with one or more structures comprising a material selected from the group consisting of: an inorganic semiconductor having a different composition than the inorganic semiconductor structure, an inorganic semiconductor having a different doping than the inorganic semiconductor structure, a carbon nanomaterial or film thereof, an organic semiconductor, a dielectric material, and a conductor. In an embodiment, for example, the heterogeneous semiconductor elements comprise a combination of two different semiconductor materials selected from the group consisting of single crystal silicon, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, SiGe and GaInAsP. In an embodiment, for example, the heterogeneous semiconductor elements comprise the inorganic semiconductor structure in combination with a dielectric material, a conductor or both a dielectric material and a conductor.

Useful heterogeneous semiconductor elements also include printable device components and printable devices. In an embodiment, for example, the printable semiconductor elements comprise on or more printable components of a device selected from the group consisting of an electronic device, an array of electronic device, an optical device, an electro-optical device, a microfluidic device, a microelectromechanical system, a nanoelectromechanical system, a sensor, an integrated circuit, a microprocessor, and a memory device.

In specific methods, at least of portion of the heterogeneous semiconductor elements comprise one or more printable semiconductor devices selected from the group consisting of a diode, a transistor, a photovoltaic cell, a light emitting diode, a laser, a P-N junction, a thin film transistor, a high electron mobility transistor, a photodiode, a metal-oxide-semiconductor field-effect transistor, a metal-semiconductor field effect transistor, a photodetector, a logic gate device, and a vertical-cavity surface-emitting laser. In an embodiment, for example, at least of portion of the printable semiconductor devices are assembled on the substrate via contact printing such that the printable semiconductor devices are provided in electrical contact with electrodes pre-patterned on the substrate.

Methods of the present invention may further comprise multiple, and optionally iterative, steps of assembling printable semiconductor elements on a substrate or structure(s) provided thereon, such as device component structures, interlayer structure and/or planarizing or encapsulating layers. In an embodiment, for example, a method of the present invention further comprises the step of assembling additional printable semiconductor elements on the substrate by contact printing the additional printable semiconductor elements onto the semiconductor elements provided on the receiving surface of the substrate or onto one or more intermediate structures provided between the semiconductor elements provided on the receiving surface of the substrate and the additional printable semiconductor elements, thereby generating a multi layer device structure.

A multilayer device structure fabricated by the present methods may comprise a plurality of device layers separated by one or more interlayers; wherein the device layers comprise printable semiconductor elements. In some embodiments, for example, the device layers have thicknesses less than or equal to 1 micron and wherein the interlayers have thicknesses less than or equal to 1.5 microns. In some embodiments, methods of this aspect further comprise the step of establishing electrical contact between printable semiconductors provided in different device layers.

A specific method of this aspect further comprises the steps of: (i) providing an interlayer on top of the printable semiconductor elements printed onto the receiving surface of the substrate or the one or more structures provided thereon; and (ii) assembling the additional printable semiconductor elements by contact printing the printable semiconductor elements onto a receiving surface of the interlayer. In an embodiment, for example, at least a portion of the additional printable semiconductor elements provided on the receiving surface of the interlayer are positioned such that they are spatially aligned, in electrical contact or both with the printable semiconductor elements provided on the receiving surface of the substrate. Methods of this aspect may optionally further comprise the steps of: (i) patterning one or more openings in the interlayer, thereby exposing regions of one or more of the printable semiconductor elements provided on the receiving surface of the substrate or the one or more structures provided thereon; and (ii) establishing electrical contact through the openings in the interlayer between printable semiconductor elements provided on the receiving surface of the substrate or the one or more structures provided thereon and the semiconductor elements provided on the receiving surface of the interlayer.

Methods of the present invention may include an number of optional processing steps. A method of the present invention further comprises the step of providing an adhesive layer on the receiving surface, wherein the printable semiconductor elements are printed onto the adhesive layer. A method of the present invention further comprises the step of providing an encapsulating layer or planarizing layer on the printable semiconductor elements printed onto the receiving surface of the substrate or the one or more structures provided thereon. A method of the present invention further comprises the step of patterning the receiving surface of the substrate or one or more printable semiconductor elements printed onto the receiving surface of the substrate or the one or more structures provided thereon with one or more thin films of conducting material via a deposition method. Methods of the present invention are applicable to a range of substrates including, but not limited to, flexible substrates; polymer substrates, plastic substrates, stretchable substrates; rigid substrates; semiconductor wafers and a contoured substrate.

The invention also includes devices and systems made using the present methods. Devices and systems of the present invention include, but are not limited to, electronic devices, optical devices, electro-optical devices, microfluidic devices, microelectromechanical systems, nanoelectromechanical systems, sensors, integrated circuits, microprocessors, and memory devices.

In another embodiment, the invention is a two-dimensional stretchable and bendable device. In this aspect, the device comprises a substrate having a contact surface, where a component is bonded to at least a portion of the substrate contact surface, wherein the component has at least one relief feature region and at least one substantially flat region; wherein the relief feature region has a portion that is separated from the substrate, and the substantially flat region is at least partially bonded to the substrate. In an aspect, the at least one relief feature region has a two-dimensional pattern of relief features on the substrate, such as a wavy pattern having a plurality of contact regions in contact with the substrate contact surface.

To facilitate bonding of the component to the substrate, any one or both of the component or substrate receiving surface may have activated regions, such as a pattern of activated regions. "Active regions" is used broadly to refer to means for bonding and/or means for providing buckling, such as by on or more of a pattern of adhesive sites on said substrate contact surface or said component; a selected pattern of substrate or component physical parameters, said parameter selected from one or more of: substrate or component thickness, modulus, temperature, composition, each having a spatial variation; chemical modification of the substrate surface; and regions adjacent to free edges of the component on the substrate contact surface. The common theme for each of these parameters is that they either facilitate bonding between the component and substrate or provide a mechanism for generating spatially-controlled buckling of the component. For example, positioning the substantially flat region or a portion of the relief feature region to an active substrate region, the component may be controllably buckled to provide for stretchable components.

Any of the devices and methods disclosed herein optionally have a component selected from the group consisting of one or more of: a metal, a semiconductor, an insulator, a piezoelectric, a ferroelectric, a magnetostrictive material, an electrostrictive material, a superconductor, a ferromagnetic material, and a thermoelectric material. Any of the devices and methods disclosed herein is optionally for a device selected from the group consisting of an electronic device, an optical device, an opto-electronic device, mechanical device, and a thermal device.

In an aspect, any of the two dimensional stretchable and bendable devices have a substantially flat region comprising an island for receiving a device component, such as an interconnect relief feature that electrically connects at least two islands.

In an embodiment, any of the substrate contact or receiving surface is: flat, substantially flat, has a relief feature, has a curved portion, has a wavy portion, or is elastomeric, such as a PDMS substrate or substrate layer.

BRIEF DESCRIPTION OF THE DRAWINGS

FIG. 28 Stretching and compressing of buckled GaAs ribbons embedded in PDMS. A Images of a single buckled ribbon stretched to different levels of tensile strain (positive %). Fracture occurs near 50%. B Images of a single buckled ribbon compressed to different levels of compressive strain (negative %). Small, short period wavy geometries appear at the peaks of the buckles for compressive strains larger than ~−15%. C Images of a single buckled ribbon compressed to different levels of compressive strain. The buckles in these cases were formed with prestrain of 60% with $W_{act}$=10 µm and $W_{in}$=400 µm (A, B) and with $W_{act}$=10 µm and $W_{in}$=300 µm (C). The red lines and arrows in each panel indicate the same positions on the same ribbons to highlight the mechanical deformations. The insets provide magnified images of the sections marked with the white boxes, clearly showing the formation of cracks at high compressive strains. The numbers corresponding to stretching or compressing degree were computed according to:

$$\left| \frac{L_{projected}^{max} - L_{projected}^{0}}{L_{projected}^{0}} \right| * 100\%$$

Figure 29:
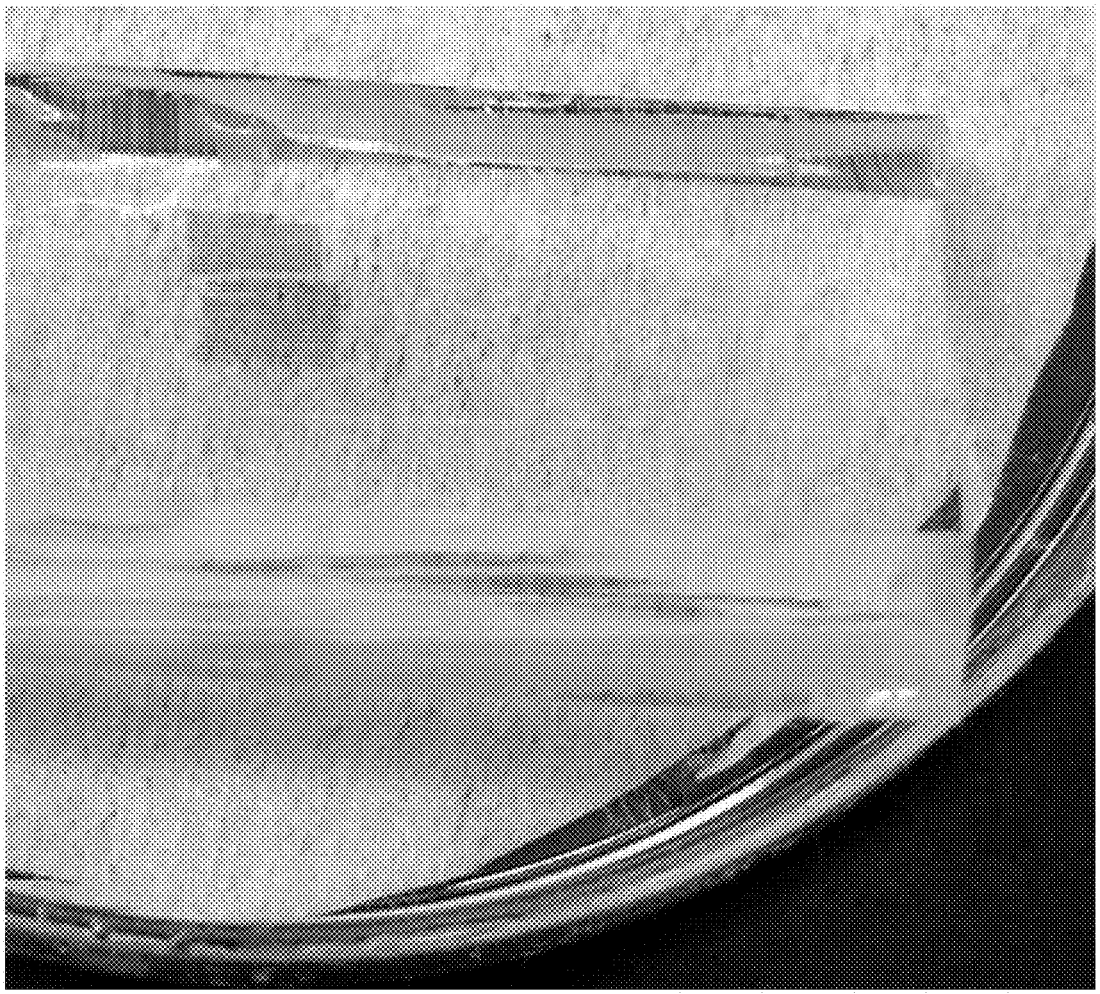

FIG. 29 Photograph of a sample with two layer of buckled GaAs ribbons arrays. The structure is fabricated in a layer by layer scheme. The first layer of GaAs ribbons (buckled geometry defined with a prestrain of 60% and with $W_{act}$=10 µm and $W_{in}$=400 µm) is embedded in PDMS. The second layer of buckled ribbons is formed on the surface of this substrate using a prestrain of 50% and with $W_{act}$=10 µm and $W_{in}$=300 µm.

Figure 30:
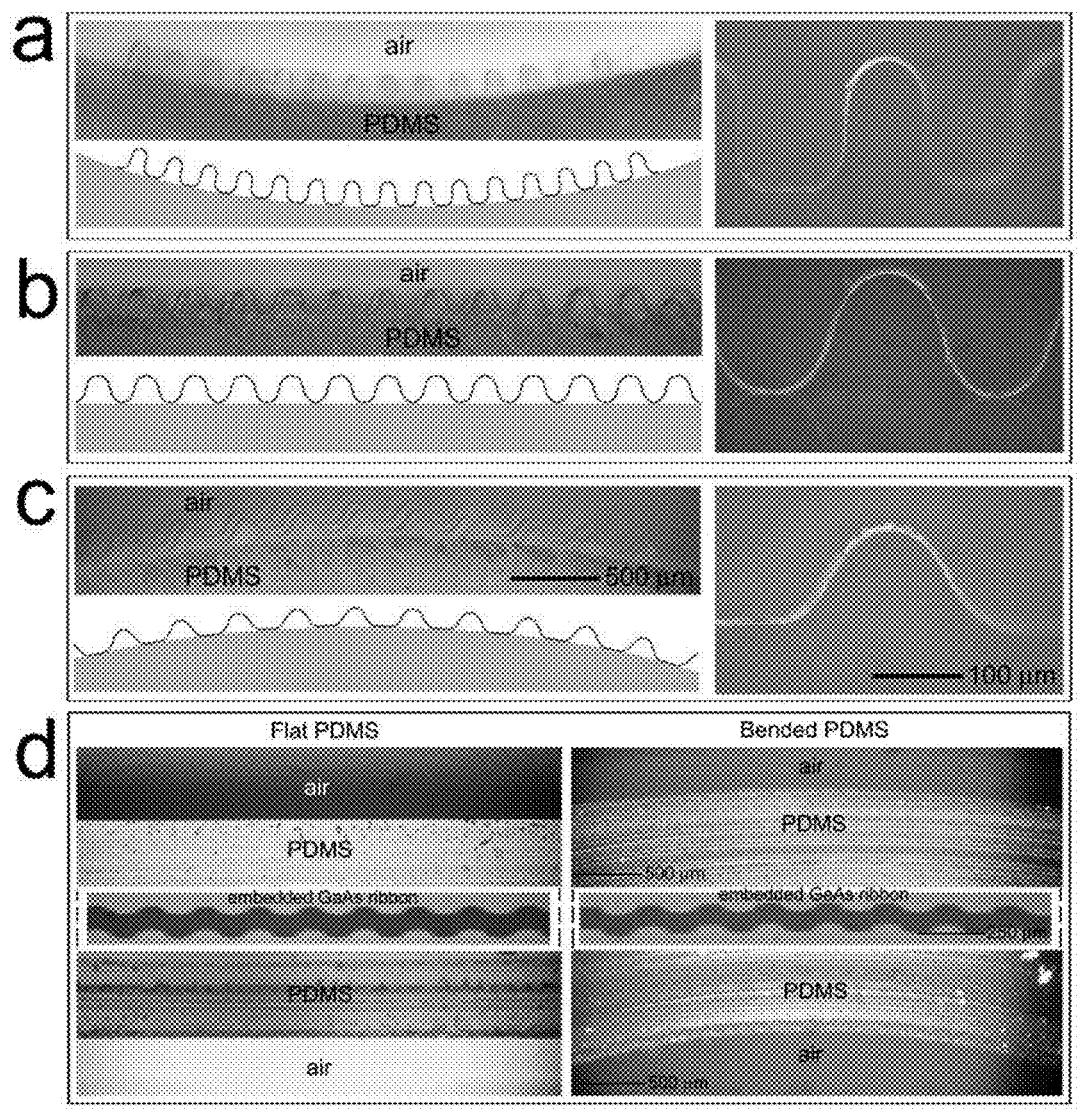

FIG. 30 Bending of buckled ribbons on surfaces and in matrixes of PDMS. A-D, Optical microscopic images with low magnification (top left frames) and high magnification (right frames) and schematic illustrations (bottom left frames) of buckled GaAs ribbons on PDMS with (A) concave, (B) flat, and (C) convex surfaces. The scale bars in c apply to a and b. (D) Images of buckled ribbons embedded in PDMS (left) before and (right) after bending. The top and bottom frames show the curvatures of the top and bottom surfaces, respectively. The scale bars in the right images apply also to the left images. The buckled ribbons are formed with a pre-strain of 60% and with $W_{act}$=10 µm and $W_{in}$=400 µm.

Figure 31:
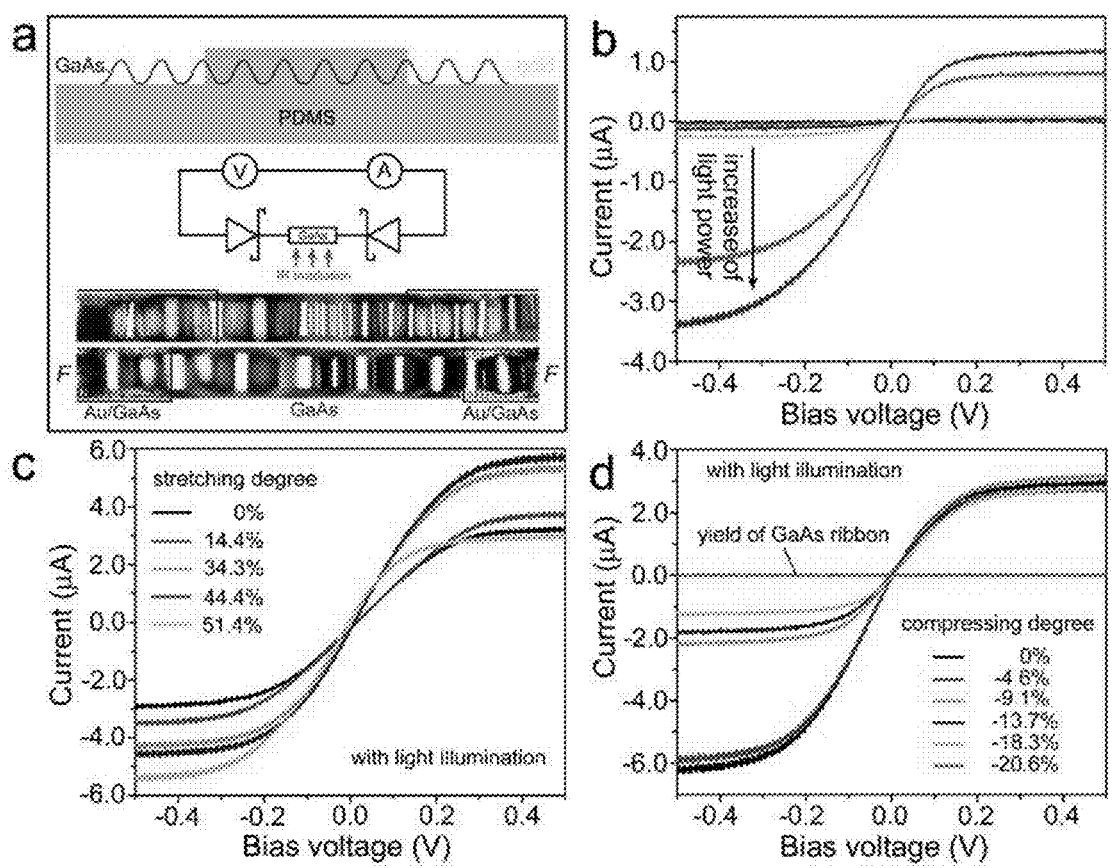

FIG. 31 Characterization of stretchable metal-semiconductor-metal photodetectors (MSM PDs). A Schematic illustrations of the geometry (top), an equivalent circuit (middle), and optical images of a buckled PD before and during stretching (bottom). B Current (I)-voltage (V) curves recorded from a buckled PD that was irradiated by an IR lamp with different output intensities. I-V characteristics of PDs illuminated with constant luminance and (C) stretched or (D) compressed by different degrees.

Figure 32:
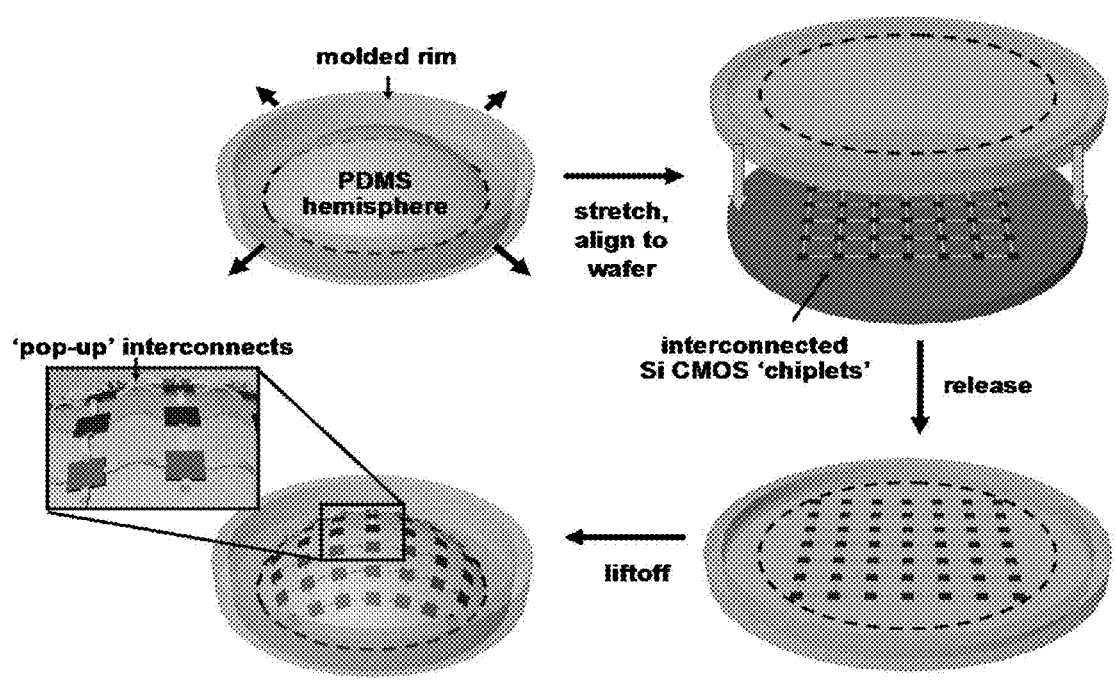

FIG. 32 A hemispherical elastomeric transfer 'stamp' can liftoff interconnected Si CMOS 'chiplets' from a conventional wafer and then transform their geometry into a hemispherical shape. The 'pop-up' interconnects between the chiplets accommodates the strains associated with this planar to curved surface transformation.

Figure 33:
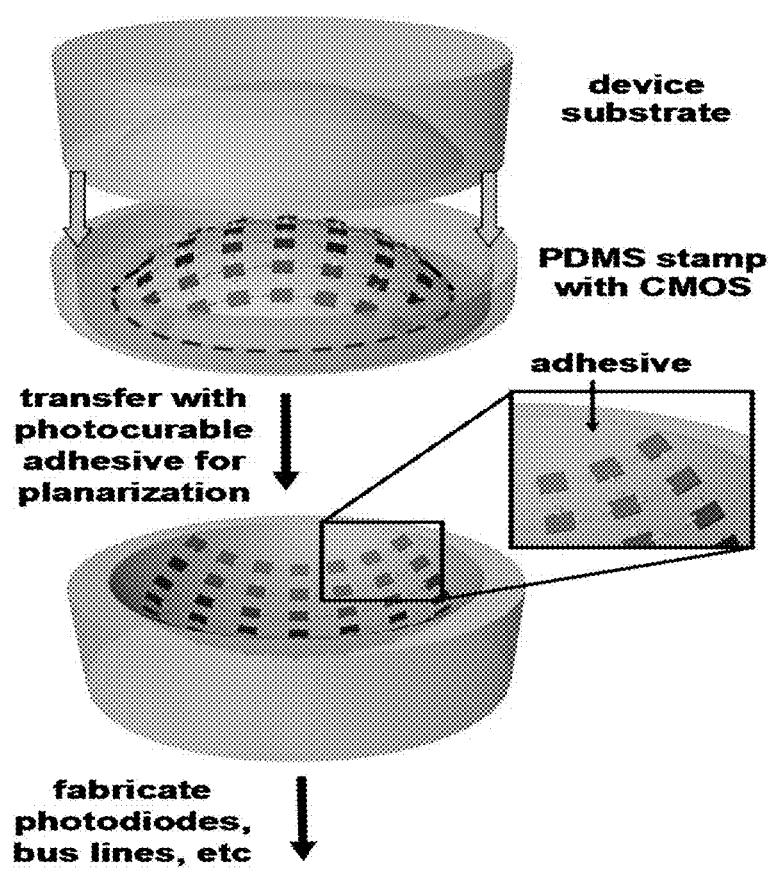

FIG. 33 Transfer of interconnected CMOS chiplets from a hemispherical stamp to a matched hemispherical device substrate. The photocurable adhesive layer bonds to the CMOS to the device substrate and also planarizes the surface.

Figure 34:
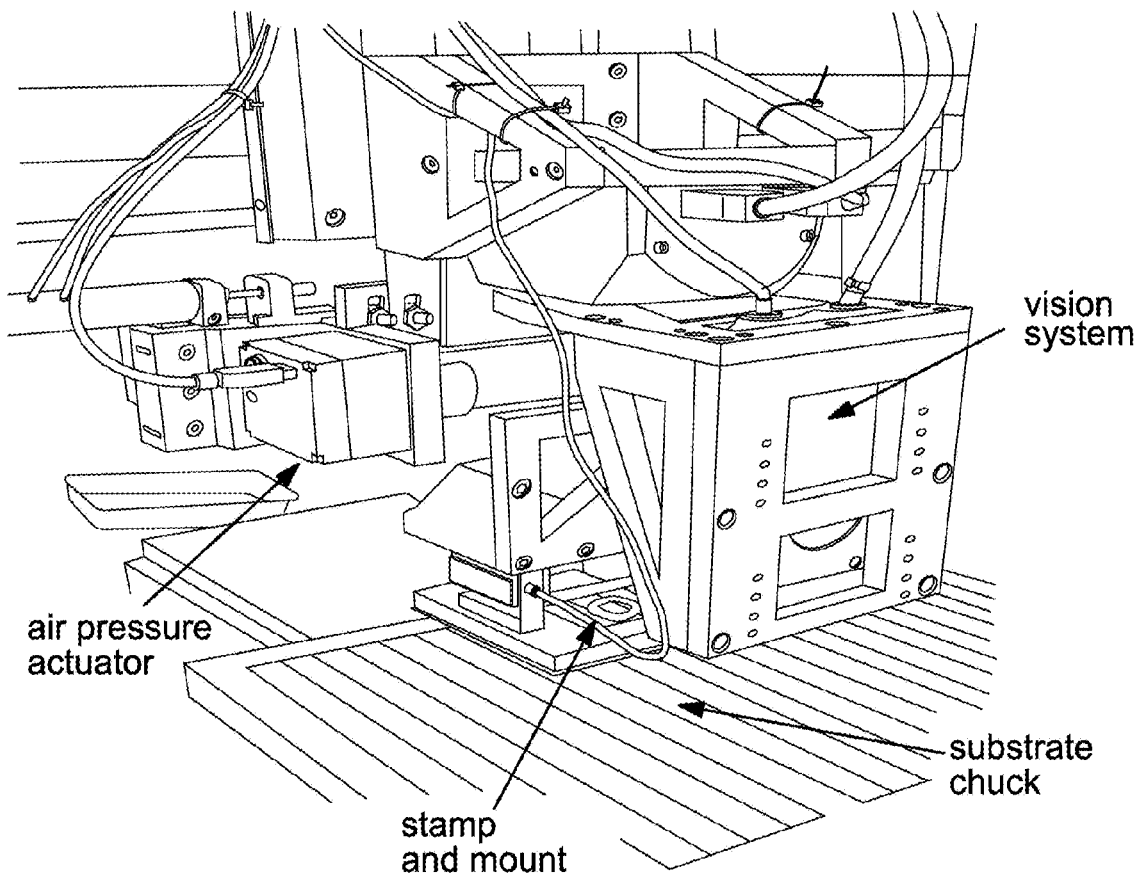

FIG. 34 Printer apparatus with fixturing, actuators and vision systems compatible with hemispherical stamps.

Figure 35:
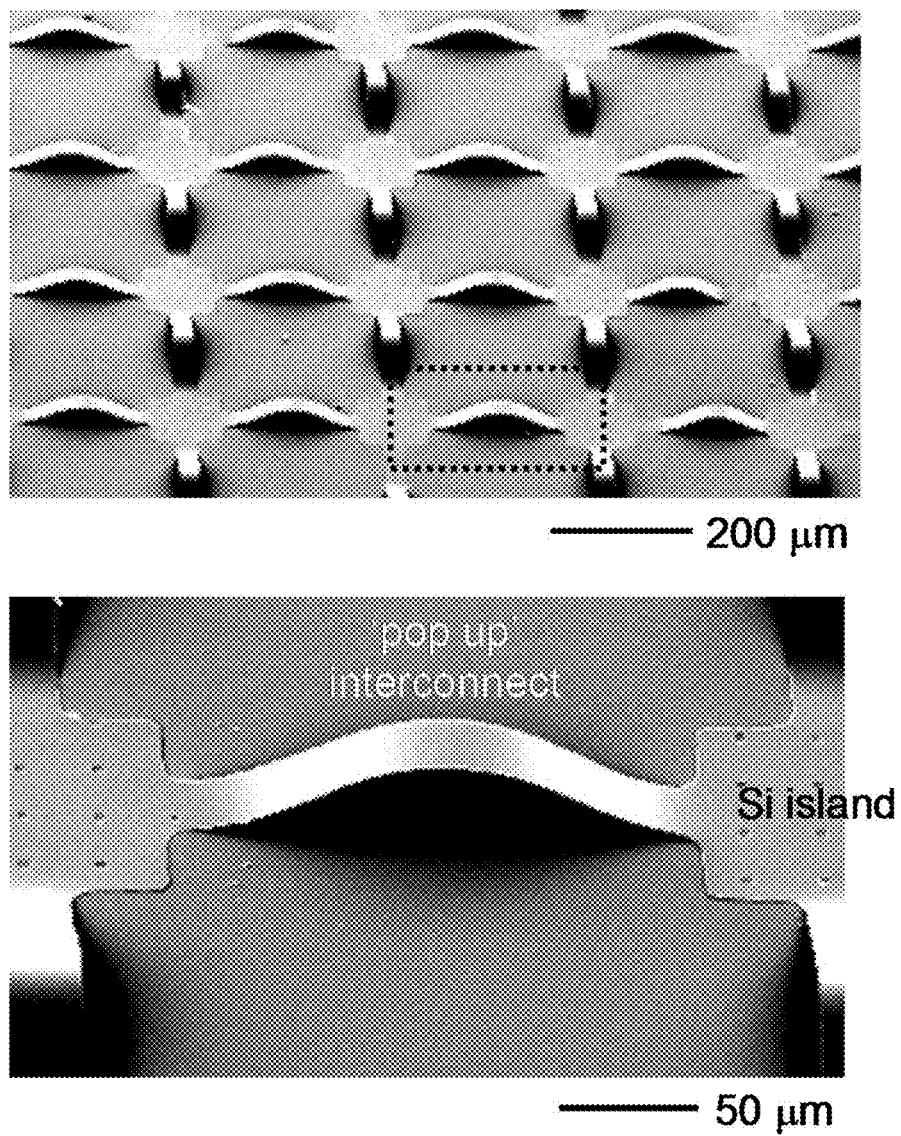

FIG. 35 Compressible array of single crystal silicon islands electrically connected by 'pop up' ribbon interconnects, on a hemispherical stamp.

FIG. 36 Optical images of an array of interconnected single crystal silicon islands 'inked' onto the surface of a hemispherical stamp with radius of curvature ~2 cm.

Figure 37:
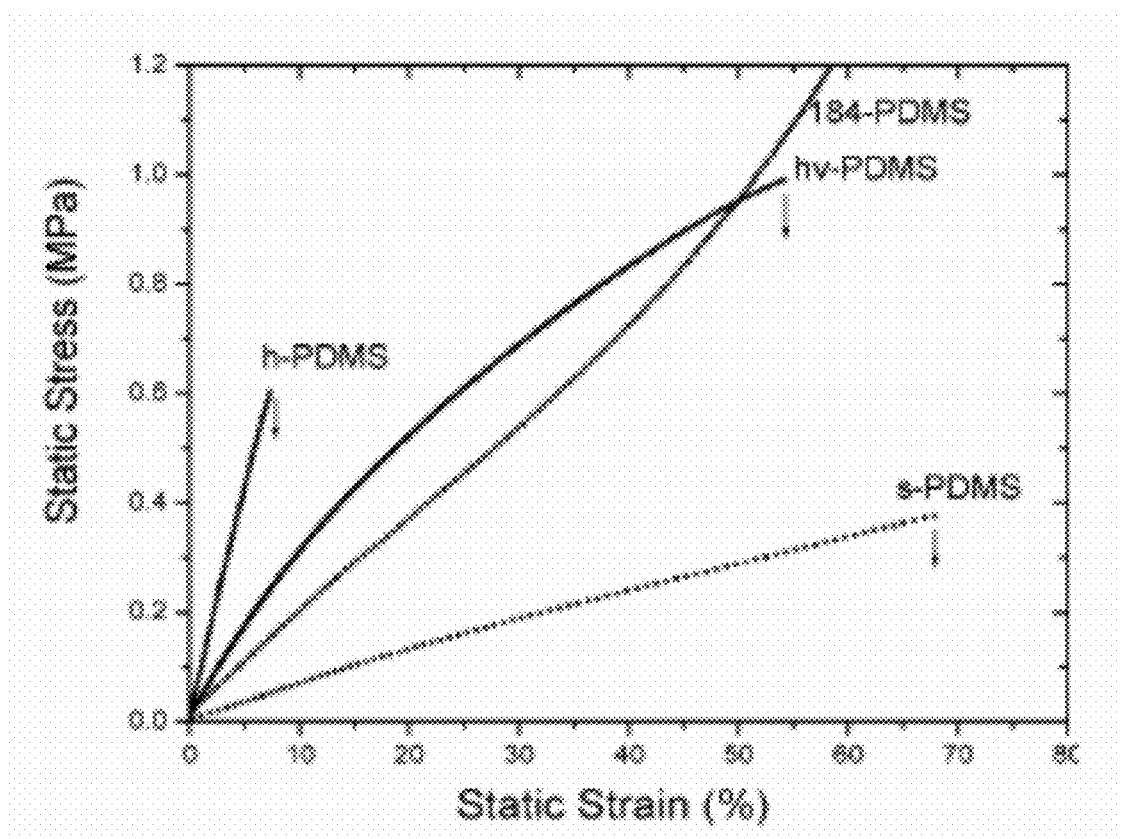

FIG. 37 Stress/strain curves for various silicone elastomers that can be used for the hemispherical stamps. Linear, purely elastic responses for strains less than 20% are important.

FIG. 38 Finite element modeling of the spherical to planar transformation in a hemispherical stamp with an initially uniform thickness of 0.57 mm.

Figure 39:
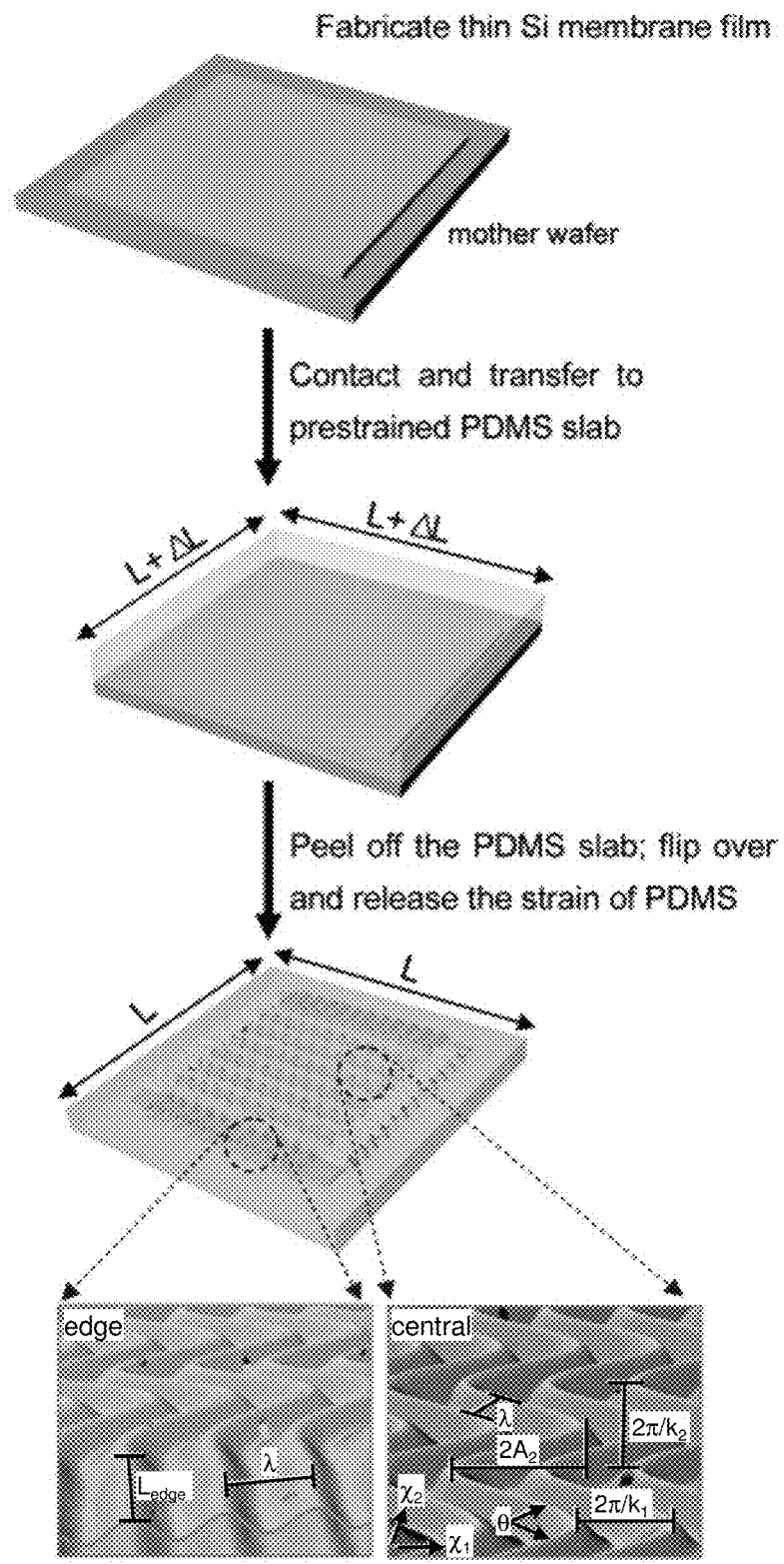

FIG. 39 Schematic illustration of steps for fabricating two-dimensional, "wavy" semiconductor nanomembranes on elastomeric supports.

Figure 40:
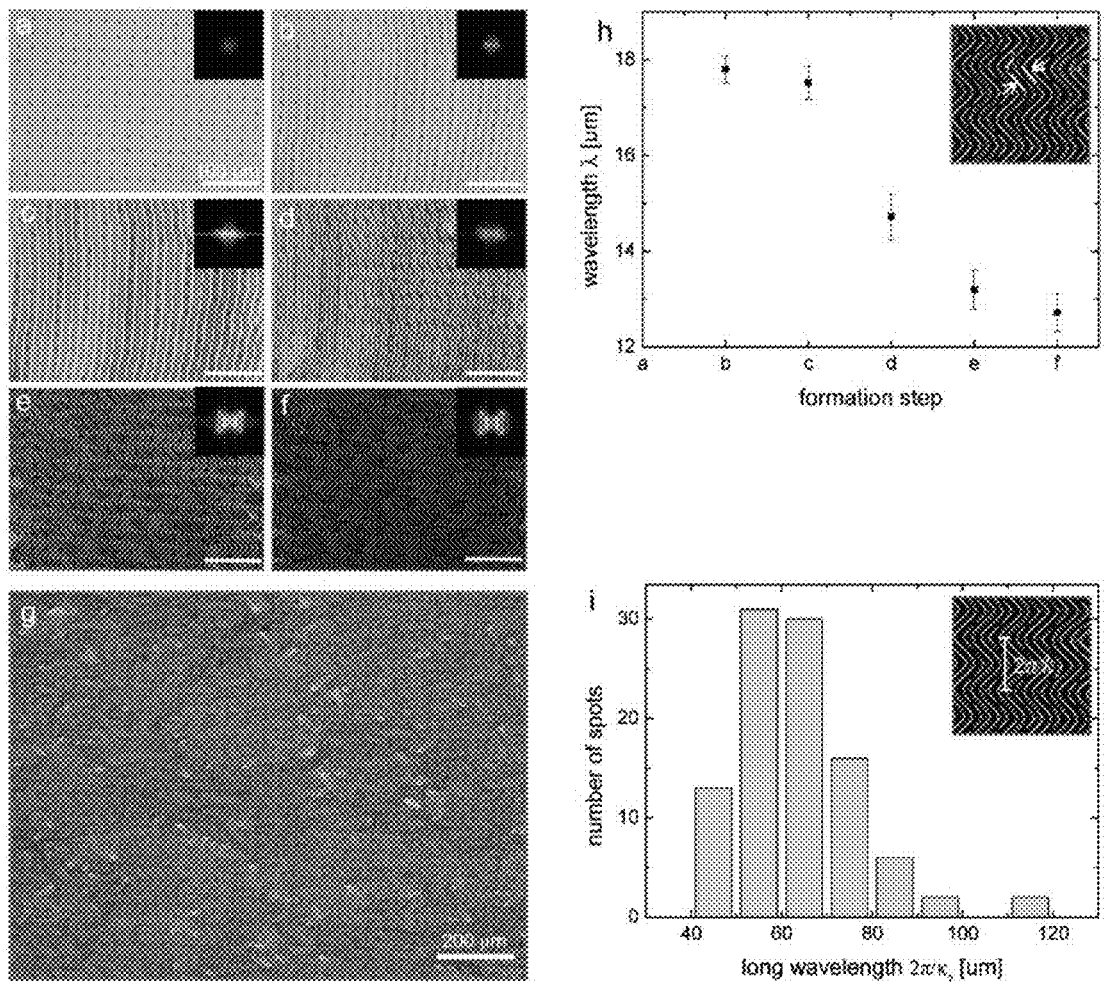

FIG. 40 (*a-f*) Optical micrographs of 2D wavy structures in silicon nanomembranes at various stages during their formation. The insets show two-dimensional power spectra. (*g*) Image of the fully developed structure, at low magnification. For this sample, the thickness of the silicon is 100 nm with the lateral dimension of ca. 4×4 mm$^2$, the substrate is PDMS, and the thermally induced prestrain is 3.8%. (*h*) Plot of the short wavelength corresponding to frames (*a-f*) and (*i*) histogram of long wavelength evaluated at various points from frame (*g*).

Figure 41:
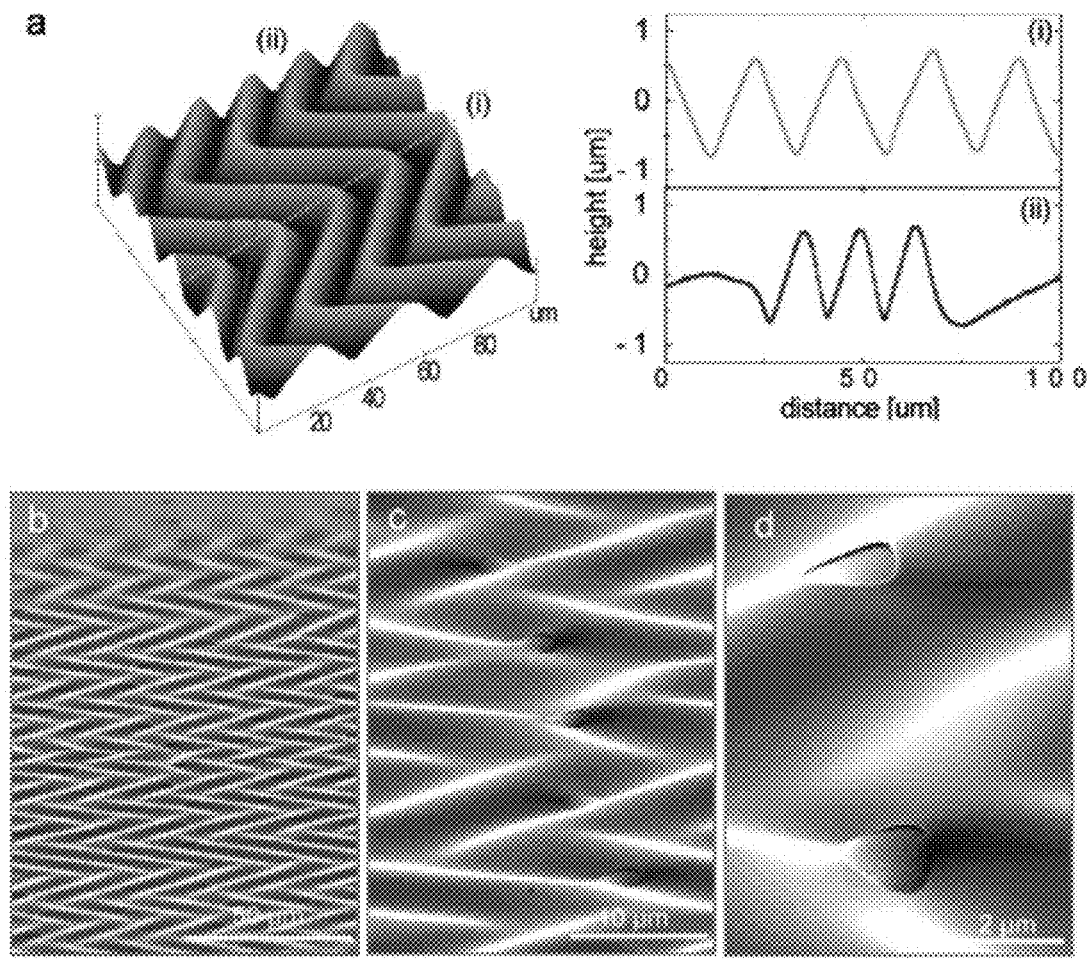

FIG. 41 (*a*) AFM and (*b-d*) SEM images (tilt angle) 60°) of a 2D wavy Si nanomembrane on PDMS. The thickness of the silicon is 100 nm, and the thermal prestrain is 3.8%. These images highlight the highly periodic nature of the wavy patterns, the good bonding between the Si and the PDMS as evidenced by the intimate contact visible at the edges of the Si and PDMS near the holes etched in the Si, and the lack of correlation between the positions of the wave structures and these holes.

Figure 42:
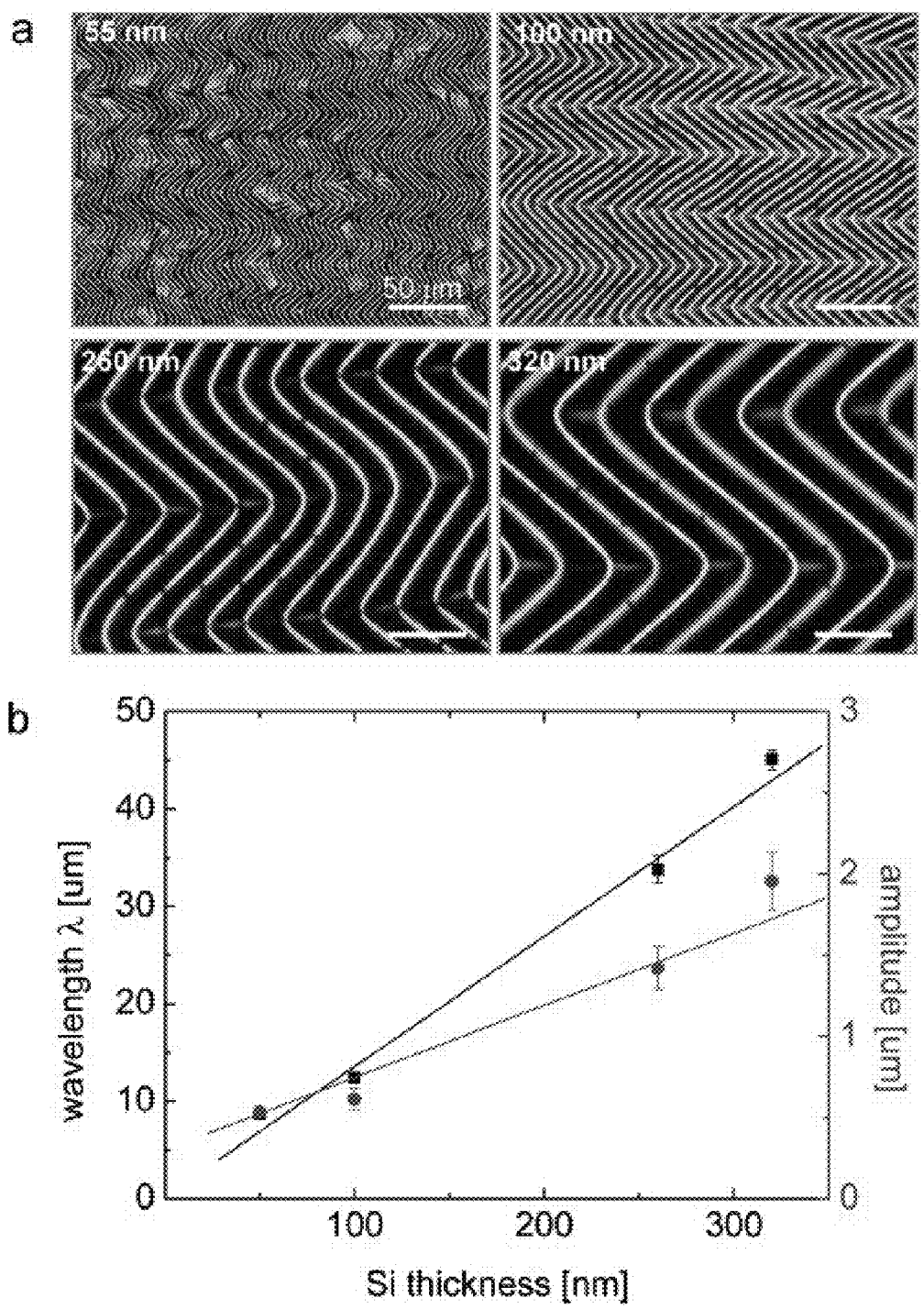

FIG. 42 (*a*) Optical micrographs of 2D wavy Si nanomembranes with various thickness (55, 100, 260, 320 nm) on PDMS, formed with a thermal prestrain of 3.8%, and (*b*) dependence of the short wavelength and amplitude on Si thickness.

Figure 43:
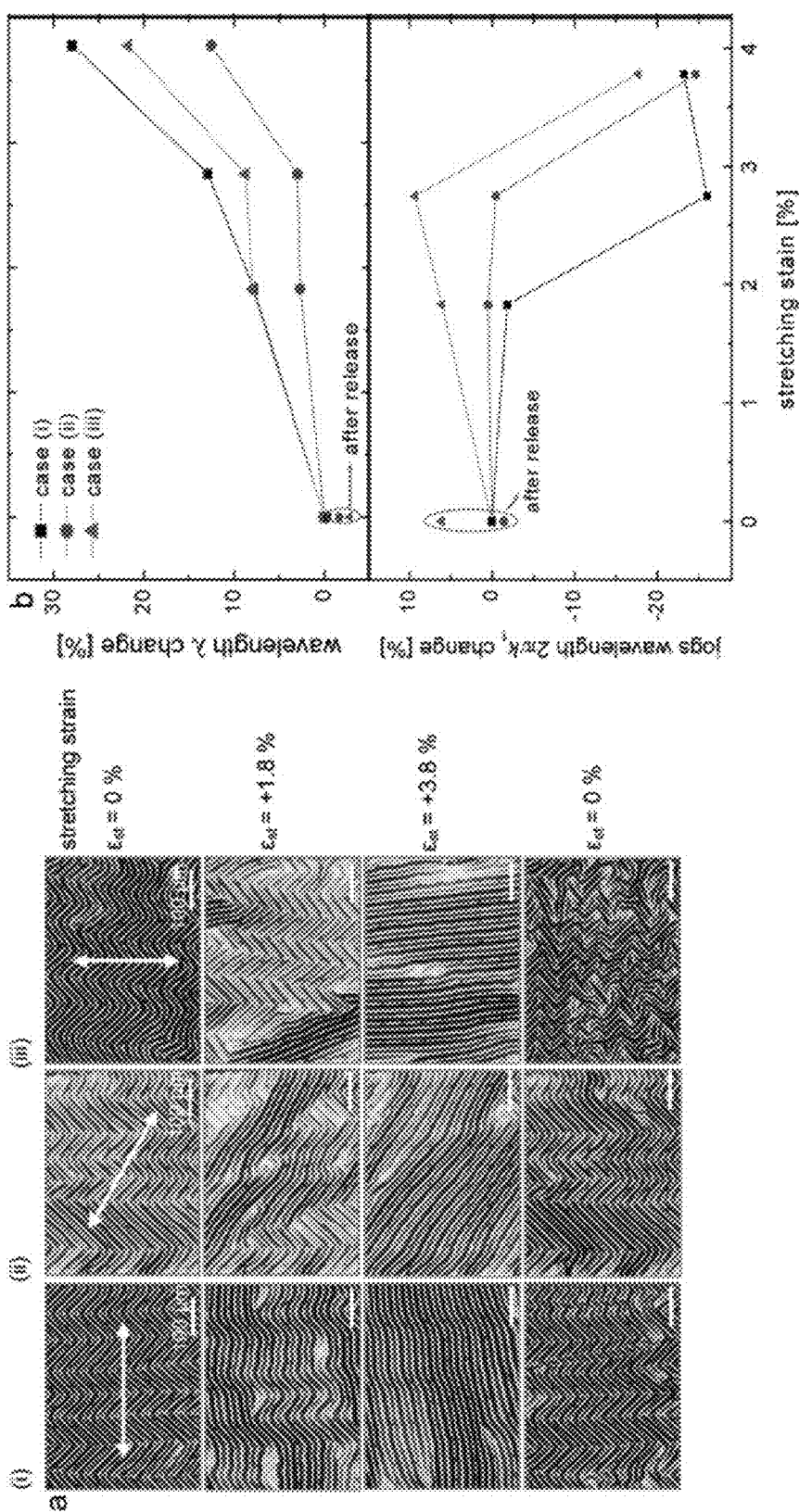

FIG. 43 (*a*) Optical micrographs of 2D wavy Si nanomembranes under different uniaxial strains, applied at three different orientations. These samples consist of Si membranes with thicknesses of 100 nm on PDMS, formed with a thermal prestrain of 3.8%. The images were collected in the relaxed state before stretching (top frames), the relaxed state after stretching (bottom frames), and at uniaxial applied tensile strains of 1.8% (top middle frames) and 3.8% (bottom middle frames). (*b*) Dependence of the short wavelength on applied strain in the three different directions.

Figure 44:
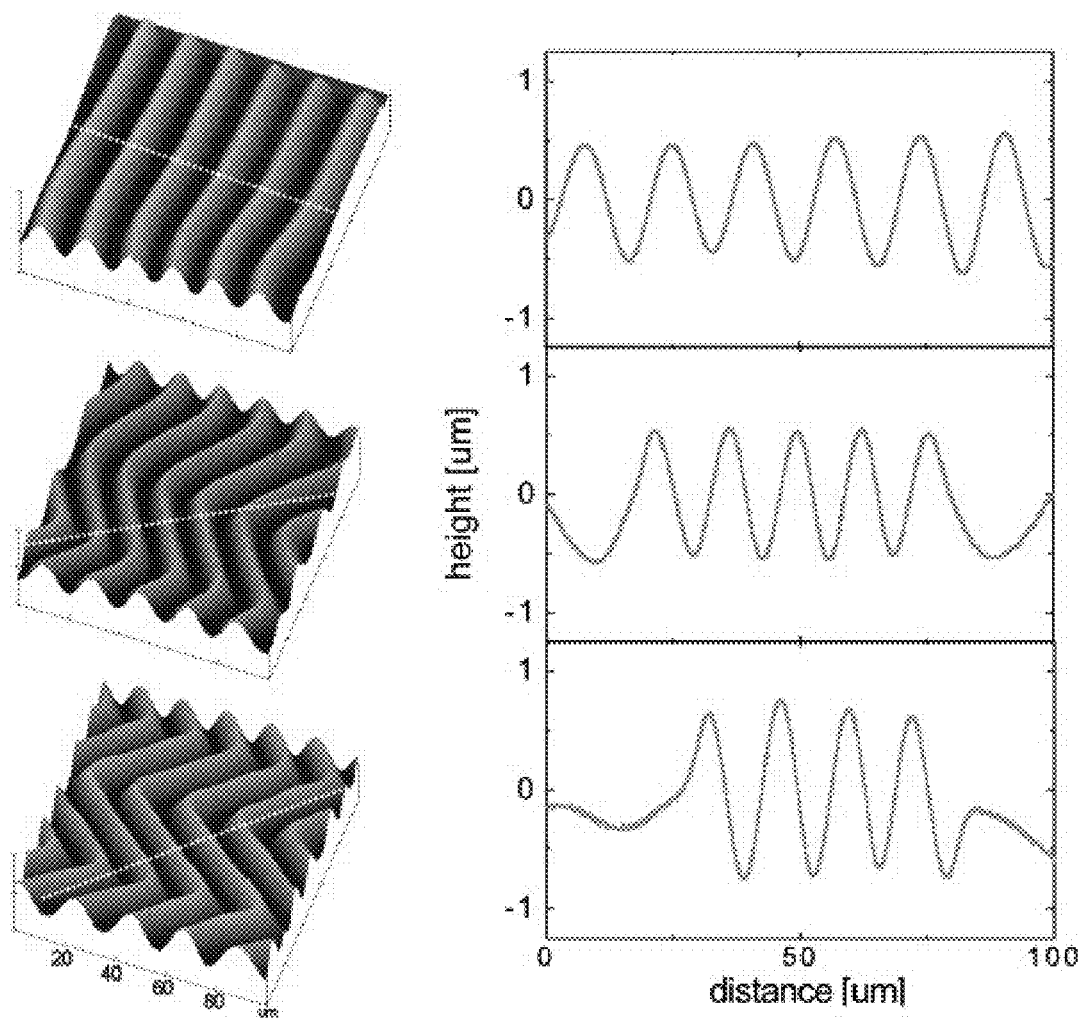

FIG. 44 AFM images of different regions of a 2D wavy Si nanomembrane, showing the 1D wavy geometry characteristics of a region near the edge of the membrane (top frame), a region slightly removed from this edge area (middle frame), and a region near the center of the membrane (bottom frame). The sample consisted of a Si membrane with thickness of 100 nm on PDMS, formed with a thermal prestrain of 3.8%.

Figure 45:
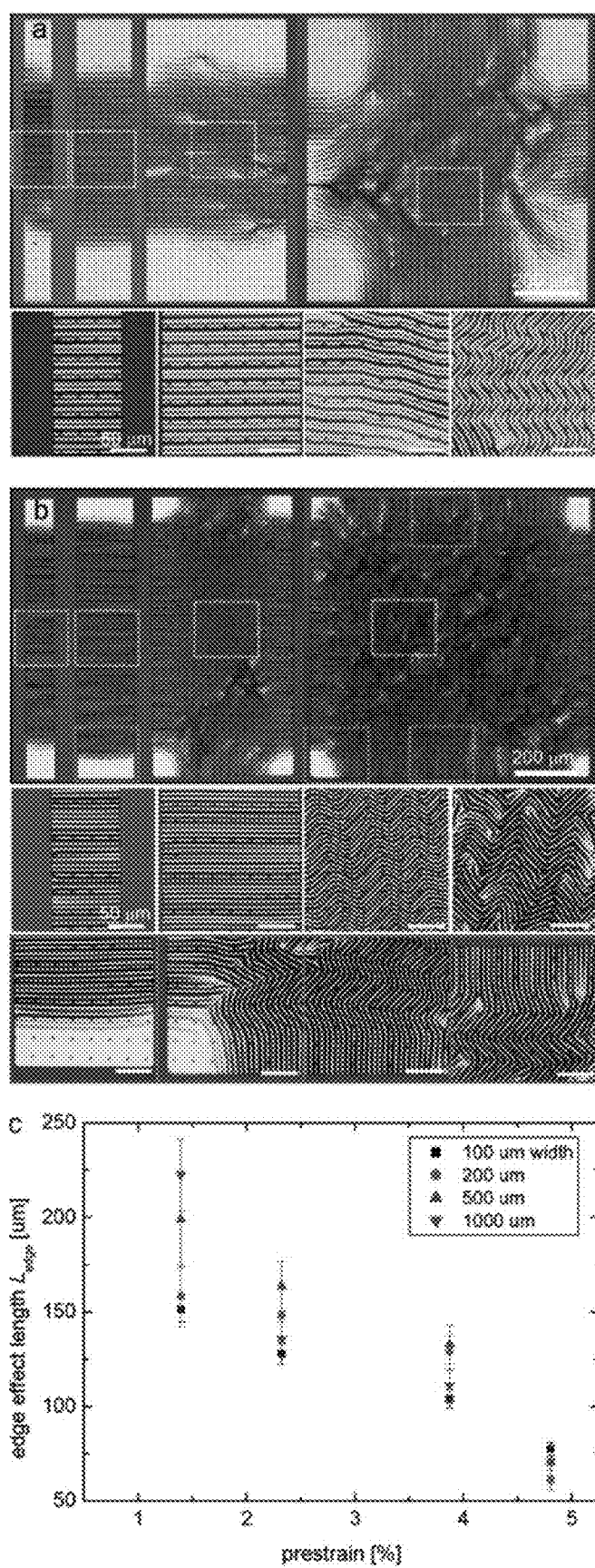

FIG. 45 Optical micrographs of 2D wavy Si nanomembranes with lengths of 1000 µm and with widths of 100, 200, 500, and 1000 µm. These membranes all have thicknesses of 100 nm and were formed on the same PDMS substrate with thermal prestrains of (a) 2.3% and (b) 4.8%. (c) Dependence of the edge effect length on prestrain for similar membranes.

Figure 46:
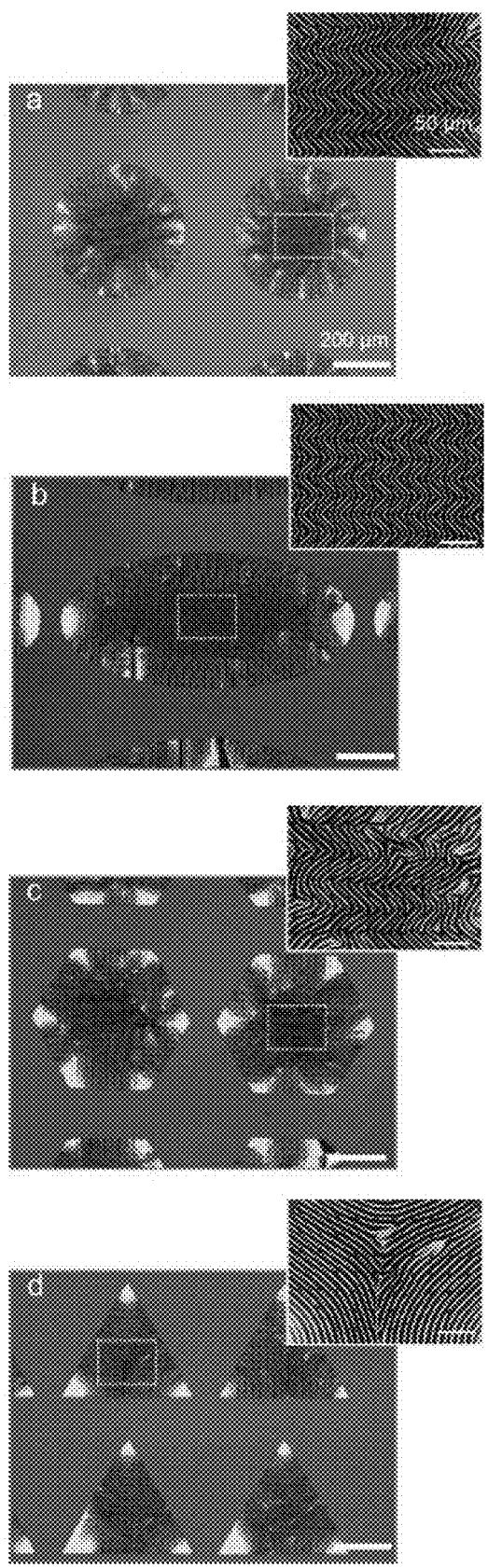

FIG. 46 Optical micrographs of 2D wavy Si nanomembranes with different shapes: (a) circle, (b) oval, (c) hexagon, and (d) triangle. These membranes all have thicknesses of 100 nm and were formed on PDMS with a thermal prestrain of 4.8%.

Figure 47:
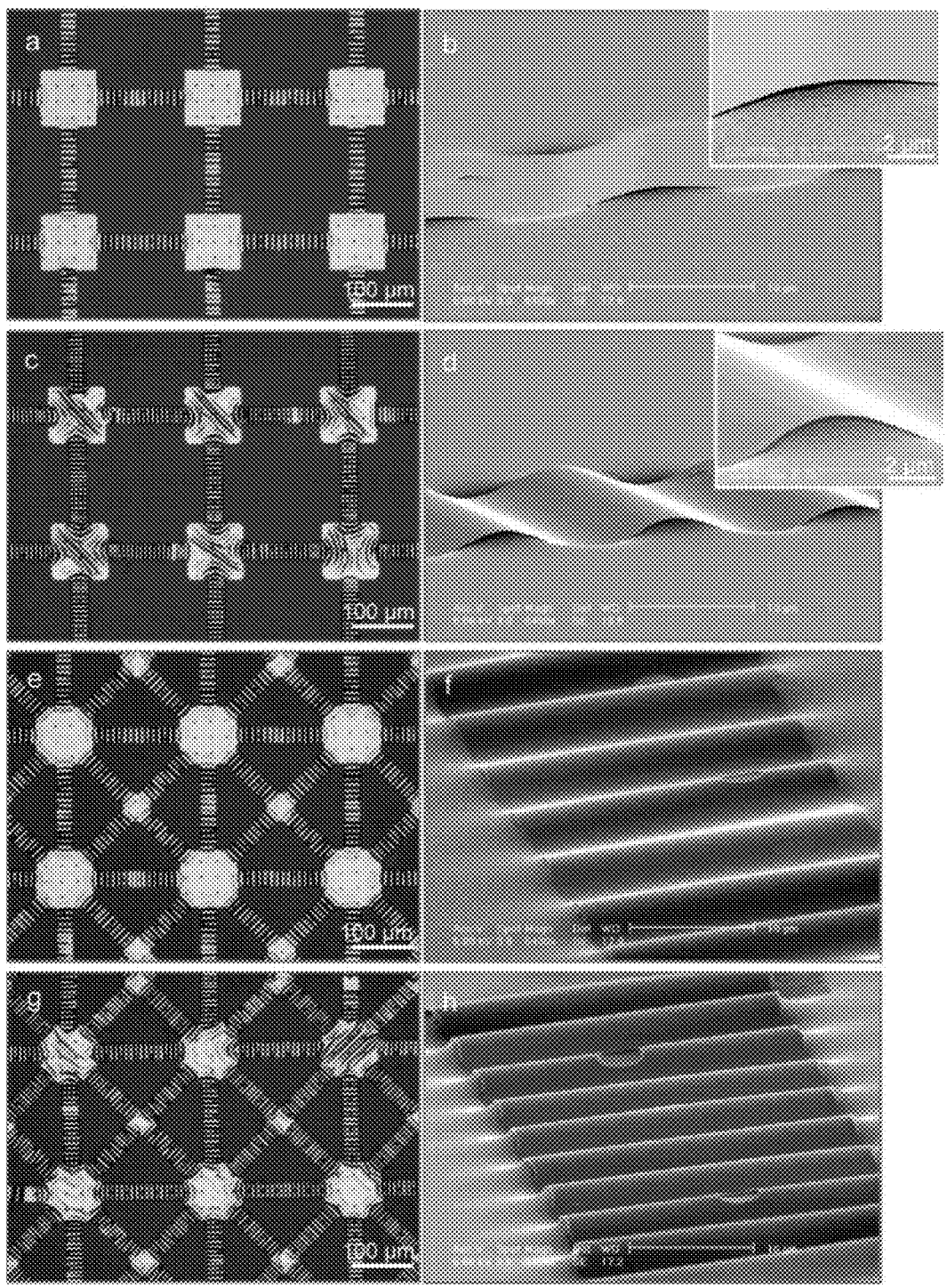

FIG. 47 Optical micrographs of wavy structures of Si nanomembranes with shapes designed to exploit edge effects to provide 2D stretchability in interconnected arrays of flat islands. In both cases illustrated here, the Si is 100 nm thick, the squares are 100×100 µm and the ribbon connections are 30×150 µm lines. The prestrain is (a, e) 2.3% and (c, g) 15%. SEM images (tilt angle of 75°) of selected regions that show ribbons and squares of (a, c, e, g) are shown in (b, d, f, h), respectively. The insets of high-magnification SEM images show the raised region of waves in b and d.

Figure 48:
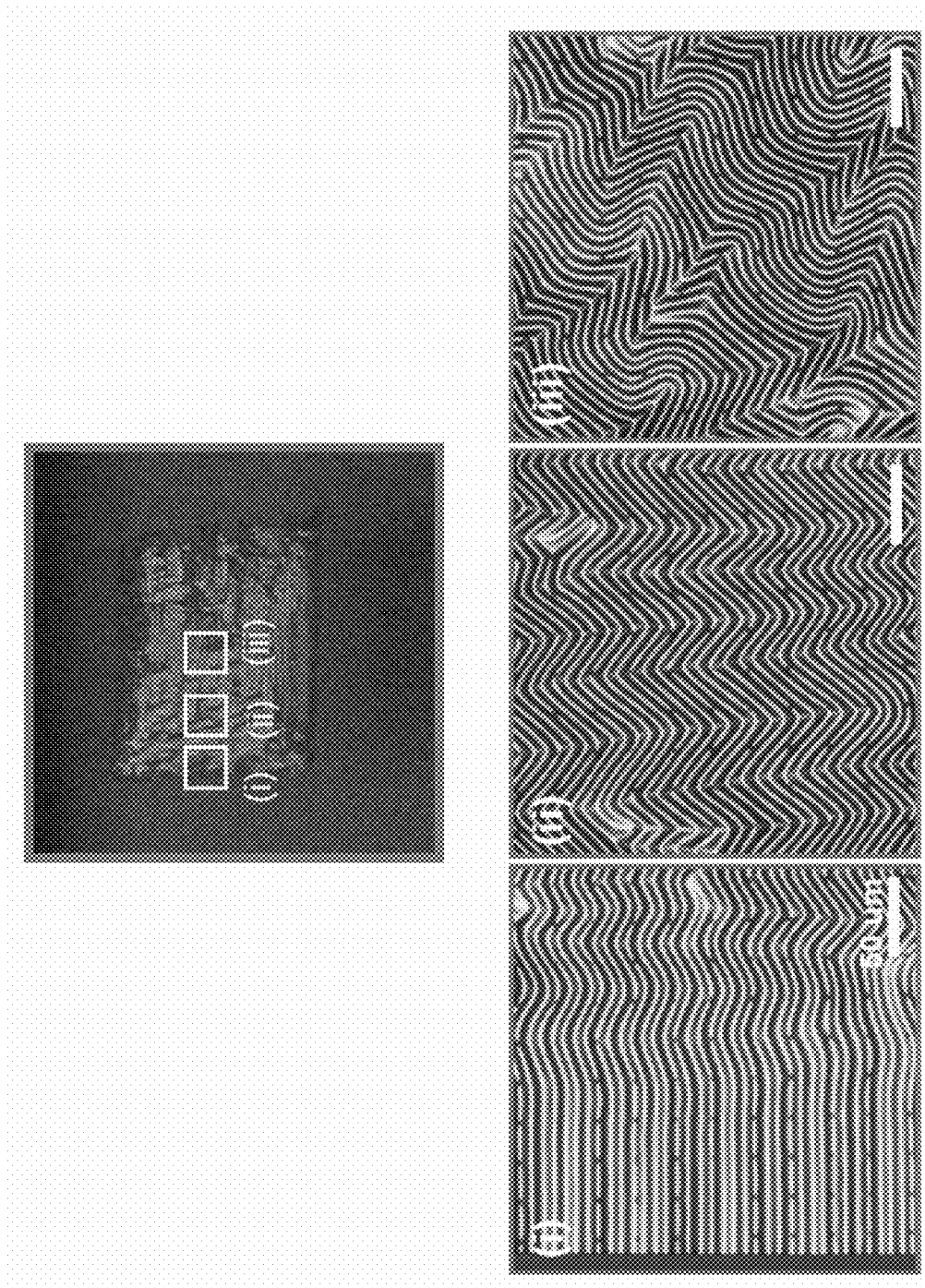

FIG. 48 is photograph of the sample of 2D wavy Si nanomembrane (100 nm thick, 4×5 mm$^2$, and 3.8% thermal prestrain) on PDMS substrate wave (top frame), and (i) the 1D waves at the edge, (ii) the herringbone waves at the inner region, and (iii) disordered herringbone waves at the center. The scale bar is 50 µm.

Figure 49:
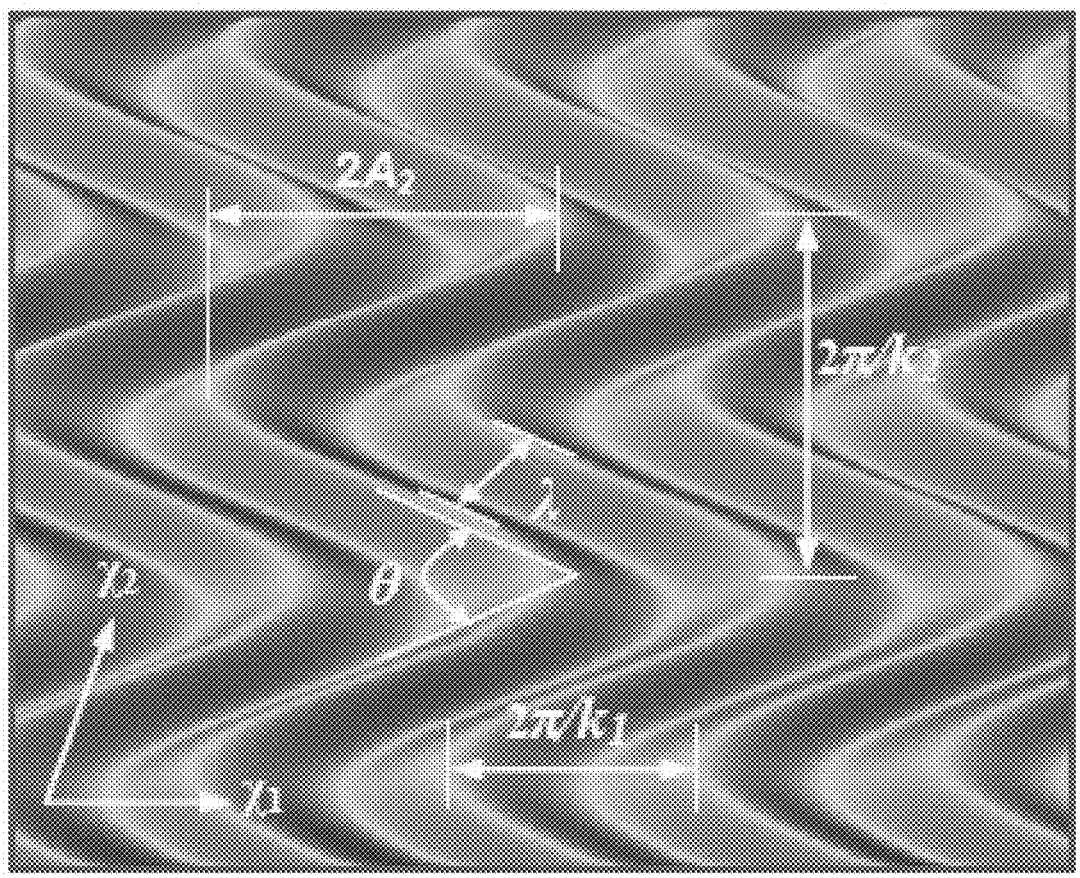

FIG. 49 Schematic illustration of the characteristic lengths in the herringbone wave structures.

Figure 50:
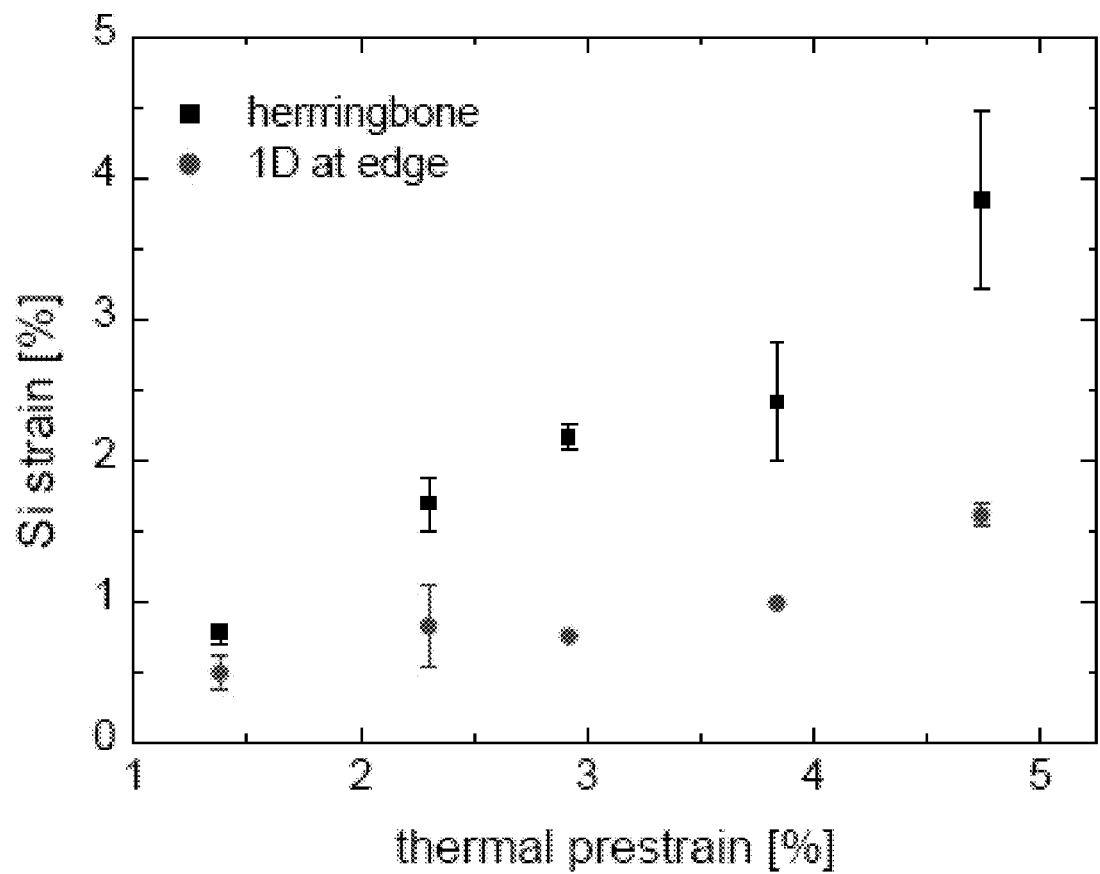

FIG. 50 Si strain as a function of applied thermal prestrain at the herringbone and 1D waves. Si strain was measured experimentally by $\in_{Si}=(L-\lambda)/\lambda$, where L and $\lambda$ are the surface and horizontal distance in AFM surface profile.

Figure 51:
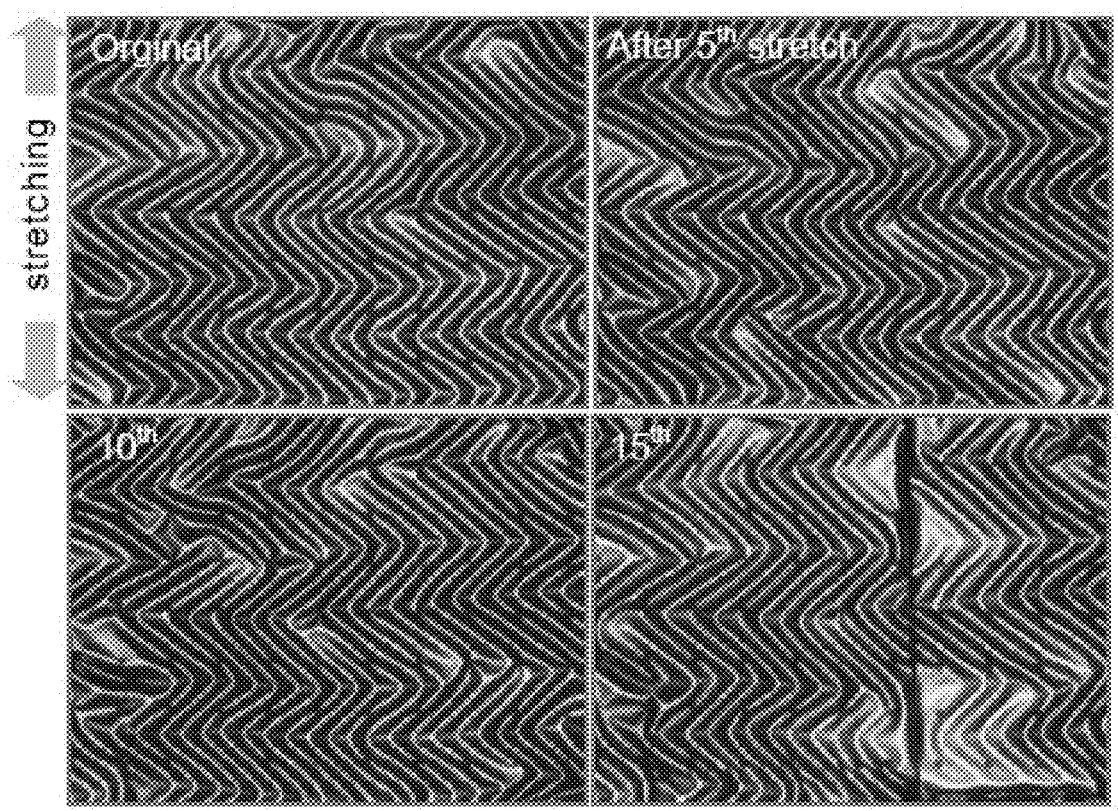

FIG. 51 Optical microscope images of herringbone waves after the cycles of stretching test ($\sim\in_{st}=4.0\%$). The test sample was prepared with 100 nm thick Si membrane and 3.8% biaxial thermal prestrain. The herringbone waves were recovered to have quite similar structures with the original, after the cycles of stretching test up to 15 times, except the some defects originated from the crack of membrane.

FIG. 52 Schematic illustration of the 'unfolding' of herringbone waves with application of uniaxial tensile strain. The compressive strain $\in_{cp}$ is due to the Poisson effect with tensile strain $\in_{st}$.

FIG. 53 Optical microscope images of the morphology change of herringbone waves during heating and cooling process as a biaxial stretching test. The test sample was prepared with 100 nm thick Si membrane and 2.9% biaxial thermal prestrain.

FIG. 54 summarizes one method of fabrication of wavy stretchable electrodes by deposition on a structured wavy master, followed by casting a stamp on that master, curing the stamp, and thereby transferring the electrodes to the master upon release.

Figures 4A, 4B:
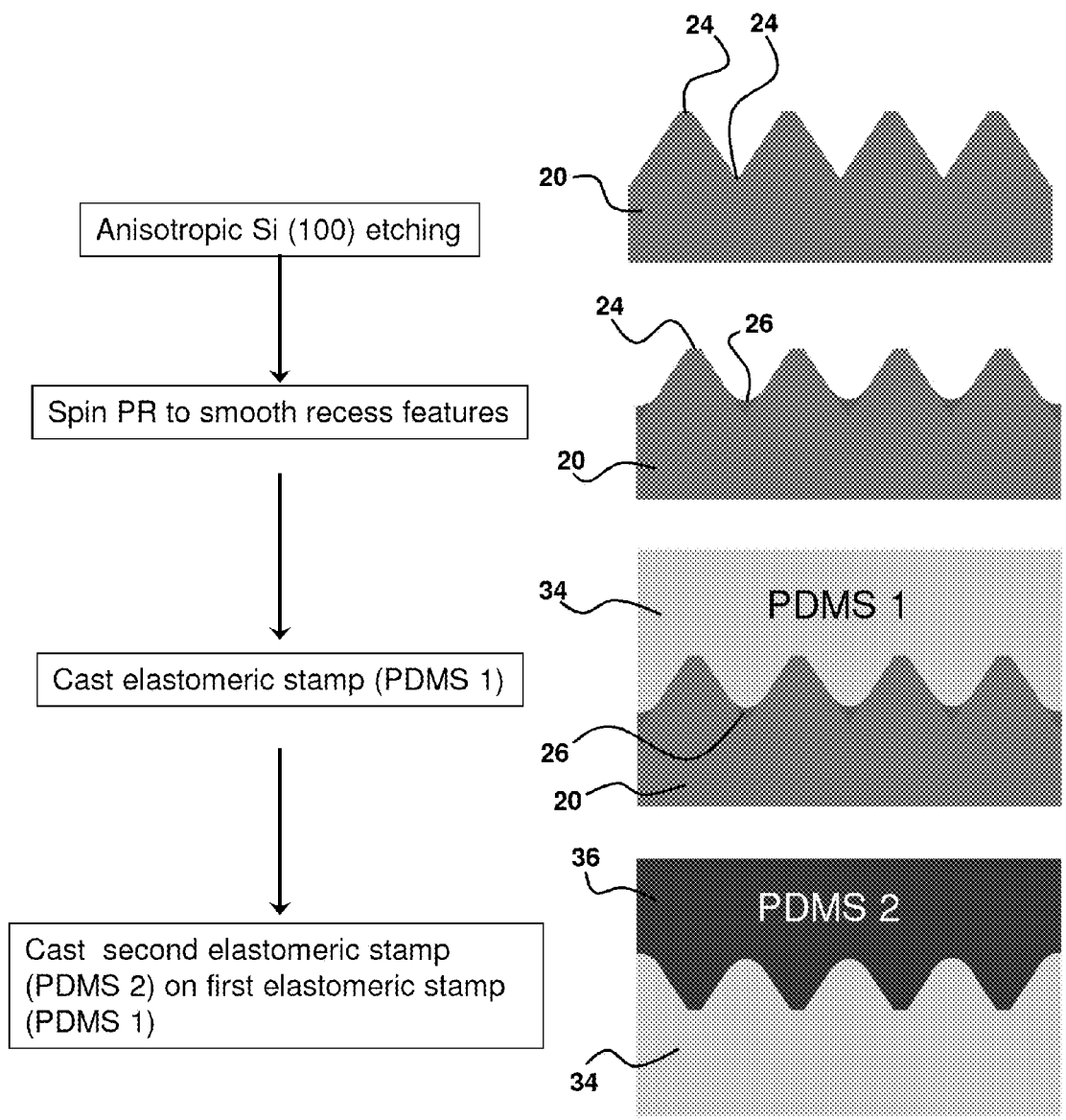
FIG. 4 provides details relating to one method for fabricating a smooth wavy elastomer substrate. A is a flow-chart summary and B illustrates the flow-chart steps.
Figure 4A:
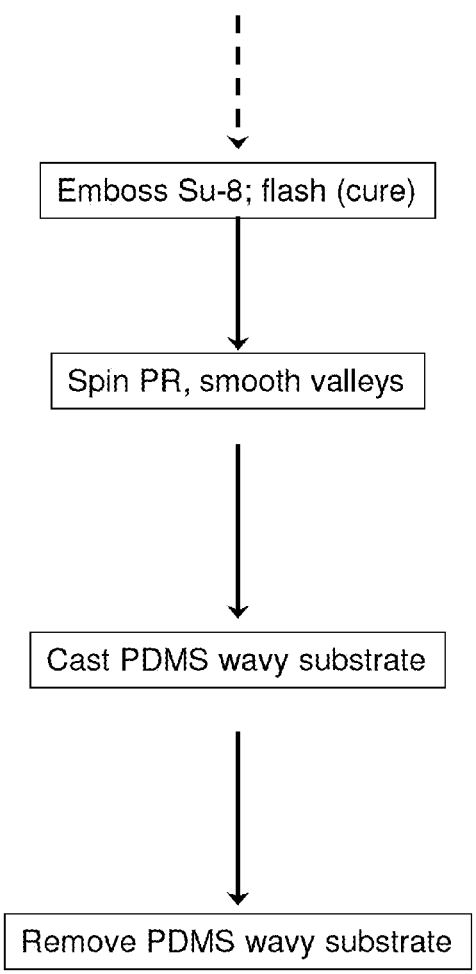
Figure 4B:
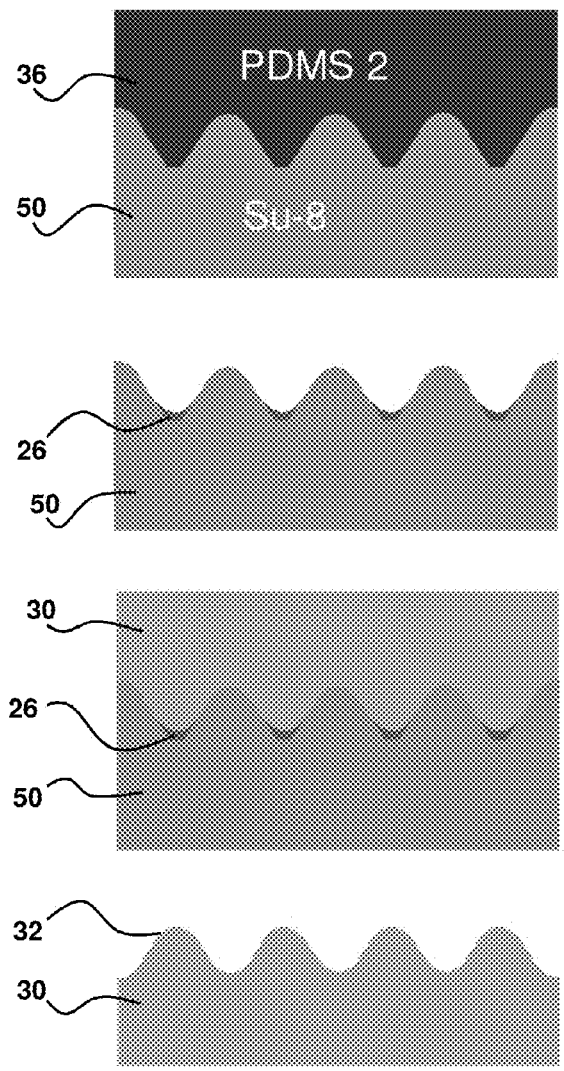

FIG. 55 provides an image of stretchable metal electrodes (Au, 300 nm thick) on wavy PDMS prepared by the methods in FIG. 4 combined with those in FIG. 54. The bottom panel is a graph of measured electrical resistance data of the stretchable wavy metal electrodes as a function of applied tensile strain (up to 30%).

Figure 56C:
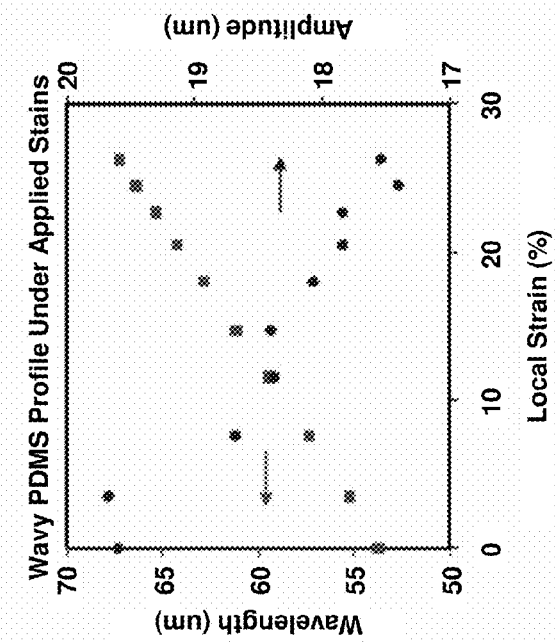
Figure 56B:
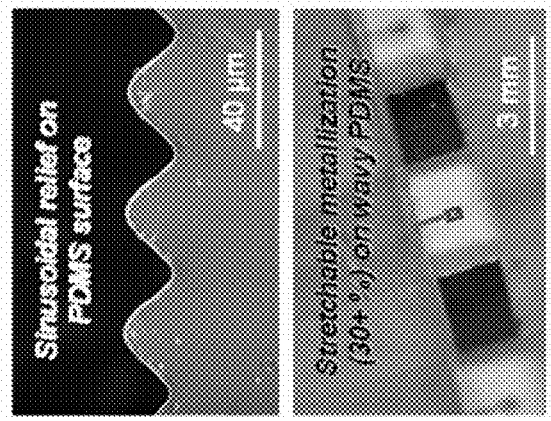
Figure 56A:
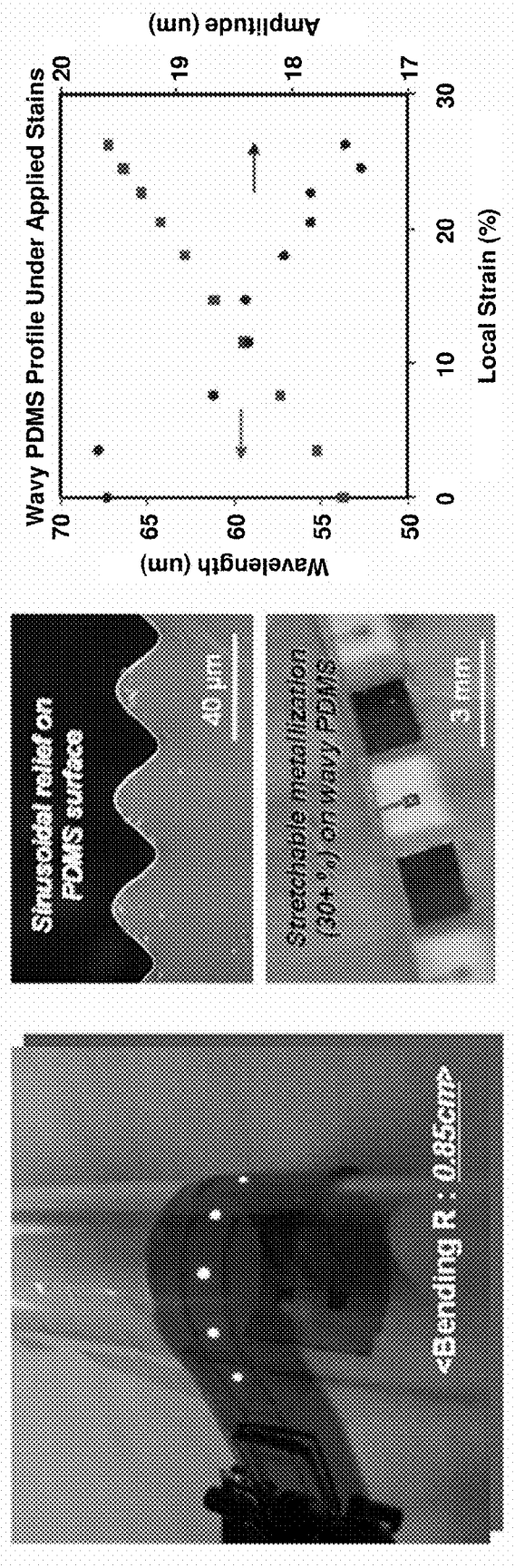

FIG. 56 is an example of an application of the present method for making flexible, stretchable iLED strip-lights. A is a photomicrograph illustrating the device is capable of large bending, and in this example the bending radius is 0.85 cm. B provides a cross-section (top panel, scale bar 40 µm) and a top-view (bottom panel, scale bar 3 mm) of stretchable metal on a wavy PDMS substrate. The metal is capable of stretching about 30% without significant degradation of physical properties. C is a plot of the effects of local strain on the wavelength (squares, left axis) and amplitude (circles, right axis) of sinusoidally-wavy metal interconnects on PDMS (shown in B). As the strain increases, there is a corresponding increase in the wavelength and decrease in the amplitude of the metal.

Figure 57:
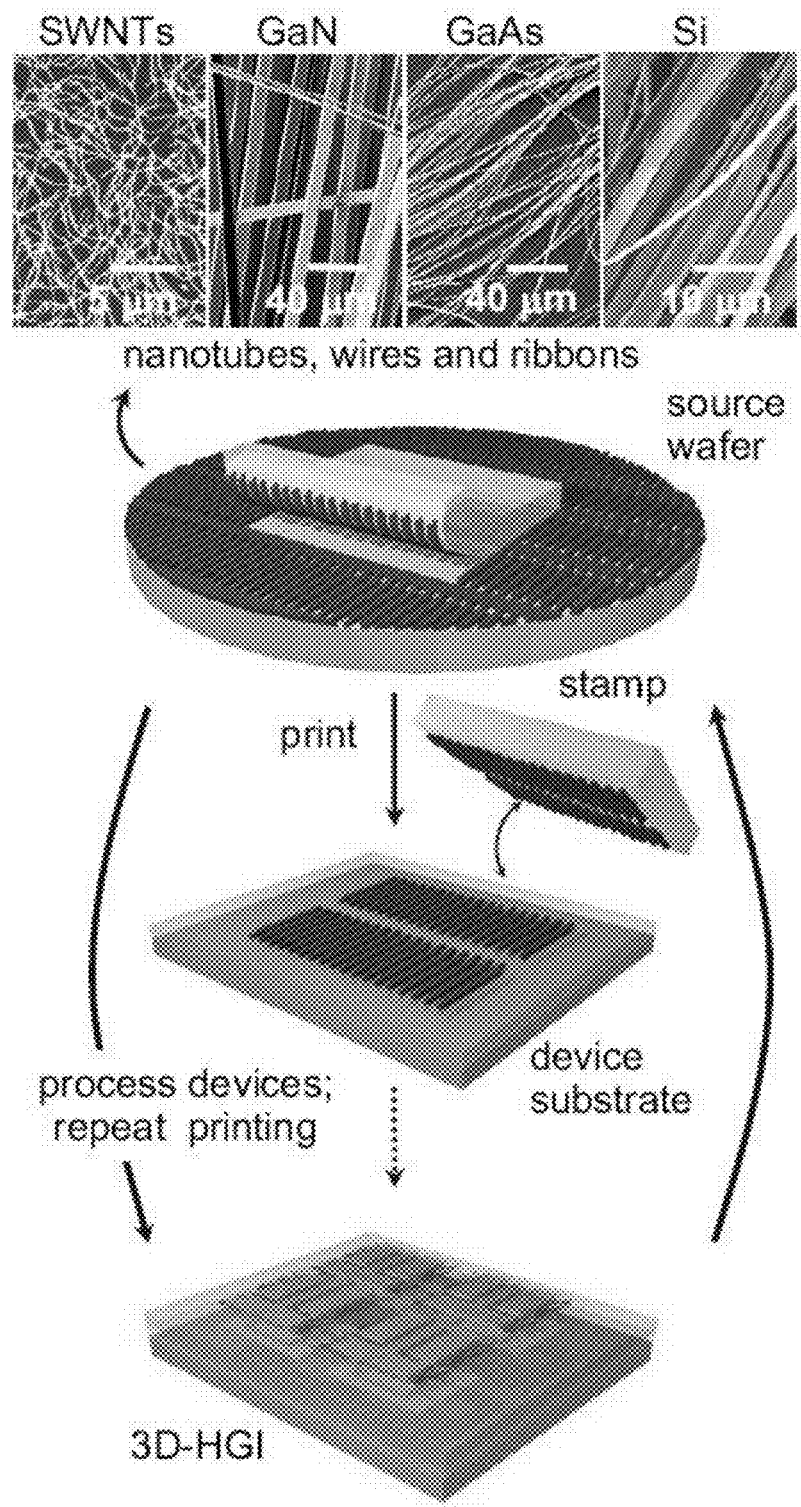

FIG. 57 Schematic illustration of a printed semiconductor nanomaterials based approach to heterogeneous, three dimensional electronics. The process involves the repetitive transfer printing of collections of nanotubes, nanowires, nanoribbons or other active nanomaterials, separately formed on source substrates, to a common device substrate to generate interconnected electronics in ultrathin, multilayer stack geometries.

Figure 58:
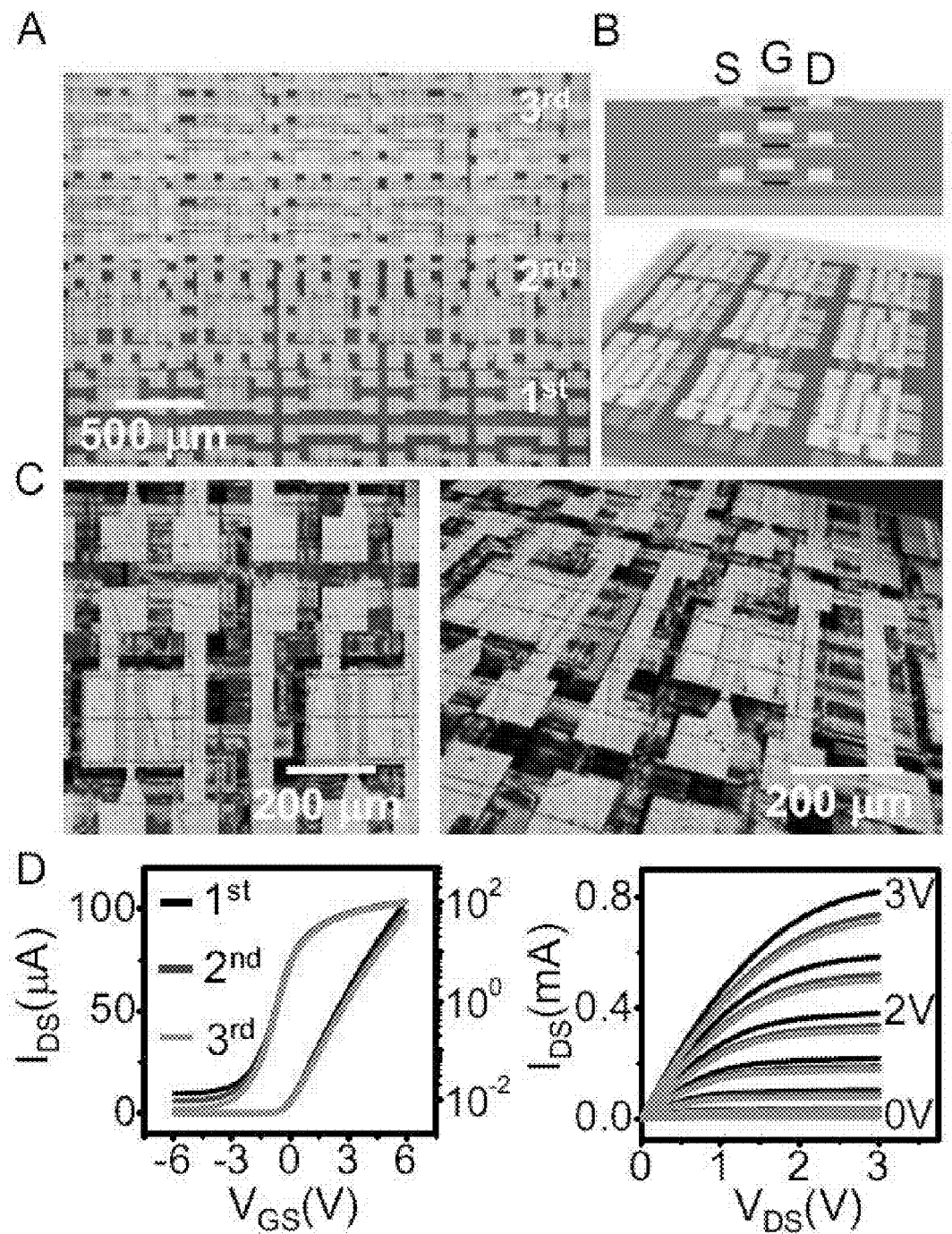

FIG. 58 (A) Optical micrograph of a three dimensional multilayer stack of arrays of single crystal silicon metal oxide field effect transistors (MOSFETs) that use printed silicon nanoribbons for the semiconductor. The bottom (labeled 1st), middle (labeled 2nd) and top (labeled 3rd) parts of this image correspond to regions with one, two and three layers of devices, respectively. (B) Schematic cross sectional (top) and angled (bottom) views. S, D and G refer to source, drain and gate electrodes (all shown in gold), respectively. The light and dark blue regions correspond to doped and undoped regions of the silicon ribbons; the purple layer is the SiO$_2$ gate dielectric. (C) Three dimensional images (left frame: top view; right frame: angled view) collected by confocal microscopy on a device substrate like that shown in (A) and (B). The layers are colorized (gold: top layer; red: middle layer; blue: bottom layer; silicon: grey) for ease of viewing. (D) Current-voltage characteristics of Si MOSFETs in each of the layers, showing excellent performance (mobilities of 470±30 cm$^2$/Vs) and good uniformity in the properties. The channel lengths and widths are 19 and 200 µm, respectively.

Figure 59:
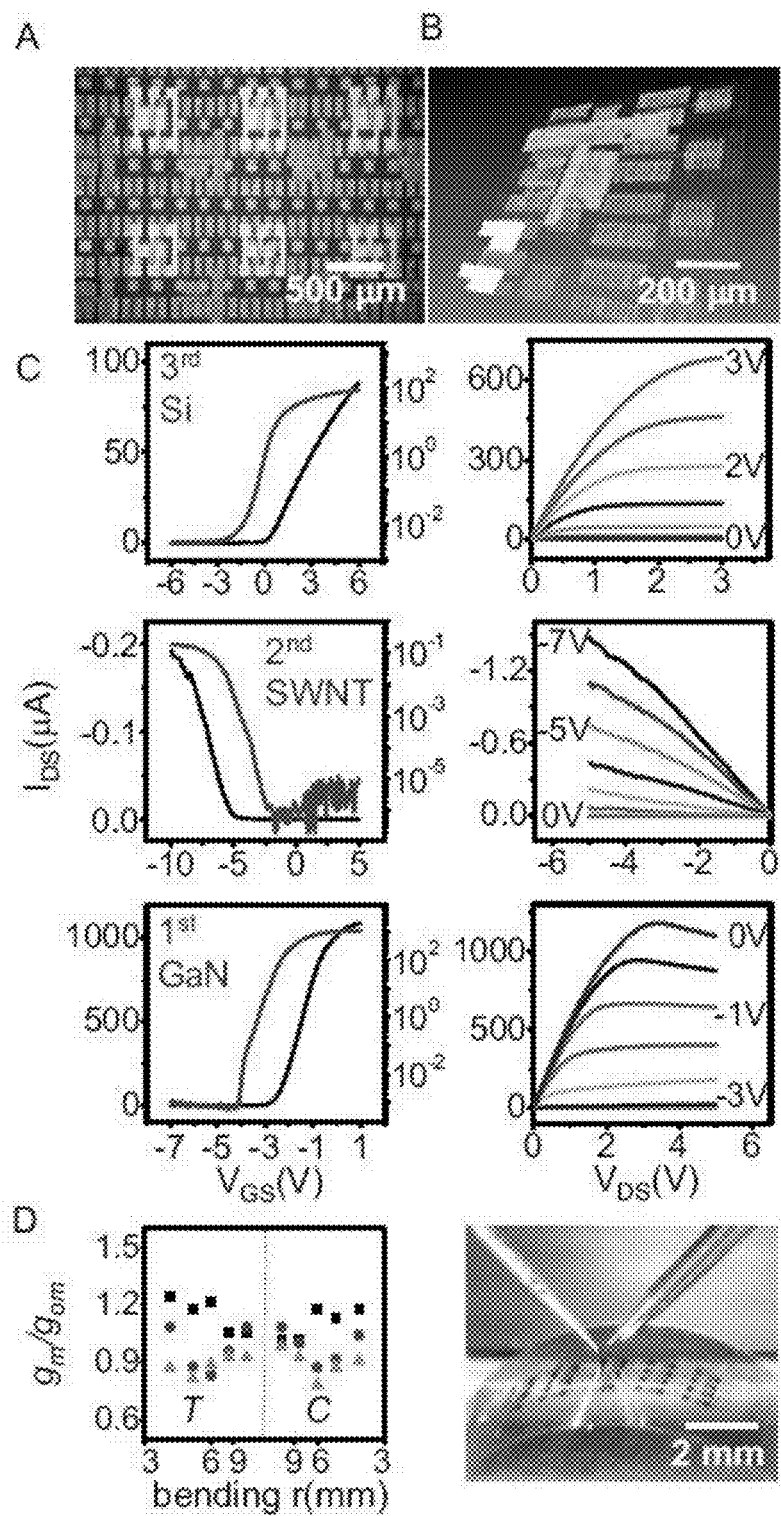

FIG. 59 (A) Optical micrograph of three dimensional, heterogeneously integrated electronic devices, including GaN nanoribbon HEMTs, Si nanoribbon MOSFETs and SWNT network TFTs, in a three layer stack. (B) Three dimensional image collected by confocal microscopy. The layers are colorized (gold: top layer, Si MOSFETs; red: middle layer, SWNT TFTs; blue: bottom layer) for ease of viewing. (C) Electrical characteristics of GaN devices on the first layer (channel lengths, widths and gate widths of 20, 170 and 5 µm, respectively), SWNT devices on the second layer (channel lengths and widths of 50 and 200 µm, respectively) and Si devices on the third layer (channel lengths and widths of 19 and 200 µm, respectively). (D) Normalized transconductances ($g_m/g_{0m}$) of devices in each layer (black squares: Si MOSFETs; red circles: SWNT TFTs; green triangles: GaN HEMTs) as a function of bending radius of the plastic substrate (left). Image of the bent system and probing apparatus (right).

Figure 60:
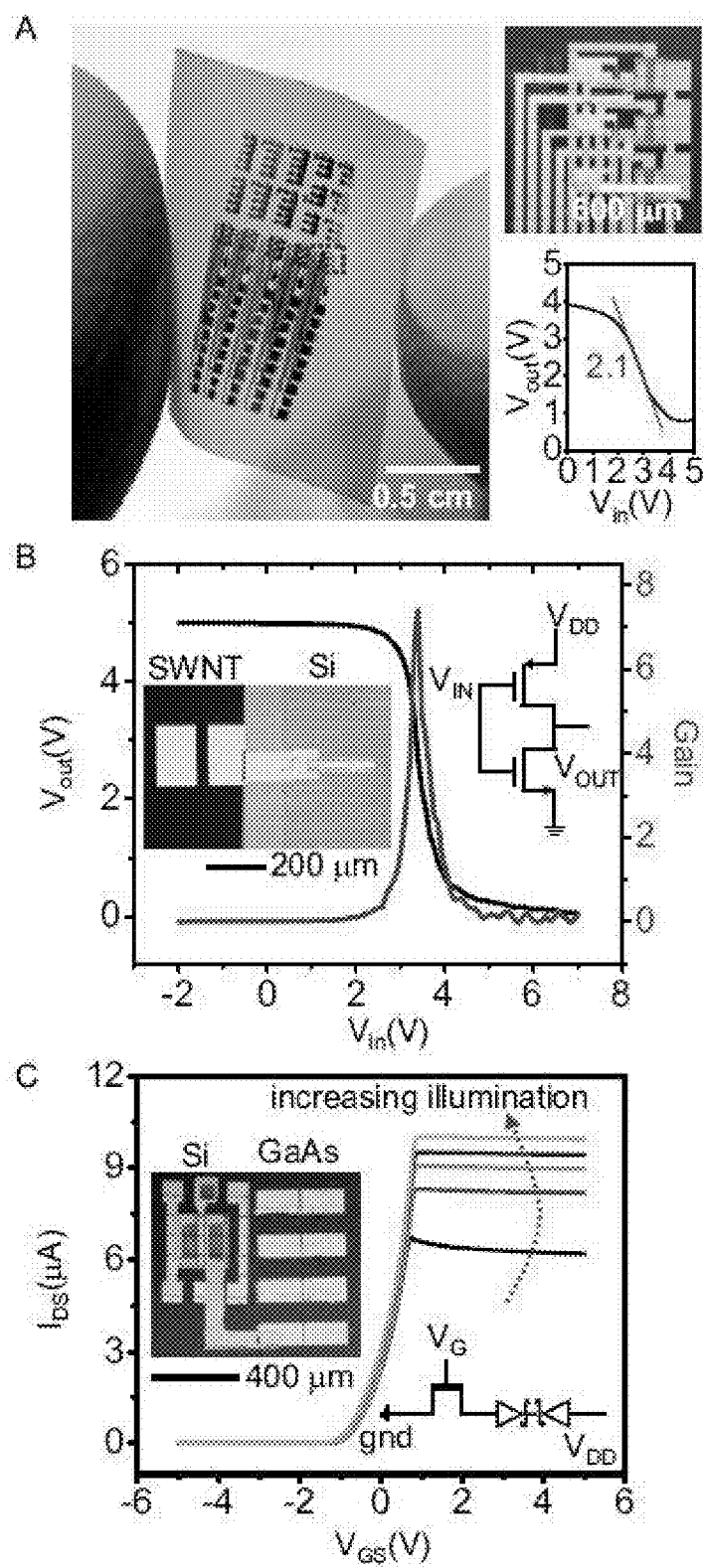

FIG. 60 (A) Image of a printed array of 3D silicon NMOS inverters on a polyimide substrate. The inverters consist of MOSFETs (channel lengths of 4 µm, load-to-driver width ratio of 6.7, and a driver width of 200 µm) on two different levels, interconnected by electrical via structures. The image on the top right provides a magnified view of the region indicated by the red box in the left frame. The graph on the bottom right shows transfer characteristics of a typical inverter. (B) Transfer characteristics of a printed complementary inverter that uses a p channel SWNT TFT (channel length and width of 30 and 200 µm, respectively) and an n channel Si MOSFET (channel length and width of 75 and 50 µm, respectively). The insets provide an optical micrograph of an inverter (left) and a circuit schematic (right). (C) Current-voltage response of a GaAs MSM (channel length and width of 10 and 100 µm, respectively) integrated with a Si MOSFET (channel length and width of 9 and 200 µm, respectively) at different levels of illumination from dark to 11 µW with an infrared light source at 850 nm. The insets shows and optical image, and a circuit diagram.

Figure 61:
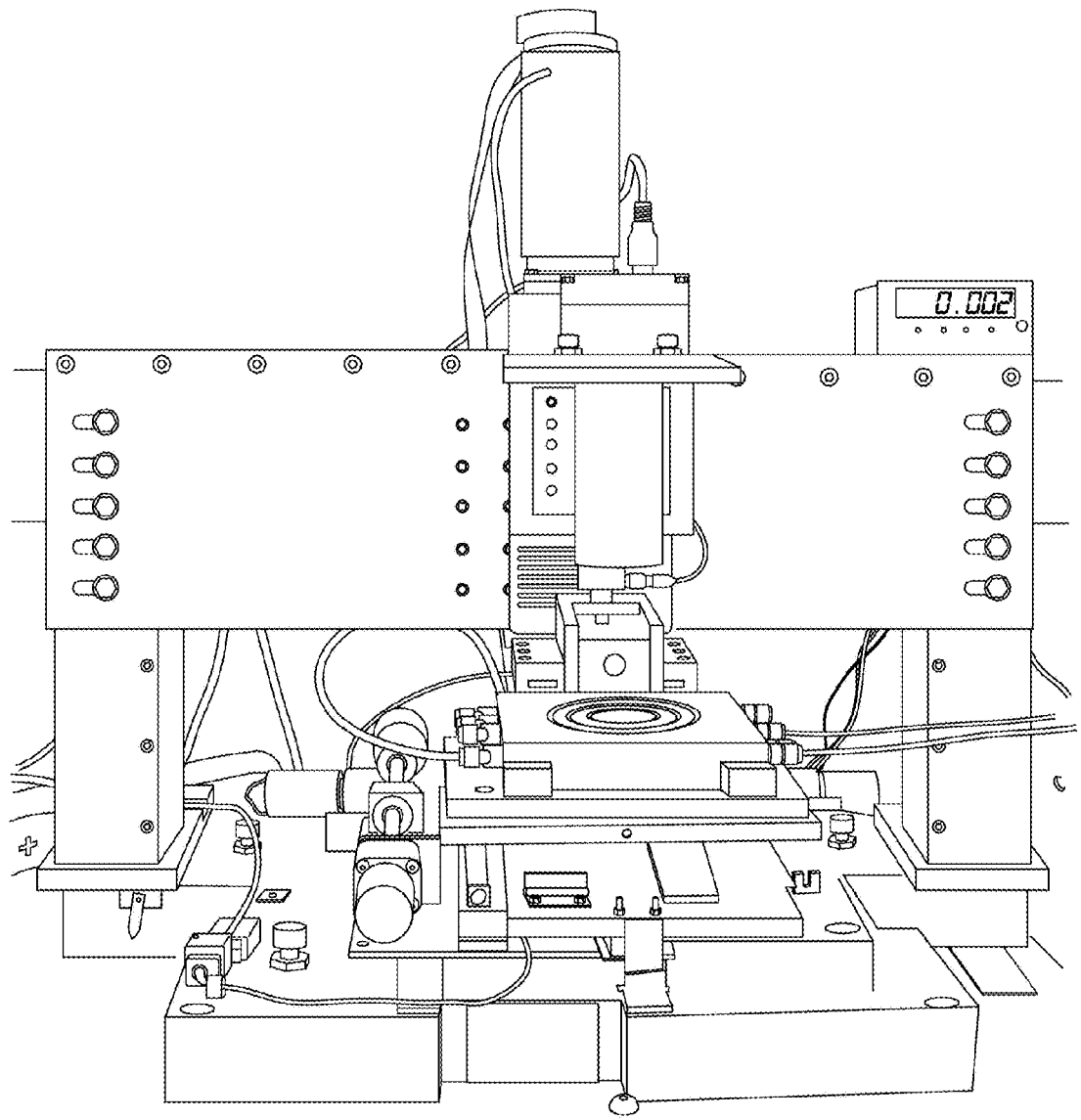

FIG. 61 Image of an automated stage for transfer-printing, capable of registration to within ~1 µm.

Figure 62:
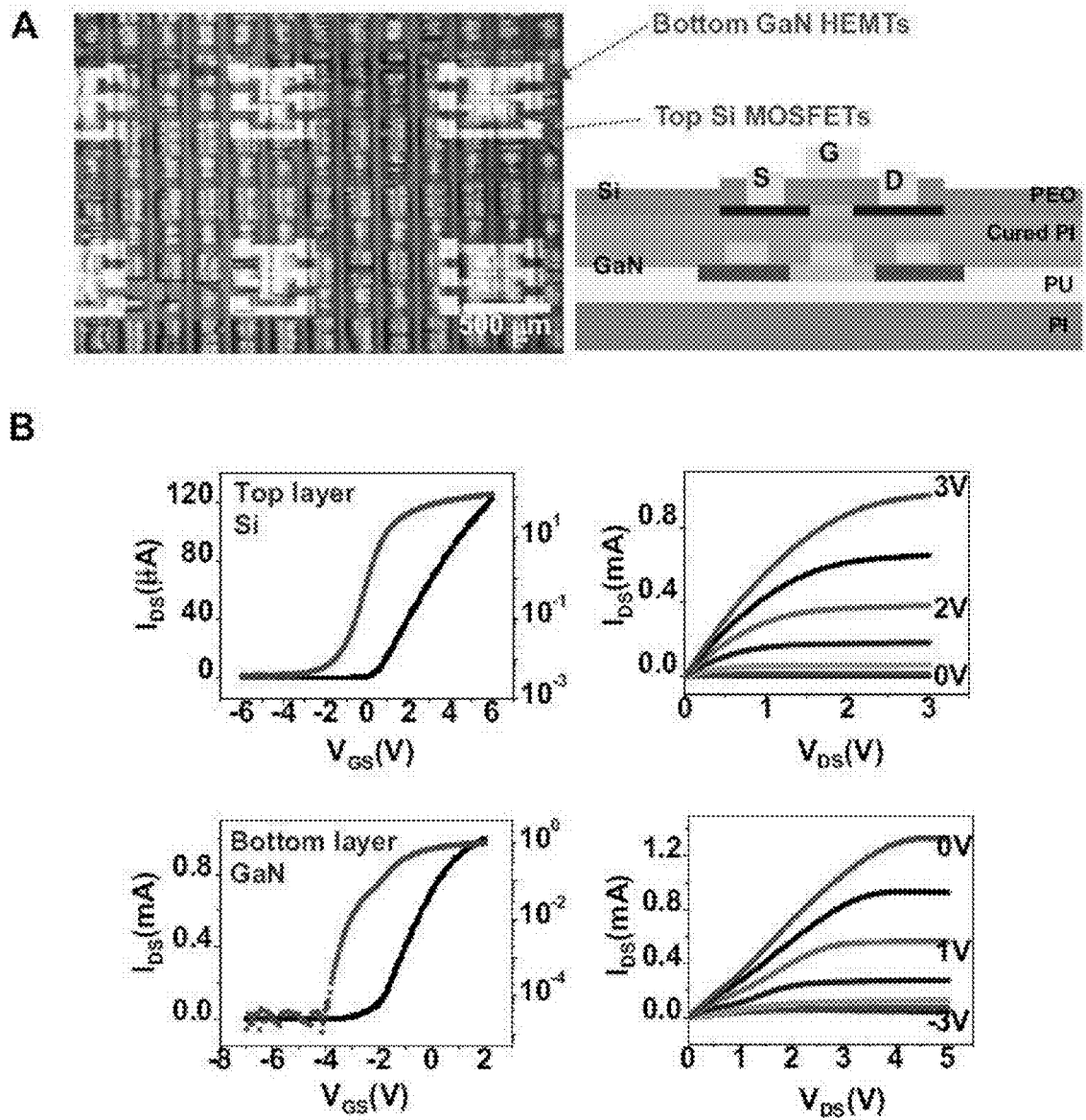

FIG. 62 (A) Optical micrographs of three dimensional, heterogeneously integrated arrays of Si MOSFETs and GaN HEMTs on a polyimide substrate. The right inset shows a cross sectional schematic view. The electrodes (gold), SiO$_2$ (PEO; purple), Si (light blue: undoped; dark blue: doped), GaN (dark green: ohmic contacts; light green: channel), polyimide (PI; brown) and polyurethane (PU; tan) are all shown. (B) Current-voltage characteristics of a typical Si MOSFET (channel length and width of 19 and 200 µm, respectively) and a GaN HEMT with (channel length, widths and gate widths of 20, 170 µm and 5 µm, respectively). The data for the Si and GaN in the left frames were measured at $V_{dd}$=0.1V and $V_{dd}$=2V, respectively.

Figure 63:
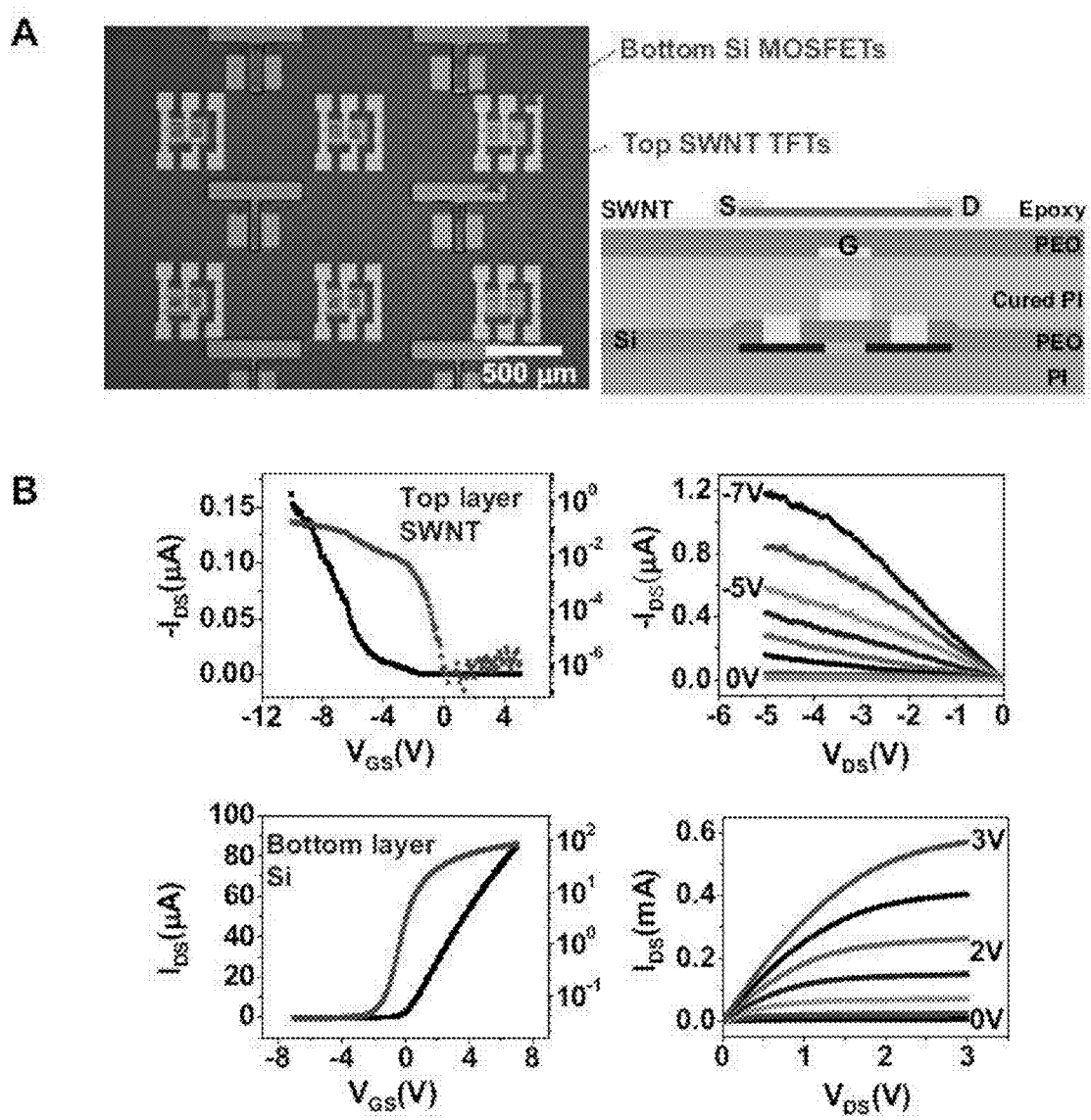

FIG. 63 (A) Optical micrographs of three dimensional, heterogeneously integrated arrays of Si MOSFETs and SWNT TFTs on a polyimide substrate. The right inset shows a cross sectional schematic view. The electrodes (gold), epoxy (cyan), SiO2 (PEO; purple), Si (light blue: undoped; dark blue: doped), SWNTs (grey), polyimide (PI; brown) and cured polyimide (tan) are all shown. (B) Current-voltage characteristics of a typical SWNT TFT (channel length and width of 75 µm and 200 µm, respectively) and a typical Si MOSFET (gate length and channel width 19 µm and 200 µm, respectively). The data for the SWNT and Si in the left frames were measured at $V_{dd}$=−0.5 V and $V_{dd}$=0.1 V, respectively.

Figure 64:
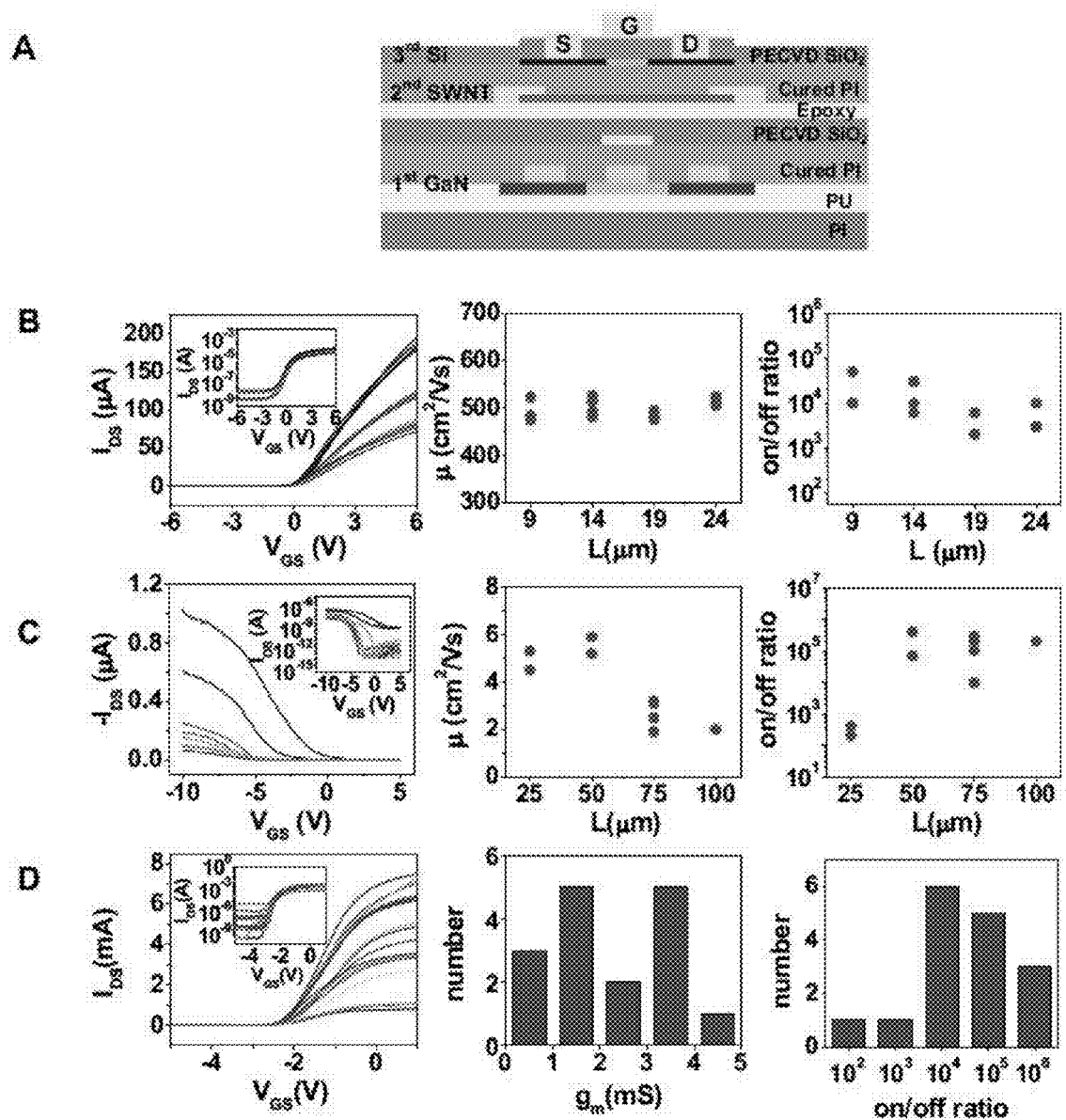

FIG. 64 (A) Cross sectional schematic illustration of three dimensional, heterogeneously integrated arrays of Si MOSFETs, SWNT TFTs and GaN HEMTs on a polyimide substrate. (B) Transfer characteristics, effective mobilities and on/off ratios for several of the Si MOSFETs (channel width=200 µm, black line: channel length=9 µm, red: 14 µm, green: 19 µm, blue: 24 µm), (C) the SWNT TFTs (channel width=200 µm, black line: channel length=25 µm, red: 50 µm, green: 75 µm, blue: 100 µm) and (D) transfer characteristics, transconductances and on/off ratios for GaN HEMTs (channel lengths, widths and gate widths of 20 µm, 170 µm and 5 µm, respectively).

Figure 65:
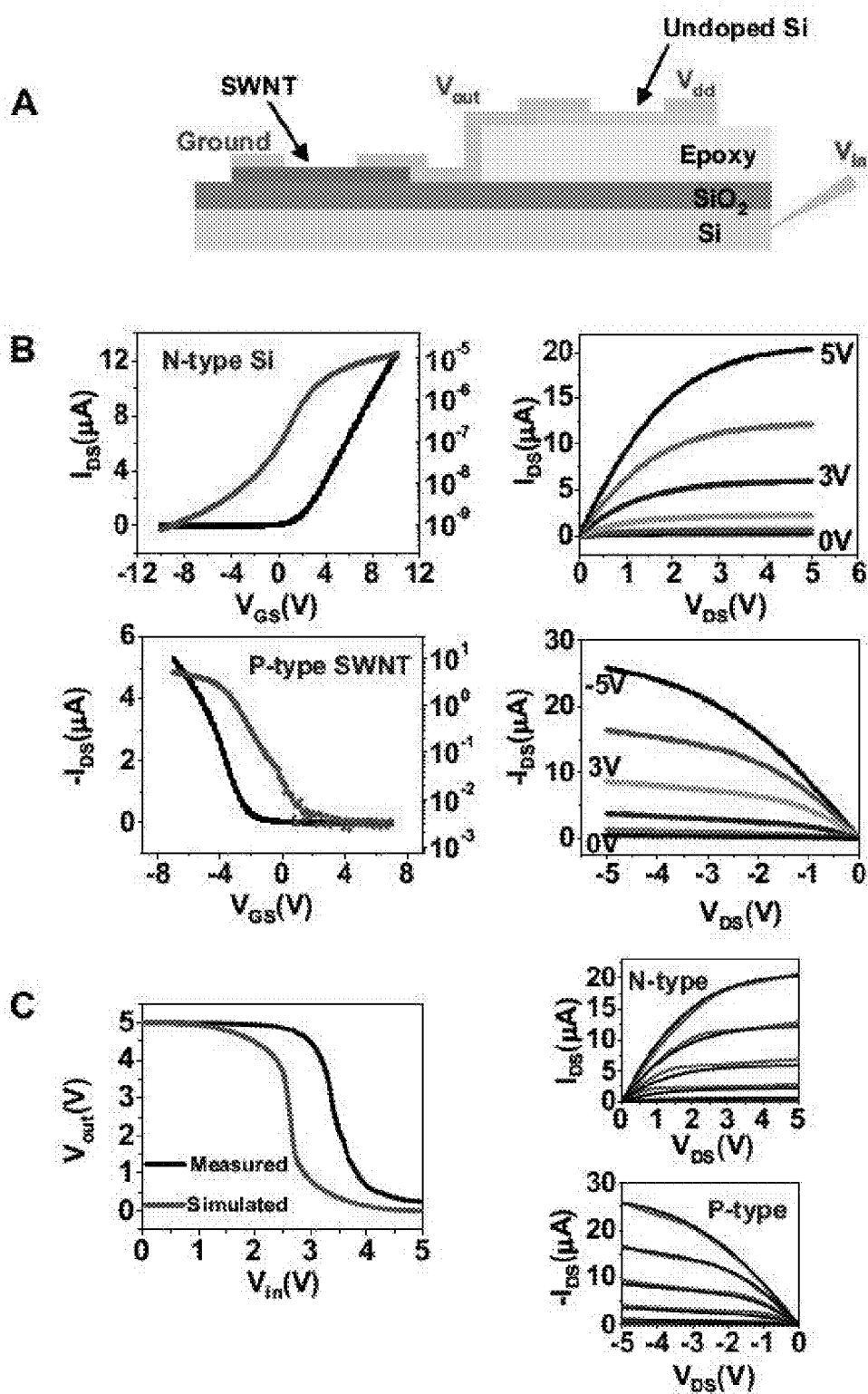

FIG. 65 (A) Schematic structure of the cross section of SWNT-Si CMOS inverter built on a silicon wafer substrate. (B) Transfer and I-V characteristics of n-channel Si MOSFET and p-channel SWNT TFT forming CMOS inverter. (C) Calculated transfer characteristics of inverter and I-V characteristics of Si and SWNT transistors.

Figure 66:
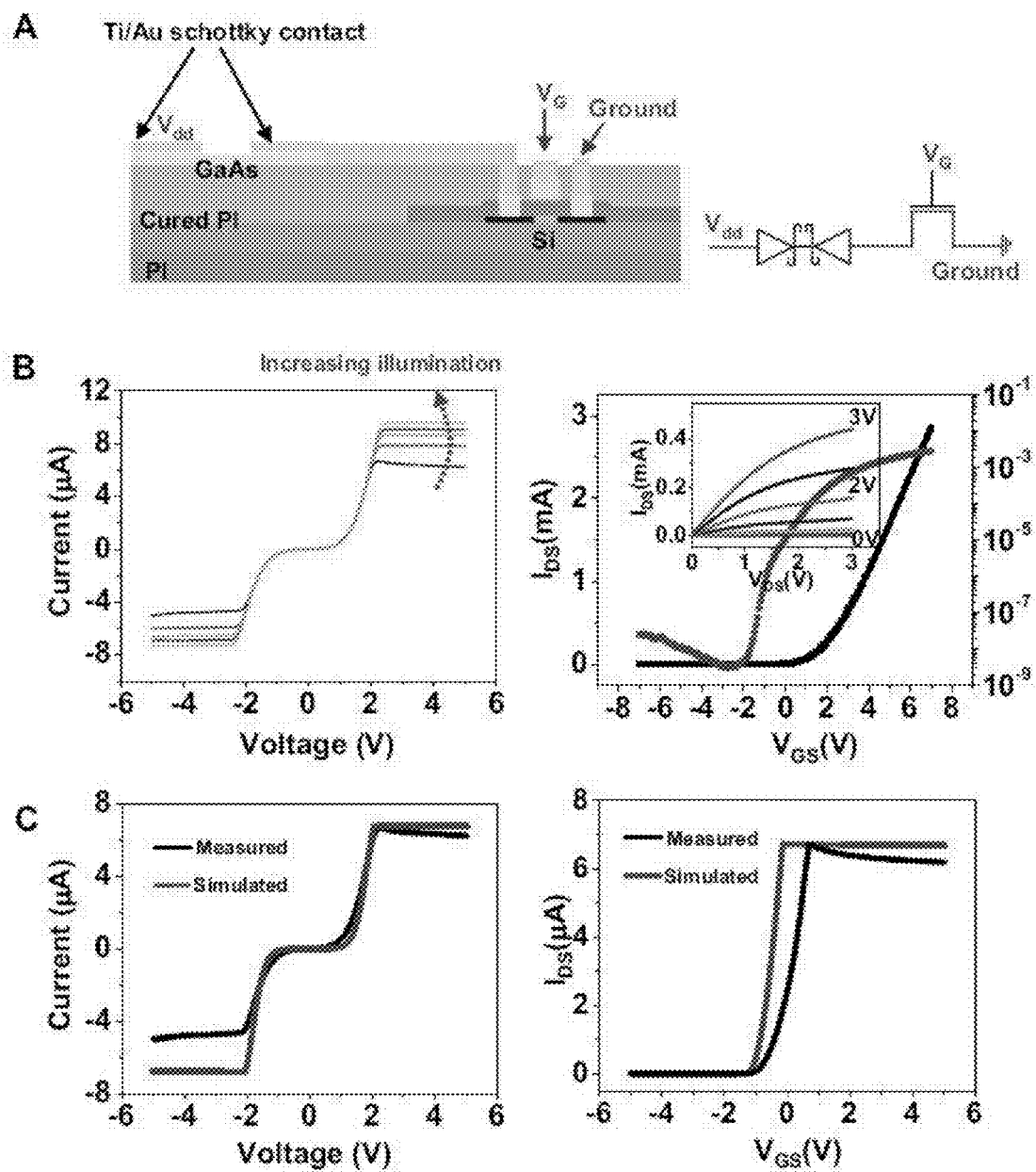

FIG. 66 (A) Schematic structure of the cross section and circuit schematic of GaAs MSM-Si MOSFET IR detector built on a polyimide substrate. (B) Current-Voltage characteristic of GaAs MSM IR detector (L=10 µm, W=100 µm) and transfer and I-V characteristics of Si MOSFET (L 9 µm, W===200 µm) with a 3V supply. (C) Calculated IV characteristic of GaAs MSM and I-V response of a GaAs MSM integrated with a Si MOSFET with a 3V supply.

Figure 67A:
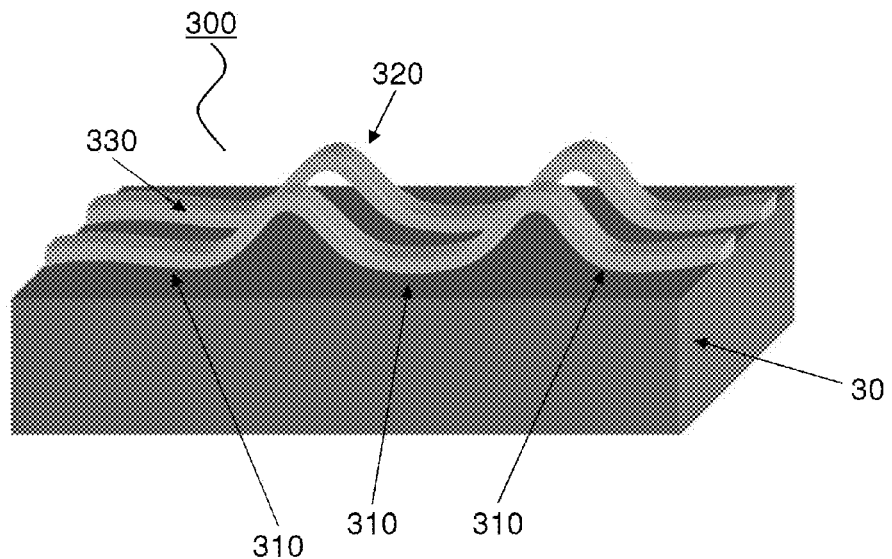
Figure 67B:
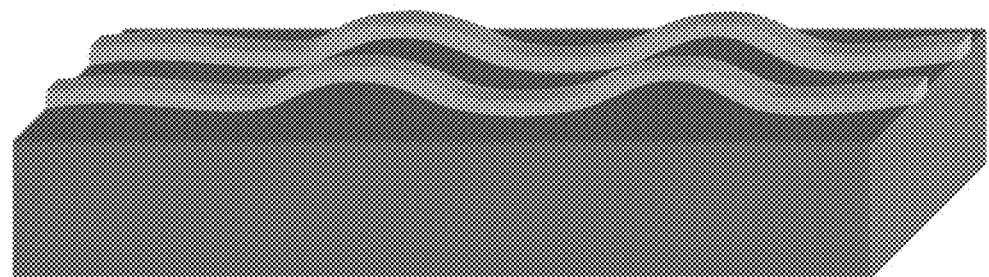

FIGS. 67A and 67B schematically illustrates an optical device (waveguide array) produced via the controlled buckling of an optical microstructure partially adhered to a deformable substrate.

Figure 68:
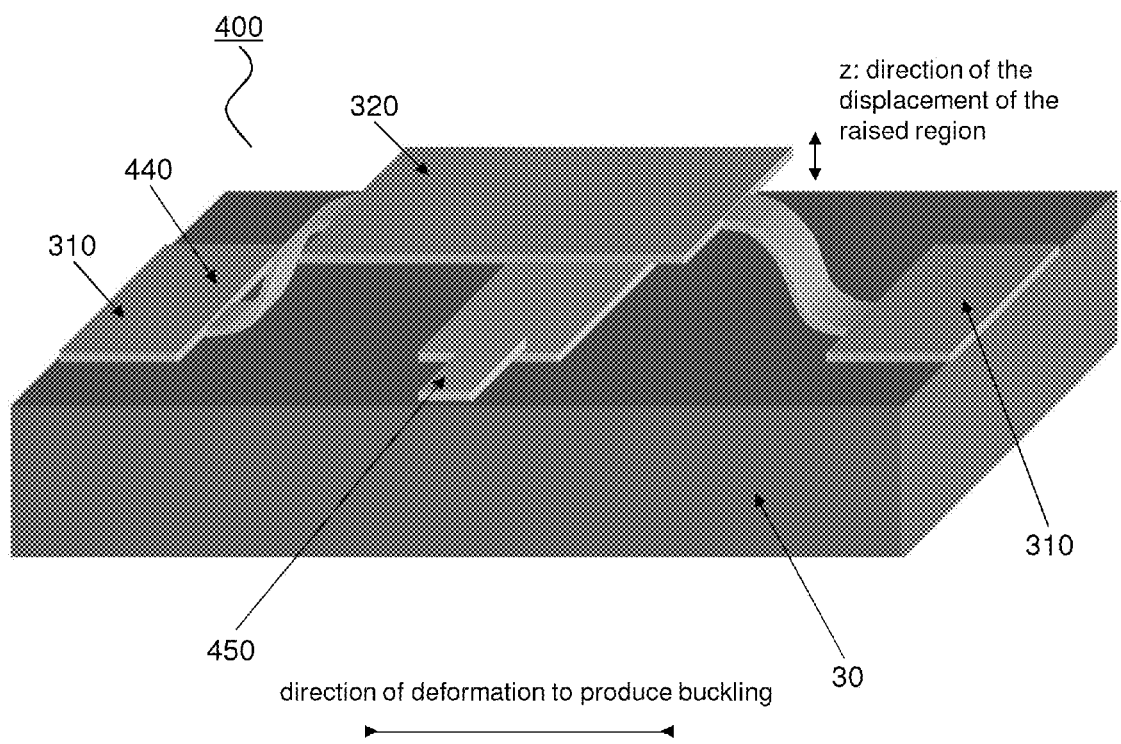

FIG. 68 schematically illustrates a mechanical device (e.g., accelerometer/pressure sensor) produced via the controlled buckling of a conductive microstructure partially adhered to a deformable substrate.

Figure 69:
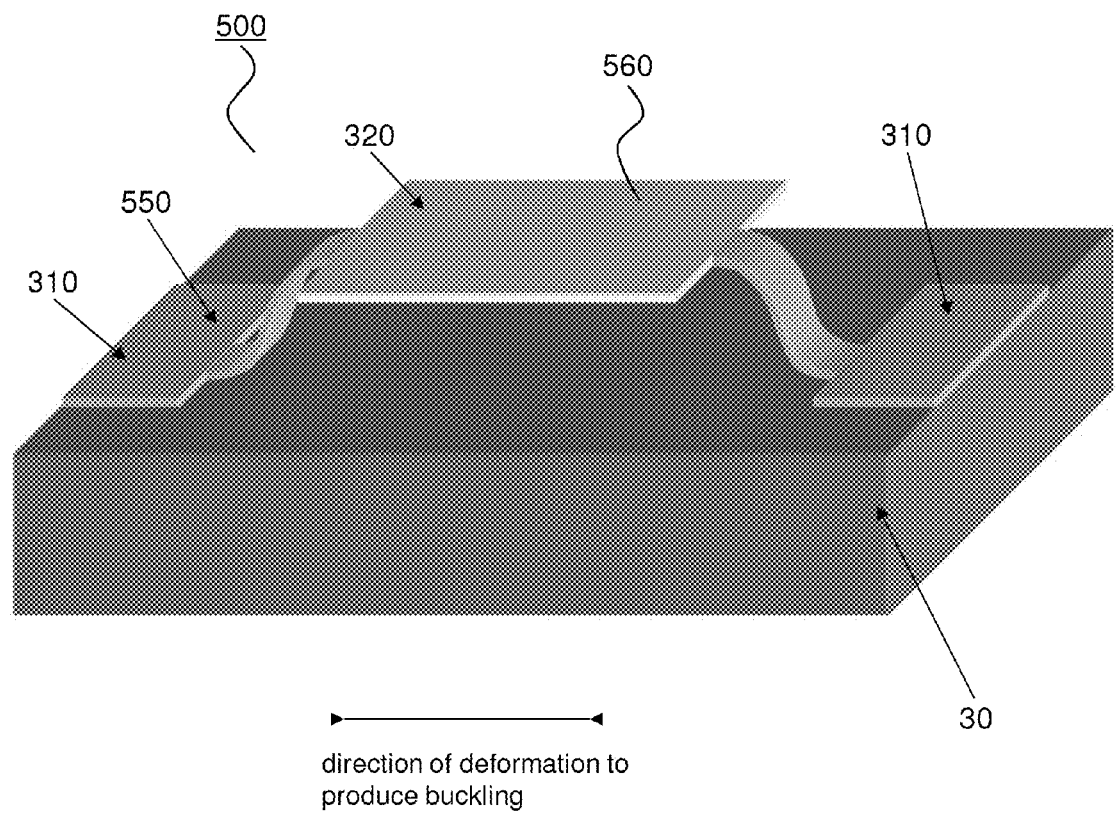

FIG. 69 schematically illustrates a thermal device (microbolometer) produced via the controlled buckling of a thermoresistive microstructure partially adhered to a deformable substrate.

DETAILED DESCRIPTION OF THE INVENTION

"Stretchable" refers to the ability of a material, structure, device or device component to be strained without undergoing fracture. In an exemplary embodiment, a stretchable material, structure, device or device component may undergo strain larger than about 0.5% without fracturing, preferably for some applications strain larger than about 1% without fracturing and more preferably for some applications strain larger than about 3% without fracturing.

A "component" is used broadly to refer to a material or individual component used in a device. An "interconnect" is one example of a component and refers to an electrically conducting material capable of establishing an electrical connection with a component or between components. In particular, the interconnect may establish electrical contact between components that are separate and/or can move with respect to each other. Depending on the desired device specifications, operation, and application, the interconnect is made from a suitable material. For applications where a high conductivity is required, typical interconnect metals may be used, including but not limited to copper, silver, gold, aluminum and the like, alloys. Suitable conductive materials may include a semiconductor like silicon, indium tin oxide, or GaAs.

"Semiconductor" refers to any material that is an insulator at a very low temperature, but which has a appreciable electrical conductivity at a temperatures of about 300 Kelvin. In the present description, use of the term semiconductor is intended to be consistent with use of this term in the art of microelectronics and electronic devices. Semiconductors useful in the present invention may comprise element semiconductors, such as silicon, germanium and diamond, and compound semiconductors, such as group IV compound semiconductors such as SiC and SiGe, group III-V semiconductors such as AlSb, AlAs, Aln, AlP, BN, GaSb, GaAs, GaN, GaP, InSb, InAs, InN, and InP, group III-V ternary semiconductors alloys such as $Al_xGa_{1-x}As$, group II-VI semiconductors such as CsSe, CdS, CdTe, ZnO, ZnSe, ZnS, and ZnTe, group I-VII semiconductors CuCl, group IV-VI semiconductors such as PbS, PbTe and SnS, layer semiconductors such as $PbI_2$, $MoS_2$ and GaSe, oxide semiconductors such as CuO and $Cu_2O$. The term semiconductor includes intrinsic semiconductors and extrinsic semiconductors that are doped with one or more selected materials, including semiconductor having p-type doping materials and n-type doping materials, to provide beneficial electronic properties useful for a given application or device. The term semiconductor includes composite materials comprising a mixture of semiconductors and/or dopants. Specific semiconductor materials useful for in some applications of the present invention include, but are not limited to, Si, Ge, SiC, AlP, AlAs, AlSb, GaN, GaP, GaAs, GaSb, InP, InAs, GaSb, InP, InAs, InSb, ZnO, ZnSe, ZnTe, CdS, CdSe, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, and GaInAsP. Porous silicon semiconductor materials are useful for applications of the present invention in the field of sensors and light emitting materials, such as light emitting diodes (LEDs) and solid state lasers. Impurities of semiconductor materials are atoms, elements, ions and/or molecules other than the semiconductor material(s) themselves or any dopants provided to the semiconductor material. Impurities are undesirable materials present in semiconductor materials which may negatively impact the electronic properties of semiconductor materials, and include but are not limited to oxygen, carbon, and metals including heavy metals. Heavy metal impurities include, but are not limited to, the group of elements between copper and lead on the periodic table, calcium, sodium, and all ions, compounds and/or complexes thereof.

"Semiconductor element" and "semiconductor structure" are used synonymously in the present description and broadly refer to any semiconductor material, composition or structure, and expressly includes high quality single crystalline and polycrystalline semiconductors, semiconductor materials fabricated via high temperature processing, doped semiconductor materials, organic and inorganic semiconductors and composite semiconductor materials and structures having one or more additional semiconductor components and/or non-semiconductor components, such as dielectric layers or materials and/or conducting layers or materials An interconnect that is "stretchable" is used herein to broadly refer to an interconnect capable of undergoing a variety of forces and strains such as stretching, bending and/or compression in one or more directions without adversely impacting electrical connection to, or electrical conduction from, a device component. Accordingly, a stretchable interconnect may be formed of a relatively brittle material, such as GaAs, yet remain capable of continued function even when exposed to a significant deformatory force (e.g., stretching, bending, compression) due to the interconnect's geometrical configuration. In an exemplary embodiment, a stretchable interconnect may undergo strain larger than about 1%, 10% or about 30% without fracturing. In an example, the strain is generated by stretching an underlying elastomeric substrate to which at least a portion of the interconnect is bonded.

A "device component" is used to broadly refer to an individual component within an electrical, optical, mechanical or thermal device. Component can be one or more of a photodiode, LED, TFT, electrode, semiconductor, other light-collecting/detecting components, transistor, integrated circuit, contact pad capable of receiving a device component, thin film devices, circuit elements, control elements, microprocessors, transducers and combinations thereof. A device component can be connected to one or more contact pads as known in the art, such as metal evaporation, wire bonding, application of solids or conductive pastes, for example. Electrical device generally refers to a device incorporating a plurality of device components, and includes large area electronics, printed wire boards, integrated circuits, device components arrays, biological and/or chemical sensors, physical sensors (e.g., temperature, light, radiation, etc.), solar cell or photovoltaic arrays, display arrays, optical collectors, systems and displays.

"Substrate" refers to a material having a surface that is capable of supporting a component, including a device component or an interconnect. An interconnect that is "bonded" to the substrate refers to a portion of the interconnect in physical contact with the substrate and unable to substantially move relative to the substrate surface to which it is bonded. Unbonded portions, in contrast, are capable of substantial movement relative to the substrate. The unbonded portion of the interconnect generally corresponds to that portion having a "bent configuration," such as by strain-induced interconnect bending.

A component in "conformal contact" with a substrate refers to a component that covers a substrate and retains a three-dimensional relief feature whose pattern is governed by the pattern of relief features on the substrate.

In the context of this description, a "bent configuration" refers to a structure having a curved conformation resulting from the application of a force. Bent structures in the present invention may have one or more folded regions, convex regions, concave regions, and any combinations thereof. Bent structures useful in the present invention, for example, may be provided in a coiled conformation, a wrinkled conformation, a buckled conformation and/or a wavy (i.e., wave-shaped) configuration.

Bent structures, such as stretchable bent interconnects, may be bonded to a flexible substrate, such as a polymer and/or elastic substrate, in a conformation wherein the bent structure is under strain. In some embodiments, the bent structure, such as a bent ribbon structure, is under a strain equal to or less than about 30%, a strain equal to or less than about 10%, a strain equal to or less than about 5% and a strain equal to or less than about 1% in embodiments preferred for some applications. In some embodiments, the bent structure, such as a bent ribbon structure, is under a strain selected from the range of about 0.5% to about 30%, a strain selected from the range of about 0.5% to about 10%, a strain selected from the range of about 0.5% to about 5%. Alternatively, the stretchable bent interconnects may be bonded to a substrate that is a substrate of a device component, including a substrate that is itself not flexible. The substrate itself may be planar, substantially planar, curved, have sharp edges, or any combination thereof. Stretchable bent interconnects are available for transferring to any one or more of these complex substrate surface shapes.

"Thermal contact" refers to the ability of two materials that are capable of substantial heat transfer from the higher temperature material to the lower temperature material, such as by conduction. Bent structures resting on a substrate are of particular use in providing regions that are in thermal contact (e.g., bond regions) with the substrate and other regions that are not in thermal contact (e.g., regions that are insulated and/or physically separated from the substrate).

Interconnects can have any number of geometries or shape, so long as the geometry or shape facilitates interconnect bending or stretching without breakage. A general interconnect geometry can be described as "buckled" or "wavy." In an aspect, that geometry can be obtained by exerting a force (e.g., a strain) on the interconnect by exerting a force on an underlying deformable substrate, such that a change in a dimension of the underlying substrate generates buckles or waves in the interconnect because portions of the interconnect are bonded to the substrate, and regions between the bound portions are not bonded. Accordingly, an individual interconnect may be defined by ends that are bonded to a substrate, and a curved central portion between the ends that is not substrate-bonded. "Curved" or "buckled" refers to relatively complex shapes, such as by an interconnect having one or more additional bond regions in the central portion. "Arc-shaped" refers to a generally sinusoidal shape having an amplitude, where the amplitude corresponds to the maximum separation distance between the interconnect and the substrate surface.

The interconnect can have any cross-sectional shape. One shape interconnect is a ribbon-shaped interconnect. "Ribbon" refers to a substantially rectangular-shaped cross-section having a thickness and a width. Specific dimensions depend on the desired conductivity through the interconnect, the composition of the interconnect and the number of interconnects electrically connecting adjacent device components. For example, an interconnect in a bridge configuration connecting adjacent components may have different dimensions than a single interconnect connecting adjacent components. Accordingly, the dimensions may be of any suitable values, so long as a suitable electrical conductivity is generated, such as widths that are between about 10 µm and 1 cm and thickness between about 50 nm to 1, or a width to thickness ratio ranging from between about 0.001 and 0.1, or a ratio that is about 0.01.

"Elastomeric" refers to a polymeric material which can be stretched or deformed and return, at least partially, to its original shape without substantial permanent deformation. Elastomeric substrates commonly undergo substantially elastic deformations. Exemplary elastomeric substrates useful in the present include, but are not limited to, elastomers and composite materials or mixtures of elastomers, and polymers and copolymers exhibiting elasticity. In some methods, the elastomeric substrate is prestrained via a mechanism providing for expansion of the elastic substrate along one or more principle axes. For example, prestraining may be provided by expanding the elastic substrate along a first axes, including expansion in a radial direction to transform a hemispherical surface to a flat surface. Alternatively, the elastic substrate may be expanded along a plurality of axes, for example via expansion along first and second axis orthogonally positioned relative to each other. Means of prestraining elastic substrates via mechanisms providing expansion of the elastic substrate include bending, rolling, flexing, flattening, expanding or otherwise deforming the elastic substrate. The prestraining means also includes prestraining provided by raising the temperature of the elastic substrate, thereby providing for thermal expansion of the elastic substrate. Elastomers useful in the present invention may include, but are not limited to, thermoplastic elastomers, styrenic materials, olefenic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones.

Strain is defined as: $\in = \Delta L / L$ for lengths changed from L (at rest) to L+$\Delta$L (under an applied force), where $\Delta$L is the displacement distance from resting. Axial strain refers to a force applied to an axis of the substrate to generate the displacement $\Delta$L. Strain is also generated by forces applied in other directions, such as a bending force, a compressive force, a shearing force, and any combination thereof. Strain or compression may also be generated by stretching a curved surface to a flat surface, or vice versa. "Level of strain" refers to the magnitude of the strain and can range from negative (corresponding to compression) to zero (relaxed state) to positive (corresponding to elongation or stretching).

"Young's modulus" is a mechanical property of a material, device or layer which refers to the ratio of stress to strain for a given substance. Young's modulus may be provided by the expression;

$$E = \frac{(\text{stress})}{(\text{strain})} = \left(\frac{L_0}{\Delta L} \times \frac{F}{A}\right); \quad (II)$$

wherein E is Young's modulus, $L_0$ is the equilibrium length, $\Delta$L is the length change under the applied stress, F is the force applied and A is the area over which the force is applied. Young's modulus may also be expressed in terms of Lame constants via the equation:

$$E = \frac{\mu(3\lambda + 2\mu)}{\lambda + \mu}; \quad (III)$$

wherein $\lambda$ and $\mu$ are Lame constants. High Young's modulus (or "high modulus") and low Young's modulus (or "low modulus") are relative descriptors of the magnitude of Young's modulus in a give material, layer or device. In the present invention, a high Young's modulus is larger than a low Young's modulus, preferably about 10 times larger for some applications, more preferably about 100 times larger for other applications and even more preferably about 1000 times larger for yet other applications. Complex surface shapes are obtained by polymerizing an elastomer having a spatially-varying Young's modulus and/or by layering an elastomer with multiple layers in various locations having different elasticity.

Compression is used herein in a manner similar to the strain, but specifically refers to a force that acts to decrease a characteristic length, or a volume, of a substrate, such that $\Delta L < 0$.

"Fracturing" or "fracture" refers to a physical break in the interconnect, such that the interconnect is not capable of substantial electrical conductivity.

A "pattern of bond sites" refers to spatial application of bonding means to a supporting substrate surface and/or to the interconnects so that a supported interconnect has bond regions and non-bond regions with the substrate. For example, an interconnect that is bonded to the substrate at its ends and not bonded in a central portion. Further shape control is possible by providing an additional bond site within a central portion, so that the not-bonded region is divided into two distinct central portions. Bonding means can include adhesives, adhesive precursors, welds, photolithography, photocurable polymer. In general, bond sites can be patterned by a variety of techniques, and may be described in terms of surface-activated ($W_{act}$) areas capable of providing strong adhesive forces between substrate and feature (e.g., interconnect) and surface-inactive ($W_{in}$) where the adhesive forces are relatively weak. A substrate that is adhesively patterned in lines may be described in terms of $W_{act}$ and $W_{in}$ dimensions. Those variables, along with the magnitude of prestrain, $\in_{pre}$ affect interconnect geometry.

"Spatial variation" refers to a parameter that has magnitude that varies over a surface, and is particularly useful for providing two-dimensional control of component relief features, thereby providing spatial control over the bendability of a device or device component.

"Carbon nanomaterial" refers to a class of structures comprising carbon atoms and having at least one dimension that is between one nanometer and one micron. In an embodiment, at least one dimension of the carbon nanomaterial is between 2 nm and 1000 nm. Carbon nanomaterials include allotropes of carbon such as single walled nanotubes (SWNTs), multi-walled nanotubes (MWNTs), nanorods, single walled and/or multiwalled fullerenes, graphite, graphene, carbon fibers, carbon films, carbon whiskers, and diamond, and all derivatives thereof.

"Spatial aligned" refers to positions and/or orientations of two or more structures that are defined with respect to each other. Spatially aligned structures may have positions and/or orientations that are preselected with respect to each other, for example, preselected to within 1 micron, preferably for some applications to within 500 nanometers, and more preferably for some applications to within 50 nanometers.

"Heterogeneous semiconductor elements" are multicomponent structures comprising a semiconductor in combination with one or more other materials or structures. Other materials and structures in the context of this description may comprise elements, molecules and complexes, aggregates and particles thereof, that are different from the semiconductor in which they are combined, such as materials and/or structures having a different chemical compositions and/or physical states (e.g. crystalline, semicrystalline or amorphous states). Useful heterogeneous semiconductor elements in this aspect of the invention include an inorganic semiconductor structure in combination with other semiconductor materials, including doped semiconductors (e.g., N-type and P-type dopants) and carbon nanomaterials or films thereof, dielectric materials and/or structures, and conducting materials and/or structures. Heterogeneous semiconductor elements of the present invention include structures having spatial homogeneous compositions, such as uniformly doped semiconductor structures, and include structures having spatial inhomogeneous compositions, such as semiconductor structures having dopants with concentrations that vary spatially in one, two or three dimensions (i.e. a spatially inhomogeneous dopant distribution in the semiconductor element).

The invention may be further understood by the following non-limiting examples. All references cited herein are hereby incorporated by reference to the extent not inconsistent with the disclosure herewith. Although the description herein contains many specificities, these should not be construed as limiting the scope of the invention but as merely providing illustrations of some of the presently preferred embodiments of the invention. The scope of the invention should, therefore, be determined by the appended claims and their equivalents, rather than by the examples given.

Figure 1A:
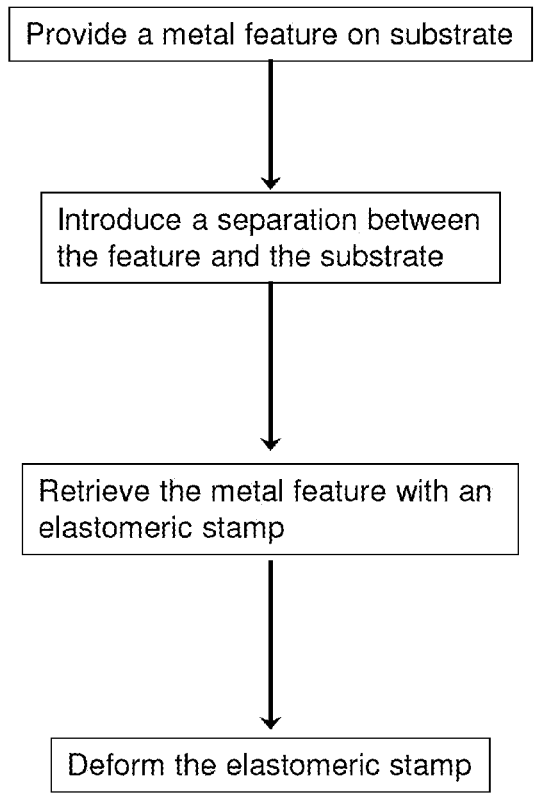
FIG. 1 summarizes one method for making a wavy or buckled stretchable metal interconnect. A is a flow-chart summary and B illustrates the flow-chart steps.
Figure 1B:
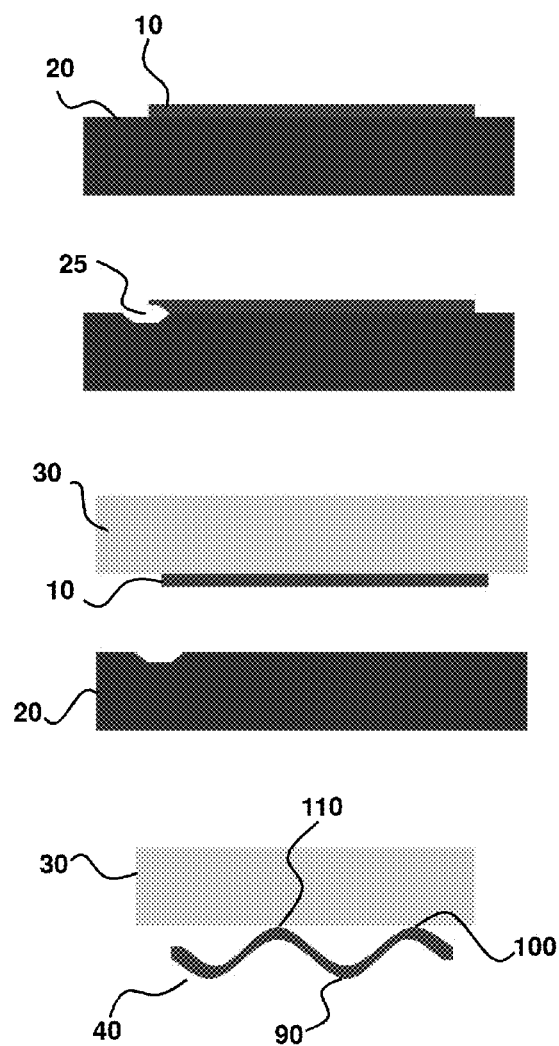

One method for making buckled or wavy interconnects is generally summarized in FIG. 1. A metal feature 10 (such as a metal feature that will be an interconnect) is provided on a substrate 20. The contacting metal feature and/or substrate surfaces are optionally treated for reduced adhesion such as by photolithography or with a shadowmask. A separation (crack) 25 is introduced between the feature 10 and the substrate 20 such as by micromachining, etching and/or mechanical scribing. The metal feature 10 is retrieved with a compliant elastomer stamp 30. Subsequent deformation of the stamp 30 generates in the metal feature 10 a wavy or buckled geometry 40. Generation of the buckles is provided by stamp 30 that is under strain when the metal feature 10 is retrieved and subsequently releasing the applied tension, or by compressing stamp 30 after the metal feature is retrieved.

Figure 2:
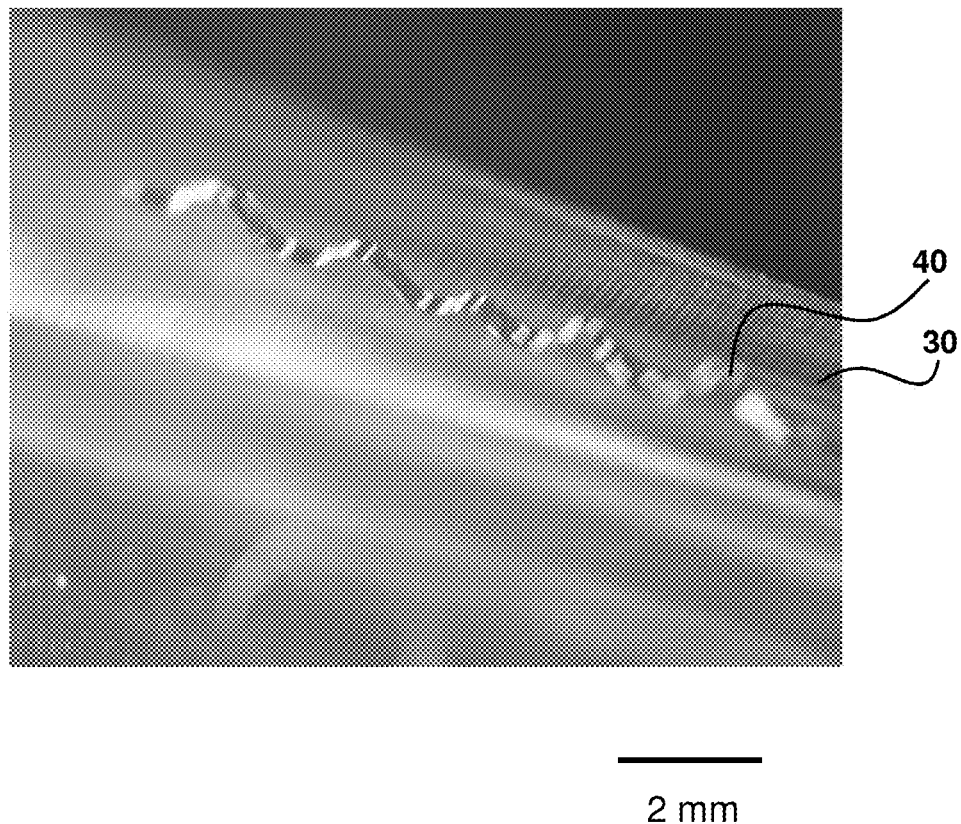
FIG. 2 is a photograph of a stretchable wavy/buckled electrical interconnect, formed by retrieval from a rigid substrate onto a pre-strained, stretchable PDMS rubber substrate followed by the release of the strain to induce buckling.

One example of a buckled or wavy metal feature generated by the method summarized in FIG. 1 is shown in FIG. 2. FIG. 2 is a photograph of a stretchable wavy/buckled electrical interconnect 40, formed by retrieval from a rigid substrate onto a pre-strained, stretchable PDMS rubber substrate 30, followed by release of the strain, thereby inducing buckling.

Figure 3A:
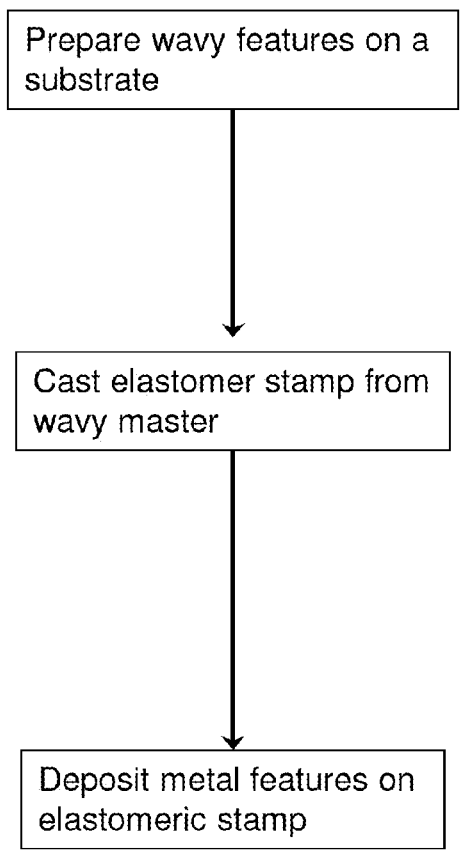
FIGS. 3A and 3B summarize one method of fabrication of wavy stretchable electrodes by deposition on a wavy-structured elastomer substrate.
Figure 3B:
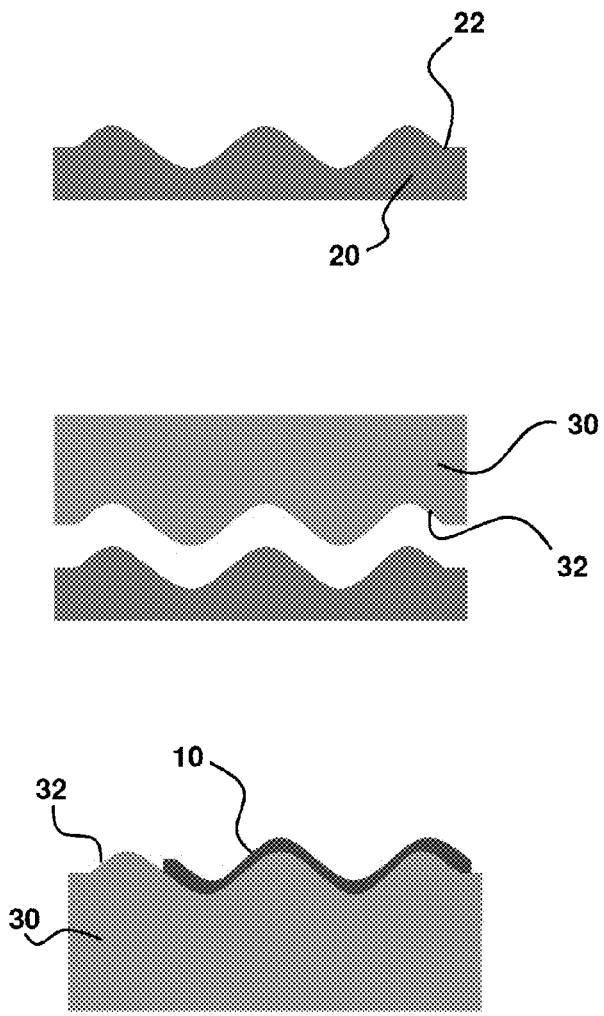

A method for generating wavy stretchable electrodes and/or interconnects is provided in FIG. 3. As shown in FIG. 3A, wavy features 22 are prepared on a substrate 20, such as by micromachining processes, for example. The substrate 20 with a surface having wavy features 22 serves as a master for molding elastomer stamps 30 with a corresponding wavy surface 32. Metal features 10 are deposited on the wavy surface 32, such as by evaporation through a shadow mask and/or electrodeposition.

FIG. 4 provides one method for fabricating a smooth wavy elastomer substrate. Anisotropic Si (1 0 0) etching provides a substrate 20 having sharp-edges 24 (FIG. 4B—top panel). Spin PR smooths the sharp-edged valleys by depositing PR 26 in the sharp-edged valleys 24 of substrate 20. An elastomeric stamp 34 is cast against substrate 20. Stamp 34 has sharp-edged recess features. A second elastomeric stamp 36 is cast on stamp 34 to generate a stamp having sharp-edged peaks. Stamp 36 is embossed with Su-8 50 and cured as appropriate. Spin PR 26 smooths the sharp-edged valleys of 50. Elastomeric substrate 30 is cast against the 50 having smooth valleys. Substrate 30 is removed to reveal a wavy and smooth surface 32.

FIG. 54 summarizes one method of fabrication of wavy stretchable electrodes by deposition on a wavy master, followed by casting a stamp on that master, curing the stamp, and thereby transferring the electrodes to the master upon release. FIG. 55 shows images of stretchable metal electrodes (Au, 300 nm thick) on wavy PDMS prepared by the methods in FIG. 4 combined with those in FIG. 54. Interface 112 is shown between metal feature 10 and substrate 20. Interface 112 may comprise material that facilitates removal of metal features 10 by stamp 30 illustrated in the bottom panel. Briefly, one method uses: on pre-cleaned 2"×3" glass slides, spin on a thin coating of SU-8 10 so that glass surface is completely covered. Bring slide/SU-8 into contact with PDMS stamp having the desired wavy surface features (smooth valleys and sharp peaks) and gently apply pressure so that all air pockets are removed. Flash cure the stamp/mold structure under a UV lamp for 30 seconds on the front side, flip, and cure for an additional 40 seconds on the reverse side. After cure, bake on hot plate at 65° C. for 5 minutes. After bake, allow sample to cool to room temperature and peel apart SU-8 mold from PDMS master. SU-8 will now have wavy surface relief with sharp edged valleys. To smooth out these valleys, mix one part SU-8 2 with one part SU-8 thinner, and spin on at high RPM for 90 seconds. Expose to UV light for 20 seconds to cure and post bake for 3 minutes at 65° C. Once cool, metal lines or contacts are deposited via electrodeposition, photolithograph and etching/lift-off, and/or evaporation through a shadowmask. Treat the metal on SU-8 with MPTMS for 1 hour and then cast elastomeric substrate against it. When removed, the PDMS has wavy surface relief with smoothed peaks and valleys along with transferred metal structures. FIG. 55 is a photograph of the a wavy stretchable electrode made by the process summarized in FIG. 54, and also provides measured electrical resistance data of the stretchable wavy metal electrodes as a function of applied tensile strain (up to 30%).

Figure 5A:
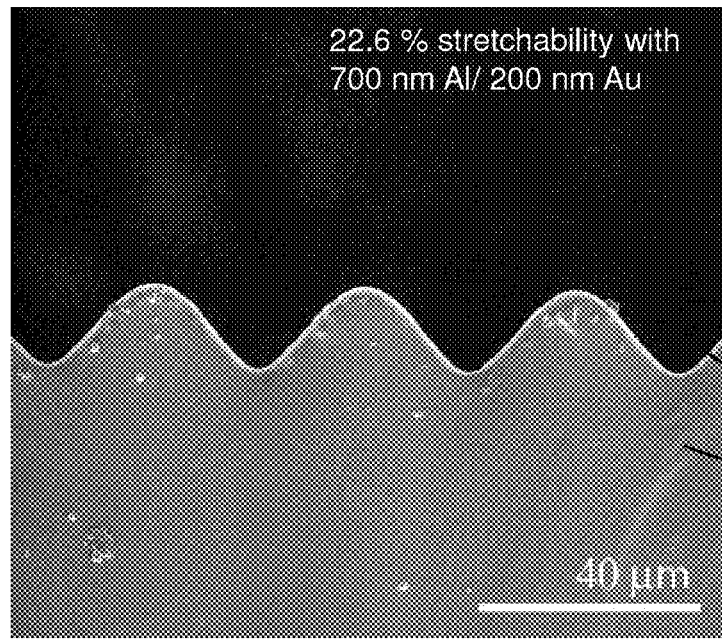
FIG. 5A provides an image of a smoothly wavy PDMS substrate generated by the methods outlined in FIGS. 3-4. The interconnect shown is capable of 22.6 stretchability and has a metal interconnect that is about 900 nm thick (700 nm Al/200 nm Au), a wavelength of about 38 microns and an amplitude (distance from peak to valley) of about 15.6 microns.
Figure 5B:
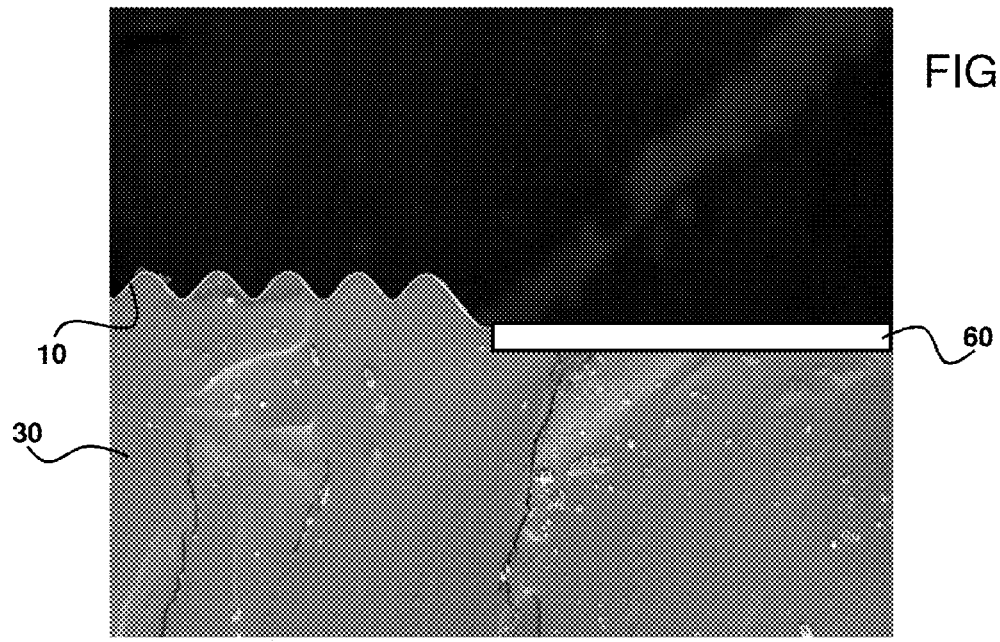
FIG. 5B shows one end of the interconnect for establishing electrical contact with a device component. The device component may be positioned in a flat portion of the substrate.

An example of a smoothly wavy PDMS substrate 30 made by the method summarized in FIG. 4 is provided in FIG. 5. A device component 60 can be supported to wavy substrate 30 in a non-wavy region (e.g., substantially flat portion) and connected to an interconnect 10 as desired.

Figure 6A:
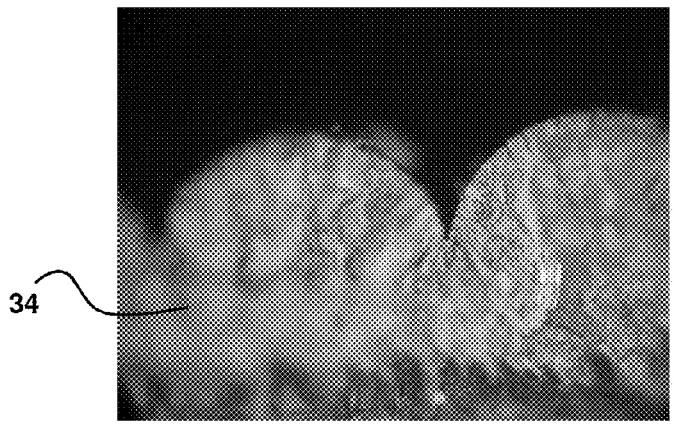
FIG. 6A Commercially available lenticular array (from Edmund Optics) with cusps. B. Spin-coat photocurable epoxy to make smoothly wavy substrate. C. Cast PDMS stamp against substrate from B to generate wavy elastomer stamp with smooth features.
Figure 6B:
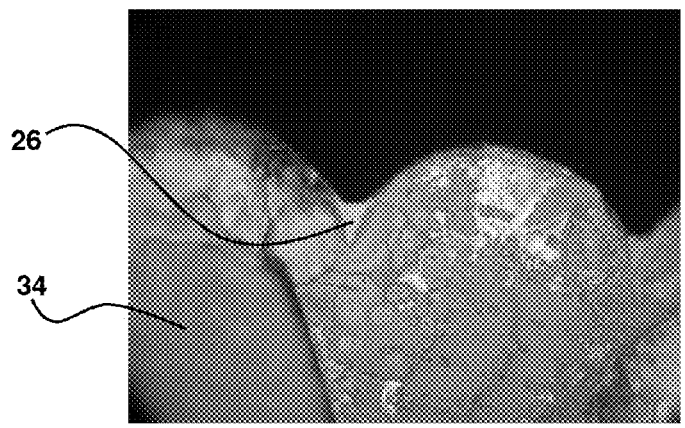
Figure 6C:
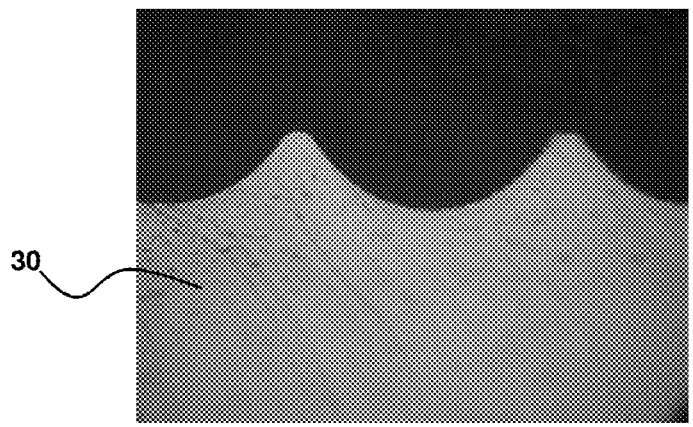

An example of spin coating of a smoothing layer into a sharp-edged valley or recess feature is shown in FIG. 6. A sharp-edged substrate 34 (FIG. 6A) is smoothed by spin-coating a photcurable epoxy 26 to generate a smoothly wavy substrate. An elastomer (e.g., PDMS) stamp 30 having a smoothly wavy surface 32 is obtained by casting a PDMS stamp against the substrate of FIG. 6B and subsequently removing the stamp 30 from the substrate 34.

Figure 7A:
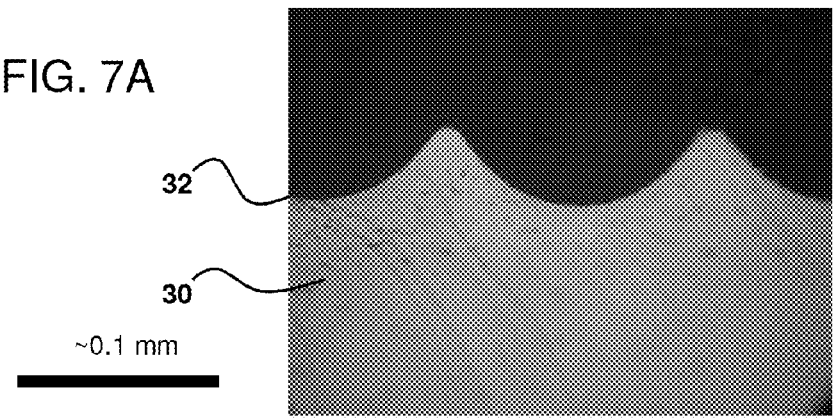
FIG. 7 Stretchable electrodes deposited by evaporation through a shadowmask onto a smoothly wavy elastomer substrate. The electrodes maintain conductivity and connectivity during stretching up to ~10% in tension. The scale bar is about 0.1 mm. A is a cross-section of waviness on an elastomeric substrate. B is a top view micrograph of electrode evaporated onto the wavy elastomer substrate. The focal plane is on the peaks of the wavy relief. C is a top view micrograph of an electrode evaporated onto the wavy elastomer substrate. The focal plane is on the valleys of the wavy relief.
Figure 7B:
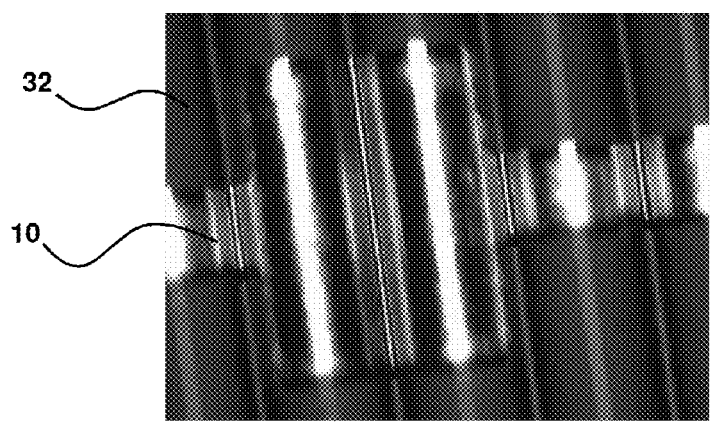
Figure 7C:
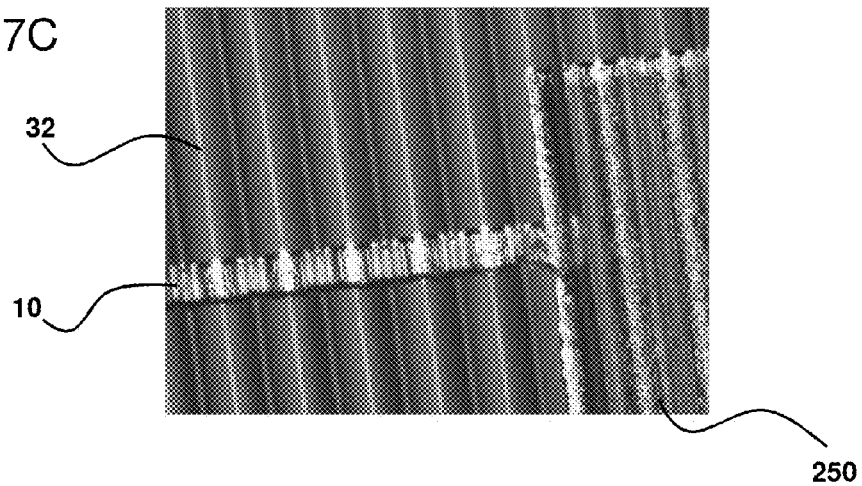

FIG. 7 are photographs of a stretchable electrode. FIG. 7A is a photograph of a cross-section of an elastomer substrate 30 having a wavy surface 32. FIG. 7B is a top view micrograph of an electrode made by evaporating metal 10 on the wavy elastomer substrate surface 32. The image's focal plane is on the peaks of the wavy relief. In FIG. 7C, the focal plane is on the valleys of the wavy relief and the metal interconnect 10 is in electrical contact with the electrode 250. The stretchable electrode is deposited by evaporation through a shadowmask onto a smoothly wavy elastomer substrate. In this example, the electrode 250 maintains conductivity and connectivity via interconnects 10 during stretching up to about 10% in tension.

Figure 8:
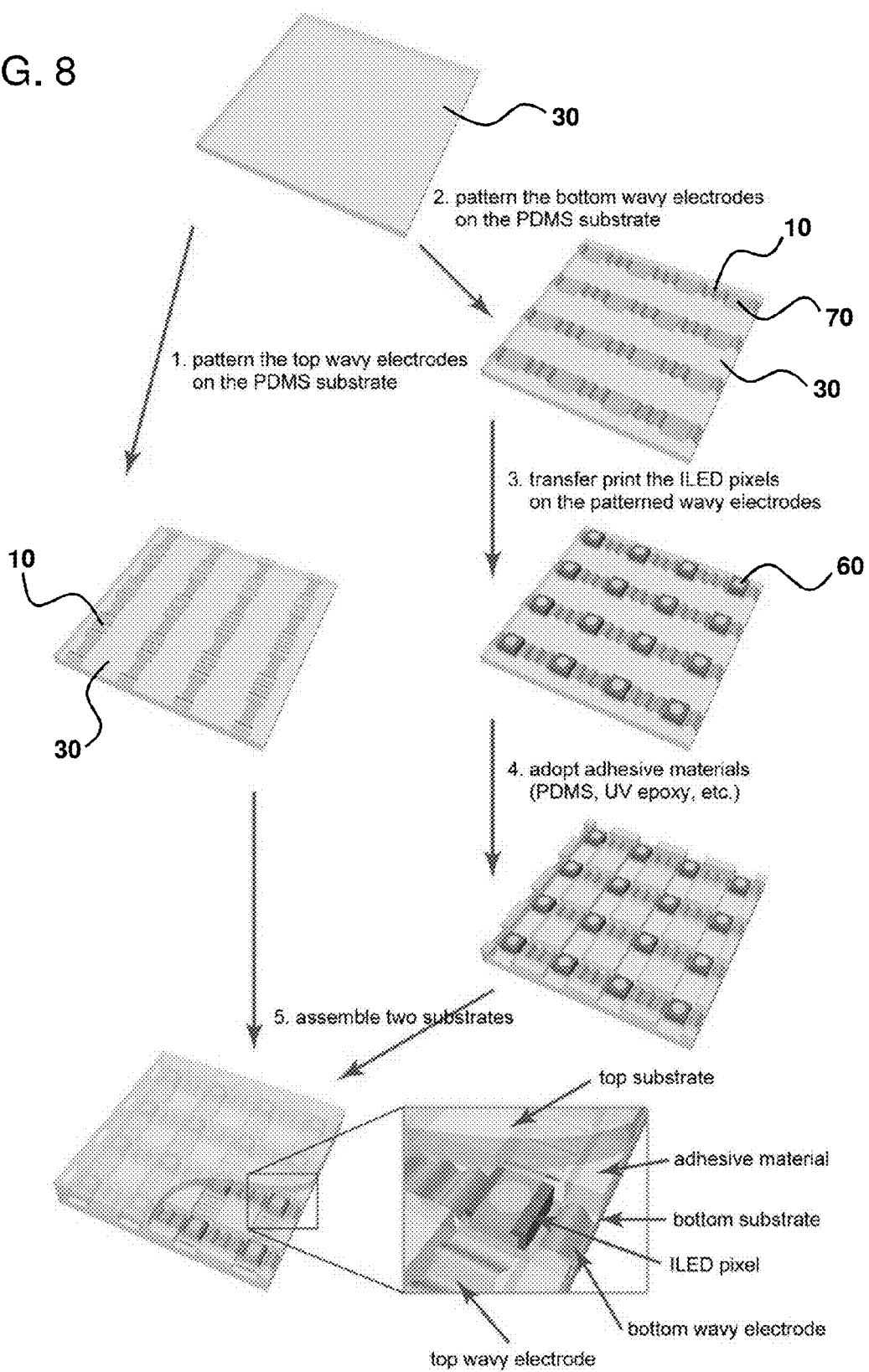
FIG. 8 is a schematic illustration of a process for the fabrication of a stretchable passive matrix LED display using stretchable electrodes.
Figure 9:
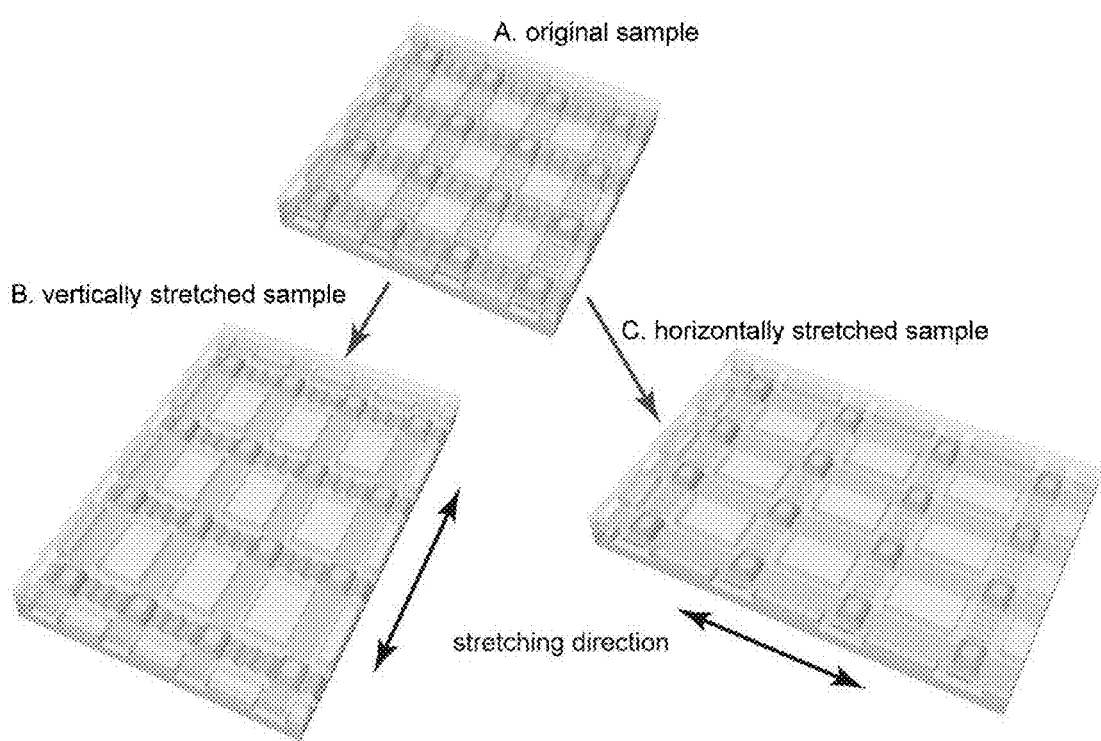
FIG. 9 illustrates the mechanical stretchability of a passive matrix LED display with wavy electrodes.

The methods and devices disclosed herein may be used to fabricate a variety of electronic devices, including for example, a stretchable passive matrix LED display (see FIG. 8). Wavy electrodes (e.g., interconnects 10 and contact pad 70) are patterned on two elastomeric substrates 30. A device component 60 (in this case ILED pixels) are patterned on the wavy electrodes at contact pad 70 by transfer printing. The two substrates 30 are accordingly assembled such that the interconnects 10 run in different orientations (perpendicular, in this example). The 2-D mechanical stretchability of such a passive matrix LED display is illustrated in FIG. 9. In addition to being able to stretch uniaxially and biaxially, the display is capable of substantial bending without breaking. Such multi-axial bending provides the capability of molding electronic devices to curved surfaces to produce curved electronic devices and for incorporation into smart electronic fabrics or displays.

Figure 10:
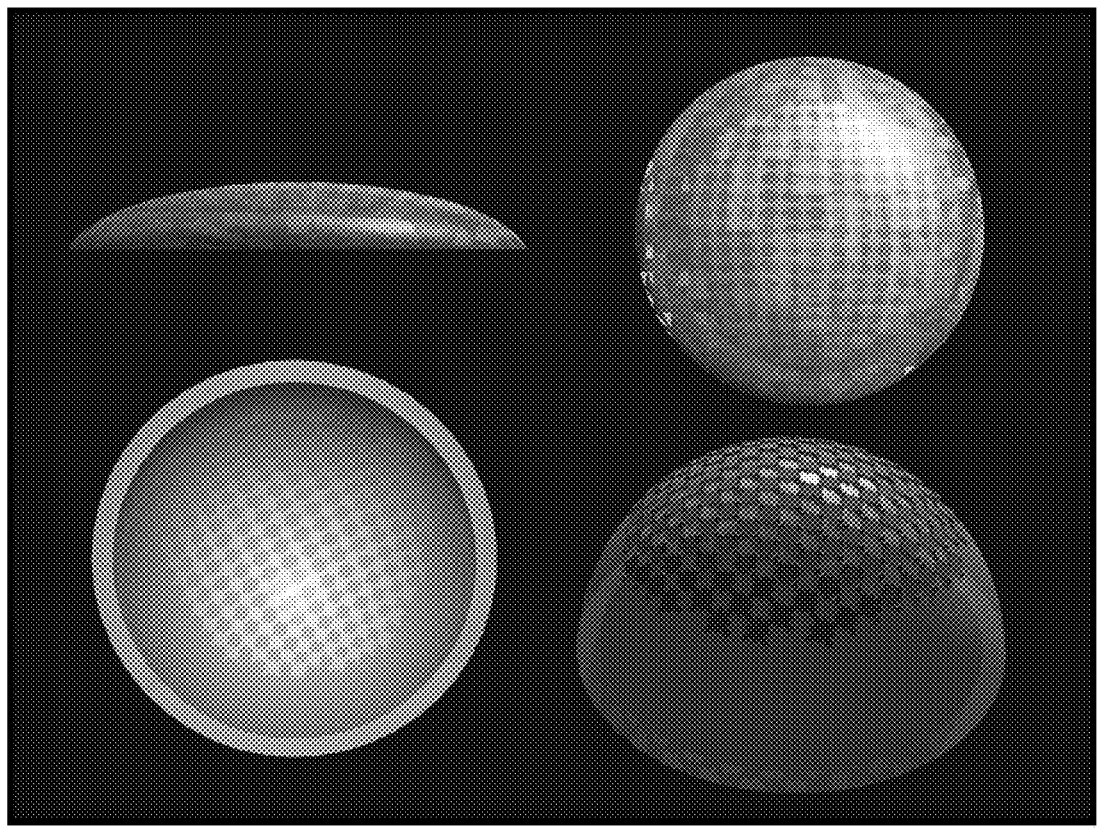
FIG. 10 illustrates inorganic photodiode arrays distributed on a lens with spherical curvature. Shown: various lens shapes and angles
Figure 11:
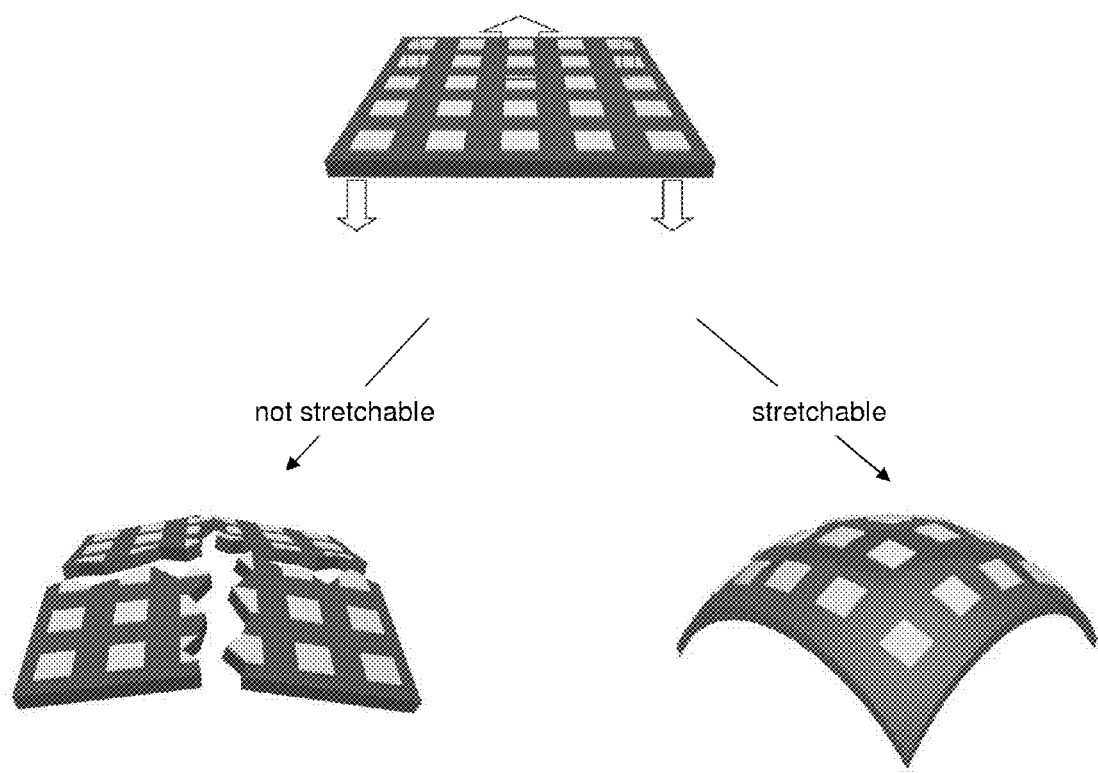
FIG. 11 illustrates the need for stretchability when a planar sheet is wrapped around a spherical surface.

One such example of a curved electronic device is provided in FIG. 10. FIG. 10 illustrates an "artificial eye" comprising an inorganic photodiode array distributed on a spherically curved lens. Four different views of the artificial array are shown. The requirement for stretchable planar electronic devices is schematically illustrated in FIG. 11. In order to wrap a planar sheet around a spherical surface, the sheet must stretch in more than one direction.

Figure 12:
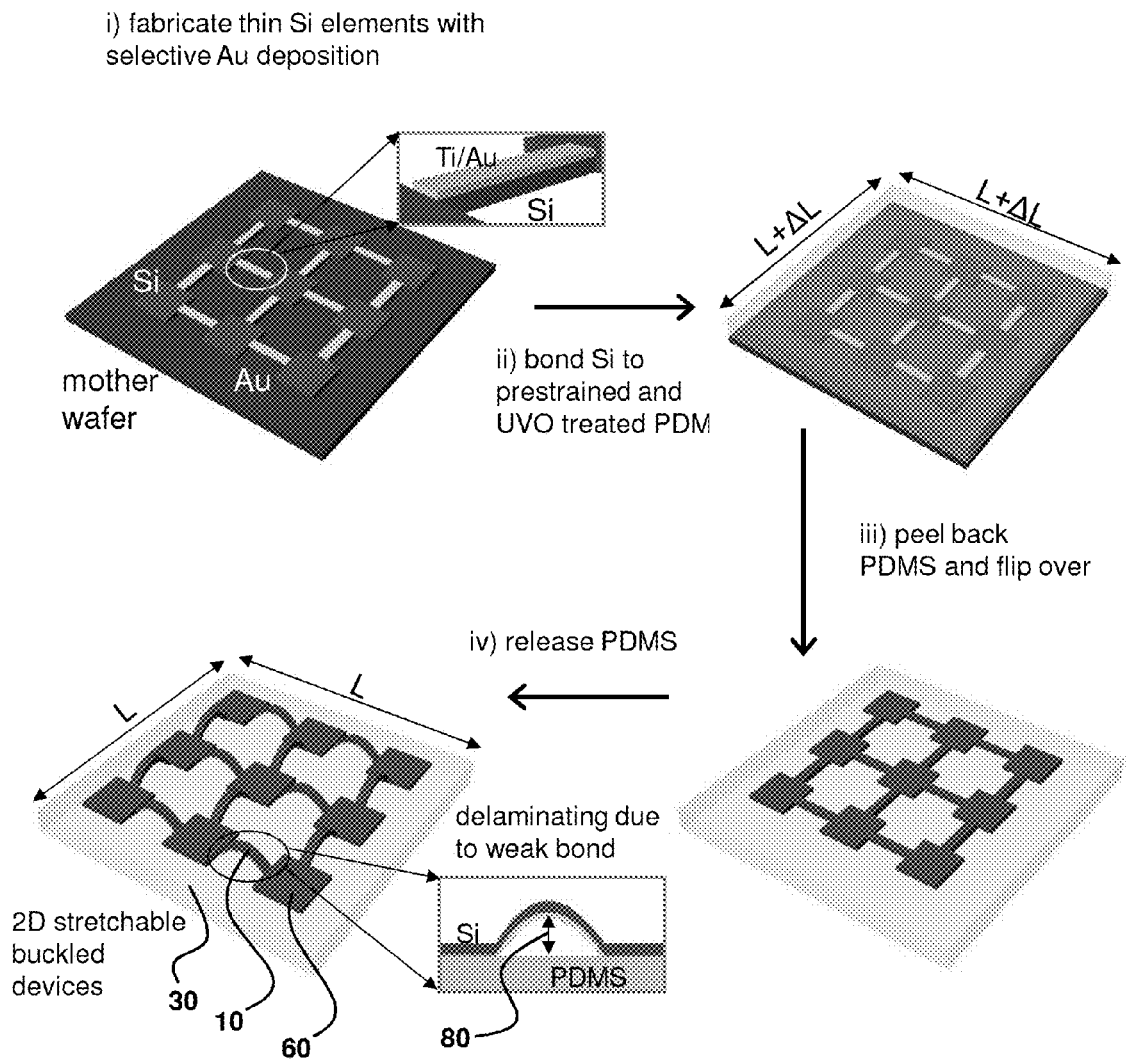
FIG. 12 summarizes one scheme for fabricating stretchable buckled semiconductor arrays capable of conforming to spherically-curved surfaces.
Figure 13A:
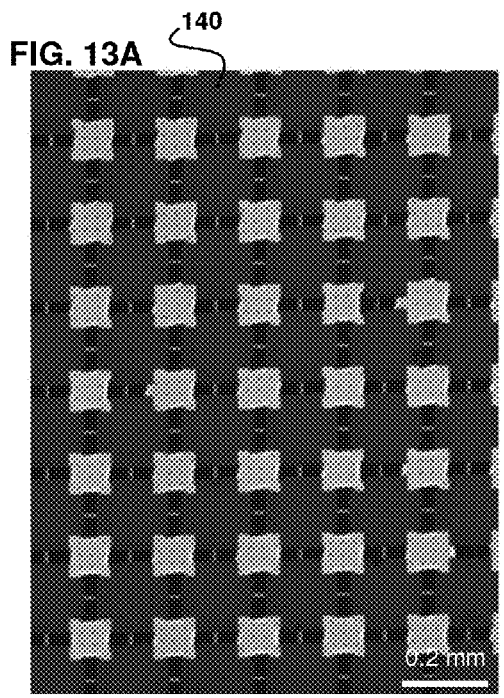
FIG. 13 Optical microscopic images of buckled stretchable silicon arrays having a single connection grid configuration (A and B), multiple connection (e.g., two) grid configuration (C), and a floral connection configuration (D). The stretchable interconnects are capable of electrically connecting photodiode, light-collecting/detecting devices, and other device components at, for example, the contact pad regions. These systems are capable of conforming to a curved surface. The configurations depicted in FIG. 13A-D are on a PDMS substrate.
Figure 13B:
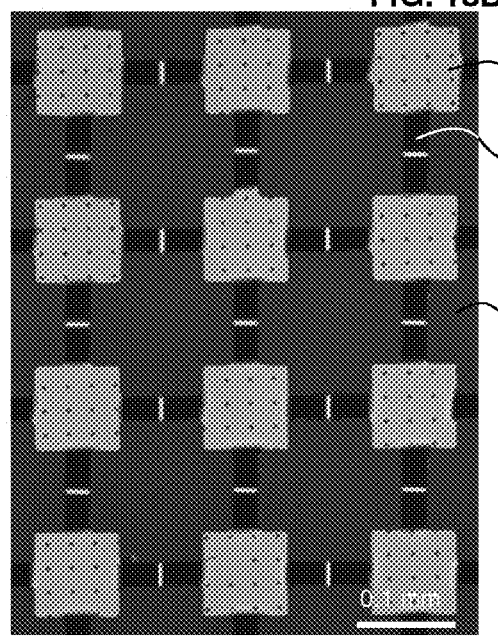
Figure 13C:
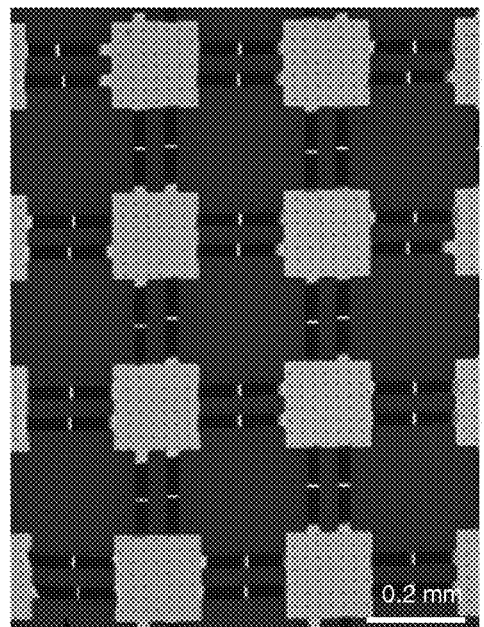
Figure 13D:
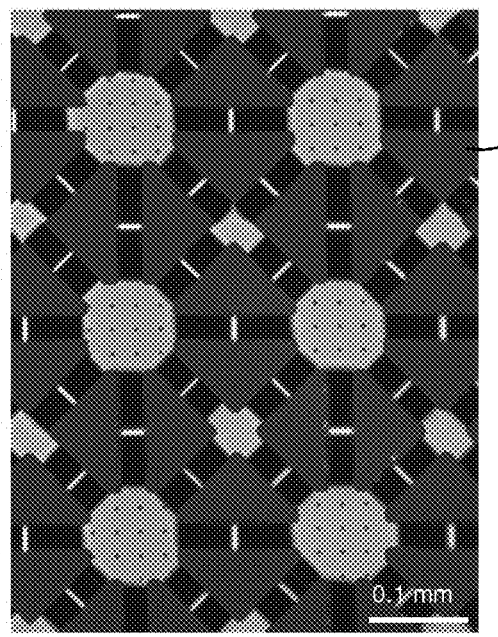

FIG. 12 is a fabrication scheme for making a stretchable buckled semiconductor array capable of conforming to curved surfaces. Thin Si elements are fabricated with selective Au or Ti/Au deposition on a substrate, such as the illustrated "mother wafer" in panel (i). Si is bonded to prestrained (indicated as L+ΔL) and UVO treated PDMS (panel (ii)). Prestrain is provided in two directions, as illustrated. The bonding is by any means known in the art such as an adhesive, for example, applied to the Si elements, the substrate, or both. The bonding means is applied in a selected pattern so that the Si has bonded regions that will remain in physical contact with the substrate (after deformation) and other regions in a bent configuration that are not in physical contact with the substrate (e.g., regions that are not bonded or are weakly bonded relative to the adhesive force in the bond regions). The prestrained substrate is removed from the wafer substrate to reveal a flat grid of semiconductor arrays (panel (iii)). Upon relaxation of the substrate from L+ΔL to L, the interconnects 10 buckle in the weakly-bonded regions (see panel (iv)) to a bent configuration whereas the device component 60 (e.g., semiconductor Si contact pad) remains bonded to the substrate 30. Accordingly, buckled interconnects 10 impart stretchability to the entire array, and specifically the capability for motion of component 60 relative to other components 60 without breaking electrical contact between components 60, thereby providing conformal capability to a curved surface or a bendable surface.

Figure 14A:
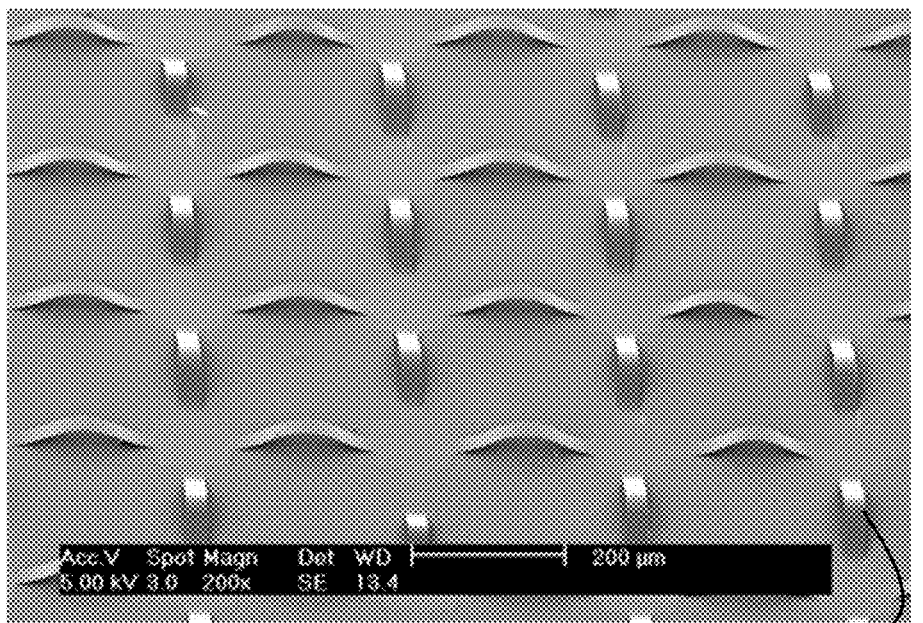
FIG. 14 Electron microscopic images of buckled stretchable silicon arrays in a grid configuration capable of supporting device components and conforming to a curved surface. The scale bar is 200 μm in A and 50 μm in B.
Figure 14B:
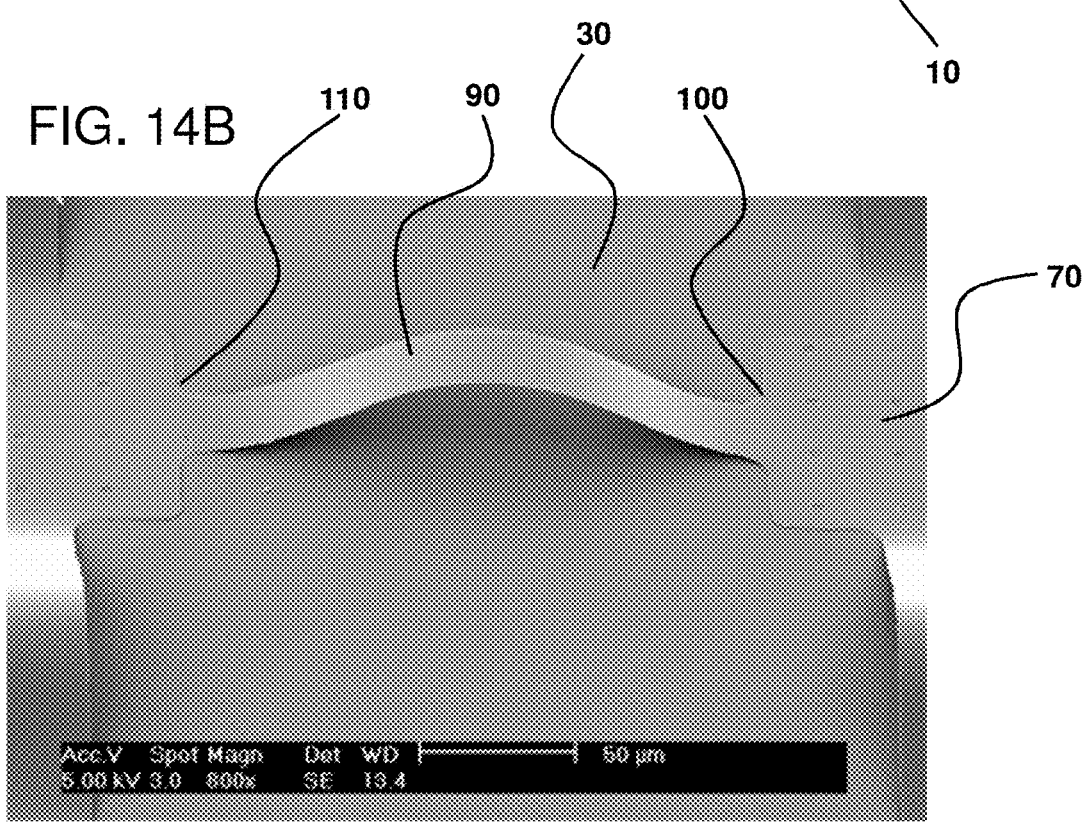

FIG. 13 provides an optical microscopic image of a buckled stretchable silicon array in a single grid configuration 140 (top two panels), grid configuration having a plurality of connected interconnects 160 (bottom left panel), and a floral configuration 150 (bottom right panel). In each of these examples, interconnect 10 is buckled in a central portion, with interconnect ends attached to a contact pad 70. The interconnects and contact pad 70 are supported on a PDMS substrate 30. Close-up views of a number of different interconnect geometries are further provided in FIGS. 14-17. FIG. 14 provides electron microscopic images to show a basic buckled or wavy interconnect 10 having a central portion 90 with a first end 100 and second end 110. The central portion is in a bent configuration. Ends 100 and 110 are connected to a device component, in this case a contact pad 70 capable of establishing electrical contact with a device component. The interconnect 10 and contact pad 70 are supported on a substrate 30, such as an elastomeric PDMS substrate.

Figure 15A:
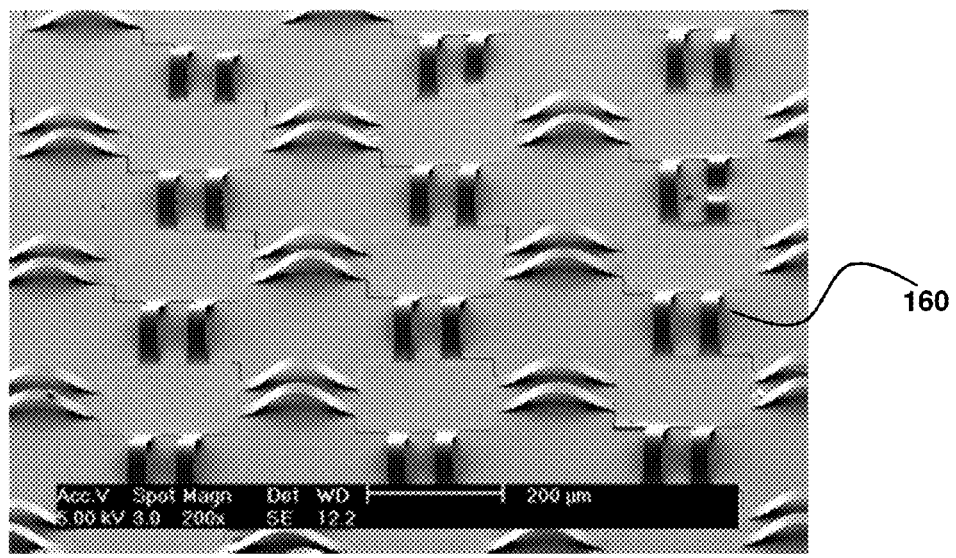
FIG. 15 Electron microscopic images of buckled stretchable silicon arrays in a grid configuration with adjacent contact pads connected to one another by a plurality (e.g., two) of interconnects and capable of supporting device components and conforming to a curved surface. The scale bar is 200 μm in A and 50 μm in B.
Figure 15B:
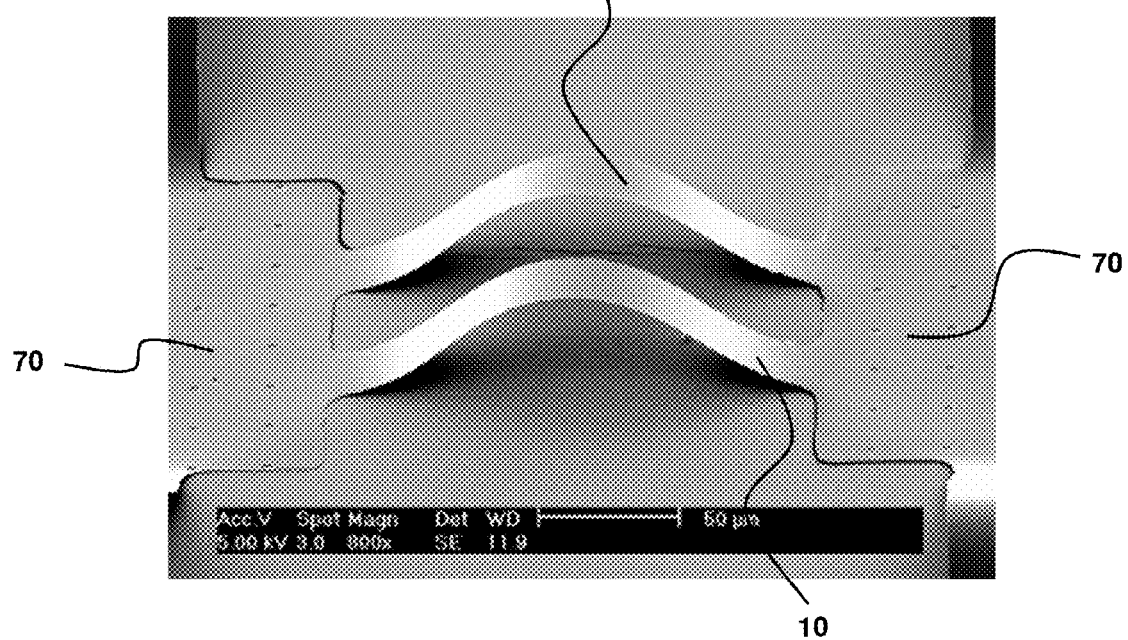

FIG. 15 is an electron microscopic image of adjacent device components (e.g., contact pad 70) connected to each other by a plurality (two) of interconnects 160. Comparing FIG. 15 to FIG. 14 demonstrates that adjacent device components 70 can be connected to one another by one or more interconnects 10 to provide additional flexibility to the electronic device. For example, a device component or contact pad 70 having a relatively large footprint is optionally connected to another device component by multiple interconnects.

Figure 16A:
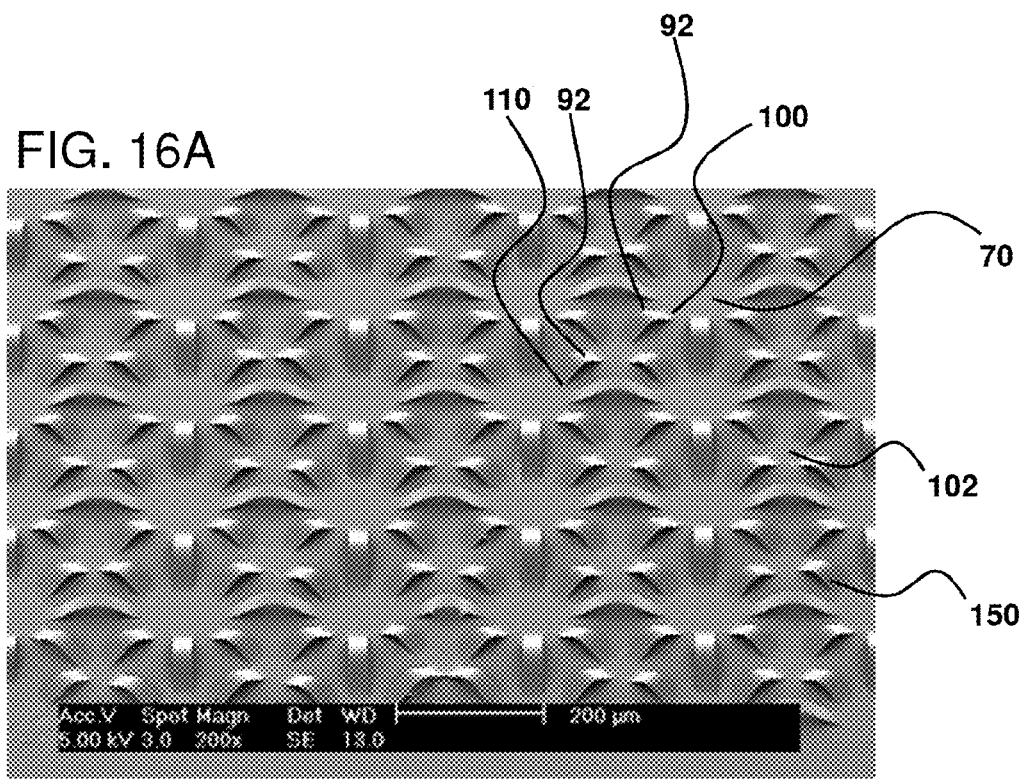
FIG. 16 Electron microscopic images of buckled stretchable silicon arrays in a floral configuration capable of supporting device components and conforming to a curved surface. The scale bar is 200 μm in A and 50 μm in B.
Figure 16B:
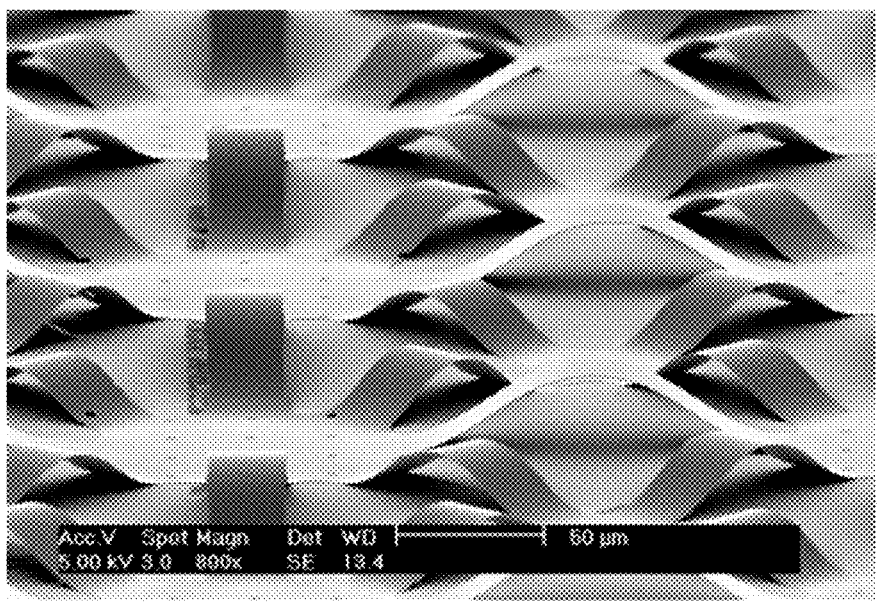

FIG. 16 is an electron microscopic image of interconnects in a floral configuration 150. A floral configuration, in contrast to a grid configuration, has interconnects oriented in more than two longitudinal directions. In this example, there are four distinct orientations, so that a device component such as contact pad 70 is capable of contacting diagonally-adjacent device components. In this example, the interconnect 10 has an optional bond region 102 in between interconnect ends 100 and 110 that are electrically connected to a device component (not shown), thereby dividing central portion 90 into two non-bonded regions 92, each having a bent configuration.

Figure 17A:
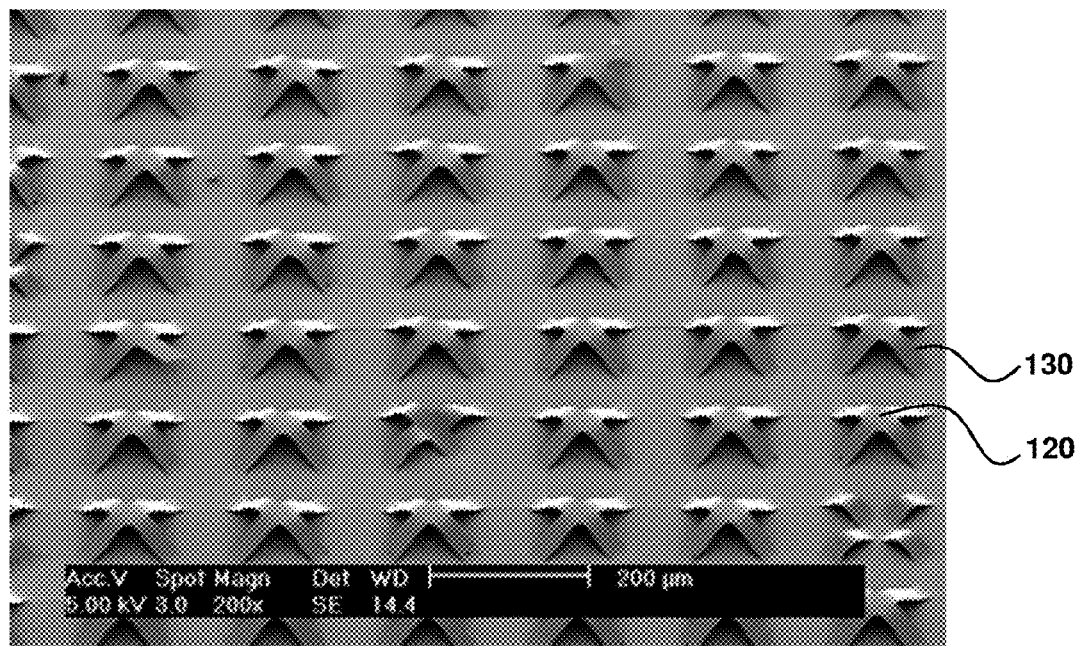
FIG. 17 Electron microscopic images of buckled stretchable silicon arrays in a bridge configuration capable of supporting device components and conforming to a curved surface. The scale bar is 200 μm in A and 50 μm in B.
Figure 17B:
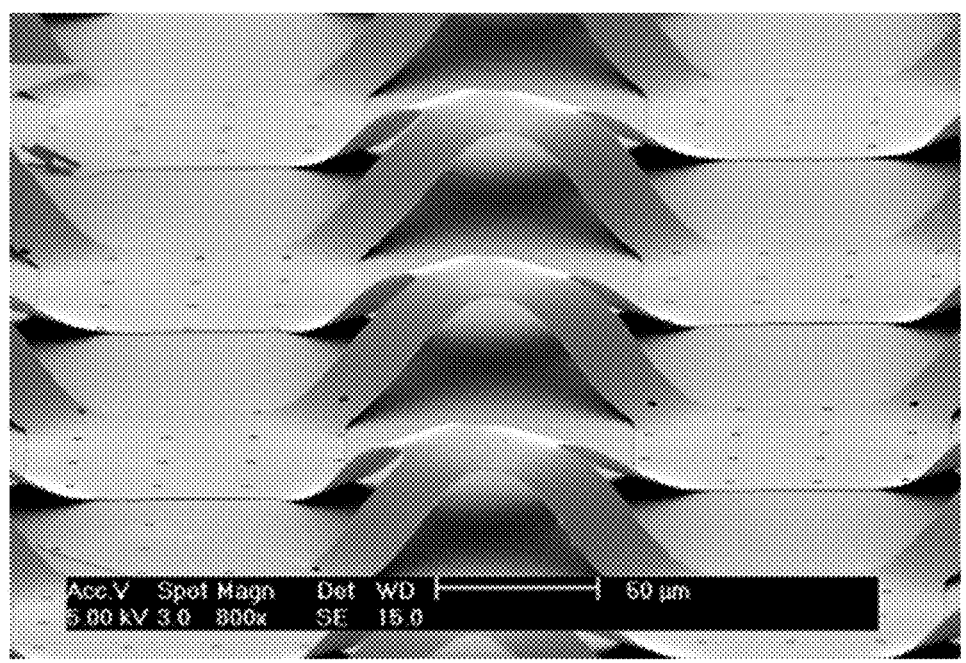

FIG. 17 is an electron microscopic image of interconnects arranged in a bridge configuration 130. In a bridge configuration, a bridge central portion peak 120 from which three or more interconnect ends extend therefrom. For example, two interconnects that intersect in a non-bonded region results in a peak 120 having four interconnect ends extending therefrom. For the situation where the device components are in a staggered arrangement, the peak 120 may have three ends extending therefrom. In the case of multiple interconnect connections between device components, more than four ends may extend from peak 120.

Figure 18:
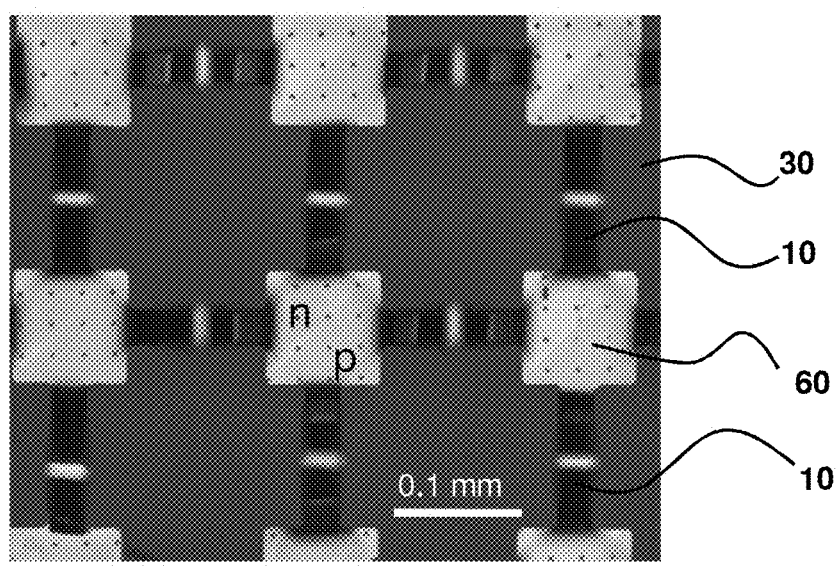
FIG. 18 Photograph of photodiodes in a grid array configuration on a stretchable buckled silicon array on PDMS.

Although many of the drawings provided herein show a device component that is a contact pad 70, the methods and devices claimed herein are capable of connecting to a vast population of device components to provide stretchable and therefore shape-conforming, electronic devices. For example, FIG. 18 shows a device component 60 that is a photodiode connected to other photodiodes in an array configuration by buckled interconnects 10 supported on an elastomeric substrate 30.

Figure 19:
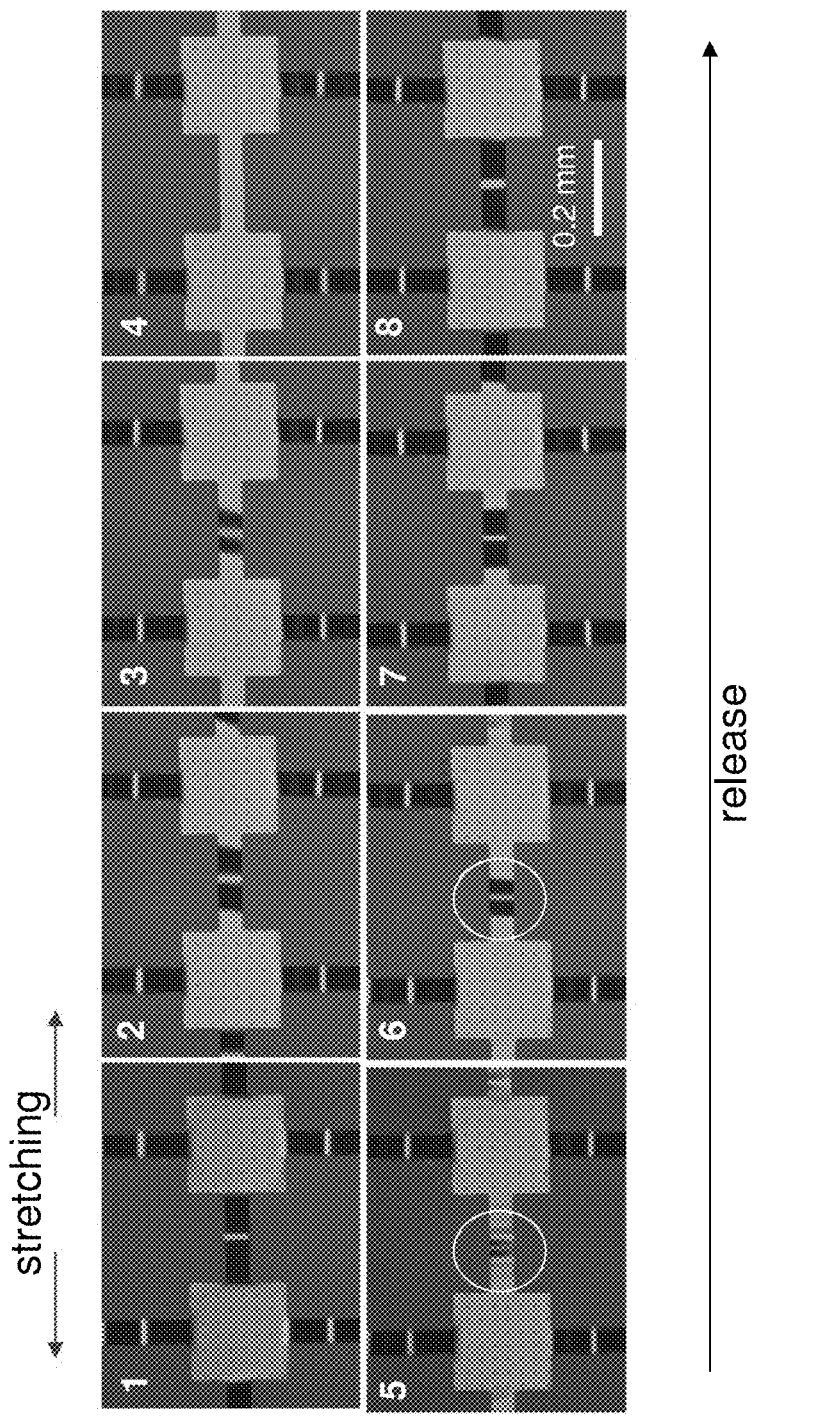
FIG. 19 demonstrates the reversible behavior of the stretchable interconnects during stretching and relaxation. The system is relaxed in panel 1. The system is stretched as indicated by the stretching arrows in panels 2, 3 and 4. The maximum stretch in panel 4 is about 10% and results in a substantially flat interconnect for the interconnect aligned in the direction of the stretching force. The system is released in panels 5-8, and panel 8 has a geometry and configuration equivalent to that shown in panel 1. The scale bar is 0.2 mm.

FIG. 19 depicts one-dimensional stretching behavior of a buckled silicon array. Panel (i) is a picture of a buckled silicon array without any straining force applied. A stretching force is applied (as indicated by the arrows above panel (i)) to stretch the array in one direction. As shown in panels (2)-(4), the buckled interconnect flattens. When the stretching force is released in panel (5), the array reverses to its buckled configuration (see panels (6)-(8)). A comparison between panels (1) and (8) shows that the buckle configuration pre and post-stretch are identical, indicating the process is reversible.

Figure 20:
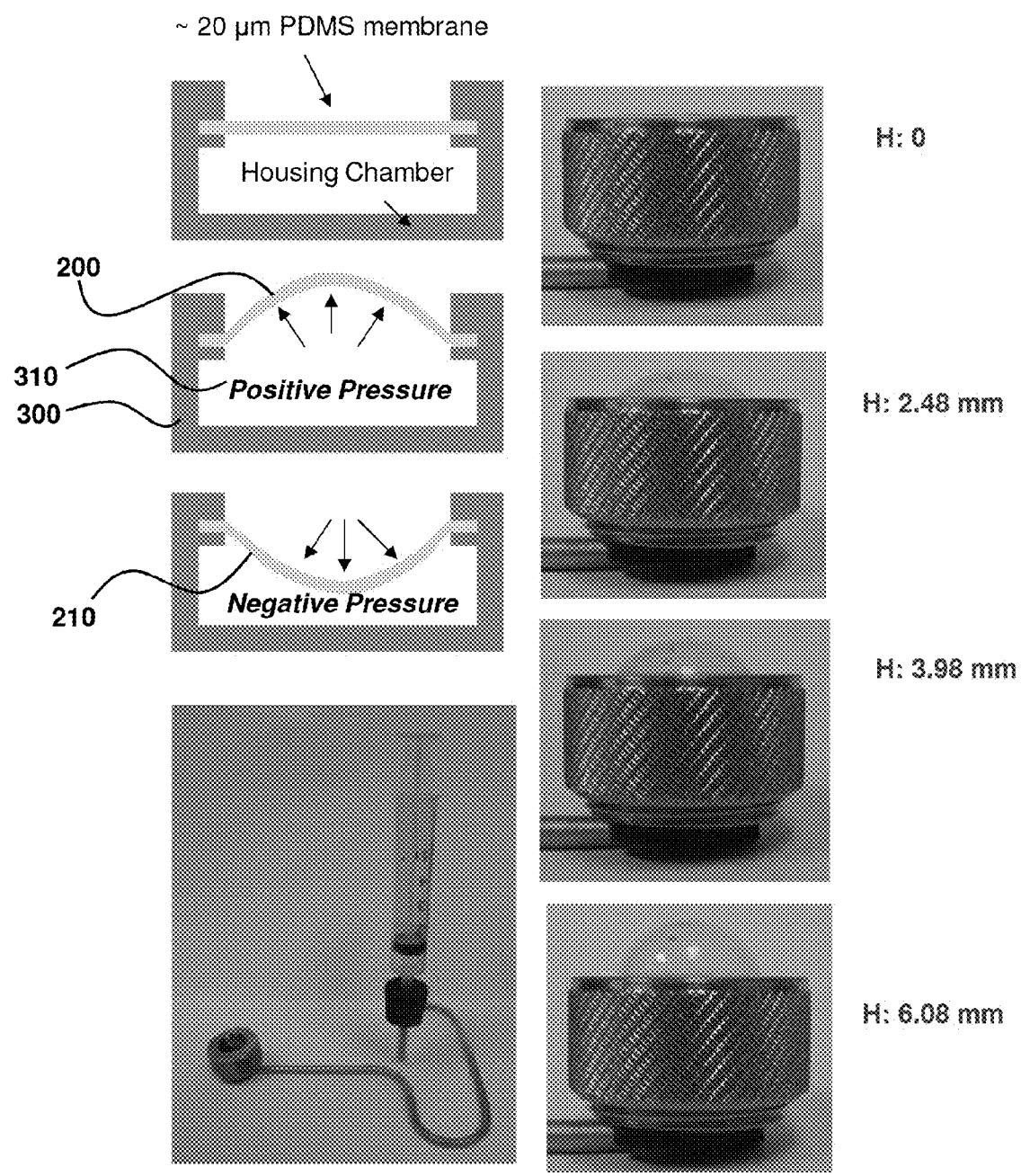
FIG. 20 "Bubble stamp" or "Balloon stamp" device capable of conformal contact to curved substrates as well as flat substrates.

Buckled arrays of device components may be readily transferred to curved surfaces, including rigid or inelastic curved surfaces. An example of one device and process for facilitating conformal contact to curved surfaces is provided by the bubble or balloon stamp 400 of FIG. 20. An elastomeric substrate 30, in this example an about 20 μm thick PDMS membrane is fixed in a housing chamber 300 to provide a chamber volume 310 defined by the interior-facing substrate wall and housing chamber. Applying a positive pressure (e.g., pressure in chamber 300 greater than exterior pressure) generates a convex 200 substrate surface capable of conformal contact with a concave-shaped receiving substrate. A negative pressure, in contrast, generates a concave surface 210 capable of conformal contact with a convex-shaped receiving substrate. Spatial manipulation of local elasticity (e.g., Young's modulus) of the substrate permits generation of complex curved geometry. The bottom left panel of FIG. 20 illustrates one means for controlling the pressure in the housing volume 310 by a syringe that introduces or removes gas to and from chamber 310. The images on the right side of the figure are different curvatures of a PDMS membrane in response to increasing level of positive pressure. Any of the methods and devices for providing buckled interconnects on an elastomeric substrate may be used with such devices for transfer printing to a curved substrate.

Figure 21:
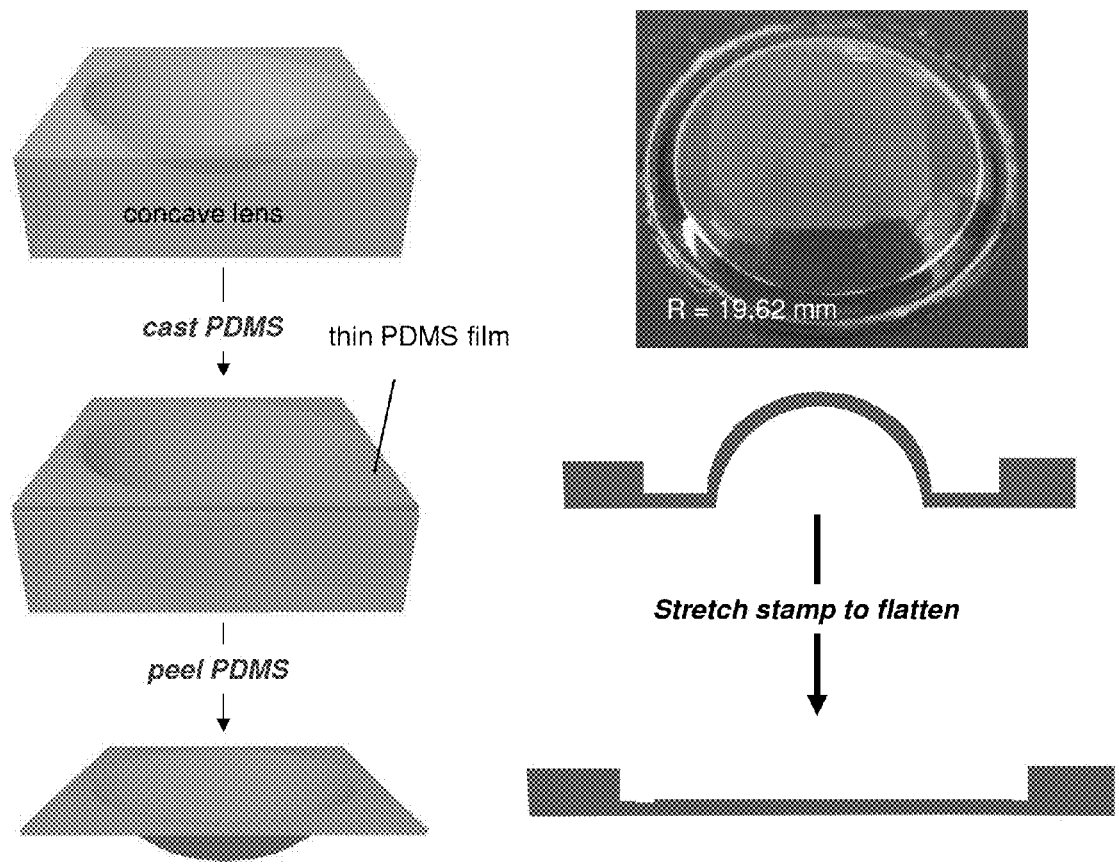
FIG. 21 Another device capable of conforming to both spherically curved and flat surfaces is a stretchable spherically-molded stamp. The stamp is cast against a curved surface (in this example a concave lens) and removed. The stamp is stretched to substantially flatten its surface and to which interconnects can be transferred.

Another means for generating buckled or pop-up interconnects on a curved surface is summarized in FIG. 21. A thin elastomeric film is cast against a shaped surface to generate an elastomeric substrate having at least a portion that is curved. The substrate is capable of being stretched to flatten the surface so that the substrate is capable of conforming to both curved and flat surfaces. An interconnect is applied to the flat stamp, and upon release of the stretching force, the substrate surface relaxes back to a curved geometry, generating a strain in the interconnect that is accommodated by a pop-up of the interconnect central portion.

Figure 22:
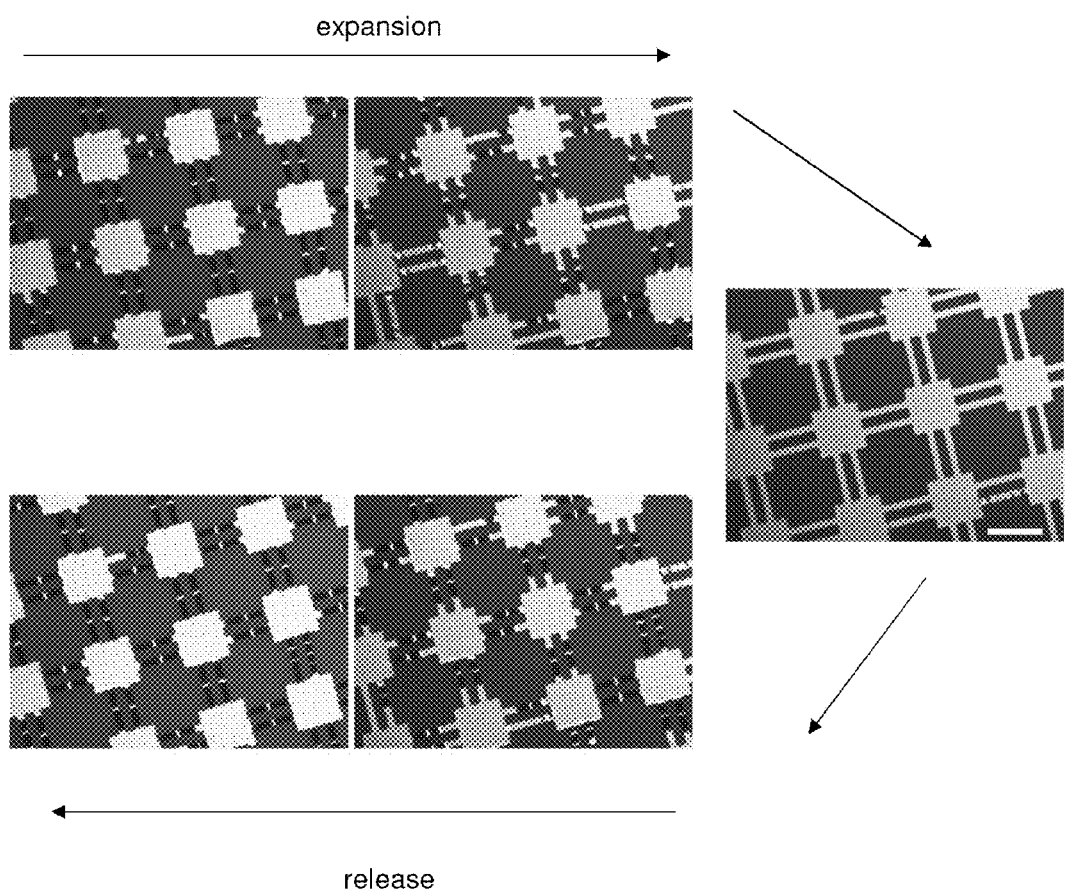
FIG. 22 Stretchable buckled silicon arrays during a stretching cycle on a "bubble" or "balloon" stamp. In this example the interconnect between adjacent contact pads comprises two wavy interconnects (Si 290 nm in thickness). The stretch test uses bubble expansion to provide multi-directional stretching. The right-most panel is under maximum stretch and the bottom two panels show that when the stretching force is removed, the interconnects relax back to their prestretched configuration shown in the top-left panel.
Figure 23:
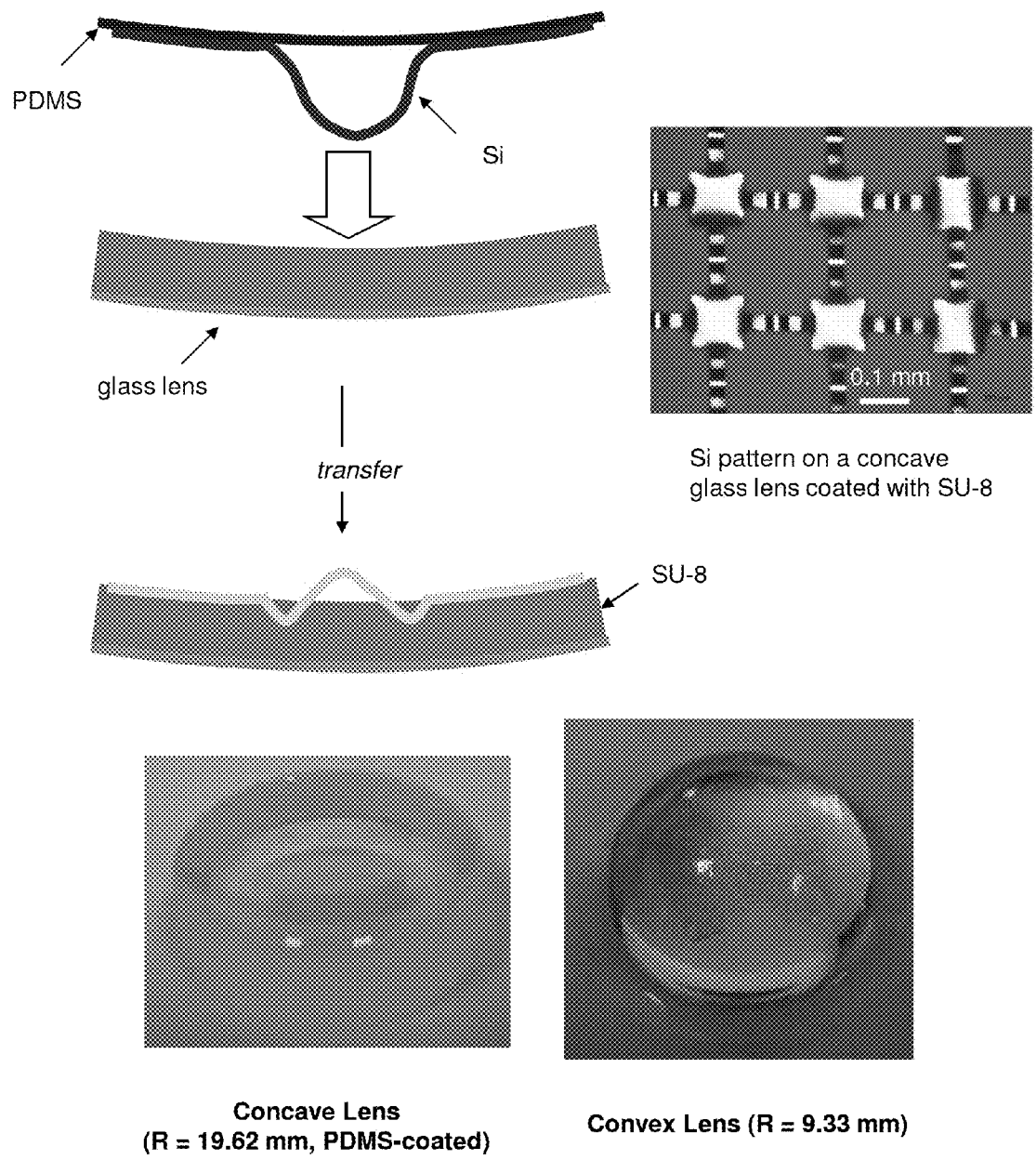
FIG. 23 Silicon printed via balloon stamps onto glass lenses coated with adhesives (PDMS or SU-8).

An example of "two-dimensional" stretching of a buckled silicon array by the device shown in FIG. 20, is provided in FIG. 22. In this example, the interconnect comprises a plurality of buckled interconnect connections in a grid configuration, with the interconnects made of 290 nm thick Si. The initially flat buckled silicon array (top left image) is placed into the housing, and a positive pressure exerted to expand the array into a bubble or balloon configuration (e.g., a curved surface). Maximum expansion is shown in the right-most image, and subsequently the positive pressure removed. Similar to the results for uniaxial stretching of a flat substrate, this "bending" stretching is reversible. At any stage of expansion, that maximizes conformal contact with a curved surface, the array may be transferred to the curved surface by any means known in the art. An example of silicon printing by balloon stamps onto glass lenses coated with adhesives (elastomeric substrate or SU-8) is shown in FIG. 23. The lens may be either concave or convex. In this example R=19.62 mm and 9.33 mm, respectively.

Example 1

Controlled Buckling Structures in Semiconductor Nanoribbons with Application Examples in Stretchable Electronics Control over the compositions, shapes, spatial locations and/or geometrical configurations of semiconductor nanostructures is important for nearly all applications of these materials. Although methods exist for defining the material compositions, diameters, lengths, and positions of nanowires and nanoribbons, there are relatively few approaches for controlling their two- and three-dimensional (2D and 3D) configurations. Provided herein is a mechanical strategy for creating certain classes of 3D shapes in nanoribbons that are otherwise difficult to generate. This example involves the combined use of lithographically patterned surface chemistry to provide spatial control over adhesion sites and elastic deformations of a supporting substrate to induce well-controlled local displacements. Precisely engineered buckling geometries are created in nanoribbons of GaAs and Si in this manner and these configurations can be described quantitatively with analytical models of the mechanics. As one applications example, particular structures provide a route to electronics (and optoelectronics) with extremely high levels of stretchability (up to ~100%), compressibility (up to ~25%) and bendability (with curvature radius down to ~5 mm).

The 2D and 3D configurations of nanoribbons and wires are controlled during their growth to yield certain geometries, such as coils, rings, and branched layouts, or after their growth to produce, as examples, sinusoidal wave-like structures by coupling these elements to strained elastomeric supports or tube-like (or helical) structures by using built-in residual stresses in layered systems. Semiconductor nanoribbons with wavy geometries are of interest in part because they enable high performance, stretchable electronic systems for potential applications such as spherically curved focal plane arrays, intelligent rubber surgical gloves and conformable structural health monitors. This approach, in which the electronic devices themselves are stretchable, is different than and perhaps complementary to an alternative route to these same applications that use rigid device islands with stretchable metal interconnects. The previously described wavy nanoribbons have two main disadvantages: (i) they form spontaneously, with fixed periods and amplitudes defined by the moduli of the materials and the thicknesses of the ribbons, in a way that offers little control over the geometries or the phases of the waves and (ii) the maximum strains that they can accommodate are in the range of 20-30%, limited by the non-optimal wavy geometries that result from this process. The procedures introduced here use lithographically defined surface adhesion sites together with elastic deformations of a supporting substrate to achieve buckling configurations with deterministic control over their geometries. Periodic or aperiodic designs are possible, for any selected set of individual nanoribbons in large scale, organized arrays of such structures. Specialized geometries designed for stretchable electronics enable strain ranges of up to nearly 150%, even in brittle materials such as GaAs, consistent with analytical modeling of the mechanics, and as much as ten times larger than previously reported results.

Figure 24:
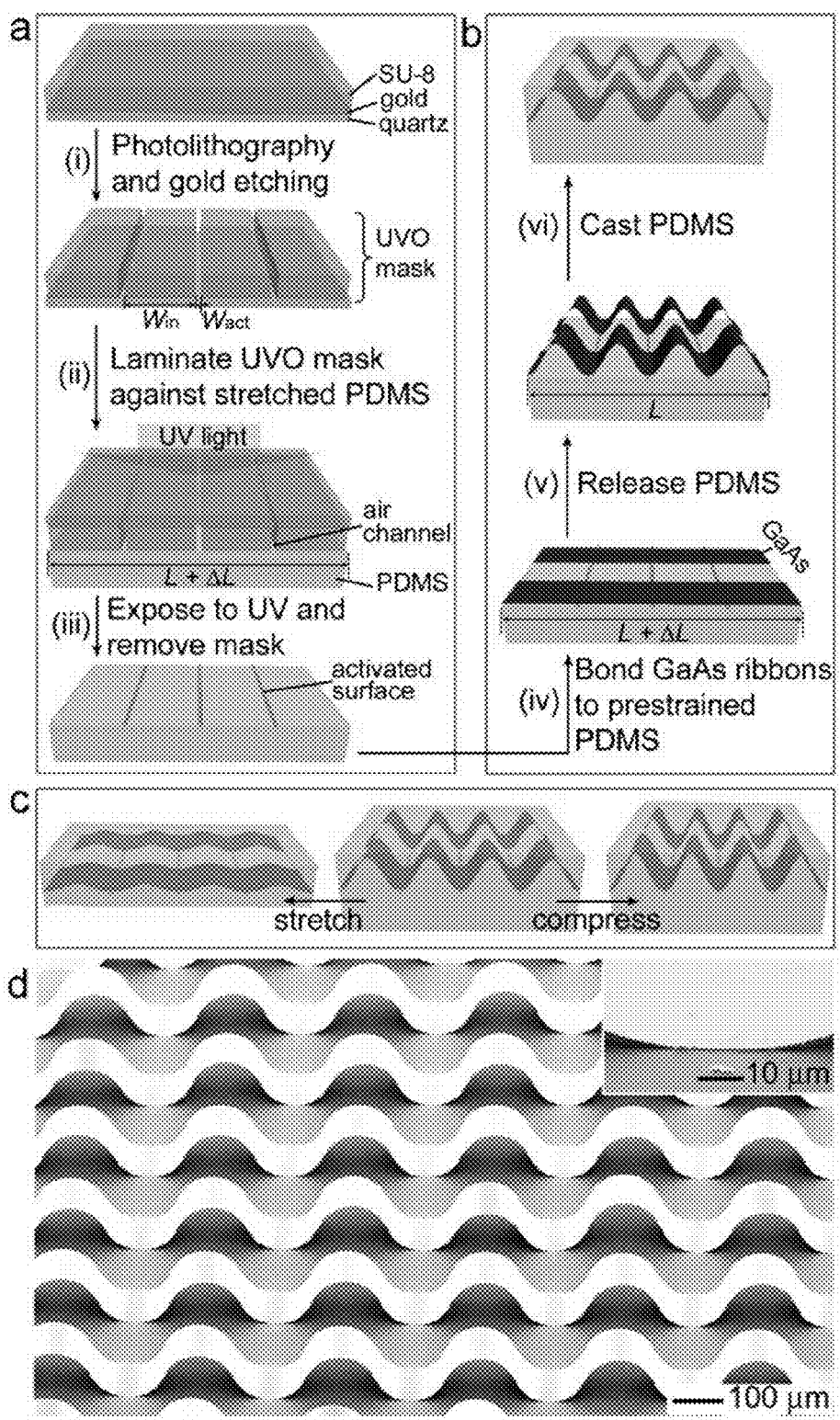
FIG. 24 summarizes processing steps for engineering 3D buckled shapes in semiconductor nanoribbons. A Fabricating a UVO mask and using it to pattern the surface chemistry on a PDMS substrate. B Forming buckled GaAs ribbons and embedding them in PDMS. C Response of buckled GaAs ribbons to stretching and compressing. D SEM image of a sample formed using the procedures in a and b. The prestrain used for generating this sample was 60%, with $W_{act}$=10 μm and $W_{in}$=400 μm.

FIG. 24 shows the steps in this procedure. The fabrication starts with the preparation of a mask for patterning surface chemical adhesion sites on an elastomeric substrate of poly (dimethylsiloxane) (PDMS). This process involves passing deep ultraviolet (UV) light (240-260 nm) through an unusual type of amplitude photomask (fabricated via step i), referred to as a UVO mask, while it is in conformal contact with the PDMS. The UVO mask possesses recessed features of relief in the transparent regions, such that exposure to UV creates patterned areas of ozone in proximity to the surface of the PDMS. The ozone converts the unmodified hydrophobic surface, dominated by —$CH_3$ and —H terminal groups, to a highly polar and reactive surface (i.e. activated surface), terminated with —OH and —O—Si—O— functionalities. The unexposed areas retain the unmodified surface chemistry (i.e. inactivated surface). The procedures introduced here involve exposures on PDMS substrates (thickness ~4 mm) under large, uniaxial prestrains ($\Delta_{pre}=\Delta L/L$ for lengths changed from L to L+$\Delta L$) (step ii). For masks with simple, periodic line patterns, we denote the widths of the activated (indicated as lines labeled "activated surface") in step (iii) of FIG. 24A and inactivated stripes (e.g., the distance between adjacent activated stripes) as $W_{act}$ and $W_{in}$ in step (i). The activated areas can bond strongly and irreversibly to other materials that have exposed —OH or —Si—O groups on their surfaces. These patterned adhesion sites are exploited to create well defined 3D geometries in nanoribbons, as outlined below. Alternatively, a similar adhesive bond site pattern is provided by similarly patterning the interconnects prior to contact with the substrate.

In this example, nanoribbons consisted of both single crystal Si and GaAs. The silicon ribbons are prepared from silicon-on-insulator (SOI) wafers using procedures described previously (see Khang et al. Science 311, 208-212 (2006)). The GaAs ribbons involved multilayers of Si-doped n-type GaAs (120 nm; carrier concentration of $4\times10^{17}$ $cm^3$), semi-insulating GaAs (SI-GaAs; 150 nm) and AlAs (200 nm) formed on a (100) SI-GaAs wafer by molecular-beam epitaxy (MBE). Chemically etching the epilayers in an aqueous etchant of $H_3PO_4$ and $H_2O_2$, using lines of photoresist patterned along the (0 1 1) crystalline orientation as etch masks, define the ribbons. Removing the photoresist and then soaking the wafer in an ethanol solution of HF (2:1 in volume between ethanol and 49% aqueous HF) removes the AlAs layer, thereby releasing ribbons of GaAs (n-GaAs/SI-GaAs) with widths determined by the photoresist (~100 μm for the examples in FIG. 24D). The addition of ethanol to the HF solution reduces the probability of cracking of the fragile ribbons due to the action of capillary forces during drying. The low surface tension (compared to water) also minimizes drying-induced disorder in the spatial layout of the GaAs ribbons. In the final step, a thin layer of SiO$_2$ (~30 nm) is deposited to provide the necessary —Si—OH surface chemistry for bonding to the activated regions of the PDMS.

Figure 25:
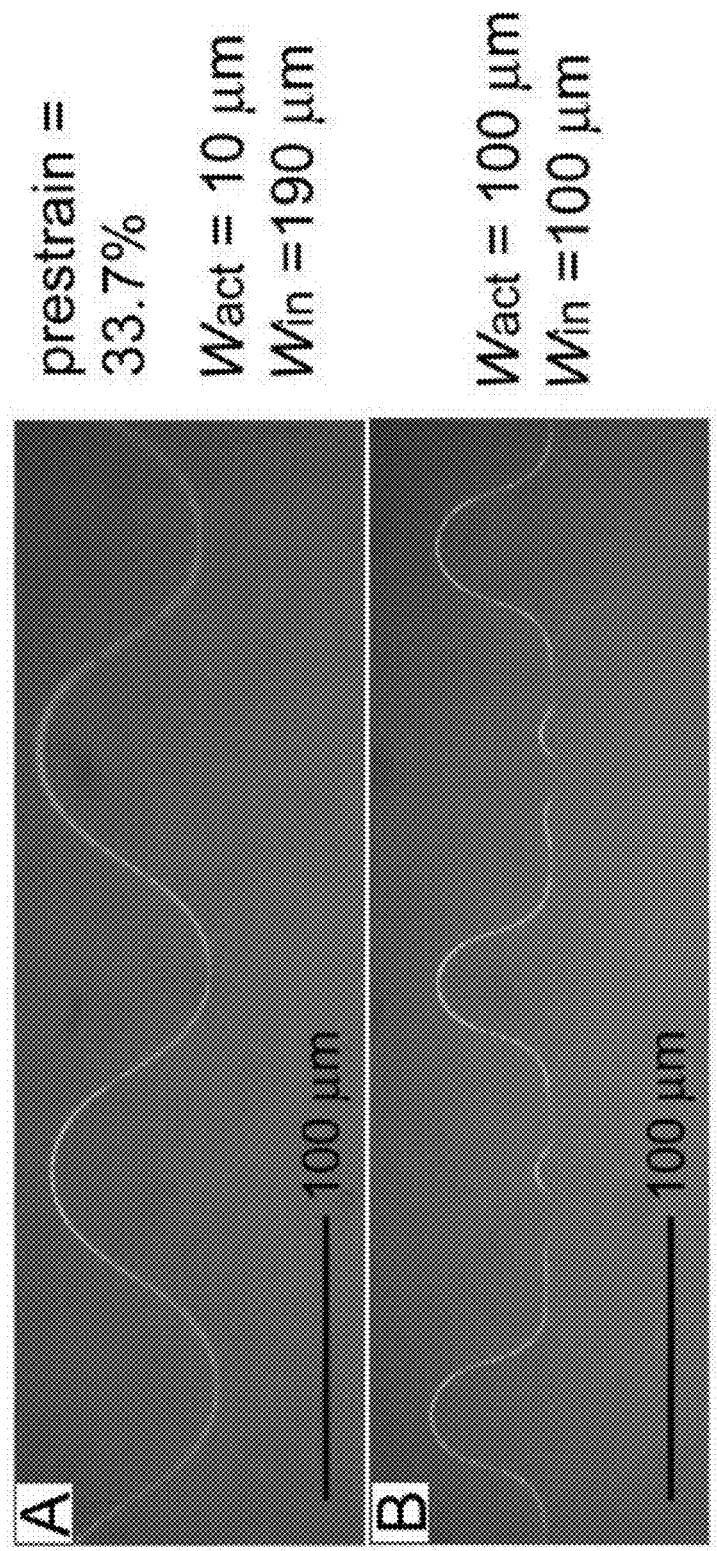
FIG. 25 Side-view profiles of buckles formed on PDMS substrates using prestrains of 33.7% and with: (A) $W_{act}$=10 μm and $W_{in}$=190 μm; and (B) $W_{act}$=100 μm and $W_{in}$=100 μm. Both samples exhibit buckles in the inactivated regions due to detachment of ribbons from the PDMS. Sinusoidal waves with small peaks formed only in the activated regions with $W_{act}$=100 μm. A comparison of these two samples indicates that selecting $W_{act}$ smaller than a critical value avoids the formation of small wavy structures FIG. 26 Side-view image of a buckled GaAs ribbon embedded in PDMS after microtoming. This image shows that the PDMS fully fills the gaps between the ribbons and the underlying substrate. The buckles in this case are formed with a prestrain of 60% and with $W_{act}$=10 μm and $W_{in}$=300 μm. The PDMS prepolymer cast on the surface of these buckled ribbons is cured in an oven at 65° C. for 4 hours.
Figure 26:
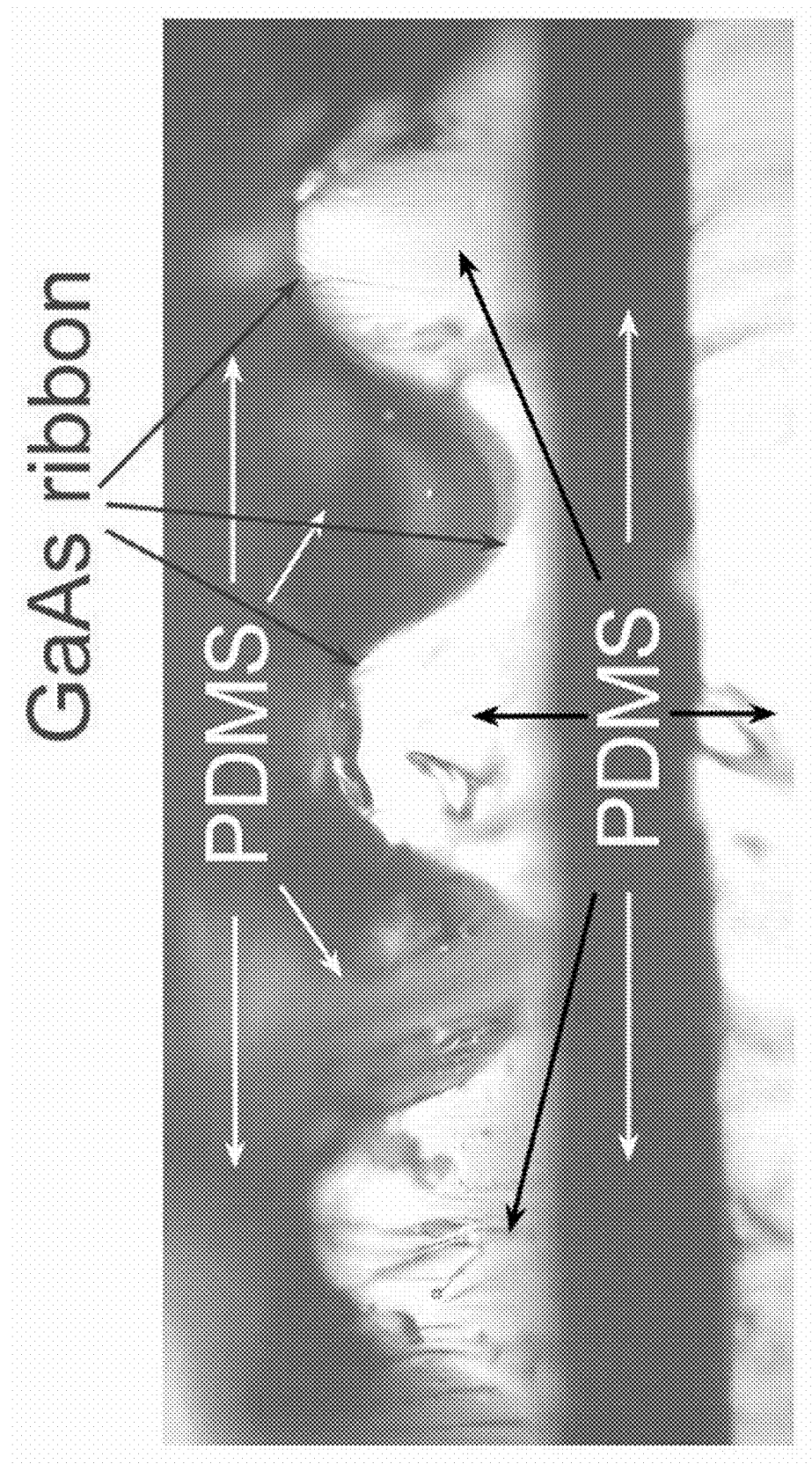

Laminating the processed SOI or GaAs wafers against a UVO treated, pre-stretched PDMS substrate (ribbons oriented parallel to the direction of prestrain), baking in an oven at 90° C. for minutes, and removing the wafer transferred all of the ribbons to the surface of the PDMS (step iv). Heating facilitates conformal contact and the formation of strong siloxane bonds (i.e., —O—Si—O—) between the native SiO$_2$ layer on the Si ribbons or the deposited SiO$_2$ layer on the GaAs ribbons and the activated areas of the PDMS. Relatively weak van der Waals forces bond the ribbons to the inactivated surface regions of the PDMS. Relaxing the strain in the PDMS generates buckles through the physical separation of the ribbons from the inactivated regions of the PDMS (step v). The ribbons remain tethered to the PDMS in the activated regions due to the strong chemical bonding. The resulting 3D ribbon geometries (i.e. the spatially varying pattern of buckles) depend on the magnitude of prestrain and the patterns of surface activation (e.g., shape and dimensions of W$_{in}$ and W$_{act}$). (Similar results can be achieved through patterned bonding sites on the ribbons). For the case of the simple line pattern, W$_{in}$ and the prestrain determine the width and amplitude of the buckles. Sinusoidal waves with wavelengths and amplitudes much smaller than the buckles also formed in the same ribbons when W$_{act}$ was >100 µm, due to mechanical instabilities of the type that generate 'wavy' silicon. (see FIG. 25, images of samples formed with different W$_{act}$). As a final step in the fabrication, the 3D ribbon structures can be encapsulated in PDMS by casting and curing a liquid prepolymer (see FIG. 24 step vi). Due to its low viscosity and low surface energy, the liquid flows and fills the gaps formed between the ribbons and the substrate (see FIG. 26).

FIG. 24D shows a tilted-view scanning electron microscope (SEM) image of buckled GaAs ribbons on PDMS, in which ∈$_{pre}$=60% and with W$_{act}$=10 µm and W$_{in}$=400 µm. The image reveals uniform, periodic buckles with common geometries and spatially coherent phases for all ribbons in the array. The anchoring points are well registered to the lithographically defined adhesion sites. The inset shows an SEM image of a bonded region; the width is ~10 µm, consistent with W$_{act}$. The images also reveal that the surface of the PDMS is flat, even at the bonding sites. This behavior, which is much different than the strongly coupled wavy structures reported previously, suggests that the PDMS induces the displacements but is not intimately involved in the buckling process (i.e. its modulus does not affect the geometries of the ribbons), for the cases described here. In this sense, the PDMS represents a soft, nondestructive tool for manipulating the ribbons through forces applied at the adhesion sites.

Figure 27:
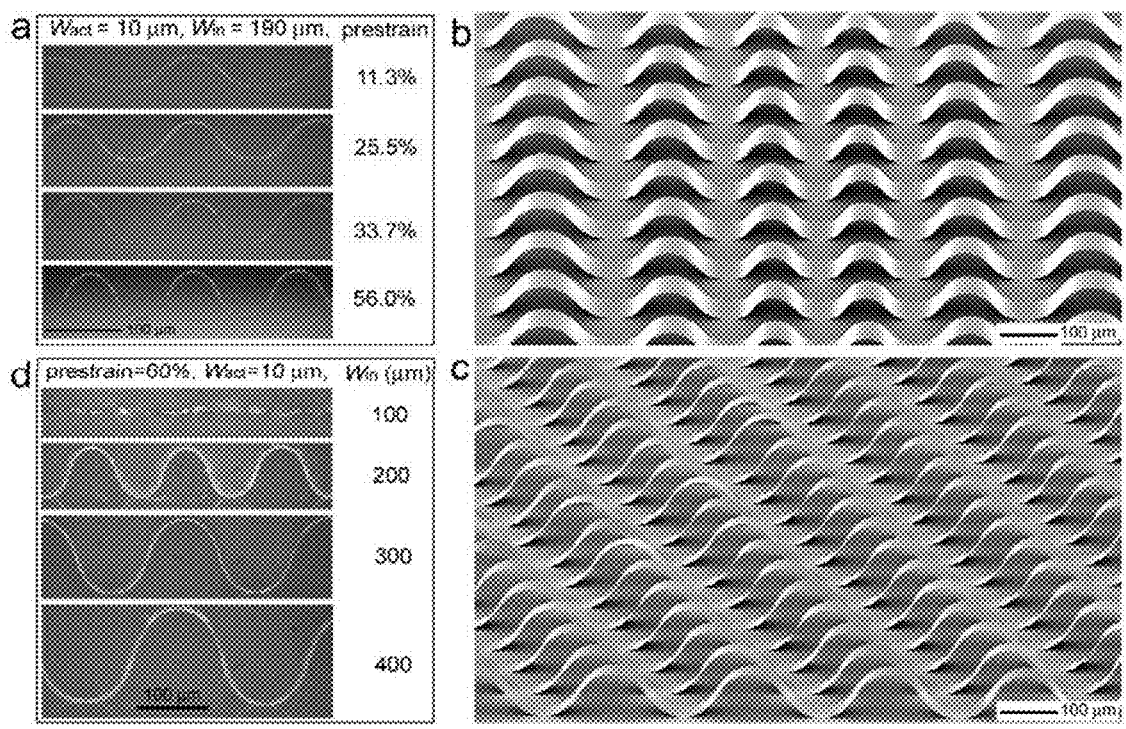
FIG. 27 Optical micrographs of the side-view profiles of buckled (A and D) GaAs and (B, C) Si ribbons. A GaAs ribbon structures formed on PDMS patterned with $W_{act}$=10 μm and $W_{in}$=190 μm, with different prestrains: 11.3%, 25.5%, 33.7%, and 56.0% (from top to bottom). The dotted lines for $\in_{pre}$=33.7% and 56.0% are mathematically predicted interconnect geometrical shape. B Si ribbon structures formed on a PDMS substrate prestrained to 50% and patterned with $W_{act}$=15 μm and $W_{in}$: 350, 300, 250, 250, 300, and 350 μm (from left to right). The image was taken by tilting the sample at angle of 45°. C Si ribbon structures formed on a PDMS substrate prestrained to 50% and patterned with parallel lines of adhesion sites ($W_{act}$=15 μm and $W_{in}$=250 μm) orientated at angles of 30° with respect to the lengths of the ribbons. The image was taken by tilting the sample at angle of 75°. D GaAs ribbon structures formed on PDMS substrates prestrained to 60% with $W_{act}$=10 μm and different $W_{in}$: 100, 200, 300, and 400 μm (from top to bottom).

FIG. 27A shows side-view optical micrographs of buckled ribbons formed on PDMS with different ∈$_{pre}$ (W$_{act}$=10 µm and W$_{in}$=190 µm). The heights of the buckles (e.g., "amplitude") increase with ∈$_{pre}$. The ribbons in the inactivated regions do not fully separate at low ∈$_{pre}$ (see the samples formed with ∈$_{pre}$=11.3% and 25.5%). At higher ∈$_{pre}$, the ribbons (thickness h) separate from the PDMS to form buckles with vertical displacement profiles characterized by:

$$y = \frac{1}{2}A_1^0\left[1 + \cos\left(\frac{\pi}{L_1}x\right)\right]$$

Where:

$$A_1^0 = \frac{4}{\pi}\sqrt{L_1 L_2\left(\varepsilon_{pre} - \frac{h^2\pi^2}{12L_1^2}\right)}$$

$$L_1 = \frac{W}{2*(1+\varepsilon_{pre})}$$

$$L_2 = L_1 + \frac{W_{act}}{2}$$

as determined by nonlinear analysis of buckles formed in a uniform, thin layer. The maximum tensile strain in the ribbons is, approximately, $$\varepsilon_{peak} = \kappa\left|_{max}\frac{h}{2} = y''\right|_{max}\frac{h}{2} = \frac{h}{4}A_1^0\left(\frac{\pi}{L_1}\right)^2$$

The width of the buckles is 2L$_1$ and the periodicity is 2L$_2$. Because h$^2$π$^2$/(12L$_1^2$) is much smaller than ∈$_{pre}$ (i.e., >10% in the report) for h<1 µm, the amplitude is independent of the mechanical properties of ribbons (e.g., thickness, chemical composition, Young's modulus, etc.) and is mainly determined by the layout of adhesion sites and the prestrain. This conclusion suggests a general applicability of this approach: ribbons made of any material will form into similar buckled geometries. This prediction is consistent with the results obtained with Si and GaAs ribbons used here. The calculated profiles, plotted as dotted lines in FIG. 27A for pre-strains of 33.7% and 56.0%, agree well with the observations in GaAs ribbons. Further, the parameters (including periodicity, width, and amplitude) of the buckles shown in FIG. 27A are consistent with analytical calculations, except at low ∈$_{pre}$ (Tables 1 and 2). An interesting result of this study is that the maximum tensile strains in the ribbons are small (e.g. ~1.2%), even for large ∈$_{pre}$ (e.g. 56.0%). This scaling enables stretchability, even with brittle materials such as GaAs, as discussed subsequently.

The lithographically defined adhesion sites can have more complex geometries than the simple grating or grid patterns associated with the structures in FIG. 24. For example, buckles with different widths and amplitudes can be formed in individual ribbons. FIG. 27B shows, as an example, an SEM image of buckled Si ribbon (widths and thicknesses of 50 µm and 290 nm, respectively), formed with a prestrain of 50% and adhesion sites characterized by W$_{act}$=15 µm and W$_{in}$=350, 300, 250, 250, 300, and 350 µm along the lengths of the ribbons. The image clearly shows the variation of widths and amplitudes of adjacent buckles in each of the ribbons. Buckled ribbons can also be formed with different phases for different ribbons. FIG. 27C presents an example of a Si system designed with phases in the buckles that vary linearly with distance perpendicular to the lengths of the ribbons. The UVO mask used for this sample has W$_{act}$ and W$_{in}$ of 15 and 250 µm, respectively. The angle between the activated stripes on PDMS stamp and Si ribbons is 30°. Many other possibilities can easily be achieved, due to the simple lithographic control of the adhesion sites, and some are shown in FIGS. 13-17, for example.

Figure 28A:
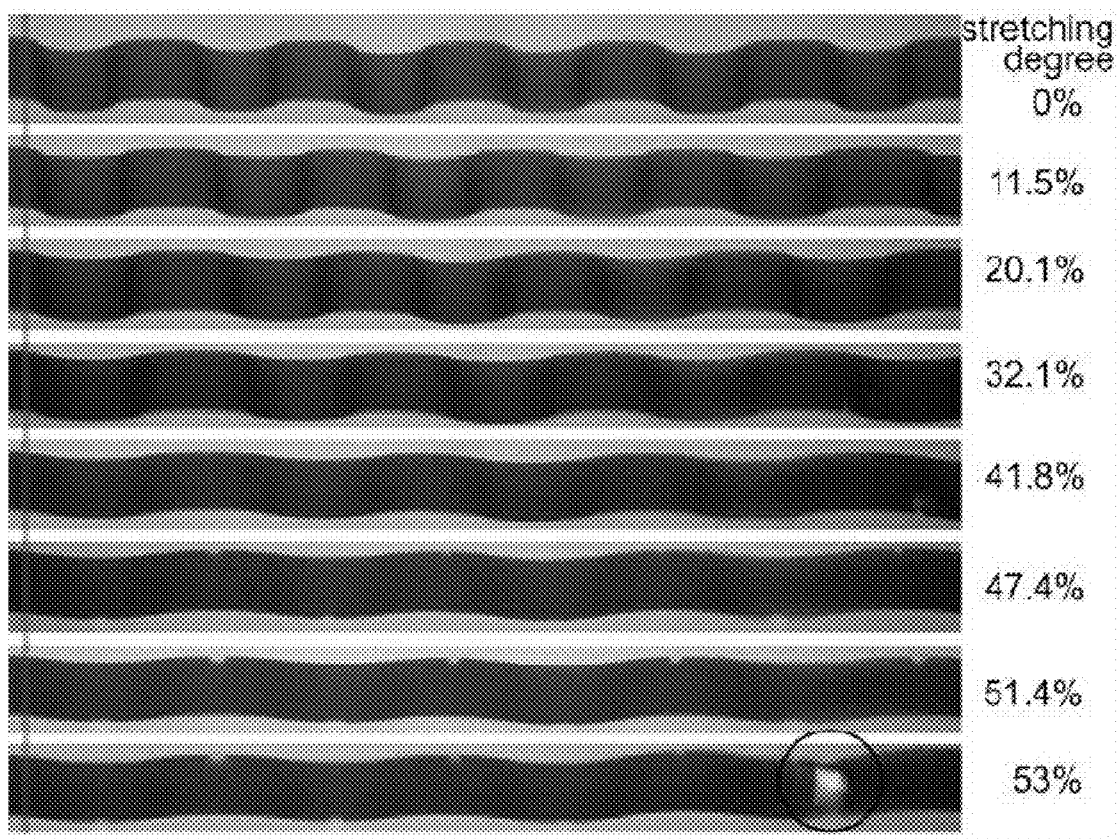
Figure 28B:
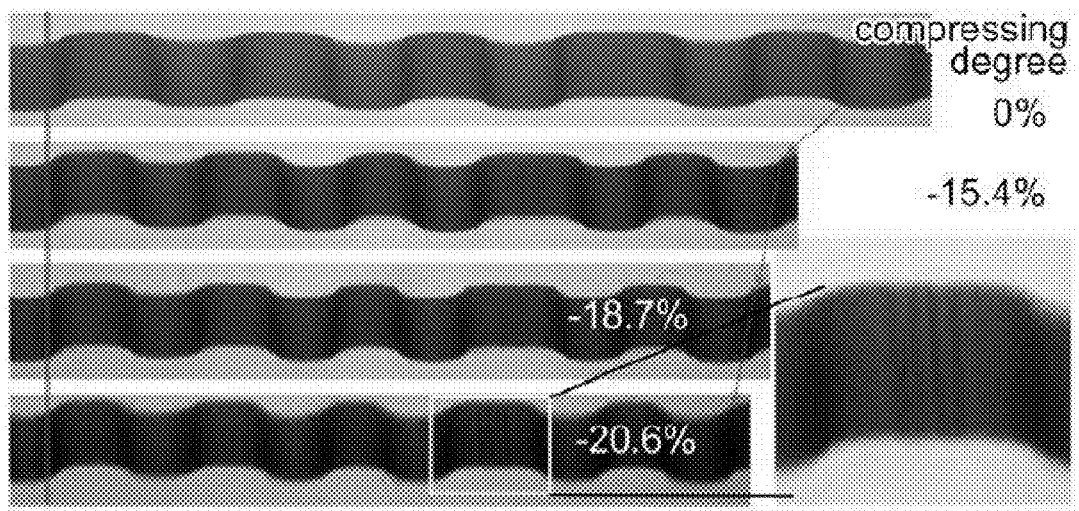
Figure 28C:
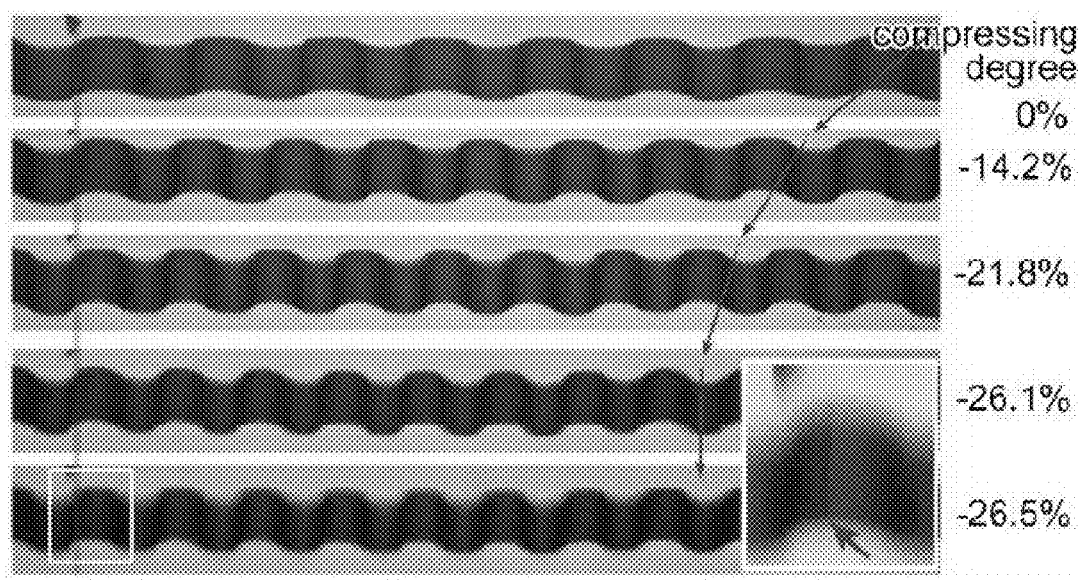

The simple case of buckled GaAs ribbons on PDMS with ∈$_{pre}$=60%, W$_{act}$=10 µm and different W$_{in}$, as shown in FIG. 27D, illustrates an aspect that is important for applications in stretchable electronics. The profiles, which agree well with analytical solutions to the mechanics, show failure due to cracking in the GaAs when W$_{in}$=100 µm (and smaller). The failure results from tensile strains (~2.5% in this case) that exceed the yield point of the GaAs (~2%). An optimized configuration for robustness to stretching and compressing can, therefore, be achieved by selecting $W_{in}$ (>>$W_{act}$) proportional to $\in_{pre}$. In this situation, prestrains up to and greater than 100% can be accommodated. We demonstrated this type of stretchability directly by applying forces to the PDMS supports. Changes in the end-to-end distances ($L_{projected}$) of segments of the ribbons provided a means to quantify the stretchability and compressibility, according to:

$$\left| \frac{L_{projected}^{max} - L_{projected}^{0}}{L_{projected}^{0}} \right| * 100\%,$$

Where $L_{projected}^{max}$ represents the maximum/minimum length before fracture and $L_{projected}^{0}$ is the length in the relaxed state. Stretching and compressing correspond to $L_{projected}^{max}$ greater and less than $L_{projected}^{0}$, respectively. Buckled ribbons on PDMS with $W_{act}$=10 μm and $W_{in}$=400 μm and $\in_{pre}$=60%, exhibit stretchability of 60% (i.e., $\in_{pre}$ and compressibility up to 30%. Embedding the ribbons in PDMS mechanically protects the structures, and also produces a continuous, reversible response, but with slight changes in the mechanics. In particular, the stretchability and compressibility decreased to ~51.4% (FIG. 28A) and ~18.7% (FIG. 28B), respectively. The PDMS matrix on top of the ribbons flattens the peaks of the buckles slightly, due partly to curing induced shrinkage of the overlying PDMS. Small period waves form in these regions under large compressive strains, due to the spontaneous mechanics of the type that generated the wavy ribbon structures described previously. Mechanical failure tended to initiate in these areas, as illustrated in FIG. 28B, thereby reducing the compressibility. Buckled structures with $W_{act}$=10 μm and $W_{in}$=300 μm avoided this type of behavior. Although such samples exhibited slightly lower stretchability than the one shown in FIG. 28A, the absence of the short period waves increased the compressibility to ~26%. Overall, single-crystalline GaAs nanoribbons with buckles formed on the pre-stretched PDMS substrates with patterned surface chemical adhesion sites exhibit stretchability higher than 50% and compressibility larger than 25%, corresponding to full scale strain ranges approaching 100%. These numbers are further improved by increasing $\in_{pre}$ and $W_{in}$ and by using a substrate material capable of higher elongation than PDMS. For even more elaborate systems, these fabrication procedures can be repeated to generate samples with multiple layers of buckled ribbons (see FIG. 29).

A direct consequence of this large stretchability/compressibility is extreme levels of mechanical bendability. FIG. 30A-C present optical micrographs of bent configurations that illustrate this feature. The PDMS substrate (thickness ~4 mm) is bent into concave (radius of ~5.7 mm), flat, and convex (radius of ~6.1 mm) curvatures, respectively. The images illustrate how the profiles changed to accommodate the bending induced surface strains (~20-25% for these cases). The shapes are similar, in fact, to those obtained in compression (by ~20%) and tension (by ~20%). The embedded systems exhibit even higher levels of bendability due to neutral mechanical plane effects. When the top and bottom layers of PDMS had similar thicknesses, there was no change in the buckling shapes during bending (FIG. 30D).

To demonstrate these mechanical properties in functional electronic devices, we build metal semiconductor-metal photodetectors (MSM PDs) using buckled GaAs ribbons with profiles similar to those shown in FIG. 30, by depositing thin gold electrodes onto the SI-GaAs sides of the ribbons for Schottky contacts. FIG. 31A shows the geometry and equivalent circuit, and top-view optical micrographs of an MSM PD before and after stretching by ~50%. In the absence of light, little current flowed through the PD; the current increased with increasing illumination with an infrared beam (wavelength ~850 nm) (FIG. 31B). The asymmetry in the current/voltage (I-V) characteristics can be attributed to differences in the electrical properties of the contacts. FIG. 31C (stretching) and FIG. 31D (compressing) show I-Vs measured at different degrees of stretching and compressing. The current increased when the PD was stretched by up to 44.4% and then decreased with further stretching. Because the intensity per unit area of the light source is constant, the increases in current with stretching can be attributed to increases in the projected area (referred to as effective area, $S_{eff}$) of the buckled GaAs ribbon as it flattens. Further stretching the PD might induce the formation of defects on the surface and/or in the lattice of the GaAs ribbon, resulting in the decrease of current and eventually, at fracture, an open circuit. Similarly, compression decreased $S_{eff}$ and thus decreased the current (FIG. 31D). These results indicate that buckled GaAs ribbons embedded in PDMS matrix provide a fully stretchable/compressible type of photosensor useful for various applications, such as wearable monitors, curved imaging arrays and other devices.

In conclusion, this example indicates that soft elastomers with lithographically defined adhesion sites are useful as tools for creating certain classes of 3D configurations in semiconductor nanoribbons. Stretchable electronics provide one example of the many possible application areas for these types of structures. Simple PD devices demonstrate some capabilities. The high level of control over the structures and the ability to separate high temperature processing steps (e.g. formation of ohmic contacts) from the buckling process and the PDMS indicate that more complex devices (e.g. transistors, and small circuit sheets) are possible. The well controlled phases of buckles in adjacent ribbons provide an opportunity for electrically interconnecting multiple elements. Also, although the experiments reported here used GaAs and Si nanoribbons, other materials (e.g. GaN, InP, and other semiconductors) and other structures (e.g. nanowires, nanomembranes) are compatible with this approach.

FABRICATION OF GaAs RIBBONS: GaAs wafers with customer-designed epitaxial layers (details described in the text) were purchased from IQE Inc., Bethlehem, Pa. Photolithography and wet chemical etching generated the GaAs ribbons. AZ photoresist (e.g., AZ 5214) was spin cast on the GaAs wafers at speed of 5000 rpm for 30 seconds and then soft baked at 100° C. for 1 minute. Exposure through a photomask with patterned lines oriented along the (0 1 1) crystallographic direction of GaAs, followed by development generated line patterns in the photoresist. Mild $O_2$ plasma (i.e., descum process) removed the residual photoresist. The GaAs wafers were then anisotropically etched for 1 minute in the etchant (4 mL $H_3PO_4$ (85 wt %), 52 mL $H_2O_2$ (30 wt %), and 48 mL deionized water), cooled in the ice-water bath. The AlAs layers were dissolved with an HF solution (Fisher® Chemicals) diluted in ethanol (1:2 in volume). The samples with released ribbons on mother wafers were dried in a fume hood. The dried samples were coated with 30 nm $SiO_2$ deposited by electron beam evaporation.

FABRICATION OF Si RIBBONS: The silicon ribbons are fabricated from an silicon-on-insulator (SOI) wafer (Soitect, Inc., top silicon 290 nm, buried oxide 400 nm, p-type). The wafer is patterned by conventional photolithography using AZ 5214 photoresist and etched with SF6 plasma (PlasmaTherm RIE, SF6 40 sccm, 50 mTorr, 100 W). After the photoresist is washed away with acetone, the buried oxide layer is then etched in HF (49%).

FABRICATION OF UVO MASKS: Fused quartz slides are cleaned in piranha solution (at 60° C.) for 15 minutes and thoroughly rinsed with plenty of water. The cleaned slides are dried with nitrogen blowing and placed in the chamber of electron-beam evaporator to be coated with sequential layers of 5-nm Ti (as adhesive layer) and 100-nm Au (mask layer for UV light). Negative photoresist, i.e., SU8 5, is spin cast on the slides at speed of 3000 rpm for 30 seconds to yield ~5 μm thick films. Soft baking, exposing to UV light, post baking, and developing generated patterns in the photoresist. Mild $O_2$ plasma (i.e., descum process) removes the residual photoresist. The photoresist serves as mask to etch Au and Ti using gold etchant (i.e., aqueous solution of I2 and KI) and titanium etchant (i.e., diluted solution of HCl), respectively.

PREPARATION OF PDMS STAMPS: PDMS substrates with thickness of ~4 mm were prepared by pouring the prepolymer (A:B=1:10, Sylgard 184, Dow Corning) into a Petri dish, followed by baking at 65° C. for 4 hours. Slabs with suitable sizes and rectangular shapes were cut from the resulting cured piece and the rinsed with isopropyl alcohol and dried with nitrogen blowing. A specially designed stage was used to mechanically stretch the PDMS to desired levels of strain. Illuminating these stretched substrates to short-wavelength UV light (low-pressure mercury lamp, BHK, 173 μW/cm2 from 240 to 260 nm) for 5 min through a UVO mask placed in contact with the PDMS generated the patterned surface chemistries.

FORMATION AND EMBODIMENT OF BUCKLED GaAs RIBBONS: GaAs wafers with released ribbons coated with $SiO_2$ were laminated against the stretched PDMS with patterned surface chemistry. Baking in an oven at 90° C. for 5 minutes, cooling to room temperature in air, and then slowly relaxing the strain in the PDMS generated buckles along each ribbon. Embedding the buckled ribbons, involved flood exposing to UV light for 5 minutes and then casting of liquid PDMS prepolymers to a thickness of ~4 mm. Curing the sample either in an oven at 65° C. for 4 hours or at room temperature for 36 hours cured the prepolymer, to leave the buckled ribbons embedded in a solid matrix of PDMS.

CHARACTERIZATION OF BUCKLED RIBBONS: The ribbons were imaged with an optical microscope by tilting the sample by ~90° (for nonembedded samples) or ~30° (for embedded samples). The SEM images were recorded on a Philips XL30 field-emission scanning electron microscope after the sample was coated with a thin layer of gold (~5 nm in thickness). The same stage used for pre-stretching the PDMS stamps was used to stretch and compress the resulting samples.

FABRICATION AND CHARACTERIZATION OF SMS PDs: Fabrication of PDs started with samples in the configuration shown in the bottom frame of FIG. 24B. A ~0.8 mm wide strip of poly(ethylene terephthalate) (PET) sheet was gently placed on the PDMS with its longitudinal axis perpendicular to the longitudinal axes of the ribbons. This strip served as a shadow mask for electron beam evaporation of a 30-nm thick gold film (to form Schottky electrodes). Removing the PET stripe, and relaxing the pre-stretched PDMS stamp formed SMS PDs built with buckled GaAs ribbons. Liquid PDMS prepolymer was cast onto the regions of the ribbons without electrodes and then cured in an oven. The gold electrodes extended beyond the top PDMS to enable probing with a semiconductor parameter analyzer. (Agilent 4155C). In measurements of the photoresponse, the PDs were manipulated using a mechanical stage for stretching and compressing. An IR LED source (with wavelength of 850 nm) provided the illumination.

Example 2

Transfer Printing

Our technical approach uses certain ideas embodied in the planar stamp based printing methods previously described. Although these basic techniques provide a promising starting point, many fundamentally new features must be introduced to meet the challenges of the HARDI (Hemispherical Array Detector for Imaging) system, as described in the following.

FIGS. 32 and 33 illustrate a general strategy related to transfer printing to curved surfaces. The first set of steps (FIG. 32) involves the fabrication and manipulation of a thin, spherically curved elastomeric stamp designed to lift off interconnected Si CMOS 'chiplets' from the planar surface of a wafer and then to transform the geometry into a hemispherical shape. A stamp for this process is formed by casting and curing a liquid prepolymer to obtain an elastomer such as poly(dimethylsiloxane) (PMDS) against high quality optical elements (i.e. a matched pair of convex and concave lenses) selected with the required radii of curvature. The stamp has a molded circular rim. Radially stretching this element by mating the molded groove (dashed circle in FIG. 32) on this rim onto an appropriately sized rigid, circular retaining ring transforms this spherical stamp into a stretched, planar sheet. Contacting this stretched stamp to a mother wafer that supports preformed and undercut etched Si CMOS 'chiplets' with thin interconnects and then peeling the stamp away 'inks' this element with these interconnected 'chiplets'. Van der Waals interactions between the chiplets and the soft, elastomeric element provides sufficient adhesion for this process.

Removing the retaining ring causes the PDMS to relax back to its initial hemispherical shape, thereby accomplishing a planar to spherical transformation of the chiplet array. This transformation induces compressive strains at the surface of the stamp. These strains are accommodated in the CMOS chiplet array by local delamination and lifting up of the interconnects (bottom left of FIG. 32). These 'pop-up' interconnects absorb the strains in a manner that avoids damage to the chiplets or detrimental strain-induced changes in their electrical properties. Maintaining the strains in the chiplets below ~0.1% accomplishes these two goals. The space required for the interconnects limits the maximum fill factor of the CMOS chiplets. The photodectectors, however, consumes nearly the full pixel areas, thereby providing a straightforward path to an 80% fill factor target.

In the second set of steps (FIG. 33), the 'inked' hemispherical stamp is used to transfer print these elements onto the final device substrate having a matching shaped cavity (e.g., in this example a glass substrate with a matching hemispherically-shaped cavity). This transfer process uses an ultraviolet (UV) curable photopolymer, such as photocurable BCB (Dow Chemical) or polyurethane (Norland Optical Adhesive) as an adhesive. These materials are applied to the device substrate in the form of a thin (tens of microns thick) liquid film. Upon contact with the stamp, this liquid layer flows to conform to the relief structures associated with the chiplets and the pop-up interconnects. UV light passed through the transparent substrate cures the photopolymer and transforms it into a solid form to yield a smooth, planarized top surface upon removal of the stamp. Final integration to form a functional system involves the deposition and patterning of electrodes and photodetector materials, and lithographic definition of the bus lines to external control circuits.

The approach of FIGS. 32 and 33 has several notable features. First, it exploits state-of-the-art planar electronics technology to enable reliable, cost-effective and high performance operation on the hemispherical substrates. In particular, the chiplets consist of collections of silicon transistors processed at the 0.13 µm design rule to yield the local, pixel-level processing capabilities for the HARDI system. Conventional processing is used with silicon-on-insulator wafers to form these devices. The buried oxide provides the sacrificial layer (undercut etching with HF) to prepare the chiplets for printing. The interconnects consist of narrow and thin (~100 nm) metal lines.

A second feature is that the approach uses elastomeric elements and mechanical designs to enable a well-controlled planar to hemispherical transformation. Reversible, linear mechanics in the transfer stamps and comprehensive mechanical modeling accomplishes this control, as outlined subsequently. A third attractive aspect is that certain basic components of the transfer processes and strategies to control adhesion have been demonstrated in planar applications. In fact, the stages that have been engineered for those planar printing applications can be adapted for the process of FIGS. 32 and 33. FIG. 34 shows a home-built printer with integrated vision systems and air pressure actuators suitable for use in this process.

These types of printer systems are used to demonstrate several aspects of the process of FIGS. 32 and 33. FIG. 35 shows scanning electron micrograph images of the surface of a hemispherical stamp that is 'inked' with an array of single crystal silicon islands interconnected in a square array with heavily doped silicon ribbons. FIG. 36 shows optical images. During the planar to spherical transformation, these ribbon interconnects pop up in the manner depicted in FIG. 32. A key aspect of these types of interconnects is that, when combined with the transfer of fully formed chiplets, they reduce the need for high resolution, curved surface lithography or other forms of processing directly on the hemisphere.

In addition to materials and general processing strategies, full computational modeling of the elastic mechanical response of the hemispherical stamps, the pop-up interconnects and the interactions with the rigid device islands is performed. These calculations reveal the physics of the process at a level that facilitates engineering control and optimization. Simple estimates based on linear elastic plate theory suggest that the strain levels associated with the processes of FIG. 32 can reach 10% or higher for a 2 mm-thick stamp and a sphere with 1 cm radius. For reliable engineering control, it is necessary, therefore, that the stamp is operated in the linear elastic regime for strains up to twice this value—i.e. ~20%. FIG. 37 shows experimental stress/strain curves of several variants of PDMS with which we have experience at the level of bulk, planar stamp based printing. The 184-PDMS appears to provide a good initial material because it provides highly linear and elastic response up to strains of ~40%.

Mechanical measurements such as these, coupled with literature values for the moduli and geometries of the chiplets and the ribbon pop-up interconnects, provide information necessary for the modeling. Two approaches to the calculations are adopted. The first is full-scale finite element modeling (FEM), in which the details of device and interconnect geometry (e.g., size, spacing, multi-layers) on the planar substrate are analyzed. Different materials (e.g., stamp, silicon, interconnects) are accounted for directly in the analysis. A lateral pressure is imposed to deform the stamp and circuits onto the desired spherical shape. The finite element analysis gives the strain distribution, particularly the maximum strain in devices and interconnects, and non-uniform spacing between transformed devices. The advantage of such an approach is that it captures all the details of device geometry and materials, and therefore can be used to explore the effects of different designs of transfer printing process in order to reduce the maximum strain and non-uniformity. This approach, however, is computationally intensive and therefore, time consuming since it involves a wide range of length scales, and the modeling of large numbers of structures devices on the stamp.

The second approach is a unit-cell model for devices (chiplets) that analyzes their mechanical performance upon loading. Each device is represented by a unit cell, and its response upon mechanical loading (e.g., bending and tension) is studied thoroughly via the finite element method. Each device is then replaced by the unit cell linked by interconnects. This unit-cell model is then incorporated into the finite element analysis to replace the detailed modeling of devices and interconnects. Furthermore, away from the edge of the sphere, the strains are relatively uniform such that the many unit-cells can be integrated and their performance can be represented by a coarse-level model. Near the sphere edge the strains are highly non-uniform such that the detailed modeling of devices are still necessary. The advantage of such an approach is that it significantly reduces the computational effort. The full-scale finite element analysis in the first approach is used to validate this unit-cell model. Once validated, the unit-cell model provides a powerful design tool since it is suitable for the quick exploration of different designs of devices, interconnects, and their spacing.

FIG. 38 presents preliminary FEM results for stretching a hemispherical stamp into a planar geometry (and relaxing it back to its hemispherical shape), as outlined in FIG. 32. The top frame shows a cross sectional view of a hemispherical stamp with a geometry like the one schematically illustrated in FIG. 32. These results show slight spatial non-uniformities in the strains of the stretched membrane, as evidenced by its non-uniform thickness. Engineering the thickness profiles of the stamps, through proper selection of the structures against which they are formed by casting and curing, can eliminate these non-uniformities. It is important to note, however, that some non-uniform strains are acceptable because (i) the pop-up interconnects are inherently distortion tolerant, and (ii) the chiplets do not have to be centered perfectly at each pixel location; the larger photodetectors will fill the pixel areas with a uniform back electrode that can establish electrical contact to the chiplets independent of their positions within the pixel areas.

The modeling can also determine the levels of strain in the Si CMOS chiplets. The systems should be designed to keep these chiplet strains below ~0.1-0.2% to avoid changes in the electrical properties and, possibly, mechanical failures due to fracture or delamination. This modeling facilitates the design of stamps and processing conditions to avoid exposure of the chiplets to strains above this range.

Example 3

Biaxially Stretchable "Wavy" Silicon Nanomembranes

This example introduces a biaxially stretchable form of single crystalline silicon that consists of two dimensionally buckled, or "wavy", silicon nanomembranes on elastomeric supports. Fabrication procedures for these structures are described, and various aspects of their geometries and responses to uniaxial and biaxial strains along various directions are presented. Analytical models of the mechanics of these systems provide a framework for quantitatively understanding their behavior. These classes of materials provides a route to high-performance electronics with full, two-dimensional stretchability.

Electronics that offer mechanically bendability are of interest for applications in information display, X-ray imaging, photovoltaic devices, and other systems. Reversible stretchability is a different and much more technically challenging mechanical characteristic that would enable device possibilities that cannot be realized with electronics that are only bendable, such as smart surgical gloves, electronic eye cameras, and personal health monitors. In one approach to electronics of this type, stretchable wires interconnect rigid device islands to provide circuit level stretchability with device components that are not stretchable. In an alternative strategy, certain structural forms of thin single-crystal semiconductor and other electronic materials allow stretchability in the devices themselves. Recent demonstrations involved the use of buckled, one-dimensional "wavy" geometries in nanoribbons (thicknesses between tens and hundreds of nanometers and widths in the micrometer range) of silicon and gallium arsenide to achieve uniaxial stretchability in metal oxide semiconductor field effect transistors (MOSFETs), metal semiconductor field effect transistors (MESFETs), pn junction diodes, and Schottky diodes. This example shows that nanomembranes of similar materials can be formed into two-dimensional (2D) wavy geometries to provide full 2D stretchability. The fabrication procedures for such systems are described, together with detailed experimental characterization and analytical modeling of their mechanical response.

FIG. 39 schematically illustrates the steps for forming two-dimensionally stretchable Si nanomembranes on elastomeric supports. For this example, these membranes are fabricated from silicon-on-insulator (SOI) wafers (Soitec, Inc., p-type) starting with the formation of a square array of holes in the top silicon (~2.5 μm diameter, and ~25 μm pitch), by defining suitable patterns of photoresist by photolithography and then removing the exposed silicon by reactive ion etching (PlasmaTherm RIE, $SF_6$ 40 sccm, 50 mTorr, 100 W). This same step defines the overall lateral dimensions of the membranes which, for the samples reported here, are in the range of 3-5 mm square. The thicknesses are between 55 and 320 nm. Immersing the etched samples in concentrated hydrofluoric acid (HF 49%) removes the buried $SiO_2$ layer (145~1000 nm thick); washing in acetone removed the photoresist. Casting and curing prepolymers of poly(dimethylsiloxane) (PDMS) against polished silicon wafers generated flat, elastomeric substrates (~4 mm thick). Exposure to an ozone environment created by intense ultraviolet light (240-260 nm) for 5 min converted the hydrophobic PDMS surface (—$CH_3$ and —H end groups) to a hydrophilic state (—OH and —O—Si—O end groups). Heating such an activated PDMS substrate briefly at 70-180° C. in a convection oven induced a controlled degree of isotropic thermal expansion. Contacting this element to the processed SOI wafer and then peeling it off again transferred the entire nanomembrane to the PDMS. Continued heating in the convection oven for a few minutes facilitated the formation of strong adhesive bonds between the membrane and the PDMS. In the final step, the nanomembrane/PDMS structure i cooled to room temperature (ca. 25° C.) to release the thermally induced prestrain (ΔL/L). This process led to the spontaneous formation of two-dimensional (2D) wavy structures of relief in the Si nanomembrane and the near surface region of the PDMS. These structures exhibit different behaviors near the edges, where one-dimensional periodic waves predominate, at the inner regions, where two-dimensional herringbone layouts are typically observed, and near the centers, where disordered herringbone structures often occur. The herringbone region is characterized by the distance between adjacent peaks in the waves, which we refer to as the short wavelength λ, the amplitude of wave $A_1$ (not shown in FIG. 1), and a longer distance $2\pi/k_2$ (along the ×2 direction), associated with the separation between adjacent "jogs" in the herringbone structure, which we refer to as the long wavelength. Other characteristic length are the 'jogs' wavelength $2\pi/k_1$ (along the $x_1$ direction, normal to the long wavelength direction $x_2$), the amplitude $A_2$ of the jogs, the jog angle θ. The bottom frames of FIG. 39 illustrate these features schematically.

Parts a-f of FIG. 40 show optical micrographs collected at different stages during the formation of herringbone waves, for the case of a nanomembrane with 100 nm thickness (lateral dimension of ca. 4×4 $mm^2$) and thermal prestrain (defined by heating to 150° C.) of ~3.8%. These images indicate structure formation in two stages, the first of which involves predominantly one-dimensional waves over large areas followed by bending of these wave structures to form, ultimately, compact herringbone layouts at full cooling (FIG. 40 *d-f*). FIG. 40*h* shows the time evolution of both characteristic wavelengths. The short wavelength tends to decrease as the cooling leads to progressively larger compressive strain on the silicon due to the relatively larger thermal contraction of the PDMS. In particular, this value decreases from 17-18 μm in the initial stages to ~14.7 μm when the herringbone structure becomes prominent and finally to ~12.7 μm in the fully cooled state. This wavelength is uniform (~5% variation) over large areas. By contrast, the long wavelength associated with the herringbone layout exhibits a broad range of values, as is evident from the image in FIG. 40*g*. Measurements at ~100 spots across this sample yield a distribution of values, summarized in the histogram of FIG. 40*g*. The herringbone structure can be represented by an out-of-plane displacement $w=A_1 \cos[k_1x_1+k_1A_2\cos(k_2x_2)]$ (FIG. 49). Here the coefficients, amplitude of wave $A_1$, long wavelength $2\pi/k_2$, jogs wavelength $2\pi/k_1$ and the amplitude $A_2$ of the jogs are determined by analysis for a particular membrane thickness, mechanical properties of the film, and substrate. The short wavelength λ is $(2\pi/k_1)\sin(\theta/2)$. The modeling uses the Si strain, as determined from measured contour lengths and periods of the wavy structures, as the applied prestrain, instead of the thermal prestain (FIG. 50). The actual strain that deforms the Si is typically somewhat smaller than the estimated thermal prestain, due possibly to a loading effect of the Si on the PDMS. The Si strain, for example, is 2.4% at the thermal prestrain of 3.8%. For such a displacement w, the stress, strain, and displacement fields in the Si film can be obtained in terms of $A_1$, $k_1$, $A_2$, and $k_2$ from the Von Karman plate theory. The fields in the PDMS substrate are obtained from 3D elasticity theory. Minimizing the total energy, which consists of the membrane energy and bending energy in the Si film and the elastic energy in the PDMS substrate gives $A_1$, $k_1$, $A_2$, and $k_2$. The Young's modulus and Poisson's ratio of Si and PDMS are $E_{Si}$=130 GPa, $v_{Si}$=0.27, $E_{PDMS}$=1.8 MPa, and $V_{PDMS}$=0.5. Both the experiments and model give the jog angle θ to be about 90°. The short wavelength given by the theory is 12.4 μm at 2.4% biaxial prestrain, which agrees well with the experimental results above. The large variation in the long wavelength $2\pi/k_2$ is also predicted by the theoretical calculation, from 30 to 60 μm.

FIG. 41 presents atomic force microscope (AFM) and scanning electron microscope (SEM) images of structures similar to those illustrated in the fully cooled state of FIG. 40. These images clearly show that the herringbone patterns are characterized by zigzag structures that define two characteristic directions, even though the compressive strain is completely isotropic. The herringbone structures represent a minimum elastic energy configuration that reduces the overall in-plane stress in the system and relieves biaxial compression in both directions. This geometry is, therefore, preferred over large areas, compared to the "checkerboard" and 1D wave layouts because the herringbone mode is the only one of these three modes that relaxes the in-plane stress in all directions without incurring significant stretch energy. Only in the immediate vicinity of the jogs is significant stretch induced. The 1D mode lowers the prestress only in one direction. The checkerboard mode lowers the stress in all directions, but it produces significant stretch energy accompanying the bending.

The two linecuts extracted from the AFM images indicate periodic, although only approximately sinusoidal, relief profiles along the jogs direction (profile i) and perpendicular to waves (profile ii). The $\lambda$ and $A_1$ of waves, determined from profile ii, are 12.8 and 0.66 µm, respectively. The $\lambda$ given by theoretical analysis, 12.4 µm, is similar with the experimental data; however, the $A_1$ from theoretical analysis is 0.90 µm, somewhat higher value than the experimental results. The SEM images show clearly the intimate bonding between the membrane and the PDMS, as evidenced by the behavior of the sample near the small holes in the silicon in both the raised and recessed regions of the waves. These images also indicate that the wave structures are completely uncorrelated to the position of these holes, since the hole size of 2.5 µm is much smaller than the characteristic wavelengths of the deformation modes in our experiments. Studies of the dependence of the geometry of the wavy structures on the thickness of the silicon can provide additional insights into the physics and further validate the mechanics models. FIG. 42 shows some results, including optical micrographs and wavelengths and amplitudes of wave structures formed in membranes with different thicknesses for similar thermal strains. For 100 nm thickness, the $\lambda$ and $A_1$ of waves are 12.6 (±0.37) and 0.64 (±0.07) µm, respectively, and for 320 nm thick, they are 45.1 (±1.06) and 1.95 (±0.18) µm. These values correspond reasonably well with theoretical calculations, which yield the $\lambda$ and $A_1$ are 12.4 and 0.90 µm for the 100 nm case and 45.1 and 3.29 µm respectively, for the 320 nm case.

These wavy membranes provide true stretchability for strains in various in-plane directions, as opposed to the one-dimensional stretchability provided by previously described ribbon geometries. To investigate this aspect, we perform uniaxial tensile stretching tests along different directions using a calibrated mechanical stage and a 2D stretchable membrane prepared with a thermally induced prestrain of 3.8%. FIG. 43 provides some images. In case i, tensile stain ($\in_{st}$) applied along the direction of the long waves caused the herringbone structure to "unfold" ($\in_{st}$)) 1.8%), gradually leading to a 1D wavy geometry at a fully stretched state ($\in_{st}$) 3.8%). This stretching induces, by the Poisson effect, a compressive strain in the orthogonal direction with an amplitude roughly equal to half of the tensile strain. This compressive strain can be accommodated by compression of the wavy structures in this direction. Upon release of the applied tensile strain, the original herringbone waves recovered to exhibit structures quite similar to the original. (FIG. 51 shows optical micrographs collected after 5, 10, and 15 stretching cycles).

Tensile strains applied in a diagonal direction (case ii), showed similar structural changes although at full stretching the 1D wave structures aligned along a direction defined by the applied strain, rather than the initial geometry. For the perpendicular case iii, at small strain $\in_{st}$ 1.8%) certain portions of the sample lose completely the herringbone layout to yield new 1D waves along the stretching direction. With increasing strain, more regions undergo this transformation until the entire area consists of these oriented 1D waves. These newly formed 1D waves are perpendicular to the orientation of the original waves; upon release, they simply bend to create a disordered herringbone-like geometry. For all cases shown in FIG. 43B, the wavelength increases with tensile strain and recovers to its initial value upon the release, even though compressive stresses are induced in the orthogonal direction by the Poisson effect. This behavior arises from an increase of $\lambda$ induced by the unfolding of the herringbone waves that is larger than the decrease in this wavelength caused by the Poisson effect. (FIG. 52) For case i, the jogs wavelength, $2\pi/k_1$ (FIG. 52A) decreases to $2\pi/k'_1$ (FIG. 52B), i.e., $k'_1 > k_1$, under the applied tensile strain, $\in_{st}$, due to the Poisson effect. However, the corresponding jog angle $\theta'$ is larger than the angle $\theta$ due to the unfolding of the herringbone structure. The short wavelength $\lambda = (2\pi/k_1)\sin(\theta/2)$ becomes $\lambda = (2\pi/k'_1)\sin(\theta'/2)$, which may be larger than $\lambda$ when the effect of angle change overcomes the Poisson effect. Our theoretical model gives $\lambda = 12.4, 14.6$, and 17.2 µm for $\in_{st} = 0$, 1.8, and 3.8%, which confirms that the short wavelength increases with the applied strain, as observed in experiments. For case iii, both $\lambda$ and $2\pi/k_1$ increased with applied stretching strain, since waves were relaxed along the direction of stretching strain, and the jogs angle ($\theta$) was not changed significantly by the Poisson effect. The biaxial stretchability of the buckled membranes was also investigated by thermally induced tensile strains (FIG. 53). The herringbone waves generated by thermal strain slowly disappeared as the sample was heated; they recovered completely upon cooling.

These observations apply only to the central regions of the membranes. As indicated in the bottom frames of FIG. 39, the edges of the membranes show 1D wave structures with wavevectors oriented along the edges. AFM images and linecut profiles of the edge region, the central region, and the transition area between them are shown in FIG. 44. The 1D waves that originate near the edge of the Si (top frame) gradually become bent (middle frame) until they transform into the herringbone geometries in the central regions (bottom frame). The $\lambda$ values in these regions are 16.6, 13.7, and 12.7 µm, respectively (from top frame), with $A_1$ of 0.52, 0.55, and 0.67 µm. Compared to the 1D waves at the edges, the 2D herringbone waves have smaller $\lambda$ and $A_1$, suggesting that the inner area of Si is affected more strongly by the compressive strain than the edges. The stress state near the edge is approximately uniaxial compression within some distance range because of the traction-free edge of the membrane. This uniaxial compression is parallel to this free edge and therefore leads to 1D waves along the edge. The stress state, however, becomes equi-biaxial compressive in the central region where herringbone structures result. For the transition area between the 1D wavy edge and the herringbone waves, the unbalanced biaxial compression causes a "semi"-herringbone wave with the large jog angle. Our model yields $\lambda$ and $A_1$ of 16.9 and 0.83 µm, respectively, for the 1D waves and 12.4 and 0.90 µm for the herringbone structure. These results agree reasonably well with the experimentally observed values.

To investigate further these edge effects, we fabricated rectangular membranes with lengths of 1000 µm and with widths of 100, 200, 500, and 1000 µm, all on the same PDMS substrate. FIG. 45 shows optical micrographs of these structures, for two different levels of thermal prestrain. At low thermal prestrain (ca. 2.3%, FIG. 45A), the 100 and 200 µm wide membranes exhibit perfect 1D waves from one side to the other, with flat, undeformed regions at the ends. The 500 μm wide membrane shows similar 1D waves and flat regions, but the waves have slightly bent geometries in the middle of the structures, with overall ordering and uniformity in orientation that are substantially less than the 100 and 200 μm cases. For the 1000 μm square, 1D waves are present in the central regions of the edges, with flat areas in the corners. The center part of the membrane shows fully developed herringbone geometries. For the corner flat region, there is an approximately stress-free state due to the two free edges. No waves form near such corners. With increasing prestrain (4.8%, FIG. 45B), the flat regions in all cases decrease in size. 1D wavy behavior persists in the 100 and 200 μm ribbons, but pronounced herringbone morphologies appear in the central region of the 500 μm case. At the higher prestrain, equibiaxial compressive strains are present in the inner region of 500 μm wide membrane. For the 1000 μm square membrane, the herringbone behavior extends to regions close to the edges. The characteristic length scales that define the spatial extent of the flat regions, which we refer to as the edge effect length, Ledge, can be evaluated as a function of membrane size and prestrain. FIG. 45C shows results that indicate a linear scaling of this length with prestrain, in a manner that is independent of the size of the membrane, for the cases investigated here. As the prestrain becomes higher, the length of uniaxial strain region becomes smaller. Therefore, shorter range 1D waves form and similar behavior can be observed in the stress-free regions near the two free edges.

FIG. 46 shows optical micrographs of wavy structures that form in other membrane geometries, including circles, ovals, hexagons, and triangles. The results are qualitatively consistent with observations in the ribbons and squares of FIG. 45. In particular, the edge regions show 1D waves oriented parallel to the edges. Waves with the orthogonal orientation only appear at distances larger than the $L_{edge}$ from the edge. For the circle, 1D waves appear near the edges, with an overall radial orientation due to the shape of the membrane. Herringbone waves appear in the center. The ovals exhibit similar behavior, although with flat regions at the edges of the major axis, due to the small radius of curvature in these regions. For the hexagon and triangle shapes, the sharp corners (angles of 120° and 60°, respectively), lead to flat regions. Herringbone geometries appear in the center of the hexagons. The centers of the triangles show the merging of 1D waves, for the level of prestrain shown here. For shapes with clear corners (e.g., hexagon, triangle, and tip of ellipse), there is no wave near the corner because the two intersecting free edges (not necessarily perpendicular) give a stress-free state. For the triangle shape, there is not enough space to generate the herringbone structure even in the central region.

The membranes themselves provide a path to biaxially stretchable electronic devices. The edge effects outlined above can be exploited to realize a particular outcome that might be useful for certain classes of such devices. In particular, in an imaging system, there might be value in maintaining flat, undeformed regions at the locations of the photodetectors to avoid nonideal behavior that occurs when these devices have wavy shapes. FIG. 47 presents some representative examples of stretchable membranes that achieve this outcome. These structures consist of 100×100 μm square islands connected by 30 μm×150 μm ribbons (30 μm×210 μm for orthogonal ribbons) in the vertical and horizontal directions (FIG. 47A, C), and in the vertical, horizontal and diagonal directions (FIG. 47E, G). Changes in the amplitudes and wavelengths of the waves in the ribbons provide a means to accommodate applied strains, in a manner that largely avoids deformations in the regions of the square islands. We examined the behavior of these structures at several different applied strains. Parts a and e of FIG. 47 show representative cases in the low strain (ca. 2.3%) regime, applied by heating the samples in an oven. Parts c and g of FIG. 47 show the same structures at relatively high biaxial strains (ca. 15%), applied using a mechanical stage. As is evident, in the low-strain regime the islands remain flat; at sufficiently high strains, wave structures begin to form in these regions. Good adhesion between PDMS and Si was maintained at all strains, as shown in the tilted angle SEM images (FIGS. 47B, D, F, H). The insets of high-magnification SEM image in parts b and d of FIG. 47 also confirm the strong bond of Si with PDMS.

In summary, nanomembranes of silicon can be integrated with prestrained elastomeric substrates to create 2D "wavy" structures with a range of geometries. Many aspects of the mechanical behavior of these systems are in good agreement to theoretically predicted behaviors. These results are useful for applications of electronics in systems where full stretchability is required during use or during installation.

REFERENCES

1. Duan, X. & Lieber, C. M. General synthesis of compound semiconductor nanowires. Adv. Mater. 12, 298-302 (2000).
2. Xiang, J., Lu, W., Hu, Y., Wu, Y., Yan, H. & Lieber, C. M. Ge/Si nanowire heterostructures as high-performance field-effect transistors. Nature 441, 489-493 (2006).
3. Wu, Y., Yan, H., Huang, M., Messer, B., Song, J. H. & Yang, P. Inorganic semiconductor nanowires: rational growth, assembly, and novel properties. Chem. Eur. J. 8, 1261-1268 (2002).
4. Pan, Z. W., Dai, Z. R. & Wang, Z. L. Nanobelts of semiconducting oxides. Science 291, 1947-1949 (2001).
5. Peng, X., Manna, L., Yang, W., Wickham, J., Scher, E., Kadavanich, A. & Alivisatos, A. P. Shape control of CdSe nanocrystals. Nature 404, 59-61 (2000).
6. Wang, D., Chang, Y.-L., Lu, Z. & Dai, H. Oxidation resistant germanium nanowires: bulk synthesis, long chain alkanethiol functionalization, and Langmuir-Blodgett assembly. J. Am. Chem. Soc. 127, 11871-11875 (2005).
7. Huang, M. H., Wu, Y., Feick, H., Tran, N., Weber, E. & Yang, P. Catalytic growth of zinc oxide nanowires by vapor transport. Adv. Mater. 13, 113-116 (2001).
8. Gudiksen, M. S., Wang, J. & Lieber, C. M. Synthetic control of the diameter and length of single crystal semiconductor nanowires. J. Phys. Chem. B 105, 4062-4064 (2001).
9. Yu, H., Li, J., Loomis, R. A., Wang, L.-W. & Buhro, W. E. Two-versus three-dimensional quantum confinement in indium phosphide wires and dots. Nat. Mater. 2, 517-520 (2003).
10. Sun, Y. & Rogers, J. A. Fabricating semiconductor nano/microwires and transfer printing ordered arrays of them onto plastic substrates. Nano Lett. 4, 1953-1959 (2004).
11. Yin, Y., Gates, B. & Xia, Y. A soft lithography approach to the fabrication of nanostructures of single crystalline silicon with well-defined dimensions and shapes. 12, 1426-1430 (2000).
12. Kodambaka, S., Hannon, J. B., Tromp, R. M. & Ross, F. M. Control of Si nanowire growth by oxygen. Nano Lett. 6, 1292-1296 (2006).
13. Shan, Y., Kalkan, A. K., Peng, C.-Y. & Fonash, S. J. From Si source gas directly to positioned, electrically contacted Si nanowires: the self-assembling "grow-in-place" approach. Nano Lett. 4, 2085-2089 (2004).

14. He, R., Cao, D., Fan, R., Hochbaum, A. I., Carraro, C., Maboudian, R. & Yang, P. Si nanowire bridges in microtrenches: integration of growth into device fabrication. Adv. Mater. 17, 2098-2102 (2005).
15. Lee, K. J., Motala, M. J., Meitl, M. A., Childs, W. R., Menard, E., Shim, A. K., Rogers, J. A. & Nuzzo, R. G. Large-area, selective transfer of microstructured silicon: a printing-based approach to high-performance thin-film transistors supported on flexible substrates. Adv. Mater. 17, 2332-2336 (2005).
16. Gao, P. X., Ding, Y., Mai, W., Hughes, W. L., Lao, C. & Wang, Z. L. Conversion of zinc oxide nanobelts into superlattice-structured nanohelices. Science 309, 1700-1704 (2005).
17. Kong, X. Y., Ding, Y., Yang, R. & Wang, Z. L. Single-crystal nanorings formed by epitaxial self-coiling of polar nanobelts. Science 303, 1348-1351 (2004).
18. Chen, P., Chua, S. J., Wang, Y. D., Sander, M. D. & Fonstad, C. G. InGaN nanorings and nanodots by selective area epitaxy. Appl. Phys. Lett. 87, 143111 (2005).
19. Manna, L., Milliron, D. J., Meisel, A., Scher, E. C. & Alivisatos, A. P. Controlled growth of tetrapod-branched inorganic nanocrystals. Nat. Mater. 2, 382-385 (2003).
20. Dick, K. A., Deppert, K., Larsson, M. W., Martensson, T., Seifert, W., Wallenberg, L. R. & Samuelson, L. Synthesis of branched 'nanotrees' by controlled seeding of multiple branching events. Nat. Mater. 3, 380-384 (2004).
21. Khang, D.-Y., Jiang, H., Huang, Y. & Rogers, J. A. A stretchable form of single-crystal silicon for high-performance electronics on rubber substrates. Science 311, 208-212 (2006).
22. Schmidt, O. G. & Eberl, K. Thin solid films roll up into nanotubes. Nature 410, 168-168 (2001).
23. Zhang, L., Ruh, E., Grützmacher, D., Dong, L., Bell, D. J., Nelson, B. J. & Schönenberger, C. Anomalous coiling of SiGe/Si and SiGe/Si/Cr helical nanobelts. Nano Lett. 6, 1311-1317 (2006).
24. Jin, H.-C., Abelson, J. R., Erhardt, M. K. & Nuzzo, R. G. Soft lithographic fabrication of an image sensor array on a curved substrate. J. Vac. Sci. Technol. B 22, 2548-2551 (2004).
25. Someya, T., Sekitani, T., Iba, S., Kato, Y., Kawaguchi, H. & Sakurai, T. A large-area, flexible pressure sensor matrix with organic field-effect transistors for artificial skin applications. Proc. Natl. Acad. Sic. U.S.A. 101, 9966-9970 (2004).
26. Nathan, A., Park, B., Sazonov, A., Tao, S., Chan, I., Servati, P., Karim, K., Charania, T., Striakhilev, D., Ma, Q. & Murthy, R. V. R. Amorphous silicon detector and thin film transistor technology for large-area imaging of X-rays. Microelectronics J. 31, 883-891 (2000).
27. Lacour, S. P., Jones, J., Wagner, S., Li, T. & Suo, Z. Stretchable interconnects for elastic electronic surfaces. Proc. IEEE 93, 1459-1467 (2005).
28. Childs, W. R., Motala, M. J., Lee, K. J. & Nuzzo, R. G. Masterless soft lithography: patterning UV/Ozone-induced adhesion on poly(dimethylsiloxane) surfaces. Langmuir 21, 10096-10105 (2005).
29. Sun, Y., Kumar, V., Adesida, I. & Rogers, J. A. Buckled and wavy ribbons of GaAs for high-performance electronics on elastomeric substrates. Adv. Mater. in press.
30. Sun, Y., Khang, D.-Y., Hua, F., Hurley, K. Nuzzo, R. G. & Rogers, J. A. Photolithographic route to the fabrication of micro/nanowires of III-V semiconductors. Adv. Funct. Mater. 15, 30-40 (2005).
32. Loo, Y.-L.; Someya, T., Baldwin, K. W., Bao, Z., Ho, P., Dodabalapur, A., Katz, H. E. & Rogers, J. A. Soft, conformable electrical contacts for organic semiconductors: high-resolution plastic circuits by lamination. Proc. Natl. Acad. Sci. U.S.A. 99, 10252-10256 (2002).
33. Suo, Z., Ma, E. Y., Gleskova, H., Wagner, S. Mechanics of rollable and foldable film-on-foil electronics. Appl. Phys. Lett. 74, 1177-1179 (1999).

P. Mandlik, S. P. Lacour, J. W. Li, S. Y. Chou, and S. Wagner, Ieee Electron Device Letters 27, 650-652 (2006).
D. S. Gray, J. Tien, and C. S. Chen, Advanced Materials 16, 393-+(2004).
S. P. Lacour, S. Wagner, Z. Y. Huang, and Z. Suo, Applied Physics Letters 82, 2404-2406 (2003).
S. P. Lacour, J. Jones, S. Wagner, T. Li, and Z. G. Suo, Proceedings of the Ieee 93, 1459-1467 (2005).
J. Jones, S. P. Lacour, S. Wagner, and Z. G. Suo, Journal of Vacuum Science & Technology A 22, 1723-1725 (2004).
S. P. Lacour, J. Jones, Z. Suo, and S. Wagner, Ieee Electron Device Letters 25, 179-181 (2004).
W. T. S. Huck, N. Bowden, P. Onck, T. Pardoen, J. W. Hutchinson, and G. M. Whitesides, Langmuir 16, 3497-3501 (2000).
N. Bowden, S. Brittain, A. G. Evans, J. W. Hutchinson, and G. M. Whitesides, Nature 393, 146-149 (1998).
S. Wagner, S. P. Lacour, J. Jones, P. H. I. Hsu, J. C. Sturm, T. Li, and Z. G. Suo, Physica E-Low-Dimensional Systems & Nanostructures 25, 326-334 (2004).
H. Kudo, T. Sawada, E. Kazawa, H. Yoshida, Y. Iwasaki, and K. Mitsubayashi, Biosensors & Bioelectronics 22, 558-562 (2006).
T. Li, Z. G. Suo, S. P. Lacour, and S. Wagner, Journal of Materials Research 20, 3274-3277 (2005).
S. P. Lacour, D. Chan, S. Wagner, T. Li, and Z. G. Suo, Applied Physics Letters 88 (2006).
S. P. Lacour, C. Tsay, and S. Wagner, Ieee Electron Device Letters 25, 792-794 (2004).
S. P. Lacour, S. Wagner, R. J. Narayan, T. Li, and Z. G. Suo, Journal of Applied Physics 100 (2006).
Reuss, R. H et al. Proc. IEEE 2005, 93, 1239.
Jain, K. et al. Proc. IEEE 2005, 93, 1500.
Nathan, A. et al. Microelectron. Reliab. 2002, 42, 735.
Someya, T et al. T. Proc. Natl. Acad. Sci. U.S.A. 2004, 101, 9966.
Hsu, P. H. I. et al. IEEE Trans. Electron. DeV. 2004, 51, 371.
Jin, H. C. et al. Vac. Sci. Technol., B: Microelectron. Nanometer Struct.-Process., Meas., Phenom. 2004, 22, 2548.
Nathan, A.; et al. Microelectron. J. 2000, 31, 883.
Someya, T. et al. Proc. Natl. Acad. Sci. U.S.A. 2005, 103, 12321.
Lacour, S. P. et al. Proc. IEEE 2005, 93, 1459. (c)
Lacour, S. P. et al. Appl. Phys. Lett. 2003, 82, 2404.
Khang, D.-Y. et al. Science 2006, 311, 208.
Sun, Y. et al. Adv. Mater. 2006, 18, 2857.
Sun, Y. et al. Nat. Nanotechnol. 2007, 1, 201.
Ouyang, M. et al. Chem. Mater. 2000, 12, 1591.
Childs, W. R.; Nuzzo, R. G. J. Am. Chem. Soc. 2002, 124, 13583.
Efimenko, K. et al. J. Colloid Interface Sci. 2002, 254, 306.
Hillborg, H. et al. Langmuir 2004, 20, 785.
Buma, T. et al. Appl. Phys. Lett. 2001, 79, 548.
Properties of Silicon; INSPEC: New York, 1998. The coefficients of thermal expansion are RPDMS) $3.1 \times 10^{-4} K^{-1}$ and $\alpha_{Si}$) $2.6 \times 10^{-6} K^{-1}$ for PDMS substrate and Si nanomembrane, respectively. The thermal prestrain for the samples prepared at 150° C. was calculated by $\Delta\alpha\Delta T = (3.1 \times 10^{-4} - 2.6 \times 10^{-6})(150-25) = 3.8\%$.
Timoshenko, S. Theory of Plates and Shells; McGraw-Hill: New York, 1940.

Timoshenko, S.; Goodier, J. N. Theory of Elasticity, 3rd ed.; McGraw-Hill: New York, 1969.
Chen, X.; Hutchinson, J. W. J. Appl. Mech. Trans. ASME 2004, 71, 597.
Chen, X.; Hutchinson, J. W. Scr. Mater. 2004, 50, 797.
Huang, Z. Y. et al. J. Mech. Phys. Solids 2005, 53, 2101.
Bietsch, A.; Michel, B. J. Appl. Phys. 2000, 88, 4310.
Ohzono, T.; Shimomura, M. Phys. Rev. B 2004, 69, 132202.
Ohzono, T.; Shimomura, M. Langmuir 2005, 21, 7230.

Example 4

Heterogeneously Integrated, Three Dimensional Electronics by Use of Printed Semiconductor Nanomaterials We have developed a simple approach to combine broad classes of dissimilar materials into heterogeneously integrated (HGI) electronic systems with two or three dimensional (3D) layouts. The process begins with the synthesis of different semiconductor nanomaterials (e.g. single walled carbon nanotubes and single crystal nanowires/ribbons of gallium nitride, silicon and gallium arsenide) on separate substrates. Repeated application of an additive, transfer printing process using soft stamps and these substrates as donors, followed by device and interconnect formation, yields high performance 3D-HGI electronics that incorporate any combination of these (or other) semiconductor nanomaterials on rigid or flexible device substrates. This versatile methodology can produce a wide range of unusual electronic systems that are difficult or impossible to achieve using other techniques.

Many existing and emerging electronic devices benefit from the monolithic, heterogeneous integration (HOD of dissimilar classes of semiconductors into single systems, in either two or three dimensional (2D or 3D) layouts. Examples include multifunctional radio frequency communication devices, infrared (IR) imaging cameras, addressable sensor arrays and hybrid CMOS/nanowire/nanodevice circuits (3-7). In some representative systems, compound semiconductors or other materials provide high speed operation, efficient photodetection or sensing capabilities while silicon CMOS provides digital readout and signal processing, in circuits that often involve stacked 3D configurations. Wafer bonding (8) and epitaxial growth (9,10) represent the two most widely used methods for achieving these types of 3D-HGI systems. The former process involves physical bonding, by use of adhesives or thermally initiated interface chemistries, of integrated circuits, photodiodes or sensors formed separately on different semiconductor wafers. This approach works well in many cases, but it has important drawbacks, including (i) limited ability to scale to large areas or to more than a few layers in the third (i.e. stacking) dimension, (ii) incompatibility with unusual (e.g. nanostructured materials) or low temperature materials and substrates, (iii) challenging fabrication and alignment for the through-wafer electrical interconnects, (iv) demanding requirements for flat, planar bonding surfaces and (v) bowing and cracking that can occur from mechanical strains generated by differential thermal expansion/contraction of disparate materials. Epitaxial growth provides a different approach that involves the direct formation, by molecular beam epitaxy or other means, of thin layers of semiconductor materials on the surfaces of wafers of other materials. Although this method avoids some of the aforementioned problems, the requirements for epitaxy place severe restrictions on the quality and type of materials that can be grown, even when buffer layers and other advanced techniques are used. By contrast, emerging classes of semiconductor nanomaterials, such as nanoscale wires, ribbons, membranes or particles of inorganic materials, or carbon based systems such as single walled carbon nanotubes (SWNTs) or graphene sheets (11-14), can be grown and then suspended in solvents or transferred onto substrates in a manner that bypasses the need for epitaxial growth or wafer bonding. Recent work shows, for example, the integration, in 2D layouts, of crossed nanowire diodes formed by solution casting (15). The results presented here illustrate how dissimilar single crystal inorganic semiconductors (e.g., nanowires/ribbons of GaN, Si and GaAs) can be combined with one another and also with other classes of nanomaterials (e.g. SWNTs) using a scalable and deterministic printing method to yield complex, HGI electronic systems in 2D or 3D layouts. In particular, ultrathin multilayer stacks of high performance metal-oxide-semiconductor field-effect transistors (MOSFETs), metal-semiconductor field-effect transistors (MESFETs), thin film transistors (TFTs), photodiodes and other components, integrated into device arrays, logic gates and actively addressable photodetectors on rigid inorganic and flexible plastic substrates demonstrate some of the capabilities.

FIG. 57 illustrates representative steps for producing these 3D-HGI systems. The process begins with synthesis of the semiconductor nanomaterials, each on their own source substrate. The devices presented here integrate nanowires and nanoribbons of single crystal Si, GaN and GaAs, formed using wafer based source materials and lithographic etching procedures (16-21), and networks of SWNTs grown by chemical vapor deposition (13,21). Scanning electron micrographs at the top of FIG. 57 show these semiconductor nanomaterials, after their removal from the source substrates. For circuit fabrication, these elements remain in the configurations defined on the wafers during the fabrication or growth stage: aligned arrays in the case of the Si, GaN and GaAs nanowires/ribbons and sub-monolayer random networks for the SWNTs. High temperature doping and annealing procedures for ohmic contacts to the Si, GaN and GaAs can be performed on the source substrates. The next step involves transferring these processed elements, using an elastomeric stamp-based printing technique described previously, from the source substrates to a device substrate, such as a sheet of polyimide (PI) as illustrated in FIG. 57. In particular, laminating a stamp of polydimethysiloxane (PDMS) against the source substrate establishes soft, van der Waals adhesion contacts to the semiconductor nanomaterial elements. Contacting the 'inked' stamp to a device substrate (e.g. PI sheet) with a thin, spin-cast layer of a liquid prepolymer (e.g. polyamic acid) on its surface and then curing the polymer leaves these semiconductor materials embedded on and well adhered to this layer (16-20) when the stamp is removed. Similar procedures work well with a range of substrates (i.e. rigid or flexible; organic or inorganic) and semiconductor nanomaterials [A slightly modified version of this process is used for the SWNTs (21).]. The thickness of the interlayer (PI in this case) can be as small as 500 nm and is typically 1-1.5 µm, for the systems described here. After some additional processing, including formation of gate dielectrics, electrodes and interconnects, the transfer printing and device fabrication steps can be repeated, beginning with spin-coating a new prepolymer interlayer on top of the previously completed circuit level. Automated stages specially designed for transfer printing or conventional mask aligners enable overlay registration accuracy of ~1 µm over several square centimeters. (22) (FIG. 61). Layer to layer interconnects (23) are formed simply by evaporating metal lines over and into openings in the interlayers defined by photopatterning and/or dry etching. This unusual approach to 3D-HGI electronics has several important features. First, all of the processing on the device substrate occurs at low temperatures, thereby avoiding differential thermal expansion/shrinkage effects that can result in unwanted deformations in multilayer stacked systems. This operation also enables the use of low temperature plastic substrates and interlayer materials, and it helps to ensure that underlying circuit layers are not thermally degraded by processing of overlying devices. Second, the method is applicable to broad classes of semiconductor nanomaterials, including emerging materials such as thin films of SWNT. Third, the soft stamps enable non-destructive contacts with underlying device layers; these stamps, together with the ultrathin semiconductor materials, can also tolerate surfaces that have some topography. Fourth, the ultrathin device geometries (<1 µm) and interlayers (<1.5 µm) allow easy formation of layer to layer electrical interconnects. These features, which overcome many of the disadvantages of conventional approaches, are illustrated in the several circuit demonstrations described in the following.

FIG. 58 presents a three layer, 3D stack arrayed Si MOSFETs fabricated using the general process flow illustrated in FIG. 57, using single crystal silicon nanoribbons, with doped contacts (formed on the source wafer), plasma enhanced chemical vapor deposited SiO2 dielectrics, and Cr/Au metallization for source, drain and gate (24). Each device uses three aligned nanoribbons, with widths, thicknesses and lengths of 87 µm, 290 nm and 250 µm, respectively. FIG. 2A shows a top view optical micrograph of an edge of the system with a layout designed to reveal separately the parts of the substrate that support one, two and three layers of MOSFETs. A ninety degree rotation of the device geometry for the second layer, relative to the first and third, helps to clarify the layout of the system. Schematic cross-sectional and angled views of the stacked structure appear in FIG. 58B. The sample can be viewed in 3D using confocal optical microscopy. FIG. 58C shows top and angled views of such images, colorized for ease of viewing. (The image quality degrades somewhat with depth, due to scattering and absorption from the upper layers). FIG. 58D presents electrical measurements of representative devices [top gate MOSFETs with channel lengths ($L_c$) of 19 µm, channel overlap distances (Lo), defined by distance that the gate electrode extends over the doped source/drain regions, of 5.5 µm, and channel widths (W) of 200 µm] in each layer. Devices on each of the three layers, which are formed on a PI substrate, show excellent properties (linear mobilities of 470±30 $cm^2$/Vs, on/off ratios>104 and threshold voltages of −0.1±0.2V) and no systematic differences between devices in different layers. Additional layers can be added to this system, by repeating the same procedures. In addition to 3D circuits with a single semiconductor, as illustrated in FIG. 59, various semiconductors can be used in multiple layers to form full 3D-HGI systems. To illustrate this capability, we fabricated arrays of MESFETS (in particular, high electron mobility transistors, HEMTs), MOSFETs and TFTs using GaN and Si nanoribbons, and SWNT films, respectively, on PI substrates. FIGS. 59A and 59B show high magnification optical and confocal images, respectively, of the resulting devices. The GaN HEMTs on the first layer use ohmic contacts (Ti/Al/Mo/Au, annealed on the source wafer) for source and drain, and a Schottky (Ni/Au) contacts for the gates. The channel lengths and widths, and the gate widths are 20, 170, and 5 µm respectively. Each device uses GaN ribbons (composed of multilayer stacks of AlGaN/GaN/AlN) with thicknesses, widths and lengths of 1.2, 10 and 150 µm, respectively, interconnected electrically by processing on the device substrate. The SWNT TFTs on the second layer use $SiO_2$/Epoxy for the gate dielectric and Cr/Au for source, drain and gate, with channel lengths and widths of 50 and 200 µm, respectively. The Si MOSFETs use the same design as those shown in FIG. 58. Various other 3D-HGI devices can be constructed using different combinations of Si, SWNT and GaN (FIGS. 61 and 62). FIG. 59C presents the current-voltage characteristics of typical devices in the systems of FIGS. 59A and 59B. In all cases, the properties are similar to those fabricated on the source wafers: the GaN HEMTs have threshold voltages (W) of −2.4±0.2 V, on/off ratios>$10_6$, and transconductances of 0.6±0.5 mS; the SWNT TFTs have $V_{th}$=−5.3±1.5 V, on/off ratios>105 and linear mobilities of 5.9±2.0 $cm^2$/Vs; the Si MOSFETs have $V_{th}$=0.2±0.3 V, on/off ratios>$10^4$ and linear mobilities of 500±30 $cm^2$/Vs. An interesting aspect of these devices, which follows from the use of thin PI substrates (25 µm), devices (2.4 µm) and PI/PU interlayers (5 µm), is their mechanical bendability, which is important for applications in flexible electronics. We evaluated the effective transconductance ($g_{eff}$) for the Si, SWNT, and GaN devices in the 3D-HGI system of FIG. 59A as a function of bend radius. FIG. 59D, which shows these data, as normalized to the transconductance in the unbent state ($g_{0eff}$), illustrates the stable performance for bend radii down to 3.7 mm.

Electrical interconnections formed between different levels in these 3D-HGI devices can create interesting circuit capabilities. The thin polymer interlayers enable these interconnects to be formed easily by evaporating metal lines over and into lithographically defined openings. FIG. 60 presents some examples. The first, shown in FIG. 60A, is a 3D NMOS inverter (logic gate) in which the drive (L=4 µm, W=200 µm) and load (L=4 µm, W=30 µm) Si MOSFETs are on different levels. With a supply voltage of 5V, this double-layer inverter exhibits well-defined transfer characteristics with gains of ~2, comparable to the performance of conventional planar inverters that use the similar transistors (25). FIG. 60B shows an inverter with a complementary design (CMOS) by use of integrated n-channel Si MOSFETs and p-channel SWNT TFTs, designed in order to equalize the current-driving capability in both pull-up and pull-down directions (FIG. 65). Transfer curves collected with a 5 V bias to the VDD terminal and gate voltage (input) swept from 0 V to 5 V appear in FIG. 60A. The curve shapes and gains (as high as ~7) are qualitatively consistent with numerical circuit simulations (FIG. 65). As a third example, we built GaAs metal-semiconductor-metal (MSM) infrared (IR) detectors (26) integrated with Si MOSFETs on flexible PI substrates, to demonstrate a capability for fabricating unit cells that could be used in active IR imagers. In this case, printed nanoribbons of GaAs (thicknesses, widths and lengths of 270 nm, 100 µm and 400 µm, respectively) transferred onto a substrate with a printed array of Si nanoribbon MOSFETs form the basis of the MSMs. Electrodes (Ti/Au=5/70 nm) deposited on the ends of these GaAs nanoribbons form back-to-back Schottky diodes with separations of 10 µm. The resulting detector cells exhibit current enhancement as the intensity of IR illumination increases (FIG. 60C), consistent with circuit simulation (FIG. 66). A responsivity of about 0.30 A/W at the 850 nm wavelength is observed from 1 to 5 V, without taking into account the light reflected from the surface of the semiconductor. The system also exhibits bendability with radii of curvature below 1 cm, which could be useful for advanced systems such as curved focal plane arrays for wide angle IR night vision imagers.

Printed semiconductor nanomaterials provide new approaches to 3D-HGI systems and could have important applications in various fields of application, not only those suggested by the systems reported here, but also others including microfluidic devices with integrated readout and sensing electronics, chem/bio sensor systems that incorporate unusual sensing materials with conventional silicon based electronics and photonic/optoelectronic systems that combine light emitters of compound semiconductor with silicon drive electronics or microelectromechanical structures. Further, the compatibility of this approach with thin, lightweight plastic substrates may create additional opportunities for devices that have unusual form factors or mechanical flexibility as key features.

MATERIALS AND METHODS: Device fabrication: Silicon devices: The fabrication begins with definition of contact doped thin ribbons of single crystal silicon, by processing silicon on insulator wafer (SOI; Soitec unibond with a 290 nm top Si layer with doping level of 6.0~9.4×$10^{14}$/$cm^3$). The first step involved phosphorous doping, using a solid source and spin-on-dopant (Filmtronic, P509), and a photolithographically defined layer of plasma enhanced chemical vapor (PECVD) deposited $SiO_2$ (Plasmatherm, 300 nm, 900 mTorr, 350 sccm, 2% $SiH_4$/He, 795 sccm $NO_2$, 250° C.) as a mask to control where dopant diffuses into the silicon. After doping, $SF_6$ plasma etching through a patterned layer of photoresist defined the ribbons. Undercut etching of the buried oxide with concentrated HF solution (Fisher Chemicals) released the ribbons from the wafer. This procedure completed the fabrication of contact doped ribbons of single crystal silicon. In the next step, contacting a flat elastomeric stamp of polydimethylsiloxane (PDMS, A:B=1:10, Sylgard 184, Dow Corning) with the photoresistcoated ribbons and then peeling back the stamp removed the ribbons from the wafer and left them adhered, by van der Waals forces between the hydrophobic PDMS and the photoresist, to the surface of the stamp. The stamp thus 'inked' with s-Si ribbons from wafer was laminated against a polyimide (PI) sheet of 25 μm (Dupont, Kapton100E) spincoated with a thin layer (~1.5 μm) of liquid PI precursor, polyamic acid (Sigma_Aldrich Inc.). Curing the precursor, peeling off the PDMS stamp, and stripping the photoresist left the ribbons embedded on and well adhered to the surface of the PI substrate. The gate dielectric layer consisted of a layer of $SiO_2$ (thickness ~100 nm) deposited by PECVD at relatively low temperature, 250° C. Photolithography and $CF_4$ plasma etching defined openings to the doped source/drain regions of the silicon. Source, drain and gate electrodes of Cr/Au (5/100 nm, from bottom to top by electron beam evaporation, Temescal FC-1800) were defined in a single step by photolithography and wet etching.

GaN devices: GaN microstructures were fabricated on a bulk wafer of GaN with heterostructure [AlGaN(18 nm)/GaN(0.6 μm)/AlN(0.6 μm)/Si]. An ohmic contact area defined by AZ 5214 photoresist and then cleaned with $SiCl_4$ plasma in a RIE system. A Ti/Al/Mo/Au (15/60/35/50 nm) metal layer was then deposited by e-beam evaporation (Ti/Al/Mo) and thermal evaporation (Au). Washing away the resist completed left metal contacts on the GaN. Thermal annealed at 850° C. for 30 sec in $N_2$ ambient formed the ohmics. SiO2 (Plasmatherm, 300 nm, 900 mTorr, 350 sccm, 2% SiH4/He, 795 sccm $NO_2$, 250° C.) and Cr metal (e-beam evaporator, 150 nm) layers were deposited as the mask materials for subsequent inductively coupled plasma (ICP) etching. Photolithography, wet etching, and RIE processing (50 mTorr, 40 sccm CF4, 100 W, 14 min) defined the ribbon geometries of the GaN. After removing the photoresist with acetone, ICP dry etching (3.2 mTorr, 15 sccm Cl2, 5 sccm Ar, −100V Bias, 14 min) was used to remove the exposed GaN and to etch slightly into the Si (~1.5 μm) to facilitate the subsequent anisotropic etching. The Si was then etched away from underneath the GaN using a tetramethyl ammonium hydroxide (Aldrich, 150° C. for 4 min 30 sec). The sample was dipped in BOE (6:1, $NH_4F$: HF) for 30 sec to remove the PECVD $SiO_2$ and a new 50 nm e-beam evaporated SiO2 layer was deposited on top of the GaN ribbons. A PDMS slab 'inked' with the GaN ribbons from mother wafer was then laminated against a PI sheet coated with 2 μm polyurethane (PU, Norland optical adhesive, No. 73). The sample was exposed to UV light (173 μWcm$^{-2}$) for 15 min to cure the PU. Peeling back the PDMS and removing the e-beam SiO2 by immersion in BOE for 20 sec resulted in the transfer of the GaN elements to the plastic substrate. A negative photoresist (AZ nLOF2020) was used to pattern Schottky contacts of Ni/Au (80/180 nm). The photoresist was removed with an AZ stripper (KWIK for 30 min).

SWNT devices: Chemical vapor deposition (CVD) was used to grow random networks of individual single walled carbon nanotubes on SiO2/Si wafers. Ferritin (Sigma Aldrich) deposited on the substrate with a methanol was used as a catalyst. The feeding gas was methane (1900 sccm $CH_4$ with a 300 sccm $H_2$). The quartz tube in the furnace was flushed with a high flow of Ar gas for cleaning before growth. During the growth, the temperature was held at 900° C. for 20 minutes. The transfer involved either procedures similar to the printing like processes described previously, or a slightly different method in which a thick Au layer and a PI precursor were coated on the $SiO_2$/Si substrate with the tubes. After curing the PI, the Au/PI was peeled back. Laminating this layer against a prepatterned device substrate coated with a thin epoxy layer (SU8, 150 nm) and then removing the PI and Au layer by oxygen reactive ion etching and wet etching, respectively, completed the transfer. In the case of bottom gate devices, the substrate supported prepatterned gate electrodes and dielectrics. In particular, gate electrodes of Cr/Au/Cr (2/10/10 nm) were patterned by photolithography and then, 300 nm $SiO_2$ was deposited on the substrate using PECVD. The source and drain electrodes of Cr/Au (2/20 nm) were defined directly on top of the tubes.

3D Circuit: 3D Si NMOS inverter: Multilayer devices were constructed by repetitively applying the same fabrication procedures. In particular, to the PI precursor was spin-cast on the top of an existing layer of devices, and silicon ribbons were transfer-printed on top. The same processes were then used to fabricate devices. For vertical metal interconnects, an electrode area was defined by photo-patterning openings in a layer of AZ4620 photoresist, and then etching away the $SiO_2$ and PI in this exposed area using $CF_4$ and $O_2$ plasma in a RIE system. Depositing 300 nm Al into this area established contacts at the bottom, and provided an electrically continuous connection over the step edge formed by the etched $SiO_2$ and PI.

SWNT and Si CMOS inverter: The SWNT devices consisted of source/drain contacts of Au (20 nm) defined by photolithography on the tube networks. The $SiO_2$ (100 nm)/Si wafer substrate provided the gate dielectric and gate. Epoxy (SU8, 500 nm) was then spin-coated onto this substrate after the SWNT transistors were selectively coated with photoresist (AZ5214). After UV exposure for curing of epoxy, a PDMS slab 'inked' with undoped Si ribbons was laminated against the substrate and subsequently removed by slow manual peeling to complete the transfer-printing process. Cr/Au (5/100 nm) were used as Schottky contacts for source and drain electrodes in the silicon devices. Al (100 nm) was used to connect the SWNT and Si transistor.

GaAs MSM IR detector integrated with Si TFT: GaAs wafers (IQE Inc., Bethlehem, Pa.) were used to generate back-to-back schottky diodes. The ribbons were generated from a high-quality bulk wafer of GaAs with multiple epitaxial layers [Si-doped n-type GaAs(120 nm)/semi-insulating(SI)-GaAs(150 nm)/AlAs(200 nm)/SI-GaAs]. The carrier concentration of n-type GaAs is 4×1017 cm$^{-3}$. GaAs wafers with photoresist mask patterns were anisotropically etched in the etchant (4 mL H3PO4 (85 wt %), 52 mL H2O2 (30 wt %), and 48 mL deionized water). The AlAs layers were etched away with a diluted HF solution in ethanol (1:2 in volume). Layers of 2 nm Ti and 28 nm SiO2 were the deposited by e-beam evaporator. A PDMS stamp inked with the GaAs ribbons was then contacted to a layer of Si transistors coated with PI (thickness 1.5 µm). Peeling back the PDMS and removing Ti and SiO$_2$ by BOE etchant completed the transfer of GaAs to the device substrate. Metals (Ti/Au=5/70 nm) for the Schottky contacts were deposited by e-beam evaporation. Electrical interconnects between the GaAs back-to-back Schottky diodes and the Si MOSFET were defined by first patterning a layer of AZ4620 photoresist, then etching through the openings using CF$_4$ and O$_2$ plasma in a RIE system and then depositing a 300 nm of Al.

Device characterization: A semiconductor parameter analyzer (Agilent, 4155C) and a conventional probing station were used for the electrical characterization of the diodes and transistors. The IR response was measured under IR LED source with wavelength of 850 nM.

Circuit Simulation: To compare the measured transfer curve of the CMOS inverter with a simulation, level 2 PSPICE models for the n-channel Si MOSFET and the p-channel SWNT TFT were generated empirically. These PSPICE models were created based on the default PSPICE MOSFET model (MbreakN and MbreakP) with extracted parameters to fit the measured IV curves of both Si NMOS and SWNT PMOS shown in FIG. 65B. The PSPICE model for GaAs MSM photo-detector was created empirically using back-to-back schottky diodes connected in series with Si MOSFET.

REFERENCES FOR EXAMPLE 4

1. K. Banerjee, S. J. Souri, P. Kapur, K. C. Saraswat, Proc. IEEE, 89, 602 (2001).
2. S. F. Al-Sarawi, D. Abbott, P. D. Franzon, IEEE Trans. Components, Packaging, and Manufacturing Technology, Part B, 21, 2 (1998).
3. A. S. Brown, W. A. Doolittle, N. M. Jokerst, S. Kang, S. Huang, S. W. Seo Materials Science and Engineering B 87, 317 (2001).
4. Y.-C. Tseng, P. Xuan, A. Javey, R. Malloy, Q. Wang, J. Bokor, H. Dai, Nano letters 4, 123 (2004).
5. C. Joachim, J. K. Gimzewski, A. Aviram, Nature 408, 541 (2000).
6. G. Roelkens et al. Optics Express 13, 10102 (2005).
7. D. B. Strukov, K. K. Likharev, Nanotechnology 16, 888 (2005).
8. K. Vanhollebeke, I. Moerman, P. Van Daele, P. Demeester, Prog. Cryst. Growth Charact. Mater. 41, 1 (2000).
9. H. Amano, N. Sawaki, I. Akasaki, Y. Toyoda, Appl. Phys. Lett. 48, 353 (1986).
10. T. Kuykendall, P. J. Pauzauskie, Y. Zhang, J. Goldberger, D. Sirbuly, J. Denlinger, P. Yang, Nature Materials 3, 524, (2004).
11. A. M. Morales, C. M. Lieber, Science 279, 208 (1998).
12. M. Law, D. J. Sirbuly, J. C. Johnson, J. Goldberger, R. J. Saykally, P. Yang, Science 305, 1269 (2004).
13. J. Kong, H. T. Soh, A. M. Cassell, C. F. Quate and H. Dai, Nature 395, 878 (1998)
14. K. S. Novoselov, A. K. Geim, S. V. Morozov, D. Jiang, Y. Zhang, S. V. Dubonos, I. V. Grigorieva, A. A. Firsov, Science 306, 666 (2004).
15. Y. Huang, X. Duan, C. M. Lieber, Small 1, 1 (2005).
16. M. A. Meitl, Z. Zhu, V. Kumar, K. Lee, X. Feng, Y. Huang, R. G. Nuzzo, J. A. Rogers, Nature Materials 5, 33 (2006).
17. E. Menard, K. J. Lee, D. Y. Khang, R. G. Nuzzo, J. A. Rogers, Appl. Phys. Lett. 84, 5398 (2004).
18. Y. Sun, S. Kim, I. Adesida, J. A. Rogers, Appl. Phys. Lett. 87, 083501 (2005).
19. K. Lee, M. A. Meitl, V. Kumar, J.-H. Ahn, I. Adesida, J. A. Rogers, R. G. Nuzzo, Appl. Phys. Lett. accepted.
20. S.-H. Hur, D.-Y. Khang, C. Kocabas, J. A. Rogers, Appl. Phys. Lett. 85, 5730 (2004).
21. Materials and Methods are available as supporting material on Science Online.
22. J. Dong, M. A. Meitl, E. Menard, P. Ferreira and J. A. Rogers, unpublished.
23. S. Linder, H. Baltes, F. Gnaedinger, and E. Doering: Proc. IEEE Micro Eletro Mech. Systems 349, (1994).
24. J.-H. Ahn, H.-S. Kim, K. Lee, Z.-T. Zhu, E. Menard, R. G. Nuzzo, J. A. Rogers, IEEE Electron Devices Lett. 27, 460 (2006).
25. J.-H. Ahn, H.-S. Kim, K. Lee, Z.-T. Zhu, E. Menard, R. G. Nuzzo, J. A. Rogers, unpublished.
26. J. B. D. Soole, H. Schumacher, IEEE J. Quantum Electron. 27, 737 (1991).

The pop up architecture is one that enables a range of device architectures and structures integrating structures that embed useful but difficult to achieve features. It is an architecture enabling important competencies devices that express electronic, optical, mechanical, and thermal forms of functionality. In many cases, the system designs exploit a hierarchy of such effects to enable explicit device level performance outcomes, although for simplicity we discuss specific embodiments below in terms of a dominant mode of functioning.

Electronic Systems. The most direct form of utility in this sphere is the provisions the described architectures make for the design of complex mechanically compliant electronic devices that directly embed high performance electronic circuits—displays, sensing elements, RF-ID tags comprising some challenging forms of application that benefit from the integration of high performance electronic circuits within a flexible system level architecture. The designs disclosed herein significantly extend the full range of mechanical compliances that can be realized. It does so by enabling the provision, at the system design level, of specific architectural details that can extend range of mechanical deformations that can be tolerated—well beyond the general limit of 1% strain that is typical for a device based on a planar integration of components. The examples show a specific architecture for the simplest system elements, the interconnects, that can be used to withstand formal system high level strains (>30% in the form factor appropriate for the construction of bus lines and interconnects in a display) as well as providing for other more demanding forms of mechanical compliance (stretchability). These benefits can be extended as well to more complex device level components as illustrated by the form factor of the exemplary devices shown in FIG. 31, a GaAs MSM IR photodetector as described. Essentially every functional component of a complex electronic system can be integrated in a design-specific, mechanically compliant form using the methods taught herein.

Optical Components and Systems. Optical components, e.g., a waveguide can respond with extreme sensitivity to flexure. The methods and systems provide new architectures for such devices that can both tolerate and, more importantly, exploit mechanical flexure to benefit functional performance. Examples of technologies that can directly exploit the methods disclosed herein include advanced forms of photonic components including, but not limited to, waveguide optical couplers and related forms of optical switches and limiters. Mechanical flexure at the system level of the integrated structure (via compression or extension) provides a direct means to effect these functionalities. The loss in a channel as well directly relates to the flexure of the waveguide—high bending radii promoting leakage in a controllable way from core to sheath modes. Such effects can be directly exploited in a variety of devices. For example, FIG. 67 schematically illustrates a waveguide array produced via the controlled buckling of an optical microstructure partially adhered to a deformable substrate. FIG. 67A shows the optical device is produced by attaching a component 330 (e.g., waveguide such as an optical fiber or other elongated microstructure) to a substrate 30 by contact printing, for example. The attachment includes strongly bound contacting regions 310 and weakly bound regions corresponding to raised regions 320. Upon deformation the second electrode buckles and the weakly-bound region of the waveguide separates physically from the substrate, thereby producing the raised region. The device may operate simply as a waveguide capable of significant (5 to 50%) stretchability (see FIG. 67B). Alternatively, the indices of refraction of the waveguide and substrate as well as the buckling geometry may be chosen such that the device operates as an optical switch, allowing light to pass in the elongated state (FIG. 67B) but not in the shortened state (FIG. 67A), due to the high curvature in the buckled waveguides.

Mechanically Functional Systems. The intersection between mechanics and electronics is fundamental for several critical classes of technologies—inertial and other forms of force sensors comprise specific examples that are both of current interest and finding broad use. The methods and systems disclosed herein provide a route to generating new forms of such devices. FIG. 68 is a representative example of a mechanical system, specifically an entwined multilayer architecture for capacitively coupled sensing. This exemplary architecture directly enables important forms of force related sensing—inertial and pressure measurements most notably. In each case the methods and systems disclosed herein provide a relatively direct means to control many systems level aspects of the performance of these devices—dynamic range and region of optimum sensitivity most notably—while enabling their integration into compact, novel form-factor systems (e.g. by allowing the integration of the electronic systems in new ways). These structures compliment established MEMS based approaches to devices of this type. Referring to FIG. 68, a mechanical device 400 (e.g., accelerometer/pressure sensor) is produced via the controlled buckling of a conductive microstructure partially adhered to a deformable substrate 30. This device architecture operates by monitoring changes in the capacitance between the bottom electrode 450 and the other electrode 440 that occur when the raised region 320 of the electrode 440 is displaced relative to the substrate via acceleration or pressure in the z-direction. The device 400 is produced by preparing an electrode (bottom electrode 450) on the substrate 30, then by attaching another electrode 440 by contact printing. The attachment includes strongly bound contacting regions 310 and weakly bound regions (e.g., in the region below 320). Upon deformation, the second electrode 440 buckles and the weakly-bound region separates physically from the substrate, thereby producing the raised region 320.

Thermally Functional Devices. The pop up structures afforded by the present invention engender new capacities to provide for the thermal isolation of complex electronic components. An explicit device class provides a general design for the pixel elements of a long wavelength imaging system that requires the integration of high performance electronic components that provide control, read out, data handling and other capabilities for the system while providing direct integration and precise thermal isolation of thermally responsive (and for this example) two terminal devices. This demanding architecture is readily accessed using the methods taught by the current invention. In the present case it is possible to place functional electronic components—such as the AD converter needed to read a pixel—in close proximity to the IR responsive elements (appropriate examples include but are not limited to Si and thin film multilayers of photoresistive metal oxides supported on $Si_3N_4$ membrane), a feature that makes it possible to both simplify design and enhance performance. Most notably, the systems and devices presented herein provides a capability of integrating of such device elements in a non-planar focal array. FIG. 69 shows a thermal device 500 (microbolometer) produced via the controlled buckling of a thermoresistive microstructure partially adhered to a deformable substrate. The device 500 is produced by attaching to the substrate 30 an electrode 550 that contains a thermoresistive material 560 by contact printing. The attachment includes strongly bound contacting regions 310 and weakly bound regions corresponding to raised regions 320. Upon deformation, the electrode 550 buckles and the weakly-bound region separates physically from the substrate, thereby producing the raised region 320 that is to a large extent thermally isolated from the substrate, thereby providing accurate and localized temperature sensing.

U.S. patent application Ser. Nos. 11/115,954, 11/145,574, 11/145,542, 60/863,248, 11/465,317, 11/423,287, 11/423,192, and Ser. No. 11/421,654 are hereby incorporated by reference to the extent not inconsistent with the present description.

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

TABLE 1

Parameters extracted (from experiments and calculations) from the buckles as shown in FIG. 31A. The calculations assume that the widths (i.e., 10 μm for the samples shown in the figure) of the activated regions are the same before and after stretching.

| pre-strain | measured width (μm) | calculated width (μm) | measured amplitude Am (μm) | calculated amplitude Acal (μm) | calculated peak strain εpeak (%) |
|---|---|---|---|---|---|
| 11.3% | 136.6 | 170.7 | 37.5 | 37.6 | 0.38 |
| 25.5% | 139.6 | 151.4 | 51.5 | 50.3 | 0.65 |
| 33.7% | 140.1 | 142.1 | 56.4 | 54.3 | 0.80 |
| 56.0% | 124.3 | 121.8 | 63.6 | 60.4 | 1.2 |

TABLE 2

Parameters extracted (from experiments and calculations) from the buckles as shown in FIG. 31D

| Win (μm) | measured wavelength λm (μm) | calculated wavelength λcal (μm) | measured amplitude Am (μm) | calculated amplitude Acal (μm) | calculated peak strain εpeak (%) |
|---|---|---|---|---|---|
| 100 | N/A | 69 | N/A | 33.2 | 2.5 |
| 200 | 123 | 131 | 66.3 | 64.1 | 1.2 |
| 300 | 199 | 194 | 100.6 | 94.9 | 0.80 |
| 400 | 253 | 256 | 129.3 | 128.8 | 0.61 |

We claim:

1. A multilayer device comprising:
a flexible substrate;
an intermediate layer that is supported on a surface of the flexible substrate;
a first device layer disposed over the flexible substrate and at least partially embedded in the intermediate layer, the first device layer comprising:
a first device component that forms part of a two-dimensional array;
at least two stretchable interconnects, each of the at least two stretchable interconnects having a first end, a second end, and a central portion that is between the first and the second end, wherein:
the at least two stretchable interconnects extend along at least two different directions from the first device component in a plane of the supporting surface to form the two dimensional array;
the first end of each of the at least two stretchable interconnects is in electrical communication with the first device component;
the central portion of each of the at least two stretchable interconnects comprises a bent configuration region;
an interlayer disposed over the first device layer, the interlayer comprising a polymeric material;
a second device layer disposed over the interlayer, the second device layer comprising a second device component; and
an electrical interconnect having a first end and a second end, the electrical interconnect extending through a portion of the interlayer,
wherein the first end of the interconnect is in electrical communication with the first device component, and
wherein the second end of the interconnect is in electrical communication with the second device component.

2. The multilayer device of claim 1, wherein the interlayer has a thickness from about 500 nm to 5 microns.

3. The multilayer device of claim 1, wherein the interlayer has a thickness of less than or equal to about 5 microns.

4. The multilayer device of claim 1, wherein the interlayer comprises a polyimide.

5. The multilayer device of claim 1, wherein the first device component is spatially aligned with at least a portion of the second device component.

6. The multilayer device of claim 1, further comprising an encapsulating layer, wherein the encapsulating layer at least partially encapsulates the second device layer.

7. The multilayer device of claim 6, further comprising at least one first stretchable semiconductor structure in electrical communication with the first device component, wherein the second device layer further comprises at least one second stretchable semiconductor structure in electrical communication with the second device component.

8. The multilayer device of claim 7, wherein the encapsulating layer at least partially encapsulates at least one of:
the second device component, and
the at least one second stretchable semiconductor structure.

9. The multilayer device of claim 6, wherein the encapsulating layer comprises at least one of a polyimide and a polyurethane.

10. The multilayer device of claim 1, wherein the flexible substrate comprises an elastomer.

11. The flexible multilayer device of claim 1, further comprising at least one first stretchable semiconductor in electrical communication with the first device component, wherein the at least one first stretchable semiconductor structure is at least partially embedded in the intermediate layer.

12. The multilayer device of claim 1, further comprising at least one first stretchable semiconductor in electrical communication with the first device component, wherein the at least one first stretchable semiconductor structure includes a plurality of stretchable semiconductor structures arranged in an array or pattern.

13. The multilayer device of claim 12, wherein the pattern includes a grid configuration, a floral configuration, a bridge configuration, or any combination thereof.

14. The multilayer device of claim 1, wherein at least one of the first device component and the second device component comprises a material selected from the group consisting of: single crystal silicon, Si, Ge, SiC, AlP, AlAs, AlSb, GaN, GaP, GaAs, GaSb, InP, InAs, InSb, ZnO, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, SiGe, GaInAsP, and a carbon nanomaterial.

15. The multilayer device of claim 1, wherein at least one of the first device component and the second device component comprises an optical device, an opto-electronic device, a microfluidic device, a microelectromechanical system, a nanoelectromechanical system, or any combination thereof.

16. The multilayer device of claim 1, further comprising at least one first stretchable semiconductor in electrical communication with the first device component, wherein the at least one first stretchable semiconductor structure has a coiled conformation, a wrinkled conformation, a buckled conformation, or a wavy configuration.

17. The multilayer device of claim 1, further comprising at least one first stretchable semiconductor in electrical communication with the first device component, wherein the at least one first stretchable semiconductor structure is in electrical communication with the first device component.

18. A multilayer device comprising:
a flexible substrate;
an intermediate layer that is supported on a surface of the flexible substrate;
a first device layer disposed over the flexible substrate and at least partially embedded in the intermediate layer, the first device layer comprising:
a first device component that forms part of a two-dimensional array;
at least two stretchable interconnects, each of the at least two stretchable interconnects having a first end, a second end, and a central portion that is between the first and the second end, wherein:
the at least two stretchable interconnects extend along at least two different directions from the first device component in a plane of the supporting surface to form the two dimensional array;
the first end of each of the at least two stretchable interconnects is in electrical communication with the first device component;
the central portion of each of the at least two stretchable interconnects comprises a bent configuration region; and
an interlayer disposed over the first device layer, the interlayer comprising a polymeric material;
a second device layer disposed over the interlayer, the second device layer comprising:
a second device component that forms part of a two-dimensional array;
at least two stretchable interconnects, each of the at least two stretchable interconnects having a first end, a second end, and a central portion that is between the first and the second end, wherein:
the at least two stretchable interconnects extend along at least two different directions from the second device component in a plane of the supporting surface to form the two dimensional array;
the first end of each of the at least two stretchable interconnects is in electrical communication with the second device component;
the central portion of each of the at least two stretchable interconnects comprises a bent configuration region; and an electrical interconnect having a first end and the second end, the electrical interconnect extending through a portion of the interlayer, wherein the first end of the interconnect is in electrical communication with the first device component, and wherein the second end of the interconnect is in electrical communication with the second device component.

19. The multilayer device of claim 18, further comprising an encapsulating layer, wherein the encapsulating layer at least partially encapsulates the second device layer.

20. The multilayer device of claim 18, wherein the flexible substrate comprises an elastomer.

21. The multilayer device of claim 18, further comprising:
at least two first stretchable semiconductor structures in electrical communication with the first device component,
wherein the at least two first stretchable semiconductor structures extend along at least two different directions from the first device component in the plane of the first device layer to form the two-dimensional array;
wherein one or more of the least two first stretchable semiconductor structures is at least partially embedded in the intermediate layer.

22. The multilayer device of claim 18, further comprising:
at least two first stretchable semiconductor structures in electrical communication with the first device component,
wherein the at least two first stretchable semiconductor structures extend along at least two different directions from the first device component in the plane of the first device layer to form the two-dimensional array;
wherein the at least two first stretchable semiconductor structures in the two-dimensional array are arranged in a grid configuration, a floral configuration, a bridge configuration, or any combination thereof.

23. The multilayer device of claim 18, wherein at least one of the first device component and the second device component comprises a material selected from the group consisting of: single crystal silicon, Si, Ge, SiC, AlP, AlAs, AlSb, GaN, GaP, GaAs, GaSb, InP, InAs, InSb, ZnO, ZnSe, ZnTe, CdS, CdSe, CdTe, HgS, PbS, PbSe, PbTe, AlGaAs, AlInAs, AlInP, GaAsP, GaInAs, GaInP, AlGaAsSb, AlGaInP, SiGe, GaInAsP, and a carbon nanomaterial.

24. The multilayer device of claim 18, wherein at least one of the first device component and the second device component comprises an optical device, an opto-electronic device, a microfluidic device, a microelectromechanical system, a nanoelectromechanical system, or any combination thereof.

25. The multilayer device of claim 18, further comprising:
at least two first stretchable semiconductor structures in electrical communication with the first device component,
wherein the at least two first stretchable semiconductor structures extend along at least two different directions from the first device component in the plane of the first device layer to form the two-dimensional array;
wherein the at least two first stretchable semiconductor structures have a coiled conformation, a wrinkled conformation, a buckled conformation, or a wavy configuration.

26. The multilayer device of claim 18, further comprising:
at least two second stretchable semiconductor structures in electrical communication with the second device component,
wherein the at least two second stretchable semiconductor structures extend along at least two different directions from the first device component in the plane of the second device layer to form a two-dimensional array.

27. The multilayer device of claim 1, further comprising at least one first stretchable semiconductor structure in electrical communication with the first device component.

28. The multilayer device of claim 18, further comprising:
at least two first stretchable semiconductor structures in electrical communication with the first device component,
wherein the at least two first stretchable semiconductor structures extend along at least two different directions from the first device component in a plane of the first device layer to form a two-dimensional array.

29. The multilayer device of claim 1, wherein at least one of the first device component and the second device component comprises a physical sensor, biological sensor, a chemical sensor, an accelerometer, a pressure sensor, or any combination thereof.

30. The multilayer device of claim 18, wherein at least one of the first device component and the second device component comprises a physical sensor, biological sensor, a chemical sensor, an accelerometer, a pressure sensor, or any combination thereof.

31. The multilayer device of claim 1, wherein the stretchable interconnects, the electrical interconnect, or both comprises a high conductivity material.

32. The multilayer device of claim 31, wherein the high conductivity material comprises a metal or an alloy thereof.

33. The multilayer device of claim 18, wherein the stretchable interconnects, the electrical interconnect, or both comprises a high conductivity material.

34. The multilayer device of claim 33, wherein the high conductivity material comprises a metal or an alloy thereof.

35. The multilayer device of claim 1, wherein the stretchable interconnects, the electrical interconnect, or both comprises a semiconductor material.

36. The multilayer device of claim 35, wherein the semiconductor material comprises silicon, indium tin oxide, or GaAs.

37. The multilayer device of claim 18, wherein the stretchable interconnects, the electrical interconnect, or both comprises a semiconductor material.

38. The multilayer device of claim 37, wherein the semiconductor material comprises silicon, indium tin oxide, or GaAs.

* * * * *